US009094043B2

(12) United States Patent
Shinohara et al.

(10) Patent No.: US 9,094,043 B2
(45) Date of Patent: Jul. 28, 2015

(54) DATA PROCESSING DEVICE AND DATA PROCESSING METHOD

(75) Inventors: Yuji Shinohara, Kanagawa (JP); Makiko Yamamoto, Tokyo (JP); Takashi Yokokawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 66 days.

(21) Appl. No.: 13/982,494

(22) PCT Filed: Feb. 1, 2012

(86) PCT No.: PCT/JP2012/052233
§ 371 (c)(1),
(2), (4) Date: Jul. 30, 2013

(87) PCT Pub. No.: WO2012/108308
PCT Pub. Date: Aug. 16, 2012

(65) Prior Publication Data

US 2013/0311850 A1 Nov. 21, 2013

(30) Foreign Application Priority Data

Feb. 8, 2011 (JP) ................................ 2011-025237

(51) Int. Cl.
*H03M 13/00* (2006.01)
*H03M 13/09* (2006.01)
(Continued)

(52) U.S. Cl.
CPC ............ *H03M 13/09* (2013.01); *H03M 13/036* (2013.01); *H03M 13/1165* (2013.01);
(Continued)

(58) Field of Classification Search
CPC .......... H03M 13/036; H03M 13/1165; H03M 13/255; H03M 13/2707; H03M 13/271; H03M 13/09; H03M 13/2906; H03M 13/152; H04L 1/0072; H04L 1/0057; H04L 1/0045; H04L 1/0065; H04L 27/2626; H04L 27/2647
See application file for complete search history.

(56) References Cited

U.S. PATENT DOCUMENTS

| | | | | |
|---|---|---|---|---|
| 8,179,955 | B2 * | 5/2012 | Taylor et al. | 375/230 |
| 2009/0125780 | A1 * | 5/2009 | Taylor et al. | 714/752 |

(Continued)

FOREIGN PATENT DOCUMENTS

| | | | |
|---|---|---|---|
| EP | 2 216 907 | A1 | 8/2010 |
| EP | 2 216 908 | A1 | 8/2010 |

(Continued)

OTHER PUBLICATIONS

Extended European Search Report issued Sep. 4, 2014 in Patent Application No. 12744385.1.

(Continued)

*Primary Examiner* — Guerrier Merant
(74) *Attorney, Agent, or Firm* — Oblon, McClelland, Maier & Neustadt, L.L.P.

(57) ABSTRACT

A data processing device and a data processing method capable of improving resistance to errors. Code bits of an LDPC code with a code length N of 16200 bits is written to, for example, eight storage units. When the code bits are stored in the storage units, a process of changing the storage start position of the code bits for each storage unit is performed as a sorting process of sorting the bits of the LDPC code such that a plurality of code bits corresponding to 1s in an arbitrary row of the parity check matrix of the LDPC code are not included in a single symbol which is read from the storage units. The present technology can be applied to, for example, the transmission of the LDPC code.

30 Claims, 126 Drawing Sheets

(51) Int. Cl.

| | |
|---|---|
| ***H03M 13/03*** | (2006.01) |
| ***H03M 13/11*** | (2006.01) |
| ***H03M 13/25*** | (2006.01) |
| ***H03M 13/27*** | (2006.01) |
| ***H03M 13/29*** | (2006.01) |
| ***H04L 1/00*** | (2006.01) |
| *H03M 13/15* | (2006.01) |
| *H04L 27/26* | (2006.01) |

(52) U.S. Cl.

CPC .......... *H03M13/255* (2013.01); *H03M 13/271* (2013.01); *H03M 13/2707* (2013.01); *H03M 13/2906* (2013.01); *H04L 1/0045* (2013.01); *H04L 1/0057* (2013.01); *H04L 1/0065* (2013.01); *H04L 1/0072* (2013.01); *H03M 13/152* (2013.01); *H04L 27/2626* (2013.01); *H04L 27/2647* (2013.01)

(56) References Cited

U.S. PATENT DOCUMENTS

| | | | | |
|---|---|---|---|---|
| 2009/0217129 | A1 | 8/2009 | Myung et al. | |
| 2010/0269019 | A1 | 10/2010 | Yokokawa et al. | |
| 2010/0275101 | A1 | 10/2010 | Yokokawa et al. | |
| 2010/0325512 | A1* | 12/2010 | Yokokawa et al. | 714/752 |

FOREIGN PATENT DOCUMENTS

| | | | |
|---|---|---|---|
| JP | 2009-153109 | | 7/2009 |
| JP | 2011-176782 | A | 9/2011 |
| JP | 2012-4873 | A | 1/2012 |
| JP | 2012-15688 | A | 1/2012 |
| JP | 2012-85196 | A | 4/2012 |
| JP | 2012-151520 | A | 8/2012 |
| JP | 2012-151653 | A | 8/2012 |
| JP | 2012-151654 | A | 8/2012 |
| JP | 5359882 | B2 | 12/2013 |
| WO | WO 2009/107990 | A2 | 9/2009 |

OTHER PUBLICATIONS

Office Action issued Sep. 16, 2014 in Japanese Patent Application No. 2011-025237.

Makiko Kan, “Simulation Results for new 16k codes”, DVB-NGH, Sony Corporation, R&D Division, Semiconductor Business Group, XP 017836582, (Jul. 13, 2011), 42 pages.

Makiko Kan, “Comparison between New 16k LDPC Codes and S2/T2 16k Codes”, DVB-NGH, Sony Corporation, R&D Division, Semiconductor Business Group, XP 017834403, (Feb. 17, 2011), 20 pages.

“Digital Video Broadcasting (DVB); Frame structure channel coding and modulation for a second generation digital terrestrial television broadcasting system (DVB-T2)”, ETSI EN 302 755, V 1.2.1, XP 014061784, (Feb. 1, 2011), 178 pages.

Maxime Boukesse, et al., “Analysis of the twisting parameters in the DVB-T2 column-twist interleaver”, Proc..17$^{th}$ IEEE Symp. on Communications and Vehicular Technology in the Benelux (SCVT), XP 031980970, (Nov. 24, 2010), 6 pages.

Makiko Kan, “New 16k LDPC Codes for DVB-NGH”, Sony Corporation, R&D Division, Semiconductor Business Group, XP 017832619, 28, (Dec. 12, 2010), pages.

International Search Report issued Mar. 6, 2012 in Application No. PCT/JP2012/052233.

Takashi Yokokawa, et al., “Parity and Column Twist Bit Interleaver for DVB-T2 LDPC Codes”, 2008 5$^{th}$ International Symposium on Turbo Codes and Related Topics, 2008, pp. 123-127.

U.S. Appl. No. 13/982,494, filed Jul. 30, 2013, Patent App. Publication No. 2013-031185, Shinohara, et al.

U.S. Appl. No. 14/412,718, filed Jan. 5, 2015, Shinohara, et al.

* cited by examiner

FIG. 3

$$H=\begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

COLUMN NUMBERS OF COLUMN WEIGHTS

| | N=64800 | | | | N=16200 | | | |
|---|---|---|---|---|---|---|---|---|
| Nominal CODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 21
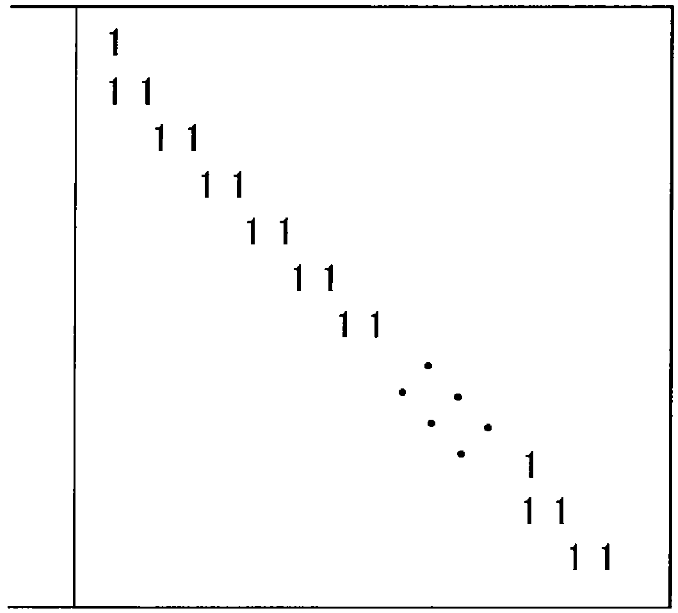
STAIRCASE STRUCTURE OF PARITY MATRIX
A
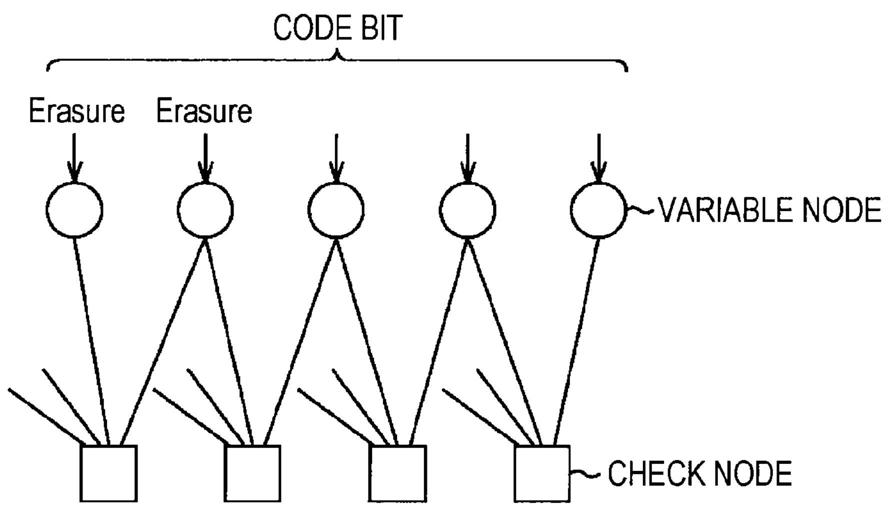
STAIRCASE STRUCTURE PORTION OF Tanner Graph
B

FIG. 25

| NECESSARY MEMORY COLUMN NUMBER mb | b=1 (FIRST TO THIRD EXCHANGE METHODS) | b=2 (FOURTH EXCHANGE METHOD) | WRITE START POSITIONS OF mb COLUMNS | | | | | | | | | | | | | | | | | | | | | | | |
|---|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG. 26

| NECESSARY MEMORY COLUMN NUMBER mb | b=1 (FIRST TO THIRD EXCHANGE METHODS) | b=2 (FOURTH EXCHANGE METHOD) | WRITE START POSITIONS OF mb COLUMNS | | | | | | | | | | | | | | | | | | | | | | | |
|---|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

EQUIVALENT REDUCTION MODEL OF Flutter

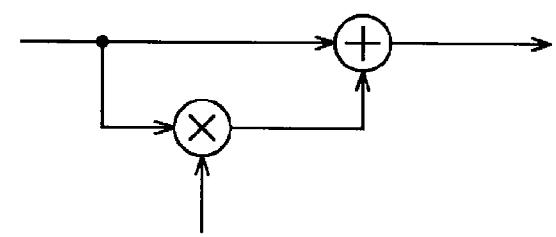

$1/\alpha^2 = D/U$
$f_d$:doppler freq.
t:time simulation WAS PERFORMED IN MODEL IN WHICH OFDM SYMBOL IS TRANSMITTED THROUGH THIS CHANNEL AND EXTRACTED BY 1 carrier AFTER FFT AT RECEPTION SIDE.

B

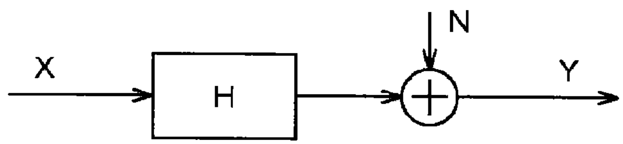

$$Y = \underbrace{\left[1 + \alpha \cdot \exp\left(j2\pi \cdot m \cdot f_d \cdot Ts + j2\pi \cdot \frac{(Nu-1) \cdot f_d \cdot Tu}{Nu}\right) \cdot \frac{\mathrm{sinc}(\pi \cdot f_d \cdot Tu)}{\mathrm{sinc}(\pi \cdot f_d \cdot Tu/Nu)}\right]}_{H} \cdot X + N$$

$$E\left[N^2\right] = \underbrace{\alpha^2 \cdot \left(1 - \left|\frac{\mathrm{sinc}(\pi \cdot f_d \cdot Tu)}{\mathrm{sinc}(\pi \cdot f_d \cdot Tu/Nu)}\right|^2\right)}_{\text{POWER OF } |C| \text{: APPROXIMATE BY AWGN}}$$

m:symbol number
Ts:symbol length(sec)
Tu:effective symbol length(sec)
Nu:number of OFDM carriers r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 34

DISPLAY ROW NUMBER OF PARITY CHECK MATRIX (INFORMATION MATRIX $H_A$) FOR EVERY 360 COLUMNS FROM FIRST COLUMN

ROW NUMBER OF PARITY CHECK MATRIX

FIRST COLUMN OF $H_A$ →
361-ST COLUMN OF $H_A$ →
721-ST COLUMN OF $H_A$ →
1081-ST COLUMN OF $H_A$ →

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

$h_{3,5}$

PARITY CHECK MATRIX INITIAL VALUE TABLE

FIG. 35

PARITY CHECK MATRIX INITIAL VALUE TABLE OF N=16200 AND r=1/5

PARITY CHECK MATRIX INITIAL VALUE TABLE OF N=16200 AND r=4/15

PARITY CHECK MATRIX INITIAL VALUE TABLE OF N=16200 AND r=1/3

PARITY CHECK MATRIX INITIAL VALUE TABLE OF N=16200 AND r=2/5

PARITY CHECK MATRIX INITIAL VALUE TABLE OF N=16200 AND r=4/9

PARITY CHECK MATRIX INITIAL VALUE TABLE OF N=16200 AND r=7/15

PARITY CHECK MATRIX INITIAL VALUE TABLE OF N=16200 AND r=8/15

PARITY CHECK MATRIX INITIAL VALUE TABLE OF N=16200 AND r=3/5

PARITY CHECK MATRIX INITIAL VALUE TABLE OF N=16200 AND r=2/3

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742

| CODING RATE | MINIMUM CYCLE LENGTH | PERFORMANCE THRESHOLD VALUE (Eb/No) |
|---|---|---|
| 1/5 | 8 | 0. 15 |
| 4/15 | 8 | −0. 21 |
| 1/3 | 6 | −0. 01 |
| 2/5 | 6 | 0. 01 |
| 4/9 | 6 | 0. 17 |
| 7/15 | 6 | 0. 36 |
| 8/15 | 6 | 0. 64 |
| 3/5 | 8 | 1. 00 |
| 2/3 | 6 | 1. 35 |

FIG. 48

| rate | X | KX | Y1 | KY1 | Y2 | KY2 | M |
|---|---|---|---|---|---|---|---|
| 1/5 | 36 | 720 | 5 | 360 | 4 | 2160 | 12960 |
| 4/15 | 21 | 1080 | 4 | 2160 | 3 | 1080 | 11880 |
| 1/3 | 30 | 1080 | 4 | 2880 | 3 | 1440 | 10800 |
| 2/5 | 32 | 1080 | 4 | 3240 | 3 | 2160 | 9720 |
| 4/9 | 25 | 1440 | 4 | 1440 | 3 | 4320 | 9000 |
| 7/15 | 24 | 1440 | 4 | 2880 | 3 | 3240 | 8640 |
| 8/15 | 21 | 1800 | 4 | 1800 | 3 | 5040 | 7560 |
| 3/5 | 13 | 2520 | 3 | 7200 | — | 0 | 6480 |
| 2/3 | 18 | 1440 | 4 | 5400 | 3 | 3960 | 5400 |

FIG. 106

| NECESSARY MEMORY COLUMN NUMBER mb | b=1 | b=2 | WRITE START POSITIONS OF mb COLUMNS | | | | | | | | | | | | | | | | | | | | | | | |
|---|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 3 | | | | | | | | | | | | | | | | | | | | | | |
| 4 | 16QAM | QPSK | 0 | 2 | 3 | 0 | | | | | | | | | | | | | | | | | | | | |
| 6 | 64QAM | | 0 | 1 | 3 | 8 | 1 | 6 | | | | | | | | | | | | | | | | | | |
| 8 | 256QAM | 16QAM | 0 | 1 | 0 | 8 | 2 | 0 | 1 | 5 | | | | | | | | | | | | | | | | |
| 12 | | 64QAM | 0 | 12 | 7 | 1 | 3 | 1 | 8 | 7 | 1 | 0 | 3 | 9 | | | | | | | | | | | | |

PARITY CHECK MATRIX INITIAL VALUE TABLE OF $r=\frac{2}{3}$ AND N=16200

FIG. 122 r3/4 16K 3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

PARITY CHECK MATRIX INITIAL VALUE TABLE OF $r=\frac{3}{4}$ AND N=16200

H' =

H' =

DATA PROCESSING DEVICE AND DATA PROCESSING METHOD

TECHNICAL FIELD

The present technology relates to a data processing device and a data processing method, and more particularly, to a data processing device and a data processing method which are capable of improving tolerance for an error of data.

BACKGROUND ART

An LDPC (Low Density Parity Check) code has a high error correction capability and is recently beginning to be employed in a transmission method including satellite digital broadcasting such as DVB (Digital Video Broadcasting)-S.2 conducted in Europe (for example, see Non-Patent Document 1). Further, employing the LDPC code in next generation terrestrial digital broadcasting is under consideration.

Recent studies have revealed that the LDPC code shows performance close to the Shannon limit as a code length increases, similarly to a turbo code or the like. Further, since the LDPC code has a property that a minimum distance is in proportion to a code length, there are advantageous, as features thereof, in that a block error probability characteristic is good, and a so-called error floor phenomenon observed in a decoding characteristic of a turbo code or the like hardly occurs.

The LDPC code will be concretely described below. The LDPC code is a linear code, and need not necessarily be binary, but the LDPC will be here described to be binary.

The most distinctive feature of the LDPC code is that a parity check matrix defining an LDPC code is sparse. Here, the sparse matrix is a matrix in which the number of elements "1s" of a matrix is very small (a matrix in which most of elements are "0").

FIG. 1 illustrates an example of a parity check matrix H of an LDPC code.

In the parity check matrix H of FIG. 1, a weight (a column weight) (the number of "1s") of each column is "3," and a weight (row weight) of each row is "6."

In encoding (LDPC coding) by an LDPC code, a code word (an LDPC code) is generated, for example, by generating a generation matrix G based on the parity check matrix H and multiplying a binary information bit by the generation matrix G.

Specifically, an encoding device performing LDPC coding first calculates the generation matrix G in which a formula $GH^T=0$ is established with a transposed matrix $H^T$ of the parity check matrix H. Here, when the generation matrix G is a K×N matrix, the encoding device multiplies the generation matrix G by a bit string (a vector u) of information bits including K bits, and generates a code word c (=uG) including N bits. The code word (the LDPC code) generated by the encoding device is received at a reception side through a predetermined communication path.

The LDPC code can be decoded by a message passing algorithm that has been proposed as probabilistic decoding by Gallager and is based on belief propagation on the so-called tanner graph including a variable node (which is also called a message node) and a check node. Here, the variable node and the check node are hereinafter appropriately referred to simply as a node.

FIG. 2 illustrates an LDPC code decoding process.

Hereinafter, a real number value (reception LLR) in which a "0" likelihood of a value of an i-th code bit of an LDPC code (one code word) received at a reception side is represented by a log likelihood ratio is also appropriately referred to as a reception value $u_{0i}$. Further, a message output from a check node is represented by $u_j$, and a message output from a variable node is represented by $v_i$.

First of all, in decoding of an LDPC code, as illustrated in FIG. 2, in step S11, an LDPC code is received, a message (check node message) $u_j$ is initialized to "0," a variable k having an integer as a counter of a repeating process is initialized to "0," and the process proceeds to step S12. In step S12, as a calculation (variable node calculation) represented by Formula (1) is performed based on the reception value $u_{0i}$ obtained when the LDPC code is received, a message (variable node message) $v_i$ is obtained, and as a calculation (check node calculation) represented by Formula (2) is performed based on the message $v_i$, a message $u_j$ is obtained.

[Mathematical Formula 1]

$$v_i = u_{0i} + \sum_{i=1}^{d_v-1} u_j \tag{1}$$

[Mathematical Formula 2]

$$\tanh\left(\frac{u_j}{2}\right) = \prod_{i=1}^{d_c-1} \tanh\left(\frac{v_i}{2}\right) \tag{2}$$

Here, in Formulas (1) and (2), $d_v$ and $d_c$ are parameters, which are arbitrarily selectable, representing the number of "1s" of the parity check matrix H in the longitudinal direction (column) and the lateral direction (row), and for example, in case of a (3, 6) code, $d_v$ is 3, and $d_c$ is 6.

In the variable node calculation of Formula (1) and the check node calculation of Formula (2), since a message input from an edge (a line connecting a variable node with a check node) from which a message is desired to be output is not a calculation target, a calculation range is 1 to $d_v-1$ or 1 to $d_c-1$. Further, actually, the check node calculation of Formula (2) is perform by generating a table of a function R ($v_1$, $v_2$) represented by Formula (3) defined by one output to two inputs $v_1$ and $v_2$ in advance and using the table consecutively (recursively) as represented by Formula (4).

[Mathematical Formula 3]

$$x=2\tan h^{-1}[\tan h(v_1/2)\tan h(v_2/2)]=R(v_1,v_2) \tag{3}$$

[Mathematical Formula 4]

$$u_j=R(v_1,R(v_2,R(v_3, \ldots R(v_{d_o-2},v_{d_o-1})))) \tag{4}$$

In step S12, the variable k increases by "1," and the process proceeds to step S13. In step S13, it is determined whether or not the variable k is larger than a predetermined repeated decoding number C. When it is determined in step S13 that the variable k is not larger than C, the process returns to step S12, and the same process is repeated.

Further, when it is determined in step S13 that the variable k is larger than C, the process proceeds to step S14, and the message $v_i$ is obtained and output as a decoding result finally output as a calculation represented by Formula (5) is performed, and then the LDPC code decoding process ends.

[Mathematical Formula 5]

$$v_i = u_{0i} + \sum_{j=1}^{d_y} u_j \tag{5}$$

Here, the calculation of Formula (5) is performed using the message $u_j$ from all edges connected to the variable node, unlike the variable node calculation of Formula (1).

FIG. 3 illustrates an example of the parity check matrix H of a (3, 6) LDPC code (a coding rate is 1/2, and a code length is 12).

In the parity check matrix H of FIG. 3, a weight of a column is 3, and a weigh of a row is 6, similarly to FIG. 1.

FIG. 4 illustrates a tanner graph of the parity check matrix H of FIG. 3.

Here, in FIG. 4, a check node is represented by plus "+," a variable node is represented by equal "=." The check node and the variable node correspond to a row and a column of the parity check matrix H, respectively. A connection line between the check node and the variable node is an edge, and corresponds to an element "1" of the parity check matrix.

In other words, in FIG. 4, when an element of a j-th row and an i-th column of the parity check matrix is "1," an i-th variable node (a node of "=") from the top is connected with a j-th check node (a node of "+") from the top by an edge. The edge represents that a code bit corresponding to a variable node has a constraint condition on a check node.

In a sum product algorithm used as an LDPC code decoding method, the variable node calculation and the check node calculation are repeatedly performed.

FIG. 5 illustrates the variable node calculation performed at the variable node.

In the variable node, a message $v_i$ corresponding to an edge that is desired to be calculated is obtained by the variable node calculation of Formula (1) using messages $u_1$ and $u_2$ from the remaining edges connected to the variable node and the reception value $u_{0i}$. The messages corresponding to the other edges are similarly obtained.

FIG. 6 illustrates the check node calculation performed at the check node.

Here, the check node calculation of Formula (2) may be rewritten to Formula (6) using a relation of a formula $a\times b=\exp\{\ln(|a|)+\ln(|b|)\}\times\mathrm{sign}(a)\times\mathrm{sign}(b)$. Here, sign (x) is 1 when $x\geq0$ and $-1$ when $x<0$.

[Mathematical Formula 6]

$$\begin{aligned} u_j &= 2\tanh^{-1}\left(\prod_{i=1}^{d_c-1}\tanh\left(\frac{v_i}{2}\right)\right) \\ &= 2\tanh^{-1}\left[\exp\left\{\sum_{i=1}^{d_c-1}\ln\left(\left|\tanh\left(\frac{v_i}{2}\right)\right|\right)\right\}\times\prod_{i=l}^{d_c-1}\mathrm{sign}\left(\tanh\left(\frac{v_i}{2}\right)\right)\right] \\ &= 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\mathrm{sign}(v_i) \end{aligned} \tag{6}$$

In case of $x\geq0$, when a function $\phi(x)$ is defined as a formula $\phi(x)=\ln(\tan h(x/2))$, since a formula $\phi^{-1}(x)=2\tan h^{-1}(e^{-x})$ is established, Formula (6) may be changed to Formula (7).

[Mathematical Formula 7]

$$u_j = \phi^{-1}\left(\sum_{i=1}^{d_c-1}\phi(|v_i|)\right)\times\prod_{i=l}^{d_c-1}\mathrm{sign}(v_i) \tag{7}$$

In the check node, the check node calculation of Formula (2) is performed according to Formula (7).

In other words, in the check node, a message $u_j$ corresponding to an edge that is desired to be calculated is obtained by the check node calculation of Formula (7) using messages $v_1$, $v_2$, $v_3$, $v_4$, and $v_5$ from remaining edges connected to the check node as illustrated FIG. 6. The messages corresponding to the other edges are similarly obtained.

The function $\phi(x)$ of Formula (7) may be represented by a formula $\phi(x)=\ln((e^x+1)/(e^x-1))$, and is $\phi(x)=\phi^{-1}(x)$ when $x>0$. When the functions $\phi(x)$ and $\phi^{-1}(x)$ are implemented as hardware, an implementation method using an LUT (Look Up Table) may be used, but both become the same LUT.

CITATION LIST

Non-Patent Document

Non-Patent Document 1: DVB-S.2: ETSI EN 302 307 V1.1.2 (2006-06)

SUMMARY OF THE INVENTION

Problems to be Solved by the Invention

The LDPC code is being employed in DVB-S.2 which is a satellite digital broadcasting standard and DVB-T.2 which is a next generation terrestrial digital broadcasting. Further, the LDPC code is planned to be employed in DVB-C.2 which is a next generation CATV (Cable Television) digital broadcasting standard.

In digital broadcasting conforming to the DVB standard such as DVB-S.2, an LDPC code is converted (symbolized) into a symbol of quadrature modulation (digital modulation) such as QPSK (Quadrature Phase Shift Keying), and the symbol is mapped with a signal point and transmitted.

In symbolization of an LDPC code, exchanging of code bits of an LDPC code is performed in code bit units of two or more bits, and an exchanged code bit is regarded as a bit of a symbol.

As a method of exchanging code bits for symbolization of an LDPC code, various methods have been proposed, and for example, it is specified even in DVB-T.2.

Meanwhile, DVB-T.2 is a digital broadcasting standard for fixed terminals such as television receivers installed at home, and may not be appropriate to digital broadcasting for portable (mobile) terminals.

In other words, mobile terminals need be smaller in circuit size and lower in power consumption than fixed terminals. Thus, in digital broadcasting for mobile terminals, in order to reduce a load necessary for processing such as decoding of an LDPC code in a mobile terminal, for example, the number of times of decoding of an LDPC code (the repeated decoding number C) or a code length of an LDPC code may be more restricted than in digital broadcasting for fixed terminals.

However, even under the restriction, tolerance for an error needs be maintained to some extent.

The present technology is made in light of the foregoing and directed to improving tolerance for an error of data such as an LDPC code.

Solutions to Problems

A data processing device/method according to a first aspect of the present technology is a data processing device/method which includes a sorting unit/step of performing a sorting process for code bits of an LDPC (Low Density Parity Check) code which is encoded with a code length of 16200, wherein, when the code bits are stored in eight storage units, the sorting process changes a storage start position of the code bits for each storage unit, and in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5.

In the first aspect, a sorting step of performing a sorting process for code bits of an LDPC (Low Density Parity Check) code which is encoded with a code length of 16200 is performed. In the sorting process, when the code bits are stored in eight storage units, a storage start position of the code bits is changed for each storage unit, and the sorting process is performed such that a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5.

A data processing device/method according to a second aspect of the present technology is a data processing device/method which includes a reverse sorting unit/step of performing a reverse sorting process for bits included in two received symbols, wherein the two symbols are data obtained by performing a sorting process for code bits of an LDPC (Low Density Parity Check) code which is encoded with a code length of 16200, and when the code bits are stored in eight storage units, the sorting process changes a storage start position of the code bits for each storage unit, and in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, and the reverse sorting process returns the sorted code bits to original arrangement.

In the second aspect, a reverse sorting step of performing a reverse sorting process for bits included in two received symbols is performed. The two symbols are data obtained by performing a sorting process for code bits of an LDPC (Low Density Parity Check) which is encoded with a code length of 16200, and in the sorting process, when the code bits are stored in eight storage units, a storage start position of the code bits is changed for each storage unit, and the sorting process is performed such that a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5. In the reverse sorting process, the sorted code bits are returned to original arrangement.

A data processing device/method according to a third aspect of the present technology is a data processing device/method which includes a sorting unit/step of performing a sorting process for code bits of an LDPC (Low Density Parity Check) code which is encoded with a code length of 16200, wherein when the code bits are stored in eight storage units, the sorting process changes a storage start position of the code bits for each storage unit, and in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5.

In the third aspect, a sorting step of performing a sorting process for code bits of an LDPC (Low Density Parity Check) code which is encoded with a code length of 16200 is performed. In the sorting process, when the code bits are stored in eight storage units, a storage start position of the code bits is changed for each storage unit, and the sorting process is performed such that a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5.

A data processing device/method according to a fourth aspect of the present technology is a data processing device/method which includes a reverse sorting unit/step of performing a reverse sorting process for bits included in one received symbol, wherein the one symbol is data obtained by performing a sorting process for code bits of an LDPC (Low Density Parity Check) code which is encoded with a code length of 16200, and when the code bits are stored in eight storage units, the rearrangement process changes a storage start position of the code bits for each storage unit, and in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, and the reverse sorting process returns the sorted code bits to original arrangement.

In the fourth aspect, a reverse sorting step of performing a reverse sorting process for bits included in one received symbol is performed. The one symbol is data obtained by performing a sorting process for code bits of an LDPC (Low Density Parity Check) code which is encoded with a code length of 16200, and in the sorting process, when the code bits are stored in eight storage units, a storage start position of the code bits is changed for each storage unit, and the sorting process is performed such that a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5. In the reverse sorting process, the sorted code bits are returned to original arrangement.

A data processing device/method according to a fifth aspect of the present technology is a data processing device/method which includes a sorting unit/step of performing a sorting process for code bits of an LDPC (Low Density Parity Check) code which is encoded with a code length of 16200, wherein when the code bits are stored in 12 storage units, the sorting process changes a storage start position of the code bits for each storage unit, and in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9.

In the fifth aspect, a sorting step of performing a sorting process for code bits of an LDPC (Low Density Parity Check) code which is encoded with a code length of 16200 is performed. In the sorting process, when the code bits are stored in 12 storage units, a storage start position of the code bits is changed for each storage unit, and the sorting process is performed such that a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9.

A data processing device/method according to a sixth aspect of the present technology is a data processing device/method which includes a reverse sorting unit/step of performing a reverse sorting process for bits included in two received symbols, wherein the two symbols are data obtained by performing a sorting process for code bits of an LDPC (Low Density Parity Check) code which is encoded with a code length of 16200, and when the code bits are stored in 12 storage units, the sorting process changes a storage start position of the code bits for each storage unit, and in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9, and the reverse sorting process returns the sorted code bits to original arrangement.

In the sixth aspect, a reverse sorting step of performing a reverse sorting process for bits included in two received symbols is performed. The two symbols are data obtained by performing a sorting process for code bits of an LDPC (Low Density Parity Check) code which is encoded with a code length of 16200, and in the sorting process, when the code bits are stored in 12 storage units, a storage start position of the code bits is changed for each storage unit, and the sorting process is performed such that a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9. In the reverse sorting process, the rearranged code bits are returned to original arrangement.

Further, the data processing device may be an independent device or may be an internal block configuring a single device.

Effects of the Invention

According to the present technology, tolerance for an error can be improved.

BRIEF DESCRIPTION OF DRAWINGS

FIG. 3 is a diagram illustrating an example of a parity check matrix of an LDPC code.

FIG. 13 is a diagram for describing a parity check matrix of an LDPC code specified in a DVB-S.2 standard.

FIG. 21 is a diagram illustrating a parity matrix $H_T$ having a staircase structure and a tanner graph corresponding to the parity matrix $H_T$.

FIG. 25 is a diagram illustrating a column number of a memory 31 necessary for column twist interleaving and an address of a write start position.

FIG. 26 is a diagram illustrating a column number of the memory 31 necessary for column twist interleaving and an address of a write start position.

FIG. 28 is a diagram illustrating a model of a communication path employed in a simulation.

FIG. 34 is a diagram for describing a method of obtaining a parity check matrix H from a parity check matrix initial value table.

FIG. 35 is a diagram illustrating an example of a parity check matrix initial value table in which a coding rate is 1/5 and a code length is 16200.

FIG. 36 is a diagram illustrating an example of a parity check matrix initial value table in which a coding rate is 4/15 and a code length is 16200.

FIG. 37 is a diagram illustrating an example of a parity check matrix initial value table in which a coding rate is 1/3 and a code length is 16200.

FIG. 38 is a diagram illustrating an example of a parity check matrix initial value table in which a coding rate is 2/5 and a code length is 16200.

FIG. 39 is a diagram illustrating an example of a parity check matrix initial value table in which a coding rate is 4/9 and a code length is 16200.

FIG. 40 is a diagram illustrating an example of a parity check matrix initial value table in which a coding rate is 7/15 and a code length is 16200.

FIG. 41 is a diagram illustrating an example of a parity check matrix initial value table in which a coding rate is 8/15 and a code length is 16200.

FIG. 42 is a diagram illustrating an example of a parity check matrix initial value table in which a coding rate is 3/5 and a code length is 16200.

FIG. 43 is a diagram illustrating an example of a parity check matrix initial value table in which a coding rate is 2/3 and a code length is 16200.

FIG. 48 is a diagram for describing a parity check matrix of an LDPC code having a code length of 16200.

FIG. 106 is a diagram illustrating a column number of the memory 31 necessary for column twist interleaving and an address of a write start position.

FIG. 116 is a diagram illustrating an example of a parity check matrix initial value table having a coding rate of 1/4 and a code length of 16200 specified in DVB-T.2.

FIG. 117 is a diagram illustrating an example of a parity check matrix initial value table having a coding rate of 1/3 and a code length of 16200 specified in DVB-S.2.

FIG. 118 is a diagram illustrating an example of a parity check matrix initial value table having a coding rate of 2/5 and a code length of 16200 specified in DVB-S.2.

FIG. 119 is a diagram illustrating an example of a parity check matrix initial value table having a coding rate of 1/2 and a code length of 16200 specified in DVB-T.2.

FIG. 120 is a diagram illustrating an example of a parity check matrix initial value table having a coding rate of 3/5 and a code length of 16200 specified in DVB-T.2.

FIG. 121 is a diagram illustrating an example of a parity check matrix initial value table having a coding rate of 2/3 and a code length of 16200 specified in DVB-T.2.

FIG. 122 is a diagram illustrating an example of a parity check matrix initial value table having a coding rate of 3/4 and a code length of 16200 specified in DVB-T.2.

FIG. 123 is a diagram for describing column twist interleaving performed in units of L code words.

FIG. 124 is a block diagram illustrating a configuration example of a receiving device 12.

FIG. 125 is a block diagram illustrating a configuration example of a bit deinterleaver 165.

Figure 126:
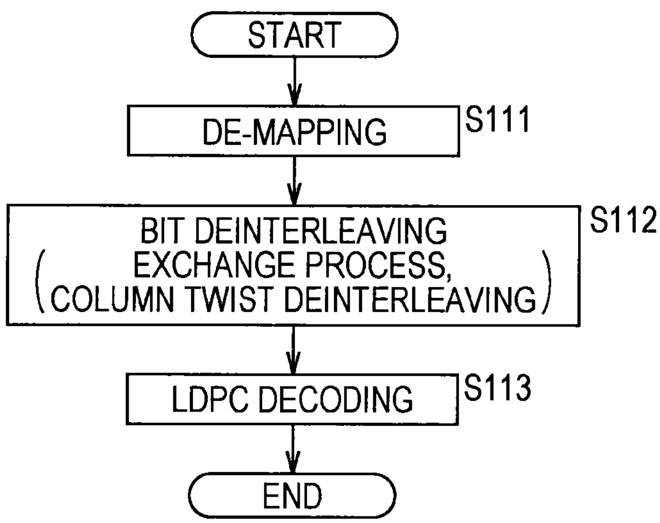

FIG. 126 is a flowchart for describing processing performed by a QAM decoder 164, the bit deinterleaver 165, and an LDPC decoder 166.

Figure 127:
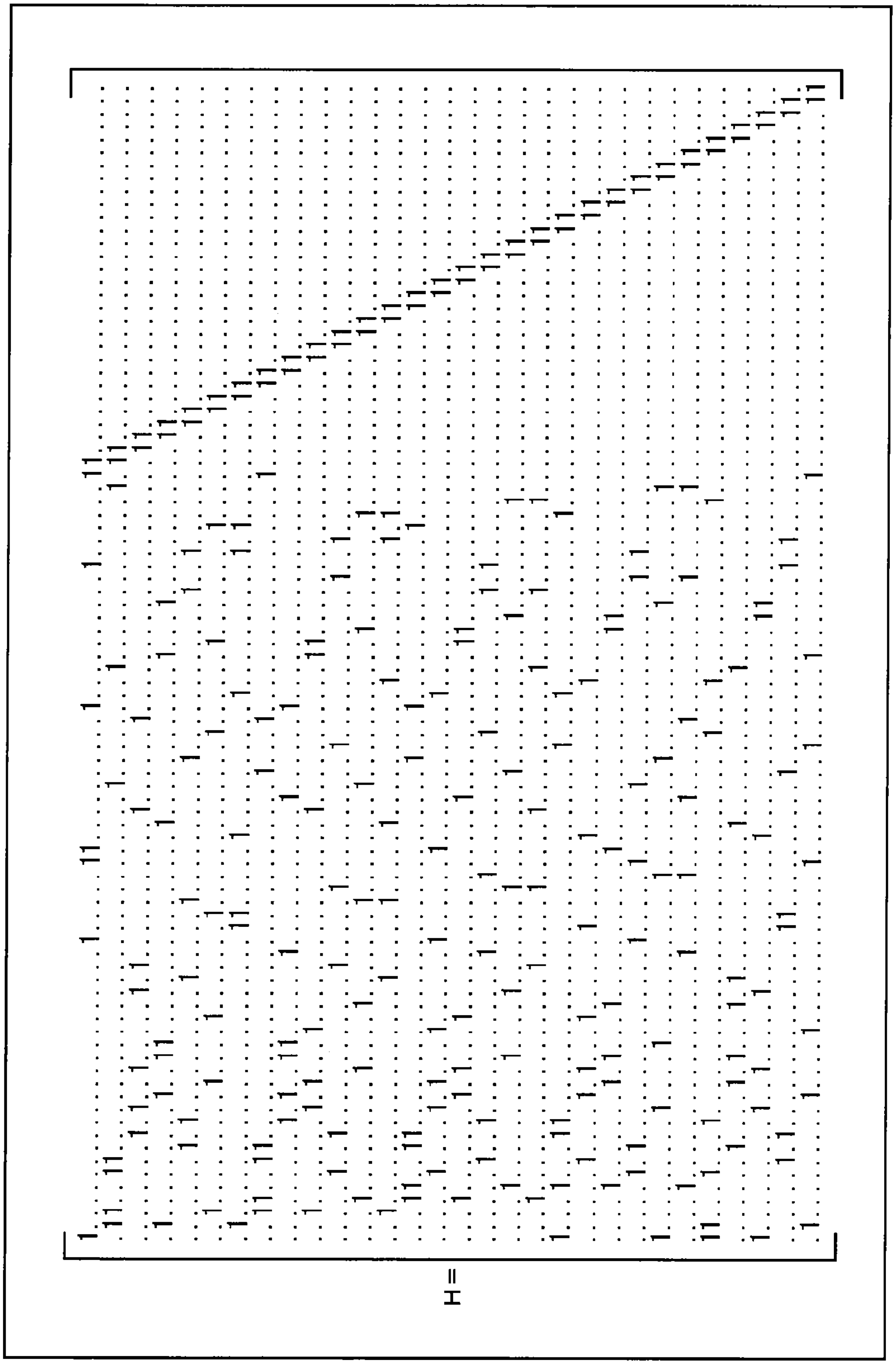

FIG. 127 is a diagram illustrating an example of a parity check matrix of an LDPC code.

Figure 128:
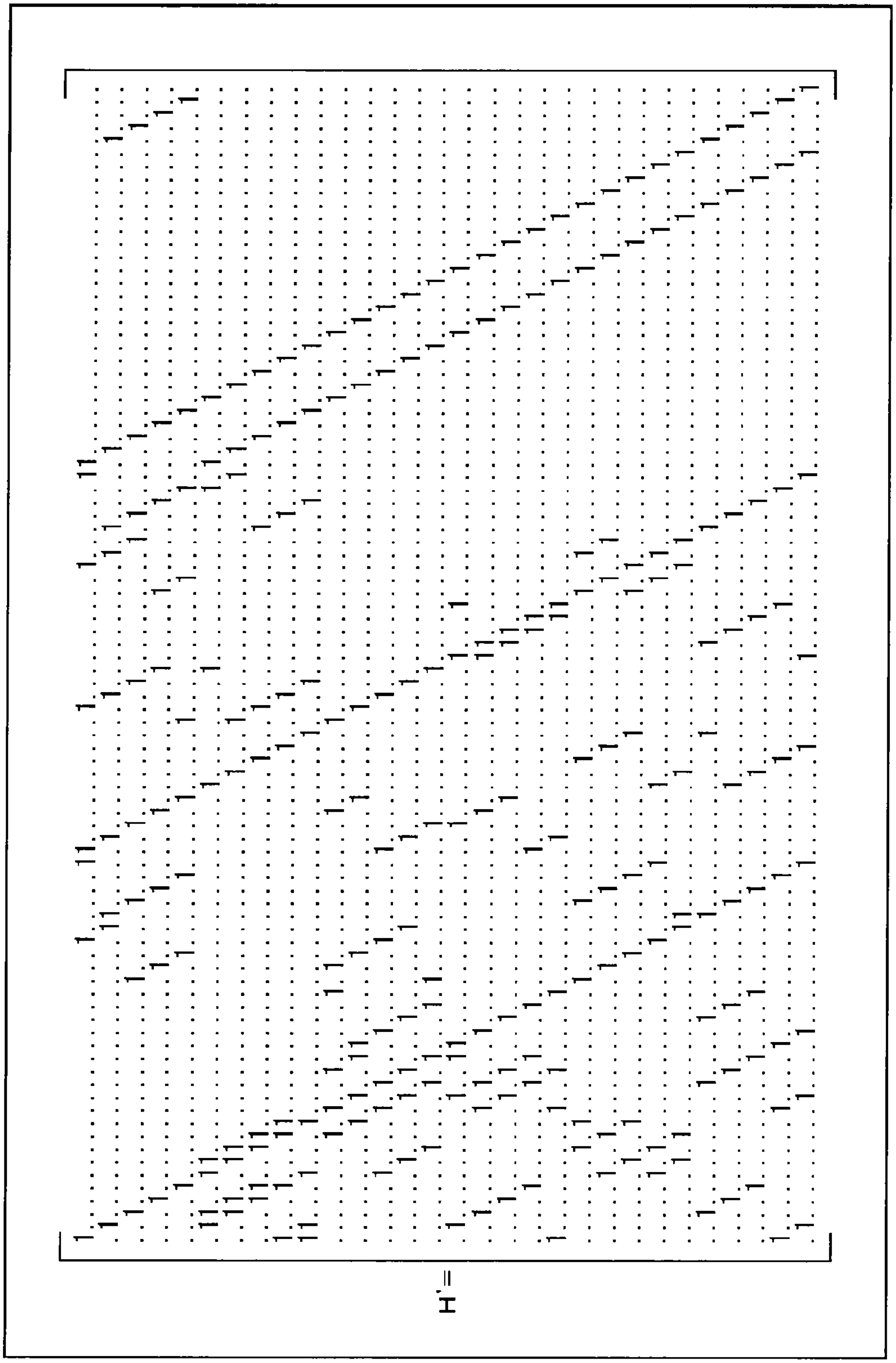

FIG. 128 is a diagram illustrating a matrix (conversion parity check matrix) obtained by executing row replacement and column replacement on a parity check matrix.

Figure 129:
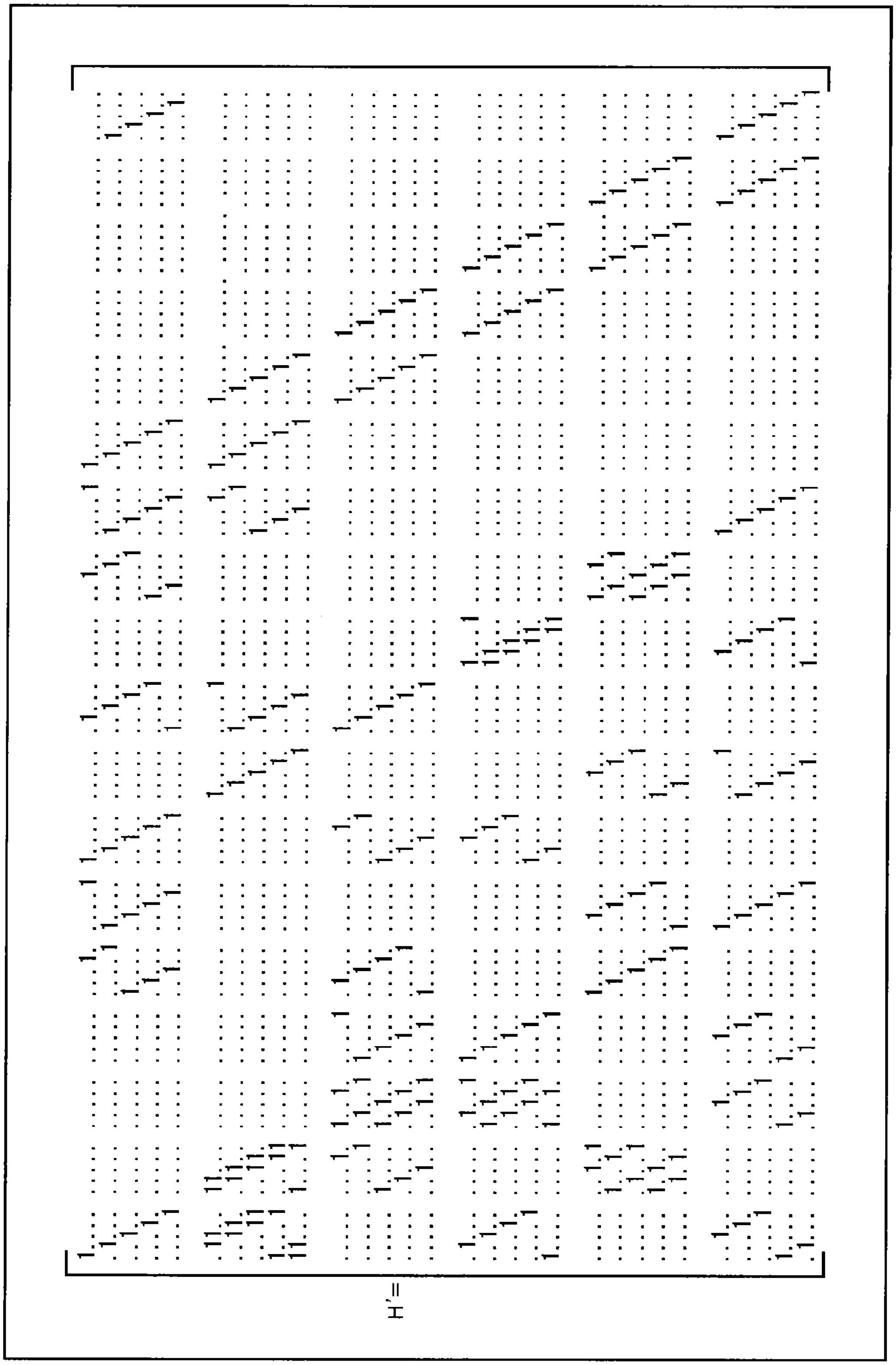

FIG. 129 is a diagram illustrating a conversion parity check matrix divided into 5×5 units.

Figure 130:
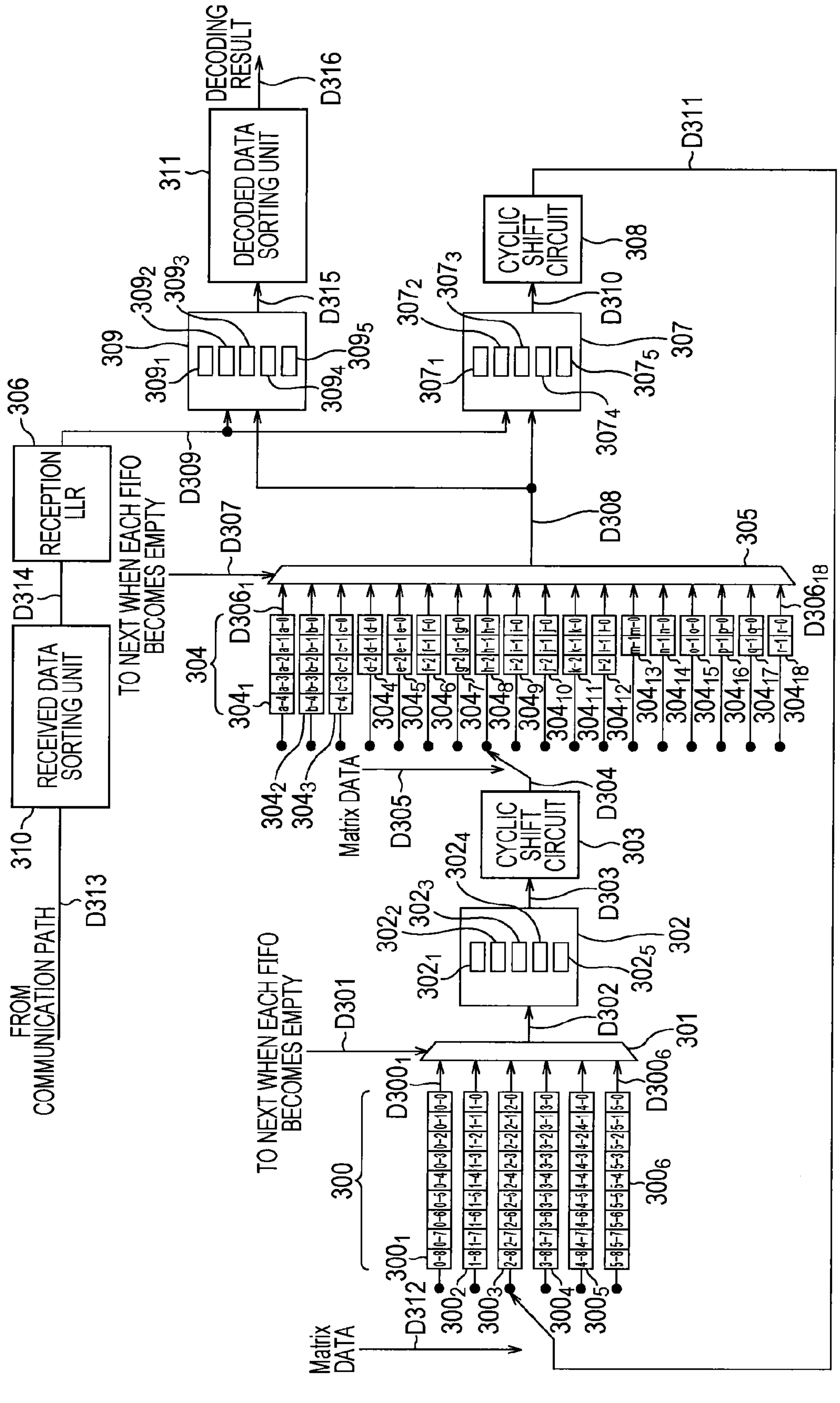

FIG. 130 is a block diagram illustrating a configuration example of a decoding device performing P node calculations together.

Figure 131:
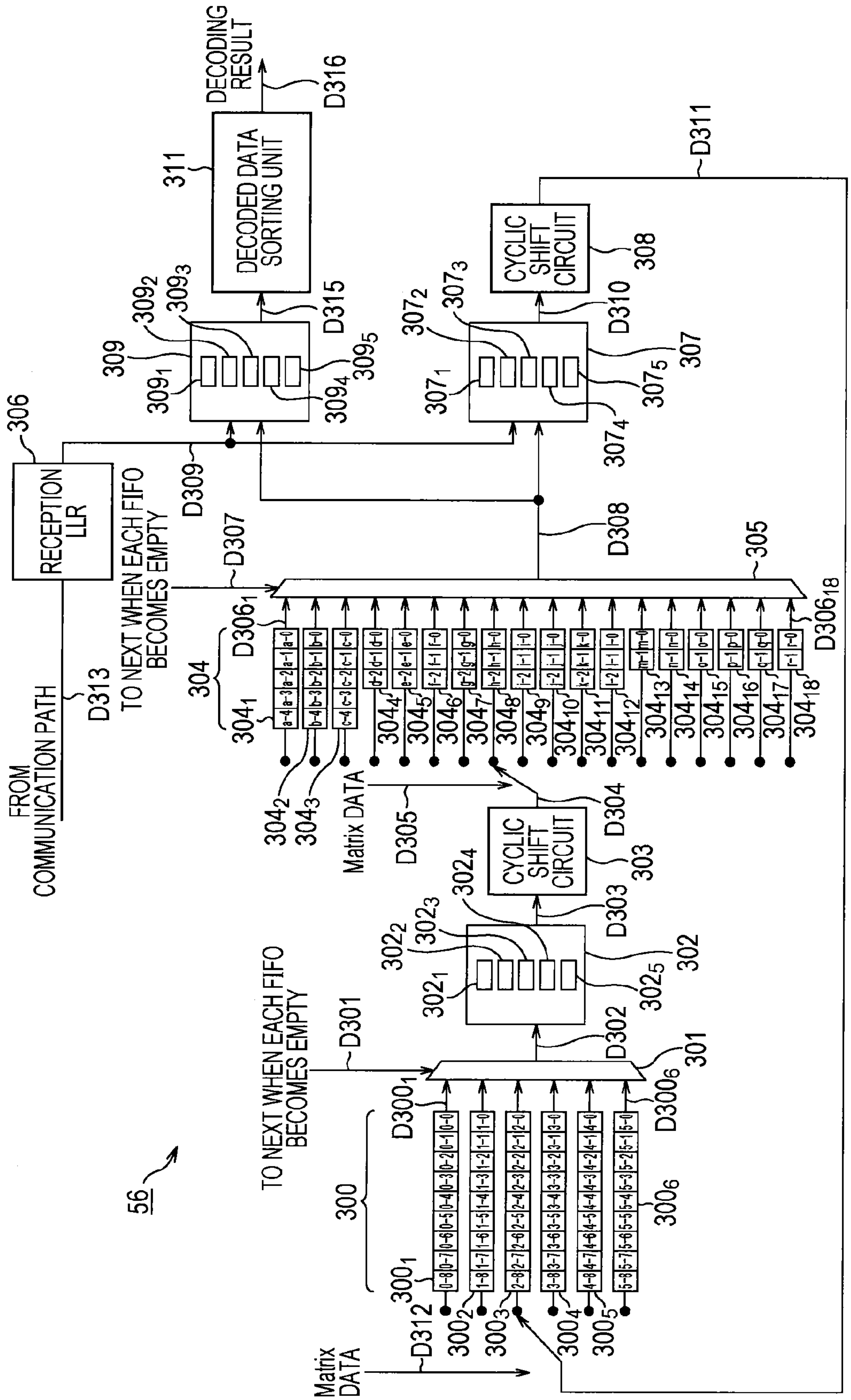

FIG. 131 is a block diagram illustrating a configuration example of the LDPC decoder 166.

Figure 132:
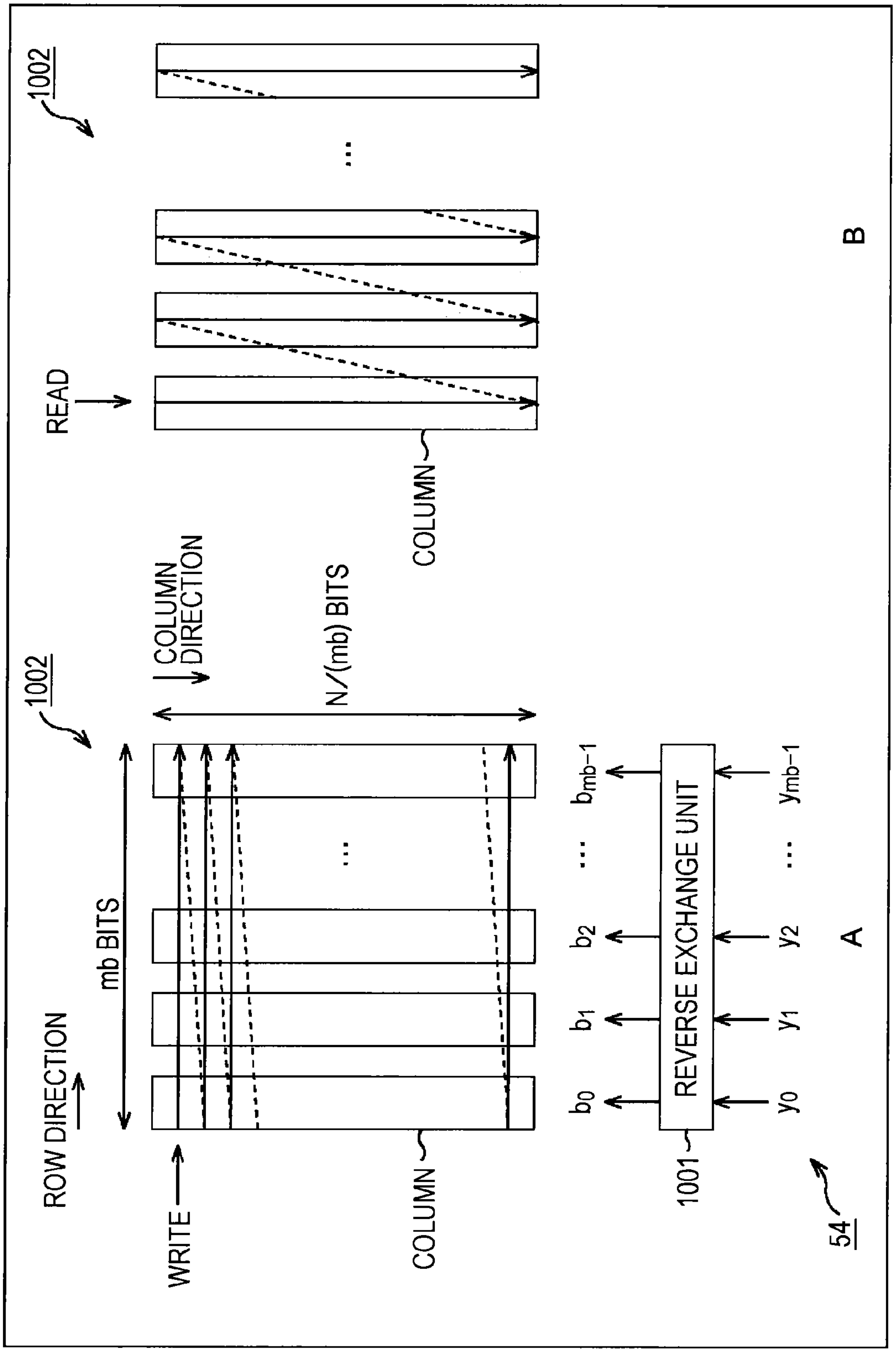

FIG. 132 is a diagram for describing processing of a multiplexer 54 configuring the bit deinterleaver 165.

Figure 133:
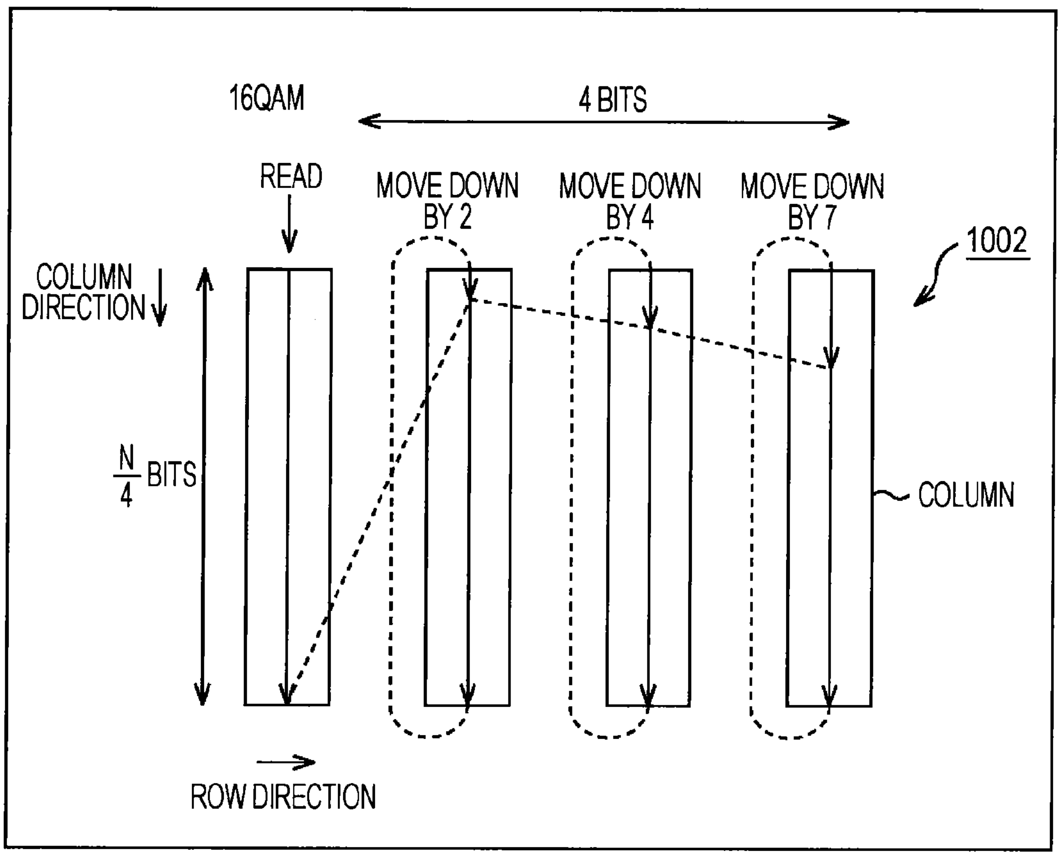

FIG. 133 is a diagram for describing processing of a column twist deinterleaver 55.

Figure 134:
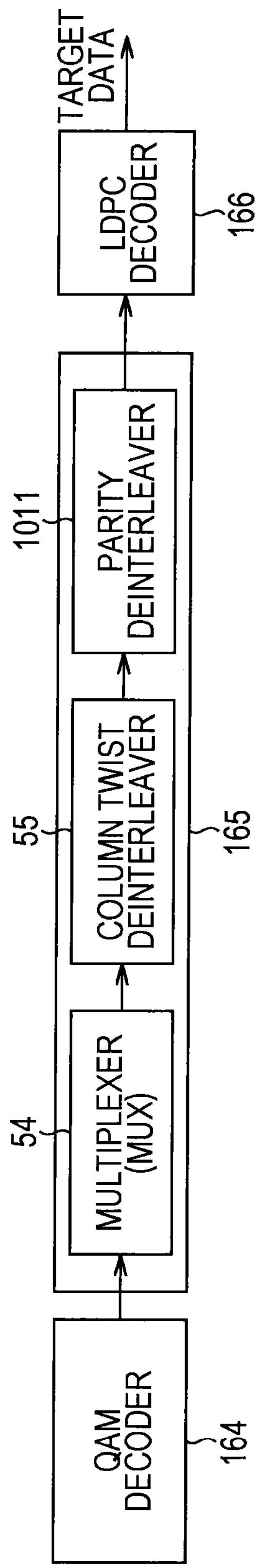

FIG. 134 is a block diagram illustrating another configuration example of the bit deinterleaver 165.

Figure 135:
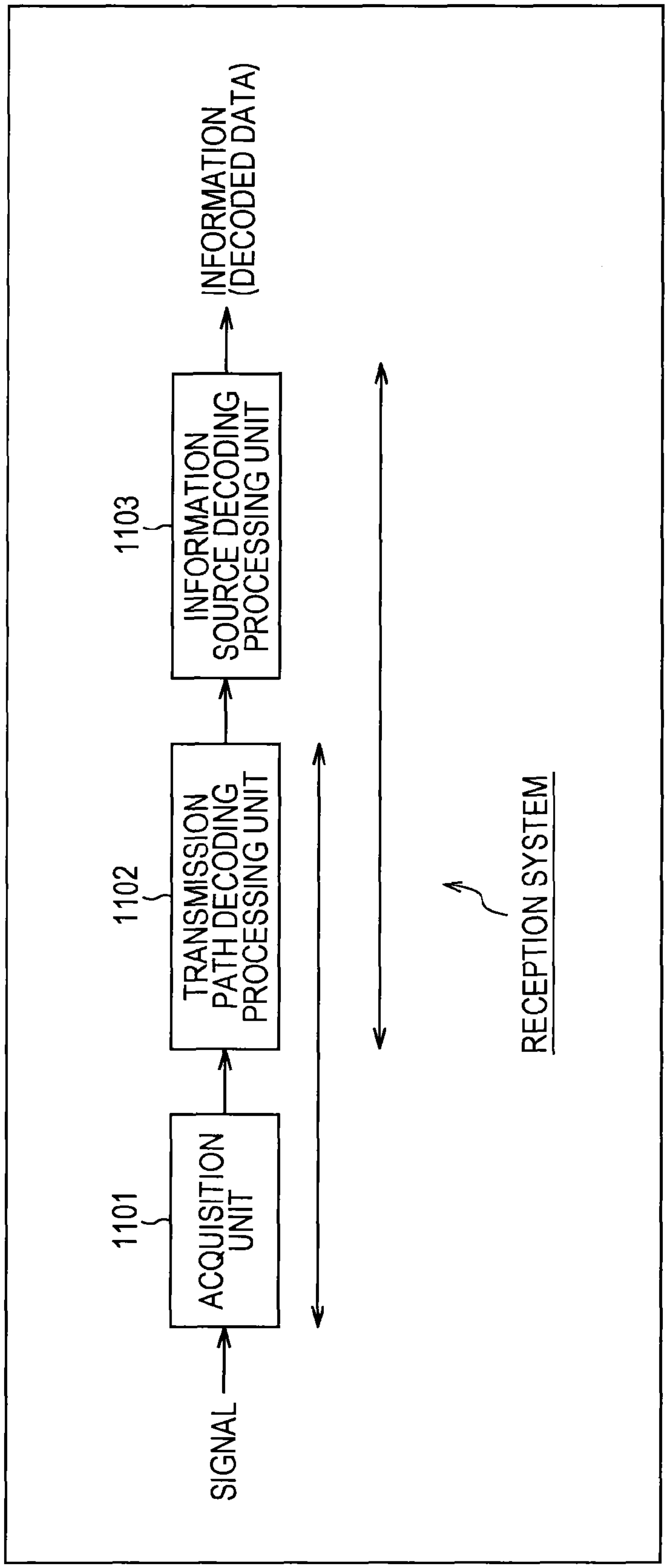

FIG. 135 is a block diagram illustrating a first configuration example of a reception system to which the receiving device 12 can be applied.

Figure 136:
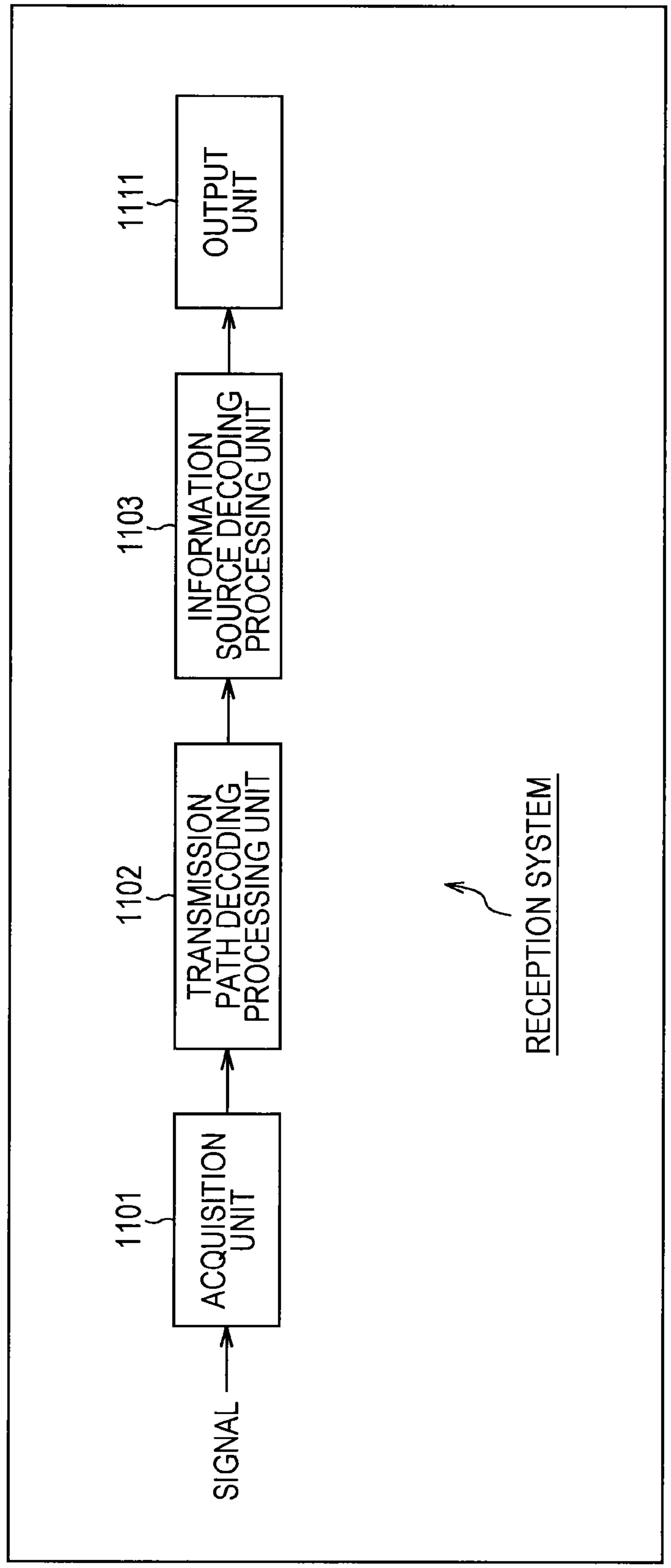

FIG. 136 is a block diagram illustrating a second configuration example of a reception system to which the receiving device 12 can be applied.

Figure 137:
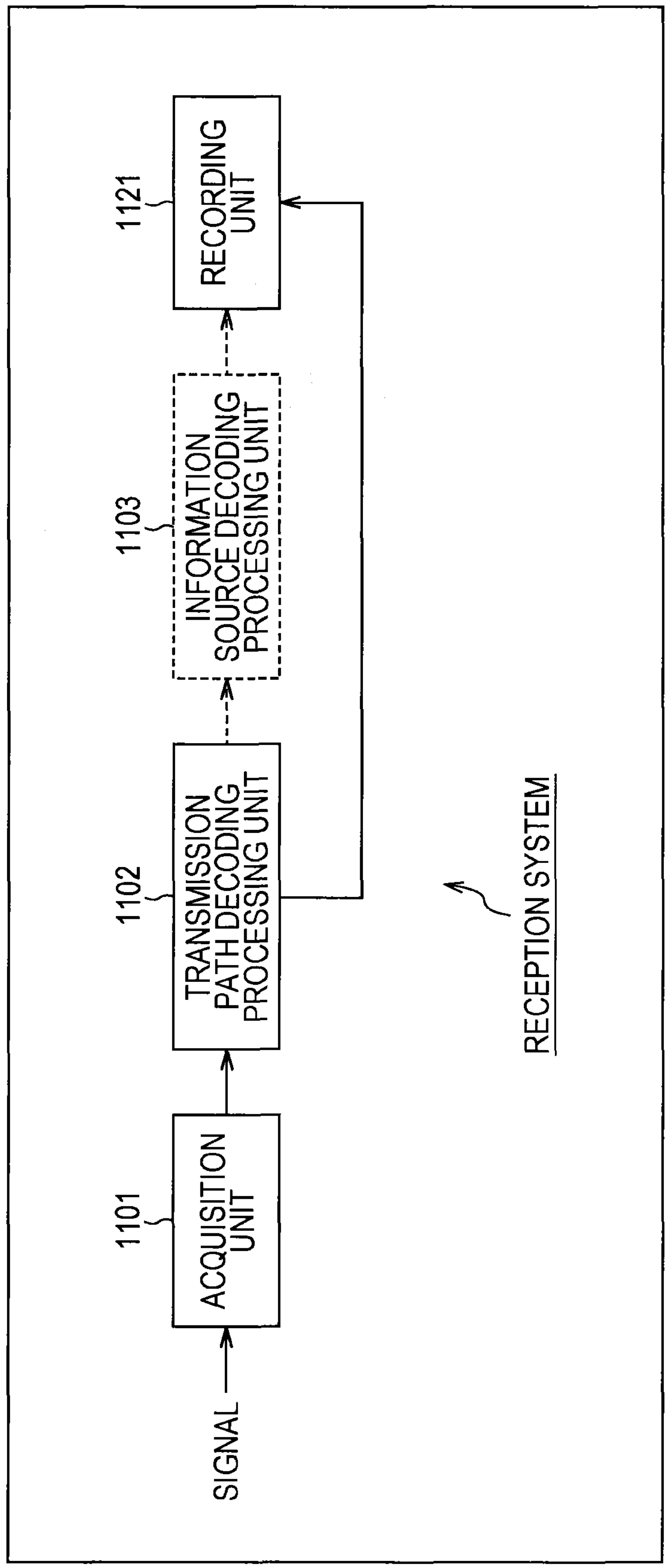

FIG. 137 is a block diagram illustrating a third configuration example of a reception system to which the receiving device 12 can be applied.

Figure 138:
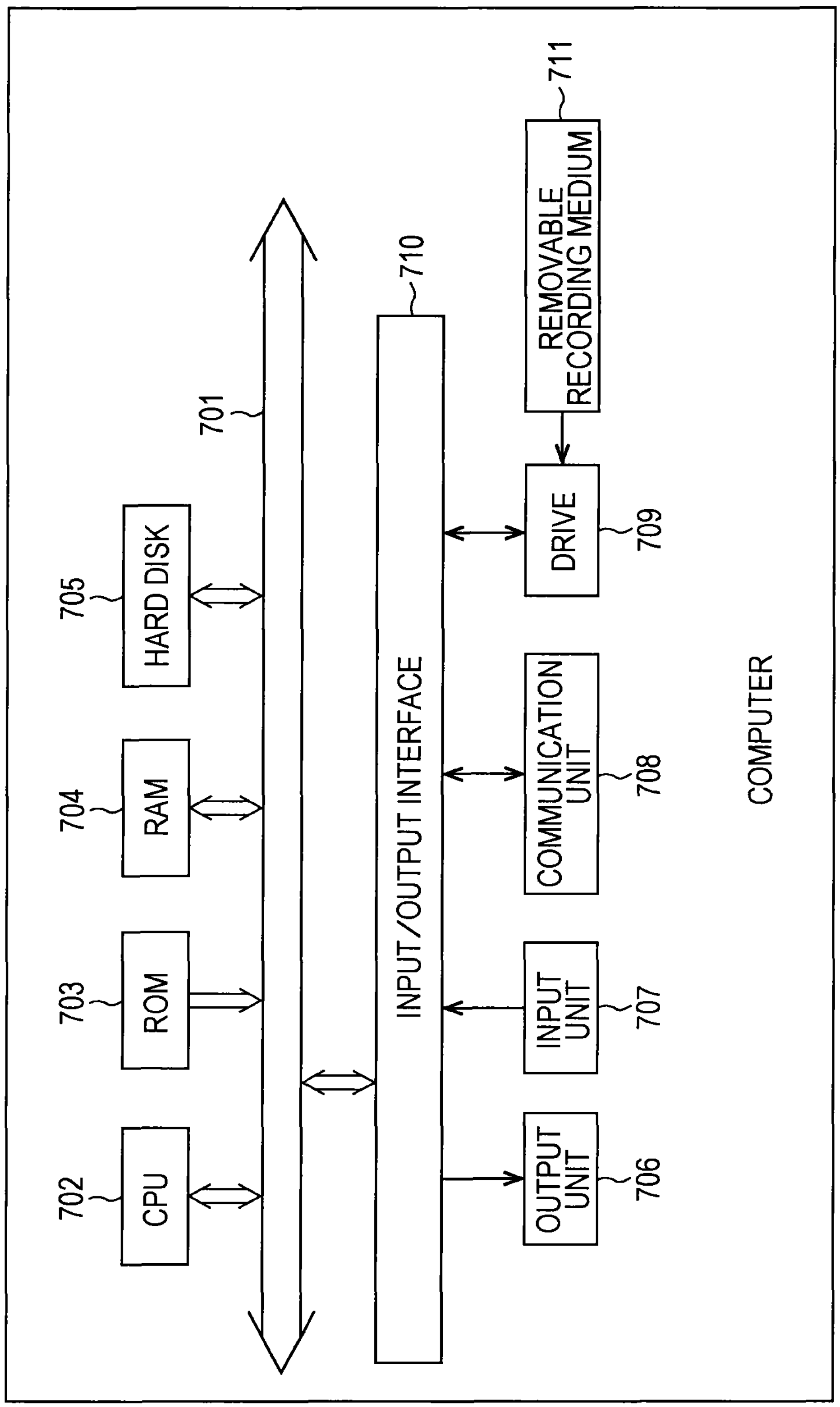

FIG. 138 is a block diagram illustrating a configuration example of a computer according to an embodiment of the present technology.

MODE FOR CARRYING OUT THE INVENTION

[Configuration Example of Transmission System According to Present Technology]

Figure 7:
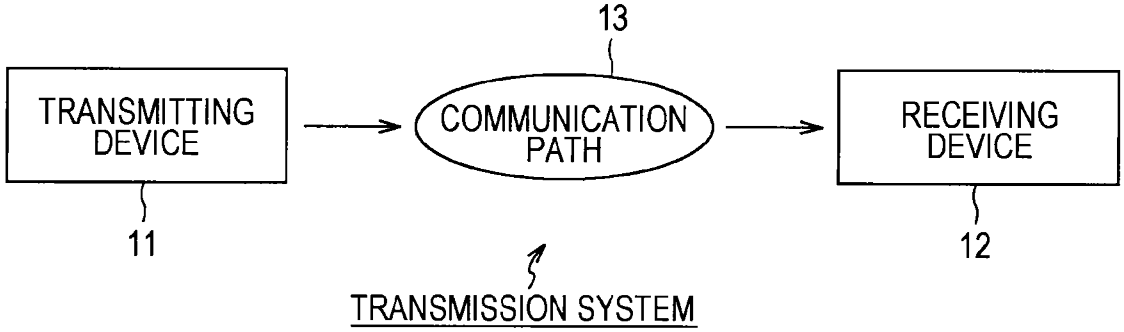
FIG. 7 is a diagram illustrating an example of a configuration of a transmission system according to an embodiment of the present technology.

FIG. 7 illustrates a configuration example of an embodiment of a transmission system (a system refers to one in which a plurality of devices are logically assembled, and it does not matter whether or not devices of respective configurations are present in a single housing) according to the present technology.

Referring to FIG. 7, the transmission system includes a transmitting device 11 and a receiving device 12.

The transmitting device 11 transmits (broadcasts) (sends) a program for a fixed terminal or a mobile terminal. In other words, for example, the transmitting device 11 encodes target data, which is a transmission target, such as image data or audio data serving as a program for a fixed terminal or a mobile terminal into an LDPC code, and transmits the LDPC code, for example, through a communication path 13 which is a ground wave.

For example, the receiving device 12 is a mobile terminal, and receives the LDPC code transmitted from the transmitting device 11 through the communication path 13, decodes the LDPC code into target data, and outputs the decoded target data.

Here, the LDPC code used in the transmission system of FIG. 7 is known to show extremely high capability in an AWGN (Additive White Gaussian Noise) communication path.

However, the communication path 13 such as a ground wave is likely to be subjected to a burst error or an erasure. For example, in an OFDM (Orthogonal Frequency Division Multiplexing) system, in a multi-path environment in which a D/U (Desired to Undesired Ratio) is 0 dB (power of Undesired=echo is equal to power of Desired=main path), power of a specific symbol may become zero (0) (erasure) according to a delay of an echo (a path other than a main path).

Further, even in a flutter (a communication path to which an echo having a Doppler frequency is added with a delay of 0), when the D/U is 0 dB, power of all OFDM symbols of a certain time may become zero (0) (erasure) due to the Doppler frequency.

In addition, a burst error may occur due to a status of an interconnection from a receiving unit (not illustrated) at the receiving device 12 side such as an antenna receiving a signal from the transmitting device 11 to the receiving device 12 or instability of power of the receiving device 12.

Figure 1:
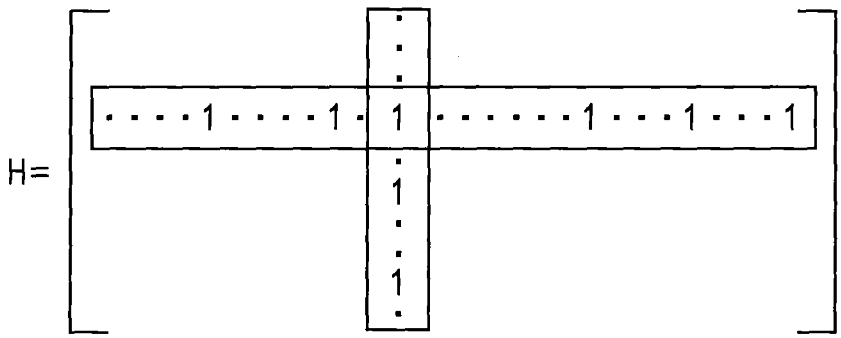
FIG. 1 is a diagram for describing a parity check matrix H of an LDPC code.
Figure 2:
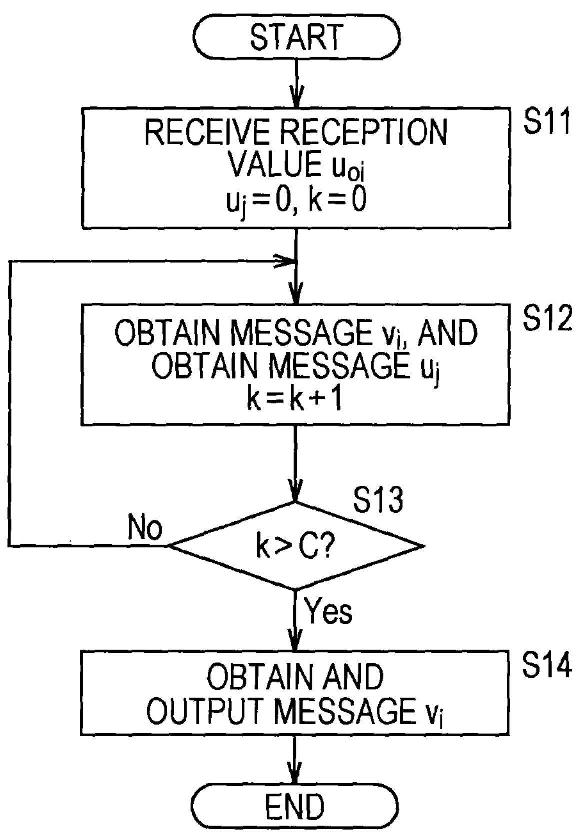
FIG. 2 is a flowchart for describing an LDPC code decoding process.
Figure 4:
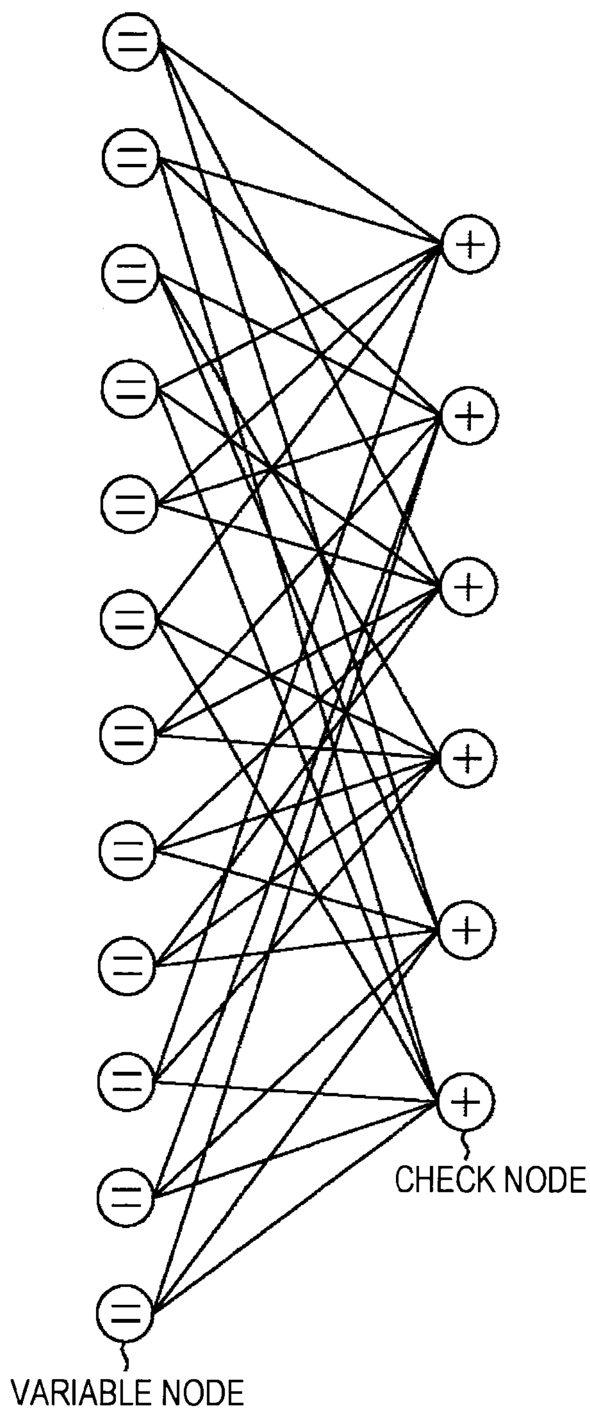
FIG. 4 is a diagram illustrating a tanner graph of a parity check matrix.
Figure 5:
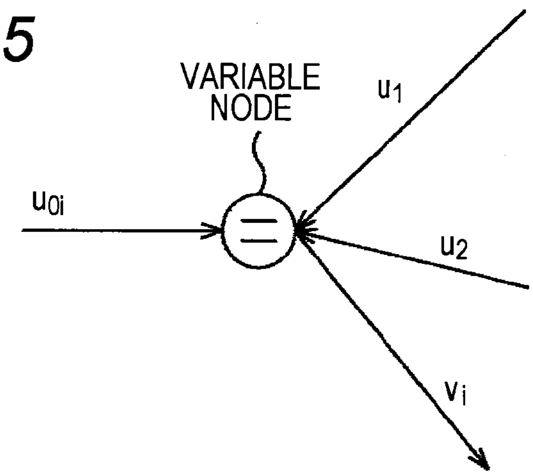
FIG. 5 is a diagram illustrating a variable node.
Figure 6:
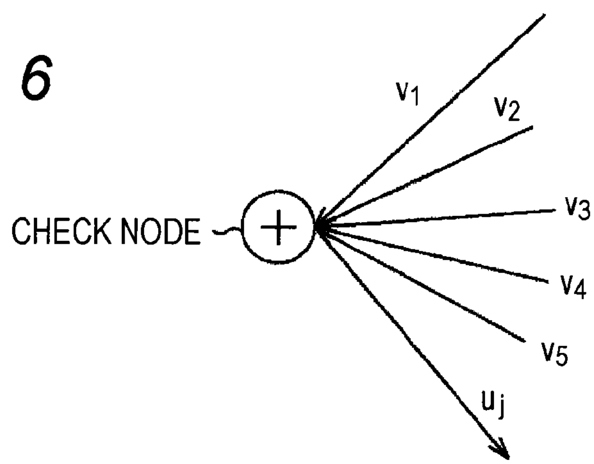
FIG. 6 is a diagram illustrating a check node.

Meanwhile, in decoding of an LDPC code, in a column of a parity check matrix H, that is, in a variable node corresponding to a code bit of an LDPC code, the variable node calculation of Formula (1) is performed with the addition of the code bit (the reception value $u_{0i}$) of the LDPC code as illustrated in FIG. 5, and thus when an error occurs in the code bit used for the variable node calculation, the accuracy of an obtained message decreases.

Further, in LDPC code decoding, in a check node, the check node calculation of Formula (7) is performed using a message obtained by a variable node connected to the check node, and thus when many check nodes are connected to (code bits of an LDPC code corresponding to) a plurality of variable nodes that have an error (includes an erasure) at the same time, decoding performance deteriorates.

In other words, for example, when two or more variable nodes connected to a check node have erasure at the same time, the check node returns a message in which a probability that a valve is 0 is equal to a probability that a value is 1 to all variable nodes. In this case, the check node returning a message of an equal probability does not contribute to a single decoding process (a set of variable node calculation and check node calculation), and as a result, it is necessary to increase a repeat count of the decoding process, and thus decoding performance deteriorates, and power consumption of the receiving device 12 performing LDPC code decoding increases.

In this regard, the transmission system of FIG. 7 is configured to improve tolerance for a burst error or erasure while maintaining performance in the AWGN communication path.

[Configuration Example of Transmitting Device 11]

Figure 8:
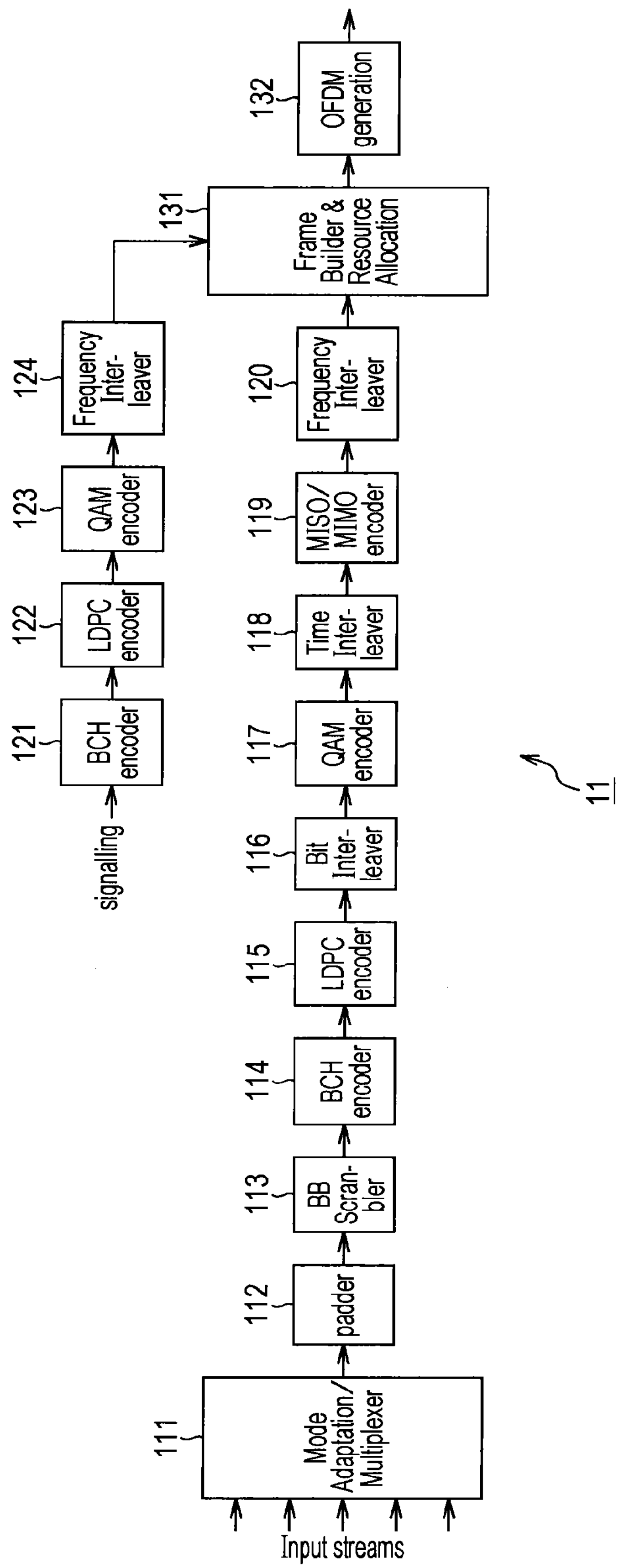
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams serving as target data are supplied to a mode adaptation/multiplexer 111.

The mode adaptation/multiplexer 111 performs mode selection and multiplexing of one or more input stream supplied thereto, and supplies the resultant data to a padder 112.

The padder 112 performs necessary zero padding (null insertion) on the data from the mode adaptation/multiplexer 111, and supplies the resultant data to a BB scrambler 113.

The BB scrambler 113 executes an energy diffusion process on the data from the padder 112, and supplies the resultant data to a BCH encoder 114.

The BCH encoder 114 performs BCH coding on the data from the BB scrambler 113, and supplies the resultant data to an LDPC encoder 115 as LDPC target data that is an LDPC coding target.

The LDPC encoder 115 performs LDPC coding according to a parity check matrix in which a parity matrix corresponding to a parity bit of an LDPC code has a staircase structure on the LDPC target data from the BCH encoder 114, and outputs an LDPC code having the LDPC target data as an information bit.

In other words, the LDPC encoder 115 performs LDPC coding of encoding the LDPC target data to an LDPC code such as an LDPC code specified in, for example, the DVB-T.2 standard, and outputs the resultant LDPC code.

Here, in the DVB-T.2 standard, an LDPC code specified in the DVB-S.2 standard is employed except when a code length is 16200 bits and a coding rate is 3/5. An LDPC code specified in the DVB-T.2 standard is an IRA (Irregular Repeat Accumulate) code, and a parity matrix in a parity check matrix of the LDPC code has a staircase structure. The parity matrix and the staircase structure will be described later. Further, an IRA code is described in, for example, "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs bit interleaving which will be described later on the LDPC code from the LDPC encoder 115, and supplies a bit-interleaved LDPC code to a QAM encoder 117.

The QAM encoder 117 maps the LDPC code from the bit interleaver 116 to a signal point representing a symbol of quadrature modulation in units of one or more code bits (symbols) of the LDPC code, and performs quadrature modulation (multi-level modulation).

In other words, the QAM encoder 117 maps the LDPC code from the bit interleaver 116 to a signal point, which is decided by a modulation method performing quadrature modulation of the LDPC code, on an IQ plane (IQ constellation) specified by an I axis representing an I component of an in-phase on a carrier wave and a Q axis representing a Q component orthogonal to a carrier wave, and performs quadrature modulation.

Here, examples of a modulation method of the quadrature modulation performed by the QAM encoder 117 includes a modulation method including a modulation method specified in the DVB-T standard, that is, QPSK (Quadrature Phase Shift Keying), 16 QAM (Quadrature Amplitude Modulation), 64 QAM, 256 QAM, 1024 QAM, and 4096 QAM. A modulation method by which the QAM encoder 117 performs quadrature modulation is set in advance, for example, according to an operation of an operator of the transmitting device 11. Further, in the QAM encoder 117, any other quadrature modulation such as 4 PAM (Pulse Amplitude Modulation) may be performed.

The data (the symbol mapped to the signal point) obtained by the processing of the QAM encoder 117 is supplied to a time interleaver 118.

The time interleaver 118 performs time interleaving (interleaving in a time direction) on the data (symbol) from the QAM encoder 117 in units of symbols, and supplies the resultant data to a MISO/MIMO encoder 119.

The MISO/MIMO encoder 119 executes space-time encoding on the data (symbol) from the time interleaver 118, and supplies the resultant data to a frequency interleaver 120.

The frequency interleaver 120 performs frequency interleaving (interleaving in a frequency direction) on the data (symbols) from the MISO/MIMO encoder 119 in units of symbols, and supplies the resultant data to a frame builder/resource allocation unit 131.

Meanwhile, a BCH encoder 121 is supplied with control data (signaling) for transmission control of a preamble called L1 or the like.

The BCH encoder 121 performs BCH coding on the supplied control data, similarly to the BCH encoder 114, and supplies the resultant data to an LDPC encoder 122.

The LDPC encoder 122 performs LDPC coding on the data from the BCH encoder 121 as LDPC target data, similarly to the LDPC encoder 115, and supplies the resultant LDPC code to a QAM encoder 123.

The QAM encoder 123 maps the LDPC code from the LDPC encoder 122 to a signal point representing a symbol of quadrature modulation in units of one or more code bits (symbols) of the LDPC code, similarly to the QAM encoder 117, performs quadrature modulation, and supplies the resultant data (symbol) to a frequency interleaver 124.

The frequency interleaver 124 performs frequency interleaving on the data (symbol) from the QAM encoder 123 in units of symbols, similarly to the frequency interleaver 120, and supplies the resultant data to the frame builder/resource allocation unit 131.

The frame builder/resource allocation unit 131 inserts a pilot symbol to a necessary position of the data (symbol) from the frequency interleavers 120 and 124, generates a frame configured with a predetermined number of symbols from the resultant data (symbol), and supplies the frame to an OFDM generation unit 132.

The OFDM generation unit 132 generates an OFDM signal corresponding to the frame from the frame from the frame builder/resource allocation unit 131, and transmits the OFDM signal via the communication path 13 (FIG. 7).

Figure 9:
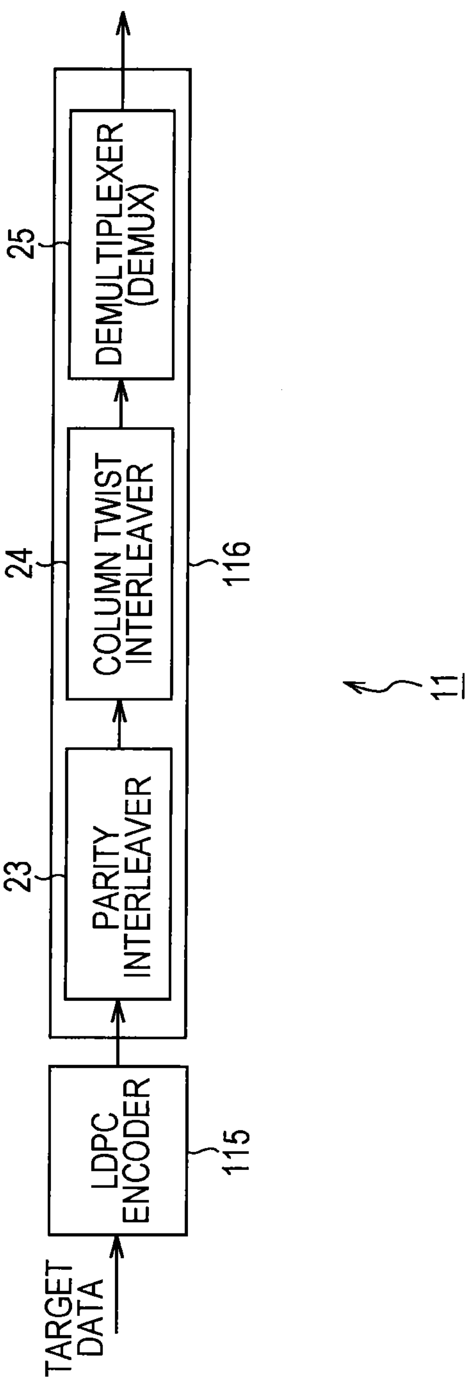
FIG. 9 is a block diagram illustrating a configuration example of a bit interleaver 116.

FIG. 9 illustrates a configuration example of the bit interleaver 116 of FIG. 8.

The bit interleaver 116 is a data processing device that interleaves data, and includes a parity interleaver 23, a column twist interleaver 24, and a demultiplexer (DEMUX) 25.

The parity interleaver 23 performs parity interleaving of interleaving a parity bit of the LDPC code from the LDPC encoder 115 to the position of another parity bit, and supplies the parity-interleaved LDPC code to the column twist interleaver 24.

The column twist interleaver 24 performs column twist interleaving on the LDPC code from the parity interleaver 23, and supplies the column-twist-interleaved LDPC code to the demultiplexer 25.

In other words, the LDPC code is transmitted after one or more code bits of the LDPC code are mapped to a signal point representing a symbol of quadrature modulation in the QAM encoder 117 of FIG. 8.

The column twist interleaver 24 performs, for example, column twist interleaving which will be described later as a sorting process of sorting code bits of the LDPC code from the parity interleaver 23 so that a plurality of code bits of the LDPC code corresponding to "1" present in an arbitrary row of the parity check matrix used by the LDPC encoder 115 are not included in a single symbol.

The demultiplexer 25 performs an exchange process of exchanging positions of two or more code bits of the LDPC code serving as a symbol on the LDPC code from the column twist interleaver 24, and obtains an LDPC code in which tolerance for AWGN is enhanced. Further, the demultiplexer 25 supplies the two or more code bits of the LDPC code obtained by the exchange process to the QAM encoder 117 (FIG. 8) as a symbol.

Figure 10:
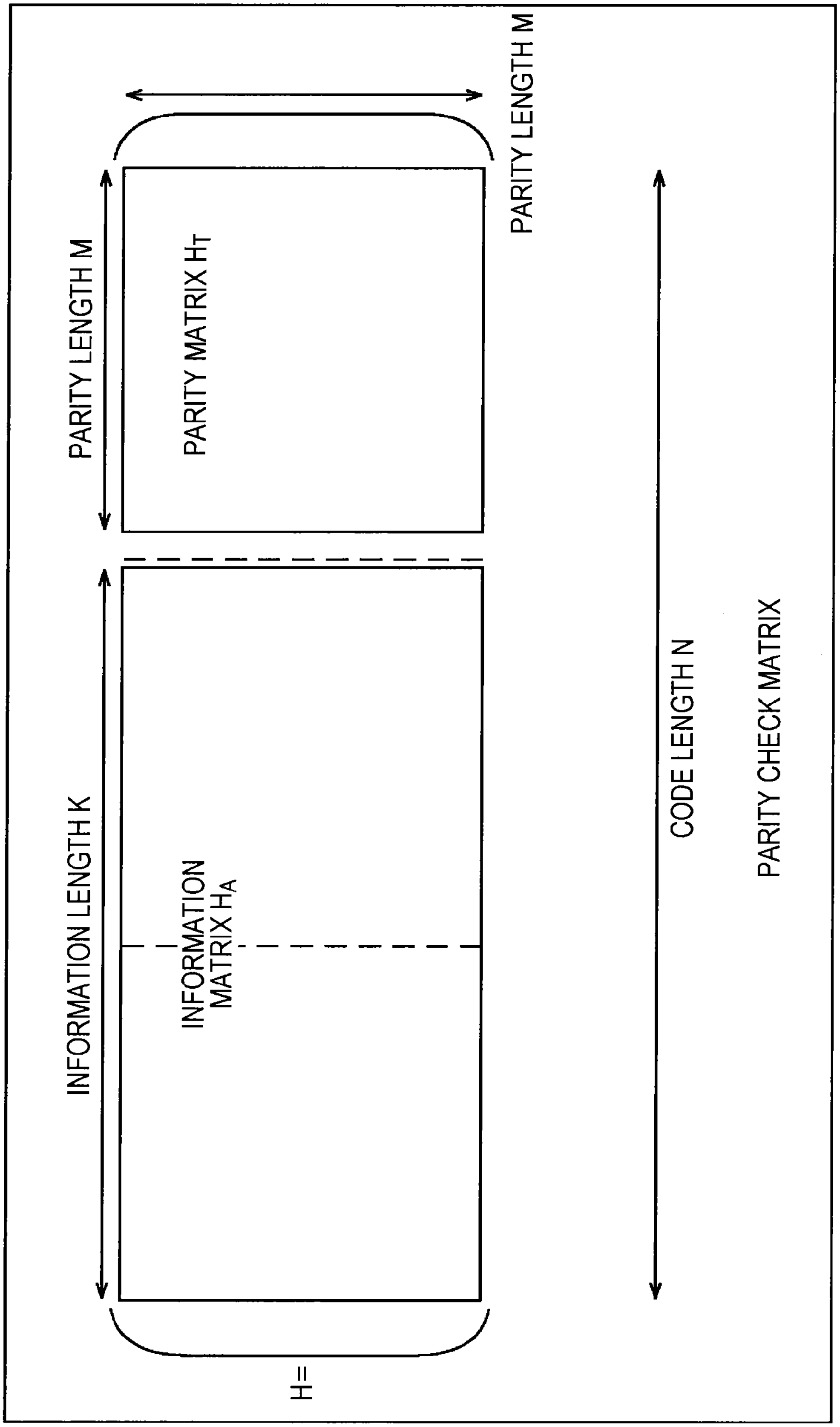
FIG. 10 is a diagram illustrating a parity check matrix.

Next, FIG. 10 illustrates the parity check matrix H used for LDPC coding by the LDPC encoder 115 of FIG. 8.

The parity check matrix H has an LDGM (Low-Density Generation Matrix) structure, and may be expressed by a formula $H=[H_A|H_T]$ (a matrix in which elements of an information matrix $H_A$ serve as left elements, and elements of a parity matrix $H_T$ serve as right elements) based on an information matrix $H_A$ of a portion corresponding to information bits among code bits of the LDPC code and a parity matrix $H_T$ corresponding to parity bits.

Here, the number of information bits among code bits of one LDPC code (one code word) and the number of parity bits are referred to as an information length K and a parity length M, respectively, and the number of code bits of one LDPC code is referred to as a code length N (=K+M).

The information length K and the parity length M of the LDPC code having the code length N are decided depending on the coding rate. Further, the parity check matrix H is a matrix in which row×column is M×N. Further, the information matrix $H_A$ is an M×K matrix, and the parity matrix $H_T$ is an M×M matrix.

Figure 11:
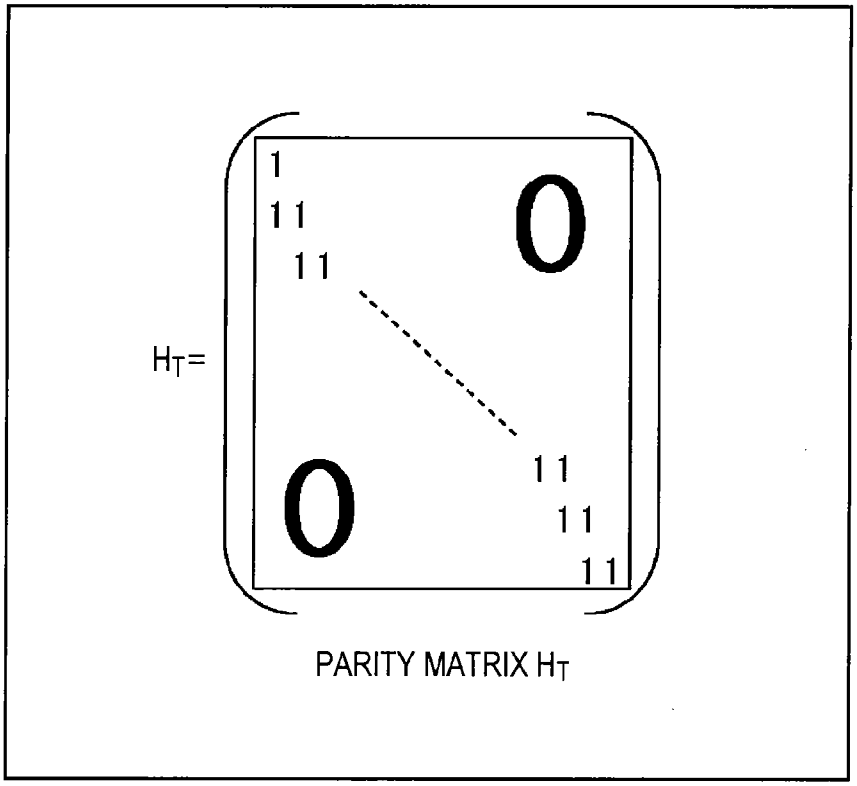
FIG. 11 is a diagram illustrating a parity matrix.

FIG. 11 illustrates the parity matrix $H_T$ of the parity check matrix H of the LDPC code specified in the DVB-T.2 (and DVB-S.2) standard.

The parity matrix $H_T$ of the parity check matrix H of the LDPC code specified in the DVB-T.2 standard has a staircase structure in which elements of "1" are arranged in the form of a staircase as illustrated in FIG. 11. The row weight of the parity matrix $H_T$ is 1 in a first row and 2 in the remaining rows. Further, the column weight is 1 in the last 1 column and 2 in the remaining columns.

As described above, the LDPC code of the parity check matrix H in which the parity matrix $H_T$ has the staircase structure can be easily generated using the parity check matrix H.

In other words, an LDPC code (one code word) is represented by a row vector c, and a column vector obtained by transposing the row vector is represented by $c^T$. Further, a portion of an information bit in the row vector c that is the LDPC code is represented by a row vector A, and a portion of a parity bit is represented by a row vector T.

In this case, the row vector c can be expressed by a formula $c=[A|T]$ (a row vector in which an element of the row vector A serves as a left element and an element of the row vector T serves as a right element) based on the row vector A serving as the information bit and the row vector T serving as the parity bit.

The parity check matrix H and the row vector $c=[A|T]$ serving as the LDPC code need to satisfy a formula $Hc^T=0$, and the row vector T serving as the parity bit configuring the row vector $c=[A|T]$ satisfying the formula $Hc^T=0$ may be obtained sequentially (in order) by causing an element of each row to be zero (0) in order starting from an element of a first row of a column vector $Hc^T$ in the formula $Hc^T=0$ when the parity matrix $H_T$ of the parity check matrix $H=[H_A|H_T]$ has the staircase structure illustrated in FIG. 11.

Figure 12:
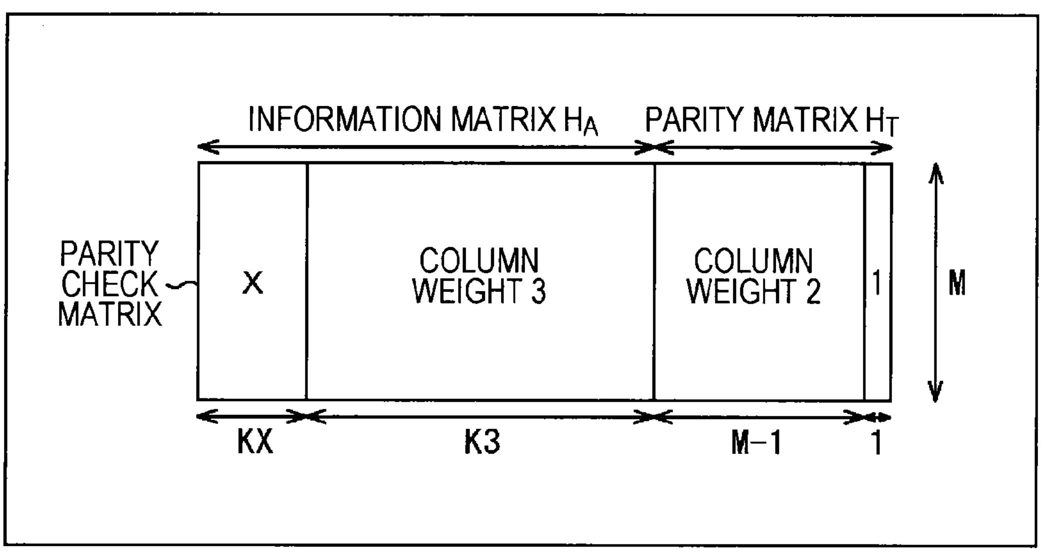
FIG. 12 is a diagram for describing a parity check matrix of an LDPC code specified in a DVB-S.2 standard.

FIG. 12 is a diagram for describing the parity check matrix H of the LDPC code specified in the DVB-T.2 standard.

The column weight is set to X for a KX column from a first column of the parity check matrix H of the LDPC code specified in the DVB-T.2 standard, the column weight is set to 3 for a subsequent K3 column, the column weight is set to 2 for a subsequent M−1 column, and the column weight is set to 1 for a last 1 column.

Here, KX+K3+M−1+1 is equal to the code length N.

FIG. 13 is a diagram illustrating column numbers KX, K3, and M and a column weight X on coding rates r of the LDPC code specified in the DVB-T.2 standard.

In the DVB-T.2 standard, an LDPC code having a code length N of 64800 bits and an LDPC code having a code length N of 16200 bits are specified.

For the LDPC code having the code length N of 64800 bits, 11 coding rates (nominal rates) 1/4, 1/3, 2/5, 1/2, 3/5, 2/3, 3/4, 4/5, 5/6, 8/9, and 9/10, and for the LDPC code having the code length N of 16200 bits, 10 coding rates 1/4, 1/3, 2/5, 1/2, 3/5, 2/3, 3/4, 4/5, 5/6, and 8/9 are specified.

Here, hereinafter, the code length N of 64800 bits is also referred to as 64 k bits, and the code length N of 16200 bits is also referred to as 16 k bits.

In the LDPC code, it is known that a code bit corresponding to a column that is large in the column weight of the parity check matrix H is low in the error rate.

In the parity check matrix H specified in the DVB-T.2 standard illustrated in FIGS. 12 and 13, a column at the beginning side (left side) tends to be large in the column weight, and thus in the LDPC code corresponding to the parity check matrix H, a code bit at the beginning tends to be robust to an error (has tolerance for an error), and a code bit at the end tends to be weak to an error.

Figure 14:
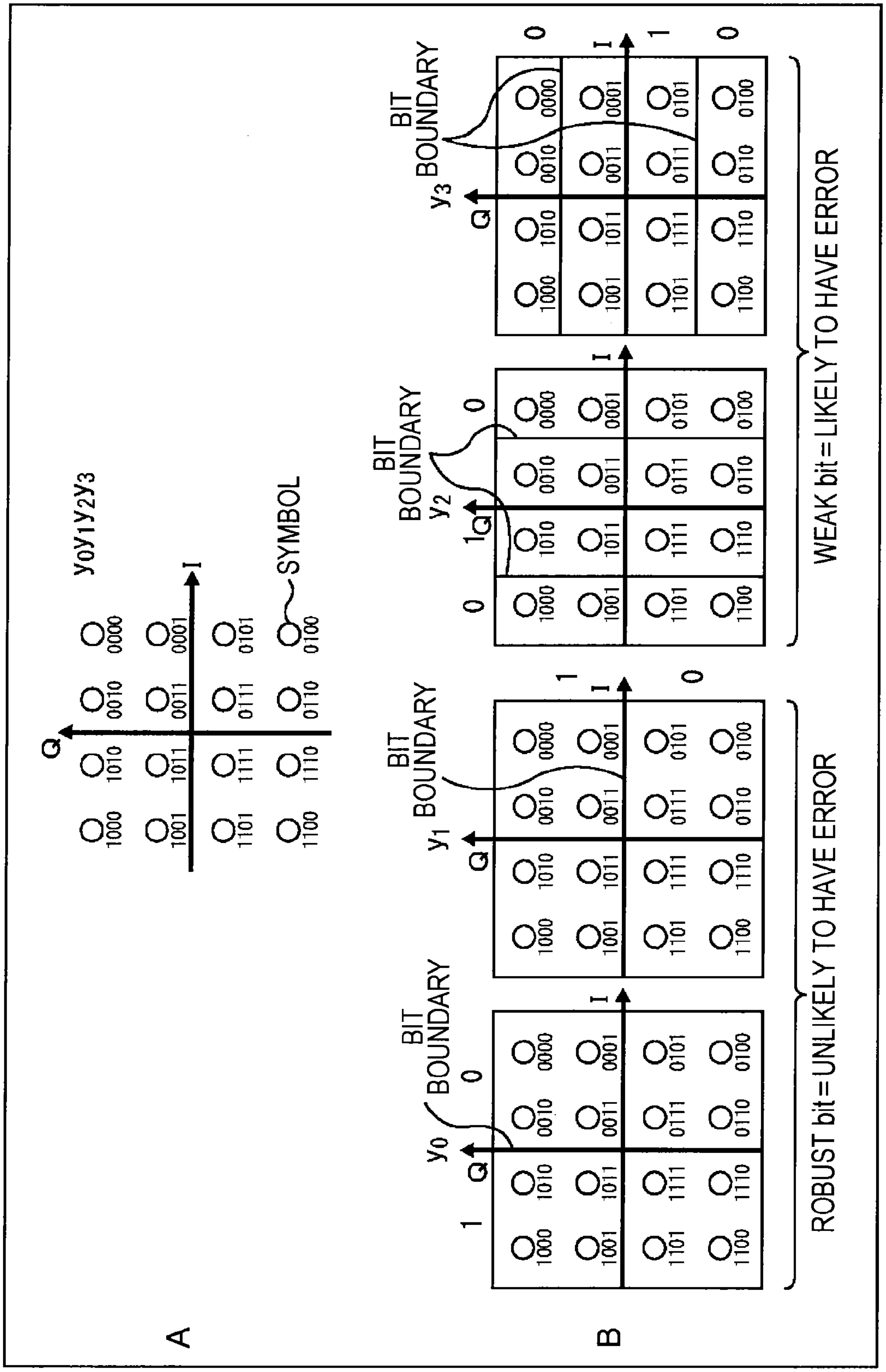
FIG. 14 is a diagram illustrating a signal point arrangement of 16 QAM.

Next, FIG. 14 illustrates an arrangement of (signal points corresponding to) 16 symbols on an IQ plane when 16 QAM is performed by the QAM encoder 117 of FIG. 8.

In other words, A of FIG. 14 illustrates symbols of 16 QAM of DVB-T.2.

In 16 QAM, one symbol is represented by 4 bits, and 16 ($=2^4$) symbols are present. The 16 symbols are arranged centering on the original point of the IQ plane in the form of a square in which I direction×Q direction is 4×4.

Here, when an (i+1)-th bit from a most significant bit in a bit string represented by one symbol is represented by a bit $y_i$, 4 bits represented by one symbol of 16 QAM can be represented as bits $y_0$, $y_1$, $y_2$, and $y_3$ in order from the most significant bit. When the modulation method is 16 QAM, 4 bits of code bits of the LDPC code are converted (symbolized) into symbols (symbol values) of 4 bits $y_0$ to $y_3$.

B of FIG. 14 illustrates a bit boundary on each of 4 bits (hereinafter, also referred to as symbol bits) $y_0$ to $y_3$ represented by symbols of 16 QAM.

Here, the bit boundary on the symbol bit $y_i$ (i=0, 1, 2, and 3 in FIG. 14) means the boundary between a symbol in which the symbol bit $y_i$ is 0 and a symbol in which the symbol bit $y_i$ is 1.

As illustrated in B of FIG. 14, for a most significant symbol bit $y_0$ among 4 symbol bits $y_0$ to $y_3$ represented by symbols of 16 QAM, only one portion on the Q axis of the IQ plane becomes the bit boundary, and for the second (second from the most significant bit) symbol bit $y_1$, only one portion on the I axis of the IQ plane becomes the bit boundary.

Further, for the third symbol bit $y_2$, among 4×4 symbols, two portions between first and second columns from the left and between third and fourth columns become the bit boundary.

Further, for the fourth symbol bit $y_3$, among 4×4 symbols, two portions between first and second rows from the top and between third and fourth rows become the bit boundary.

The symbol bit $y_i$ represented by the symbol is unlikely to have an error (low in an error probability) when many symbols are distant from the bit boundary and is likely to have an error (high in an error probability) when many symbols are close to the bit boundary.

Here, when a bit unlikely to have an error (robust to an error) is referred to as a "robust bit" and a bit likely to have an error (weak to an error) is referred to as a "weak bit," for 4 symbol bits $y_0$ to $y_3$ of symbols of 16 QAM, the most significant symbol bit $y_0$ and the second symbol bit $y_1$ are robust bits, and the third symbol bit $y_2$ and the fourth symbol bit $y_3$ are weak bits.

Figure 15:
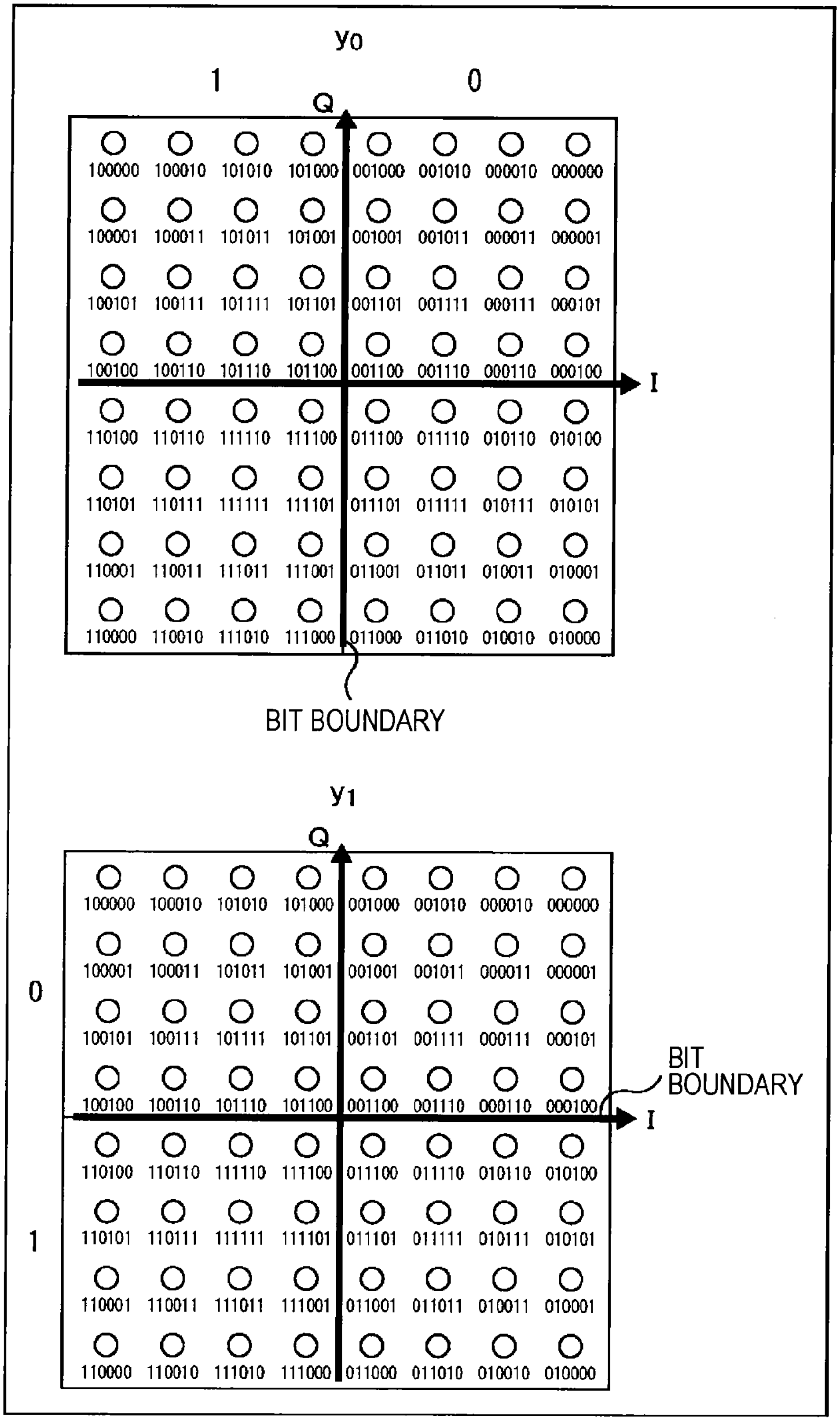
FIG. 15 is a diagram illustrating a signal point arrangement of 64 QAM.
Figure 16:
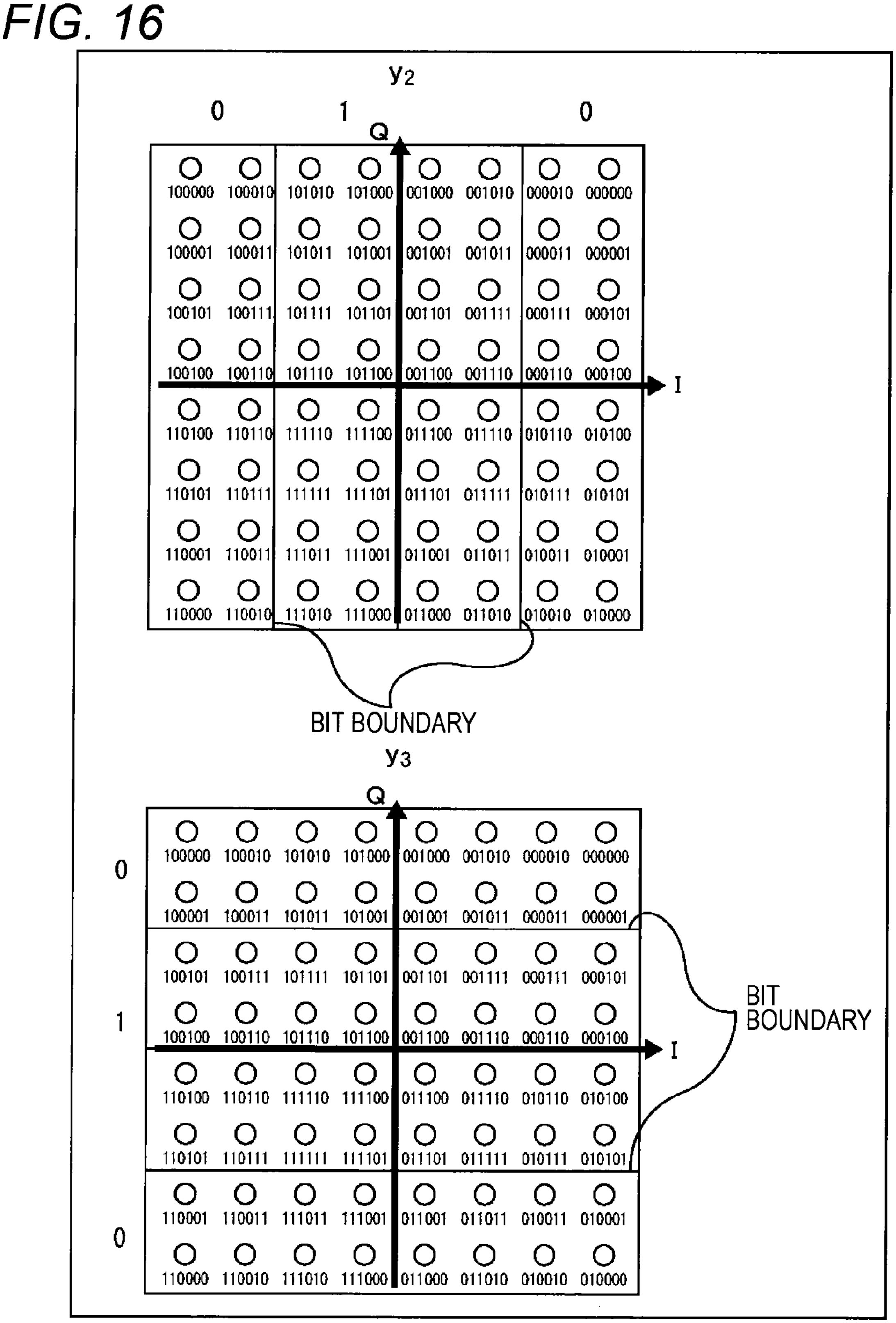
FIG. 16 is a diagram illustrating a signal point arrangement of 64 QAM.
Figure 17:
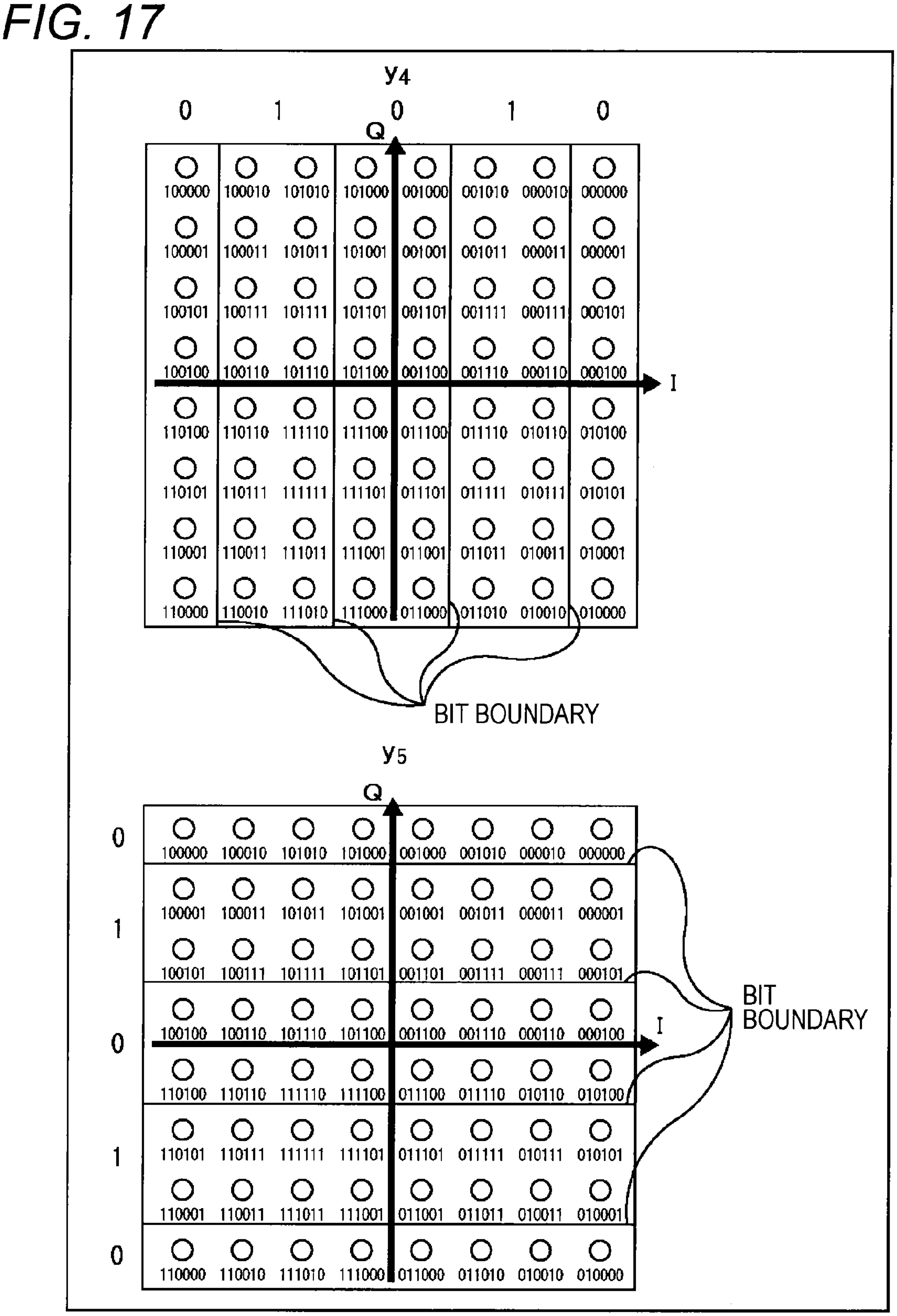
FIG. 17 is a diagram illustrating a signal point arrangement of 64 QAM.

FIGS. 15 to 17 illustrate an arrangement of (signal points corresponding to) 64 symbols on the IQ plane when 64 QAM is performed by the QAM encoder 117 of FIG. 8, that is, symbols of 16 QAM of DVB-T.2.

In 64 QAM, one symbol is represented by 6 bits, and 64 ($=2^6$) symbols are present. The 64 symbols are arranged centering on the original point of the IQ plane in the form of a square in which I direction×Q direction is 8×8.

The symbol bits of one symbol of 64 QAM can be represented as bits $y_0$, $y_1$, $y_2$, $y_3$, $y_4$, and $y_5$ in order from the most significant bit. When the modulation method is 64 QAM, 6 bits of code bits of the LDPC code are converted into symbols of symbol bits $y_0$ to $y_5$ of 6 bits.

Here, FIG. 15 illustrates bit boundaries on the most significant symbol bit $y_0$ and the second symbol bit $y_1$ among the symbol bits $y_0$ to $y_5$ of the symbol of 64 QAM, FIG. 16 illustrates bit boundaries on the third symbol bit $y_2$ and the fourth symbol bit $y_3$, and FIG. 17 illustrates bit boundaries on the fifth symbol bit $y_4$ and the sixth symbol bit $y_5$.

The bit boundary on each of the most significant symbol bit $y_0$ and the second symbol bit $y_1$ is one portion as illustrated in FIG. 15. Further, the bit boundaries on each of the third symbol bit $y_2$ and the fourth symbol bit $y_3$ are two portions as illustrated in FIG. 16, and the bit boundaries on each of the fifth symbol bit $y_4$ and the sixth symbol bit $y_5$ are four portions as illustrated in FIG. 17.

Thus, for the symbol bits $y_0$ to $y_5$ of the symbol of 64 QAM, the most significant symbol bit $y_0$ and the second symbol bit $y_1$ are robust bits, and the third symbol bit $y_2$ and the fourth symbol bit $y_3$ are next robust bits. The fifth symbol bit $y_4$ and the sixth symbol bit $y_5$ are weak bits.

It can be understood from FIGS. 14 to 17 that for the symbol bits of the symbol of the quadrature modulation, a high-order bit is likely to be a robust bit, and a low-order bit is likely to be a weak bit.

Here, as described above with reference to FIGS. 12 and 13, the LDPC code output from the LDPC encoder 115 (FIG. 8) includes a code bit robust to an error and a code bit weak to an error.

Further, as described above with reference to FIGS. 14 to 17, as a symbol bit of a symbol of quadrature modulation performed by the QAM encoder 117, there are a robust bit and a weak bit.

Thus, when a code bit of the LDPC code that is weak to an error is allocated to a weak symbol bit of a symbol of the quadrature modulation, tolerance for an error decreases as a whole.

In this regard, an interleaver of interleaving code bits of the LDPC code such that a code bit of the LDPC code that is weak to an error is allocated to a robust bit (symbol bit) of a symbol of quadrature modulation has been proposed.

The demultiplexer 25 of FIG. 9 can perform processing of the interleaver.

Figure 18:
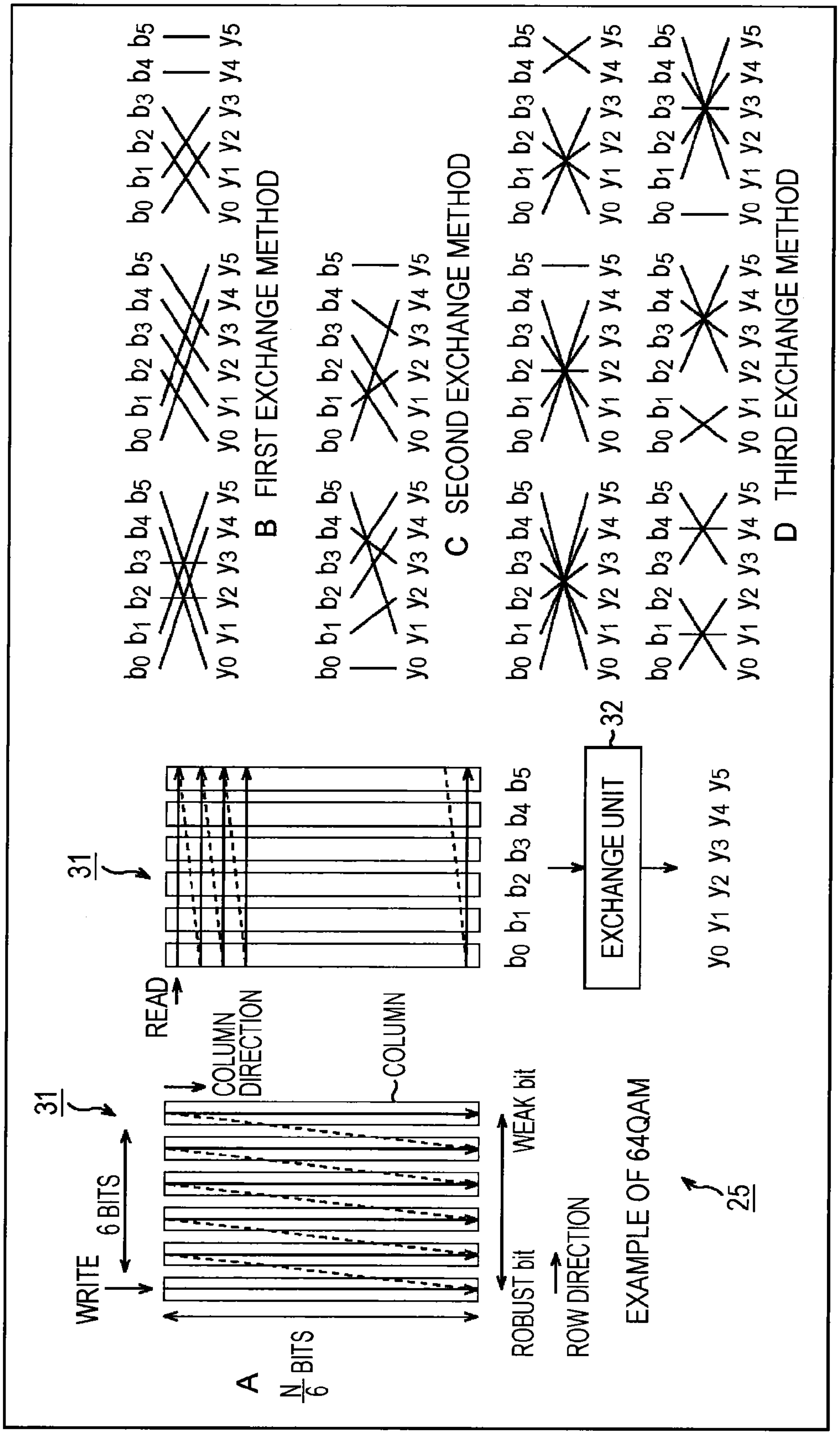
FIG. 18 is a diagram for describing processing of a demultiplexer 25.

FIG. 18 is a diagram for describing processing of the demultiplexer 25 of FIG. 9.

In other words, A of FIG. 18 illustrates a functional configuration example of the demultiplexer 25.

The demultiplexer 25 includes a memory 31 and an exchange unit 32.

The memory 31 is supplied with the LDPC code from the LDPC encoder 115.

The memory 31 has a storage capacity of storing mb bits in a row (lateral) direction and storing N/(mb) bits in a column (longitudinal) direction, and writes code bits of an LDPC code supplied thereto in the column direction, reads code bits in the row direction, and supplies the code bits to the exchange unit 32.

Here, N (=information length K+parity length M) represents a code length of an LDPC code as described above.

Further, m represents a bit number of code bits of an LDPC code serving as one symbol, and b is a predetermined positive integer and a multiple used to cause m to be an integral multiple. The demultiplexer 25 converts (symbolizes) a code bit of an LDPC code into a symbol as described above, and the multiple b represents the number of symbols obtained by single symbolization by the demultiplexer 25.

A of FIG. 18 illustrates a configuration example of the demultiplexer 25 when the modulation method is 64 QAM, and thus the bit number m of code bits of an LDPC code serving as one symbol is 6.

Further, in A of FIG. 18, the multiple b is 1, and thus the memory 31 has a storage capacity in which column direction× row direction is N/(6×1)×(6×1) bits.

Here, a storage region of the memory 31, in which the row direction is 1 bit, extending in the column direction is hereinafter appropriately referred to as a column. In A of FIG. 18, the memory 31 is configured with 6 (=6×1) columns.

In the demultiplexer 25, writing code bits of an LDPC code downward (in the column direction) from the top of columns configuring the memory 31 is performed from the left column to the right column.

Further, when writing of code bits ends up to the bottom of the rightmost column, code bits are read in the row direction in units of 6 bits (mb bits) starting from the first column of all columns configuring the memory 31 and supplied to the exchange unit 32.

The exchange unit 32 performs the exchange process of exchanging the positions of code bits of 6 bits from the memory 31, and outputs the resultant 6 bits as 6 symbol bits $y_0$, $y_1$, $y_2$, $y_3$, $y_4$, and $y_5$ representing one symbol of 64 QAM.

In other words, code bits of mb bits (here, 6 bits) are read from the memory 31 in the row direction, but when an i-th bit (i=0, 1, . . . , mb−1) from the most significant bit in the code bits of mb bits read from the memory 31 is represented by a bit $b_i$, the code bits of 6 bits read from the memory 31 in the row direction can be represented by bits $b_0$, $b_1$, $b_2$, $b_3$, $b_4$, and $b_5$ in order from the most significant bit.

Through the relation of the column weight described with reference to FIGS. 12 and 13, a code bit present in a direction of the bit $b_0$ is a code bit robust to an error, and a code bit present in a direction of the bit $b_5$ is a code bit weak to an error.

The exchange unit 32 can performs the exchange process of exchanging positions of the code bits $b_0$ to $b_5$ of 6 bits from the memory 31 so that among the code bits $b_0$ to $b_5$ of 6 bits from the memory 31, a code bit weak to an error is allocated to a robust bit among symbol bits $y_0$ to $y_5$ of one symbol of 64 QAM.

Here, as a exchanging method of exchanging the code bits $b_0$ to $b_5$ of 6 bits from the memory 31 and allocating the code bits to 6 symbol bits $y_0$ to $y_5$ representing one symbol of 64 QAM, various methods have been proposed from respective companies.

B of FIG. 18 illustrates a first exchanging method, C of FIG. 18 illustrates a second exchanging method, and D of FIG. 18 illustrates a third exchanging method.

In B to D of FIG. 18 (similar even in FIG. 19), a line segment connecting bits $b_i$ and $y_j$ means that the code bit $b_i$ is allocated to the symbol bit $y_j$ (exchanged for the position of the symbol bit $y_j$).

Any one of three types of exchanging methods is being proposed to be employed as the first exchanging method of B of FIG. 18, and any one of two types of exchanging methods is being proposed to be employed as the second exchanging method of C of FIG. 18.

Six types of exchanging methods are being proposed to be selected and used in order as the third exchanging method of D of FIG. 18.

Figure 19:
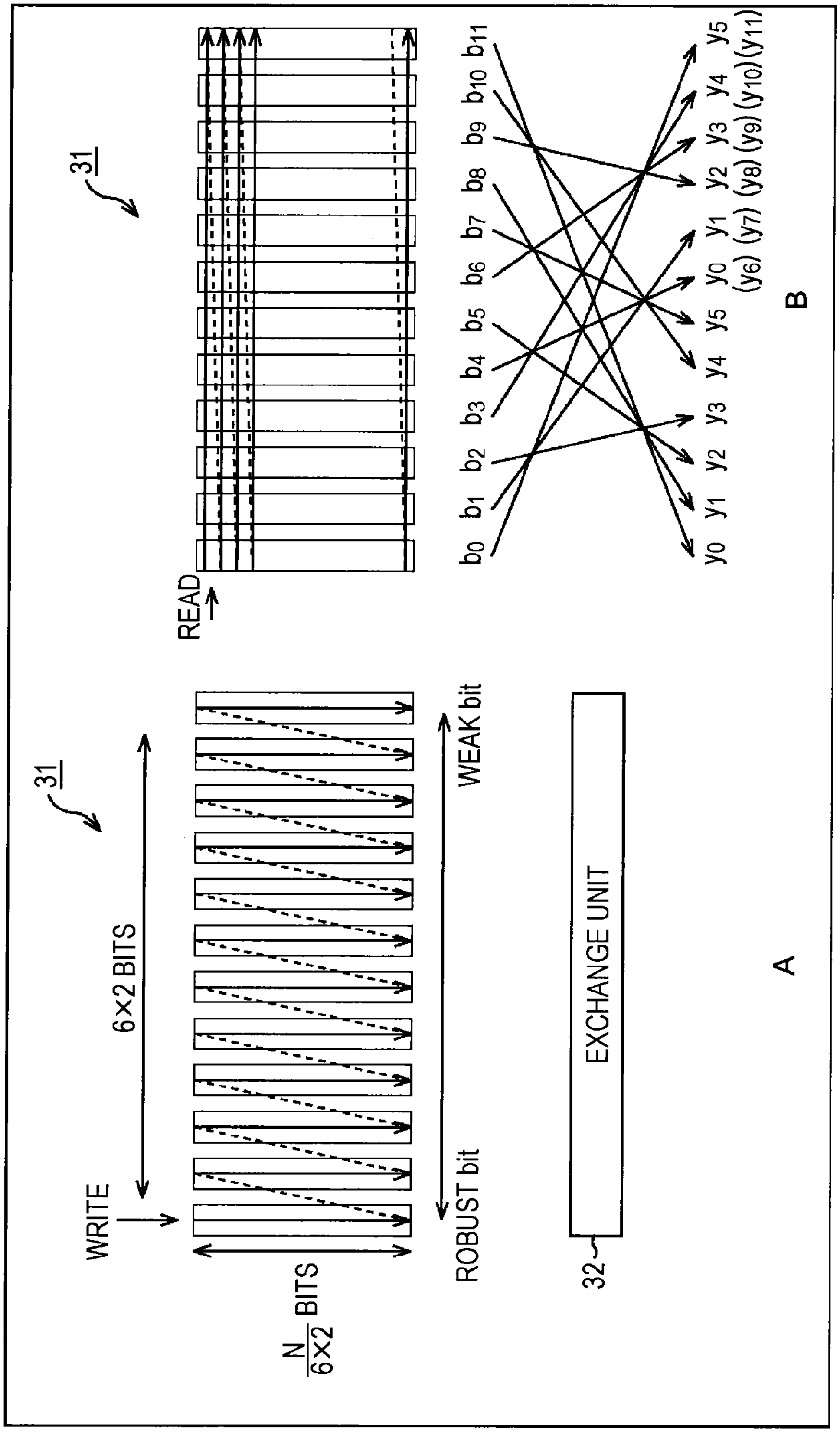
FIG. 19 is a diagram for describing processing of a demultiplexer 25.

FIG. 19 illustrates a configuration example of the demultiplexer 25 when the modulation method is 64 QAM (thus, the bit number m of code bits of an LDPC code mapped to one symbol is 6, similarly to FIG. 18) and the multiple b is 2 and a fourth exchanging method.

When the multiple b is 2, the memory 31 has a storage capacity in which column direction×row direction is N/(6×2)×(6×2) bits and is configured with 12 (=6×2) columns.

A of FIG. 19 illustrates a writing sequence of an LDPC code to the memory 31.

In the demultiplexer 25, writing code bits of an LDPC code downward (in the column direction) from the top of columns configuring the memory 31 is performed from the left column to the right column as described with reference to FIG. 18.

Further, when writing of code bits ends up to the bottom of the rightmost column, code bits are read in the row direction in units of 12 bits (mb bits) starting from the first column of all columns configuring the memory 31 and supplied to the exchange unit 32.

The exchange unit 32 performs the exchange process of exchanging the positions of code bits of 12 bits from the memory 31 according to the fourth exchanging method, and outputs the resultant 12 bits as 12 symbol bits representing two symbols (b symbols) of 64 QAM, that is, 6 symbol bits $y_0$, $y_1$, $y_2$, $y_3$, $y_4$, and $y_5$ representing one symbol of 64 QAM and 6 symbol bits $y_0$, $y_1$, $y_2$, $y_3$, $y_4$, and $y_5$ representing next one symbol.

Here, B of FIG. 19 illustrates the fourth exchanging method of the exchange process by the exchange unit 32 of A of FIG. 19.

Further, when the multiple b is 2 (similar even when the multiple b is 3 or more), code bits of mb bits are allocated to symbol bits of mb bits of consecutive b symbols through the exchange process. In the following including FIG. 19, for the sake of convenience of description, an (i+1)-th bit from the most significant bit among symbol bits of mb bits of consecutive b symbols is represented by a bit (symbol bit) $y_i$.

An appropriate exchanging method, that is, an improvement in the error rate in the AWGN communication path differs, for example, according to the coding rate, the code length, or the modulation method of the LDPC code.

[Parity Interleaving]

Next, parity interleaving by the parity interleaver 23 of FIG. 9 will be described with reference to FIGS. 20 to 22.

Figure 20:
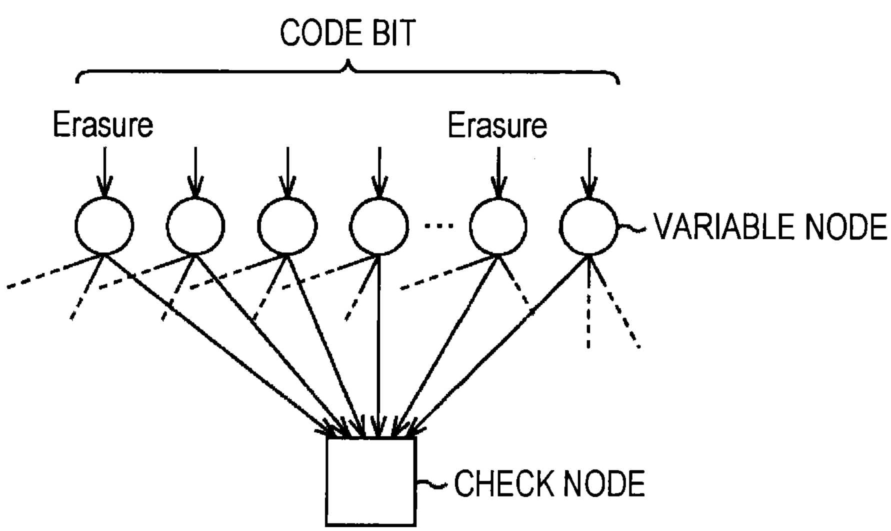
FIG. 20 is a diagram illustrating a tanner graph on LDPC code decoding.

FIG. 20 illustrates (a part of) a tanner graph of a parity check matrix of an LDPC code.

When two or more (code bits corresponding to) variable nodes connected to a check node have an error such as erasure at the same time as illustrated in FIG. 20, the check node returns a message in which a probability that a valve is 0 is equal to a probability that a value is 1 to all variable nodes connected to the check node. Thus, when a plurality of variable nodes connected to the same check node have erasure or the like at the same time, decoding performance deteriorates.

Meanwhile, an LDPC code, which is specified in the DVB-T.2 standard, output from the LDPC encoder 115 of FIG. 8 is an IRA code, and the parity matrix $H_T$ of the parity check matrix H has the staircase structure as illustrated in FIG. 11.

FIG. 21 illustrates a parity matrix $H_T$ having a staircase structure and a tanner graph corresponding to the parity matrix $H_T$.

In other words, A of FIG. 21 illustrates the parity matrix $H_T$ having the staircase structure, and B of FIG. 21 illustrates the tanner graph corresponding to the parity matrix $H_T$ of A of FIG. 21.

In the parity matrix $H_T$ having the staircase structure, elements of "1" are adjacent to each other in each row (except for a first row). Thus, in the tanner graph of the parity matrix $H_T$, two adjacent variable nodes corresponding to columns of two adjacent elements in which a value of the parity matrix $H_T$ is "1" are connected to the same check node.

Thus, when parity bits corresponding to two adjacent variable nodes have an error at the same time due to a burst error, erasure, or the like, the check node connected to the two variable nodes (variable nodes obtaining a message using a parity bit) corresponding to two parity bits having an error returns a message in which a probability that a value is 0 is equal to a probability that a value is 1 to the variable nodes connected to the check node, and thus, decoding performance deteriorates. Further, when a burst length (the number of parity bits consecutively having an error) increases, the check node returning a message of an equal probability increases, and decoding performance further deteriorates.

In this regard, the parity interleaver 23 (FIG. 9) performs parity interleaving of interleaving a parity bit of an LDPC code from the LDPC encoder 115 to the position of another parity bit in order to prevent deterioration in decoding performance.

Figure 22:
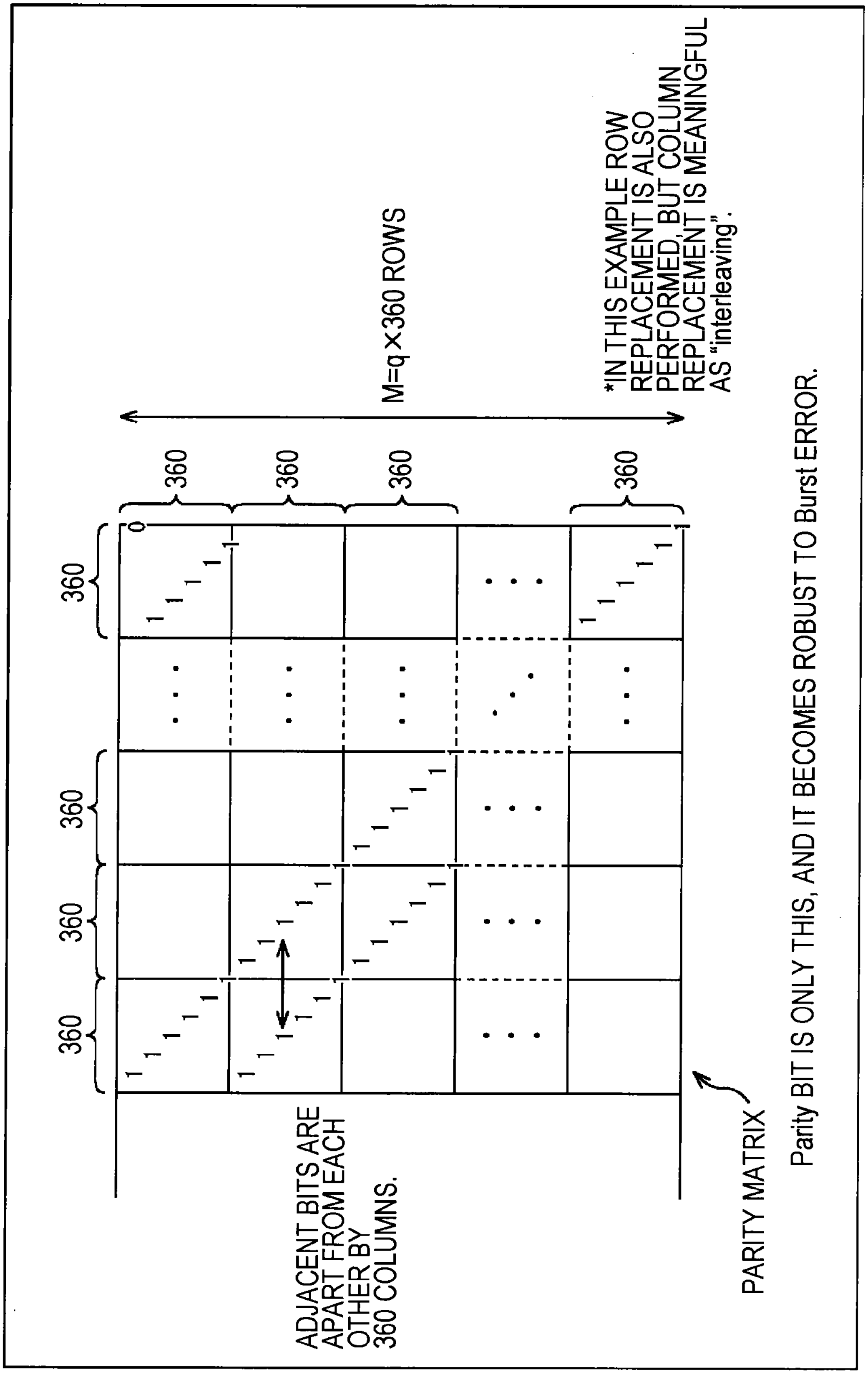
FIG. 22 is a diagram illustrating a parity matrix $H_T$ of a parity check matrix H corresponding to a parity-interleaved LDPC code.

FIG. 22 illustrates the parity matrix $H_T$ of the parity check matrix H corresponding to the LDPC code that has been subjected to parity interleaving performed by the parity interleaver 23 of FIG. 9.

Here, an information matrix $H_A$ of the parity check matrix H corresponding to the LDPC code, which is specified in the DVB-T.2 standard, output from the LDPC encoder 115 has a cyclic structure.

The cyclic structure represents a structure in which a certain column matches another cyclic-shifted column, and includes, for example, even a structure in which a position of "1" of each row of P columns becomes a position cyclic-shifted in the column direction by a value proportional to a value q obtained by dividing a first column of the P columns by the parity length M for every P columns. Hereinafter, the P columns in the cyclic structure are appropriately referred to as a unit column number of a cyclic structure.

As an LDPC code specified in the DVB-T.2 standard, there are two types of an LDCP code having a code length N of 64800 bits and a code length N of 16200 bits as described above with reference to FIGS. 12 and 13, and for both of the two types of the LDPC codes, the unit column number P of the cyclic structure is specified to be 360 that is one of divisors excluding 1 and M among divisors of the parity length M.

Further, the parity length M has a value other than a prime number expressed by a formula M=q×P=q×360 using the value q differing according to the coding rate. Thus, the value q is another divisor excluding 1 and M among the divisors of the parity length M, similarly to the unit column number P of the cyclic structure, and obtained by dividing the parity length M by the unit column number P of the cyclic structure (the product of P and q which are the divisors of the parity length M is the parity length M).

When the information length is represented by K, an integer of 0 or more and less than P is represented by x, and an integer of 0 or more and less than q is represented by y as described above, the parity interleaver 23 performs parity interleaving of interleaving a (K+qx+y+1)-th code bit among code bits of an N-bit LDPC code to the position of a (K+Py+x+1)-th code bit.

Both of the (K+qx+y+1)-th code bit and the (K+Py+x+1)-th code bit are code bits after a (K+1)-th code bit and thus parity bits, and thus the positions of the parity bits of the LDPC code are shifted by parity interleaving.

According to such parity interleaving, since (parity bits corresponding to) variable nodes connected to the same check node are distant from each other by the unit column number P of the cyclic structure, that is, 360 bits here, when the burst length is less than 360 bits, a phenomenon that a plurality of variable nodes connected to the same check node have an error at the same time can be avoided, and as a result, tolerance for a burst error can be improved.

Further, an LDPC code that has been subjected to parity interleaving of interleaving the (K+qx+y+1)-th code bit to the position of the (K+Py+x+1)-th code bit matches an LDPC code of a parity check matrix (hereinafter, also referred to as a "conversion parity check matrix") obtained by performing column replacement of replacing a (K+qx+y+1)-th column of an original parity check matrix H with a (K+Py+x+1)-th column.

Further, in the parity matrix of the conversion parity check matrix, a pseudo-cyclic structure having P columns (360 columns in FIG. 22) as a unit appears as illustrated in FIG. 22.

Here, the pseudo-cyclic structure means a structure in which a portion excluding a part has a cyclic structure. In the conversion parity check matrix obtained by executing column replacement corresponding to parity interleaving on the parity check matrix of the LDPC code specified in the DVB-T.2 standard, a portion (a shift matrix which will be described later) of 360 rows×360 columns of a right-hand corner portion is short of one element of "1" (has an element of "0"), and in that sense, a pseudo-cyclic structure rather than a (complete) cyclic structure is formed.

The conversion parity check matrix of FIG. 22 is a matrix obtained by executing replacement of a row (row replacement) causing a conversion parity check matrix to be configured with a constitutive matrix as well as column replacement corresponding to parity interleaving on the original parity check matrix H.

[Column Twist Interleaving]

Next, column twist interleaving used as the sorting process by the column twist interleaver 24 of FIG. 9 will be described with reference to FIG. 23 to FIG. 26.

The transmitting device 11 of FIG. 8 transmits one or more code bits of an LDPC code as a single symbol. In other words, for example, when two code bits are transmitted as a single symbol, for example, QPSK is used as a modulation method, and when four code bits are transmitted as a single symbol, for example, 16 QAM is used as a modulation method.

When two or more code bits are transmitted as a single symbol and erasure or the like occurs in a certain symbol, all of code bits of the symbol have an error (erasure).

Thus, in order to decrease a probability that a plurality of (code bits corresponding to) variable nodes connected to the same check node have erasure at the same time in order to improve decoding performance, it is necessary to prevent variable nodes corresponding to code bits of a single symbol from being connected to the same check node.

Meanwhile, as described above, in the parity check matrix H of the LDPC code, which is specified in the DVB-T.2 standard, output from the LDPC encoder 115, the information matrix $H_A$ has the cyclic structure, and the parity matrix $H_T$ has the staircase structure. Further, as described above with reference to FIG. 22, in the conversion parity check matrix that is the parity check matrix of the parity-interleaved LDPC code, the cyclic structure (exactly, pseudo-cyclic structure as described above) appears even in the parity matrix.

Figure 23:
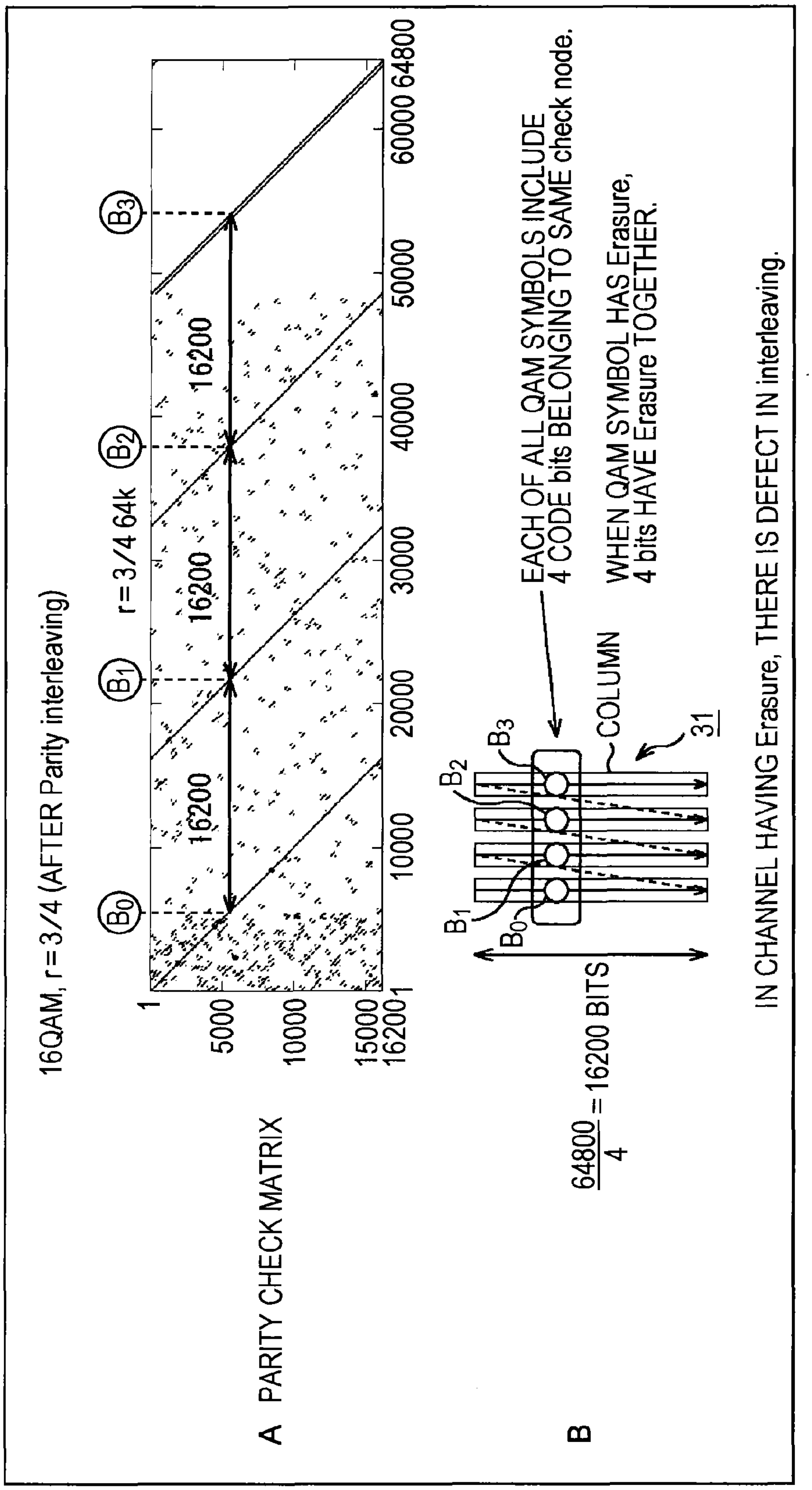
FIG. 23 is a diagram illustrating a conversion parity check matrix.

FIG. 23 illustrates a conversion parity check matrix.

In other words, A of FIG. 23 illustrates a conversion parity check matrix of a parity check matrix H of an LDPC code in which the code length N is 64800 bits and the coding rate (r) is 3/4.

In the conversion parity check matrix of A of FIG. 23, the position of an element having a value of "1" is indicated by a point (•).

B of FIG. 23 illustrates processing that is performed on the LDPC code of the conversion parity check matrix of A of FIG. 23, that is, the parity-interleaved LDPC code by the demultiplexer 25 (FIG. 9).

In B of FIG. 23, 16 QAM is used as a modulation method, and code bits of the parity-interleaved LDPC code are written in four columns configuring the memory 31 of the demultiplexer 25 in the column direction.

The code bits written in the four columns configuring the memory 31 in the column direction are read in the row direction in units of 4 bits and used as a single symbol.

In this case, code bits $B_0$, $B_1$, $B_2$, and $B_3$ of four bits serving as a single symbol may be code bits corresponding to "1" present in an arbitrary row of the conversion parity check matrix of A of FIG. 23, and in this case, variable nodes respectively corresponding to the code bits $B_0$, $B_1$, $B_2$, and $B_3$ are connected to the same check node.

Thus, when the code bits $B_0$, $B_1$, $B_2$, and $B_3$ of four bits serving as a single symbol may be code bits corresponding to "1" present in an arbitrary row of the conversion parity check matrix, if erasure occurs in the symbol, it is difficult to obtain an appropriate message in the same check node connected with the variable nodes respectively corresponding to the code bits $B_0$, $B_1$, $B_2$/and $B_3$, and thus decoding performance deteriorates.

Even when coding rates other than 3/4 are used, similarly, there are cases in which a plurality of code bits corresponding to a plurality of variable nodes connected to the same check node are used as a single symbol of 16 QAM.

In this regard, the column twist interleaver 24 performs column twist interleaving of interleaving the code bits of the parity-interleaved LDPC code from the parity interleaver 23 such that a plurality of code bits corresponding to "1" present in an arbitrary row of the conversion parity check matrix are not included in a single symbol.

Figure 24:
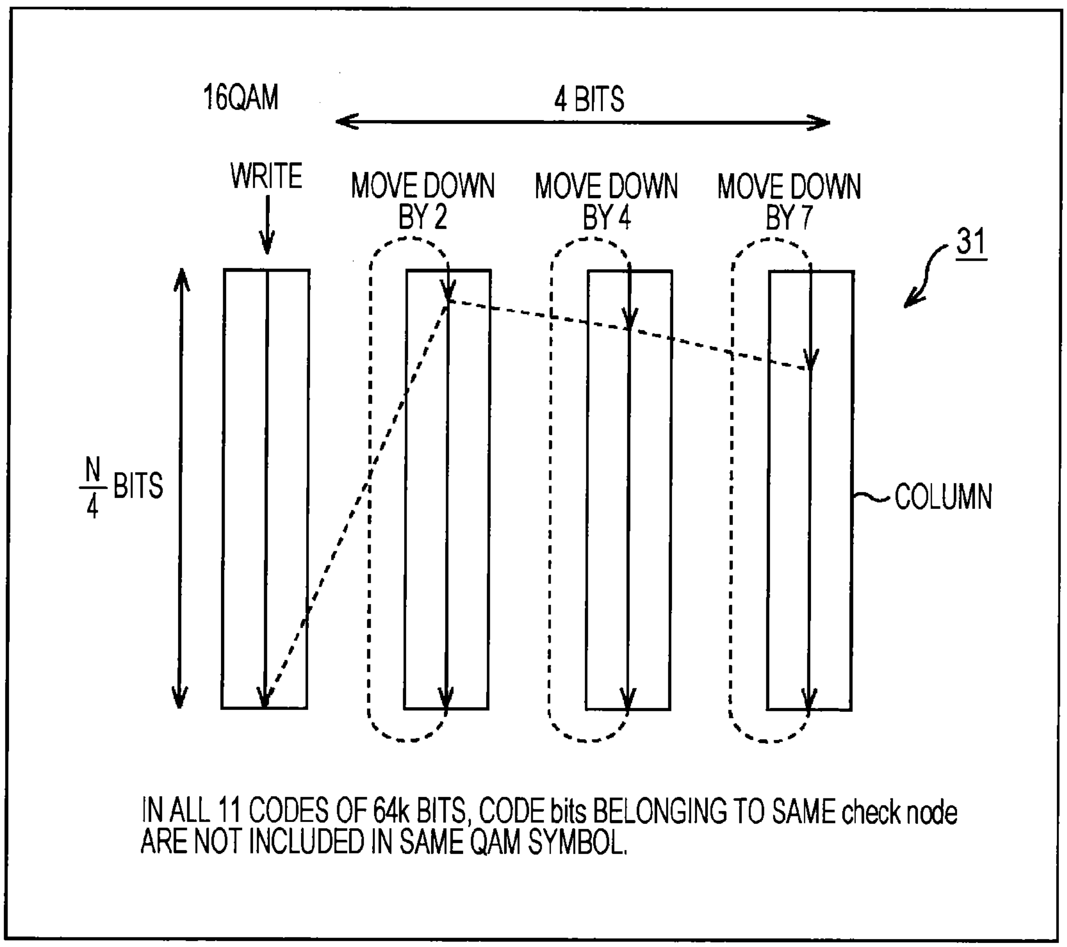
FIG. 24 is a diagram for describing processing of a column twist interleaver 24.

FIG. 24 is a diagram for describing column twist interleaving.

In other words, FIG. 24 illustrates the memory 31 of the demultiplexer 25 (FIGS. 18 and 19).

The memory 31 has a storage capacity of storing mb bits in the row (lateral) direction and storing N/(mb) bits in the column (longitudinal) direction, and is configured with mb columns as described above with reference to FIG. 18. Further, the column twist interleaver 24 performs column twist interleaving by controlling a write start position when the code bits of the LDPC code are written in the column direction and read in the row direction to and from the memory 31.

In other words, the column twist interleaver 24 appropriately changes the write start position to start writing of code bits in each of a plurality of columns such that a plurality of code bits serving as a single symbol read in the row direction do not become code bits corresponding to "1" present in an arbitrary row of a conversion parity check matrix (the code bits of the LDPC code are sorted such that a plurality of code bits corresponding to "1" present in an arbitrary row of a parity check matrix are not included in the same symbol).

Here, FIG. 24 illustrates a configuration example of the memory 31 when the modulation method is 16 QAM and the multiple b described in FIG. 18 is 1. Thus, the bit number m of the code bits of the LDPC code serving as a single symbol is 4, and the memory 31 is configured with 4 (=mb) columns.

The column twist interleaver 24 (instead of the demultiplexer 25 of FIG. 18) performs writing the code bits of the LDPC code downward (in the column direction) from the top of 4 columns configuring the memory 31 from the left column to the right column.

Further, when writing of the code bits ends up to the rightmost column, the column twist interleaver 24 reads the code bits in the row direction in units of 4 bits (mb bits) starting from the first column of all columns configuring the memory 31, and outputs the code bits to the exchange unit 32 (FIGS. 18 and 19) of the demultiplexer 25 as the LDPC code that has been subjected to column twist interleaving.

Here, in the column twist interleaver 24, when an address of a beginning (top) position of each column is represented by 0 and addresses of respective positions in the column direction are represented by integers in the ascending order, a write start position of the leftmost column is set to the position having the address of 0, a write start position of a second column (from the left) is set to the position having the address of 2, a write start position of a third column is set to the position having the address of 4, and a write start position of a fourth column is set to the position having the address of 7.

Further, for a column whose write start position is a position other than the position having the address of 0, after code bits are written up to the lowest position, it returns to the beginning (the position having the address of 0), and writing is performed up to the position directly before the write start position. Thereafter, writing to a next (right) column is performed.

As such column twist interleaving is performed, the LDPC code specified in the DVB-T.2 standard can avoid a phenomenon that a plurality of code bits corresponding to a plurality of variable nodes connected to the same check node are used as a single symbol of 16 QAM (included in the same symbol), and as a result, decoding performance in the communication path having erasure can be improved.

FIG. 25 illustrates a column number of the memory 31 necessary for column twist interleaving and an address of a write start position for LDPC codes of 11 coding rates, in which the code length N is 64800, specified in the DVB-T.2 standard for each modulation method.

When the multiple b is 1 and the bit number m of a single symbol is 2 as, for example, QPSK is employed as a modulation method, according to FIG. 25, the memory 31 includes two columns storing 2×1 (=mb) bits in the row direction, and stores 64800/(2×1) bits in the column direction.

Further, of the two columns of the memory 31, the write start position of the first column is the position having the address of 0, and the write start position of the second column is the position having the address of 2.

Further, for example, when any one of the first to third exchanging methods of FIG. 18 is employed as the exchanging method of the exchange process of the demultiplexer 25 (FIG. 9), the multiple b is 1.

When the multiple b is 2 and the bit number m of a single symbol is 2 as, for example, QPSK is employed as a modulation method, according to FIG. 25, the memory 31 includes four columns storing 2×2 bits in the row direction, and stores 64800/(2×2) bits in the column direction.

Further, among the four columns of the memory 31, the write start position of the first column is the position having the address of 0, the write start position of the second column is the position having the address of 2, the write start position of the third column is the position having the address of 4, and the write start position of the fourth column is the position having the address of 7.

Further, for example, when the fourth exchanging method of FIG. 19 is employed as the exchanging method of the exchange process of the demultiplexer 25 (FIG. 9), the multiple b is 2.

When the multiple b is 1 and the bit number m of a single symbol is 4 as, for example, 16 QAM is employed as a modulation method, according to FIG. 25, the memory 31 includes four columns storing 4×1 bits in the row direction, and stores 64800/(4×1) bits in the column direction.

Further, among the four columns of the memory 31, the write start position of the first column is the position having the address of 0, the write start position of the second column is the position having the address of 2, the write start position of the third column is the position having the address of 4, and the write start position of the fourth column is the position having the address of 7.

When the multiple b is 2 and the bit number m of a single symbol is 4 as, for example, 16 QAM is employed as a modulation method, according to FIG. 25, the memory 31 includes eight columns storing 4×2 bits in the row direction, and stores 64800/(4×2) bits in the column direction.

Further, among the eight columns of the memory 31, the write start position of the first column is the position having the address of 0, the write start position of the second column is the position having the address of 0, the write start position of the third column is the position having the address of 2, the write start position of the fourth column is the position having the address of 4, the write start position of the fifth column is the position having the address of 4, the write start position of the sixth column is the position having the address of 5, the write start position of the seventh column is the position having the address of 7, and the write start position of the eighth column is the position having the address of 7.

When the multiple b is 1 and the bit number m of a single symbol is 6 as, for example, 64 QAM is employed as a modulation method, according to FIG. 25, the memory 31 includes six columns storing 6×1 bits in the row direction, and stores 64800/(6×1) bits in the column direction.

Further, among the six columns of the memory 31, the write start position of the first column is the position having the address of 0, the write start position of the second column is the position having the address of 2, the write start position of the third column is the position having the address of 5, the write start position of the fourth column is the position having the address of 9, the write start position of the fifth column is the position having the address of 10, and the write start position of the sixth column is the position having the address of 13.

When the multiple b is 2 and the bit number m of a single symbol is 6 as, for example, 64 QAM is employed as a modulation method, according to FIG. 25, the memory 31 includes twelve columns storing 6×2 bits in the row direction, and stores 64800/(6×2) bits in the column direction.

Further, among the twelve columns of the memory 31, the write start position of the first column is the position having the address of 0, the write start position of the second column is the position having the address of 0, the write start position of the third column is the position having the address of 2, the write start position of the fourth column is the position having the address of 2, the write start position of the fifth column is the position having the address of 3, the write start position of the sixth column is the position having the address of 4, the write start position of the seventh column is the position having the address of 4, the write start position of the eighth column is the position having the address of 5, the write start position of the ninth column is the position having the address of 5, the write start position of the tenth column is the position having the address of 7, the write start position of the eleventh column is the position having the address of 8, and the write start position of the twelfth column is the position having the address of 9.

When the multiple b is 1 and the bit number m of a single symbol is 8 as, for example, 256 QAM is employed as a modulation method, according to FIG. 25, the memory 31 includes eight columns storing 8×1 bits in the row direction, and stores 64800/(8×1) bits in the column direction.

Further, among the eight columns of the memory 31, the write start position of the first column is the position having the address of 0, the write start position of the second column is the position having the address of 0, the write start position of the third column is the position having the address of 2, the write start position of the fourth column is the position having the address of 4, the write start position of the fifth column is the position having the address of 4, the write start position of the sixth column is the position having the address of 5, the write start position of the seventh column is the position having the address of 7, and the write start position of the eighth column is the position having the address of 7.

When the multiple b is 2 and the bit number m of a single symbol is 8 as, for example, 256 QAM is employed as a modulation method, according to FIG. 25, the memory 31 includes sixteen columns storing 8×2 bits in the row direction, and stores 64800/(8×2) bits in the column direction.

Further, among the sixteen columns of the memory 31, the write start position of the first column is the position having the address of 0, the write start position of the second column is the position having the address of 2, the write start position of the third column is the position having the address of 2, the write start position of the fourth column is the position having the address of 2, the write start position of the fifth column is the position having the address of 2, the write start position of the sixth column is the position having the address of 3, the write start position of the seventh column is the position having the address of 7, the write start position of the eighth column is the position having the address of 15, the write start position of the ninth column is the position having the address of 16, the write start position of the tenth column is the position having the address of 20, the write start position of the eleventh column is the position having the address of 22, the write start position of the twelfth column is the position having the address of 22, the write start position of the thirteenth column is the position having the address of 27, the write start position of the fourteenth column is the position having the address of 27, the write start position of the fifteenth column is the position having the address of 28, and the write start position of the sixteenth column is the position having the address of 32.

When the multiple b is 1 and the bit number m of a single symbol is 10 as, for example, 1024 QAM is employed as a modulation method, according to FIG. 25, the memory 31 includes ten columns storing 10×1 bits in the row direction, and stores 64800/(10×1) bits in the column direction.

Further, among the ten columns of the memory 31, the write start position of the first column is the position having the address of 0, the write start position of the second column is the position having the address of 3, the write start position of the third column is the position having the address of 6, the write start position of the fourth column is the position having the address of 8, the write start position of the fifth column is the position having the address of 11, the write start position of the sixth column is the position having the address of 13, the write start position of the seventh column is the position having the address of 15, the write start position of the eighth column is the position having the address of 17, the write start position of the ninth column is the position having the address of 18, and the write start position of the tenth column is the position having the address of 20.

When the multiple b is 2 and the bit number m of a single symbol is 10 as, for example, 1024 QAM is employed as a modulation method, according to FIG. 25, the memory 31 includes twenty columns storing 10×2 bits in the row direction, and stores 64800/(10×2) bits in the column direction.

Further, among the twenty columns of the memory 31, the write start position of the first column is the position having the address of 0, the write start position of the second column is the position having the address of 1, the write start position of the third column is the position having the address of 3, the write start position of the fourth column is the position having the address of 4, the write start position of the fifth column is the position having the address of 5, the write start position of the sixth column is the position having the address of 6, the write start position of the seventh column is the position having the address of 6, the write start position of the eighth column is the position having the address of 9, the write start position of the ninth column is the position having the address of 13, the write start position of the tenth column is the position having the address of 14, the write start position of the eleventh column is the position having the address of 14, the write start position of the twelfth column is the position having the address of 16, the write start position of the thirteenth column is the position having the address of 21, the write start position of the fourteenth column is the position having the address of 21, the write start position of the fifteenth column is the position having the address of 23, the write start position of the sixteenth column is the position having the address of 25, the write start position of the seventeenth column is the position having the address of 25, the write start position of the eighteenth column is the position having the address of 26, the write start position of the nineteenth column is the position having the address of 28, and the write start position of the twentieth column is the position having the address of 30.

When the multiple b is 1 and the bit number m of a single symbol is 12 as, for example, 4096 QAM is employed as a modulation method, according to FIG. 25, the memory 31 includes twelve columns storing 12×1 bits in the row direction, and stores 64800/(12×1) bits in the column direction.

Further, among the twelve columns of the memory 31, the write start position of the first column is the position having the address of 0, the write start position of the second column is the position having the address of 0, the write start position of the third column is the position having the address of 2, the write start position of the fourth column is the position having the address of 2, the write start position of the fifth column is the position having the address of 3, the write start position of the sixth column is the position having the address of 4, the write start position of the seventh column is the position having the address of 4, the write start position of the eighth column is the position having the address of 5, the write start position of the ninth column is the position having the address of 5, the write start position of the tenth column is the position having the address of 7, the write start position of the eleventh column is the position having the address of 8, and the write start position of the twelfth column is the position having the address of 9.

When the multiple b is 2 and the bit number m of a single symbol is 12 as, for example, 4096 QAM is employed as a modulation method, according to FIG. 25, the memory 31 includes twenty four columns storing 12×2 bits in the row direction, and stores 64800/(12×2) bits in the column direction.

Further, among the twenty four columns of the memory 31, the write start position of the first column is the position having the address of 0, the write start position of the second column is the position having the address of 5, the write start position of the third column is the position having the address of 8, the write start position of the fourth column is the position having the address of 8, the write start position of the fifth column is the position having the address of 8, the write start position of the sixth column is the position having the address of 8, the write start position of the seventh column is the position having the address of 10, the write start position of the eighth column is the position having the address of 10, the write start position of the ninth column is the position having the address of 10, the write start position of the tenth column is the position having the address of 12, the write start position of the eleventh column is the position having the address of 13, the write start position of the twelfth column is the position having the address of 16, the write start position of the thirteenth column is the position having the address of 17, the write start position of the fourteenth column is the position having the address of 19, the write start position of the fifteenth column is the position having the address of 21, the write start position of the sixteenth column is the position having the address of 22, the write start position of the seventeenth column is the position having the address of 23, the write start position of the eighteenth column is the position having the address of 26, the write start position of the nineteenth column is the position having the address of 37, the write start position of the twentieth column is the position having the address of 39, the write start position of the twenty first column is the position having the address of 40, the write start position of the twenty second column is the position having the address of 41, the write start position of the twenty third column is the position having the address of 41, and the write start position of the twenty fourth column is the position having the address of 41.

0 0 0 1

FIG. 26 illustrates a column number of the memory 31 necessary for column twist interleaving and an address of a write start position for LDPC codes of 10 coding rates, in which the code length N is 16200, specified in the DVB-T.2 standard for each modulation method.

When the multiple b is 1 and the bit number m of a single symbol is 2 as, for example, QPSK is employed as a modulation method, according to FIG. 26, the memory 31 includes two columns storing 2×1 bits in the row direction, and stores 16200/(2×1) bits in the column direction.

Further, of the two columns of the memory 31, the write start position of the first column is the position having the address of 0, and the write start position of the second column is the position having the address of 0.

When the multiple b is 2 and the bit number m of a single symbol is 2 as, for example, QPSK is employed as a modulation method, according to FIG. 26, the memory 31 includes four columns storing 2×2 bits in the row direction, and stores 16200/(2×2) bits in the column direction.

Further, among the four columns of the memory 31, the write start position of the first column is the position having the address of 0, the write start position of the second column is the position having the address of 2, the write start position of the third column is the position having the address of 3, and the write start position of the fourth column is the position having the address of 3.

When the multiple b is 1 and the bit number m of a single symbol is 4 as, for example, 16 QAM is employed as a modulation method, according to FIG. 26, the memory 31 includes four columns storing 4×1 bits in the row direction, and stores 16200/(4×1) bits in the column direction.

Further, among the fourth columns of the memory 31, the write start position of the first column is the position having the address of 0, the write start position of the second column is the position having the address of 2, the write start position of the third column is the position having the address of 3, and the write start position of the fourth column is the position having the address of 3.

When the multiple b is 2 and the bit number m of a single symbol is 4 as, for example, 16 QAM is employed as a modulation method, according to FIG. 26, the memory 31 includes eight columns storing 4×2 bits in the row direction, and stores 16200/(4×2) bits in the column direction.

Further, among the eighth columns of the memory 31, the write start position of the first column is the position having the address of 0, the write start position of the second column is the position having the address of 0, the write start position of the third column is the position having the address of 0, the write start position of the fourth column is the position having the address of 1, the write start position of the fifth column is the position having the address of 7, the write start position of the sixth column is the position having the address of 20, the write start position of the seventh column is the position having the address of 20, and the write start position of the eighth column is the position having the address of 21.

When the multiple b is 1 and the bit number m of a single symbol is 6 as, for example, 64 QAM is employed as a modulation method, according to FIG. 26, the memory 31 includes six columns storing 6×1 bits in the row direction, and stores 16200/(6×1) bits in the column direction.

Further, among the six columns of the memory 31, the write start position of the first column is the position having the address of 0, the write start position of the second column is the position having the address of 0, the write start position of the third column is the position having the address of 2, the write start position of the fourth column is the position having the address of 3, the write start position of the fifth column is the position having the address of 7, and the write start position of the sixth column is the position having the address of 7.

When the multiple b is 2 and the bit number m of a single symbol is 6 as, for example, 64 QAM is employed as a modulation method, according to FIG. 26, the memory 31 includes twelve columns storing 6×2 bits in the row direction, and stores 16200/(6×2) bits in the column direction.

Further, among twelve columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 3, the write start position of the eighth column is the position having the address of 3, the write start position of the ninth column is the position having the address of 3, the write start position of the tenth column is the position having the address of 6, the write start position of the eleventh column is the position having the address of 7, and the write start position of the twelfth column is the position having the address of 7.

When the multiple b is 1 and the bit number m of a single symbol is 8 as, for example, 256 QAM is employed as a modulation method, according to FIG. 26, the memory 31 includes eight columns storing 8×1 bits in the row direction, and stores 16200/(8×1) bits in the column direction.

Further, among the eight columns of the memory 31, the write start position of the first column is the position having the address of 0, the write start position of the second column is the position having the address of 0, the write start position of the third column is the position having the address of 0, the write start position of the fourth column is the position having the address of 1, the write start position of the fifth column is the position having the address of 7, the write start position of the sixth column is the position having the address of 20, the write start position of the seventh column is the position having the address of 20, and the write start position of the eighth column is the position having the address of 21.

When the multiple b is 1 and the bit number m of a single symbol is 10 as, for example, 1024 QAM is employed as a modulation method, according to FIG. 26, the memory 31 includes ten columns storing 10×1 bits in the row direction, and stores 16200/(10×1) bits in the column direction.

Further, among the ten columns of the memory 31, the write start position of the first column is the position having the address of 0, the write start position of the second column is the position having the address of 1, the write start position of the third column is the position having the address of 2, the write start position of the fourth column is the position having the address of 2, the write start position of the fifth column is the position having the address of 3, the write start position of the sixth column is the position having the address of 3, the write start position of the seventh column is the position having the address of 4, the write start position of the eighth column is the position having the address of 4, the write start position of the ninth column is the position having the address of 5, and the write start position of the tenth column is the position having the address of 7.

When the multiple b is 2 and the bit number m of a single symbol is 10 as, for example, 1024 QAM is employed as a modulation method, according to FIG. 26, the memory 31 includes twenty columns storing 10×2 bits in the row direction, and stores 16200/(10×2) bits in the column direction.

Further, among the twenty columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 2, the write start position of the eighth column is the position having the address of 2, the write start position of the ninth column is the position having the address of 5, the write start position of the tenth column is the position having the address of 5, the write start position of the eleventh column is the position having the address of 5, the write start position of the twelfth column is the position having the address of 5, the write start position of the thirteenth column is the position having the address of 5, the write start position of the fourteenth column is the position having the address of 7, the write start position of the fifteenth column is the position having the address of 7, the write start position of the sixteenth column is the position having the address of 7, the write start position of the seventeenth column is the position having the address of 7, the write start position of the eighteenth column is the position having the address of 8, the write start position of the nineteenth column is the position having the address of 8, and the write start position of the twentieth column is the position having the address of 10.

When the multiple b is 1 and the bit number m of a single symbol is 12 as, for example, 4096 QAM is employed as a modulation method, according to FIG. 26, the memory 31 includes twelve columns storing 12×1 bits in the row direction, and stores 16200/(12×1) bits in the column direction.

Further, among twelve columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 3, the write start position of the eighth column is the position having the address of 3, the write start position of the ninth column is the position having the address of 3, the write start position of the tenth column is the position having the address of 6, the write start position of the eleventh column is the position having the address of 7, and the write start position of the twelfth column is the position having the address of 7.

When the multiple b is 2 and the bit number m of a single symbol is 12 as, for example, 4096 QAM is employed as a modulation method, according to FIG. 26, the memory 31 includes twenty four columns storing 12×2 bits in the row direction, and stores 16200/(12×2) bits in the column direction.

Further, among the twenty four columns of the memory 31, the write start position of the first column is the position having the address of 0, the write start position of the second column is the position having the address of 0, the write start position of the third column is the position having the address of 0, the write start position of the fourth column is the position having the address of 0, the write start position of the fifth column is the position having the address of 0, the write start position of the sixth column is the position having the address of 0, the write start position of the seventh column is the position having the address of 0, the write start position of the eighth column is the position having the address of 1, the write start position of the ninth column is the position having the address of 1, the write start position of the tenth column is the position having the address of 1, the write start position of the eleventh column is the position having the address of 2, the write start position of the twelfth column is the position having the address of 2, the write start position of the thirteenth column is the position having the address of 2, the write start position of the fourteenth column is the position having the address of 3, the write start position of the fifteenth column is the position having the address of 7, the write start position of the sixteenth column is the position having the address of 9, the write start position of the seventeenth column is the position having the address of 9, the write start position of the eighteenth column is the position having the address of 9, the write start position of the nineteenth column is the position having the address of 10, the write start position of the twentieth column is the position having the address of 10, the write start position of the twenty first column is the position having the address of 10, the write start position of the twenty second column is the position having the address of 10, the write start position of the twenty third column is the position having the address of 10, and the write start position of the twenty fourth column is the position having the address of 11.

Figure 27:
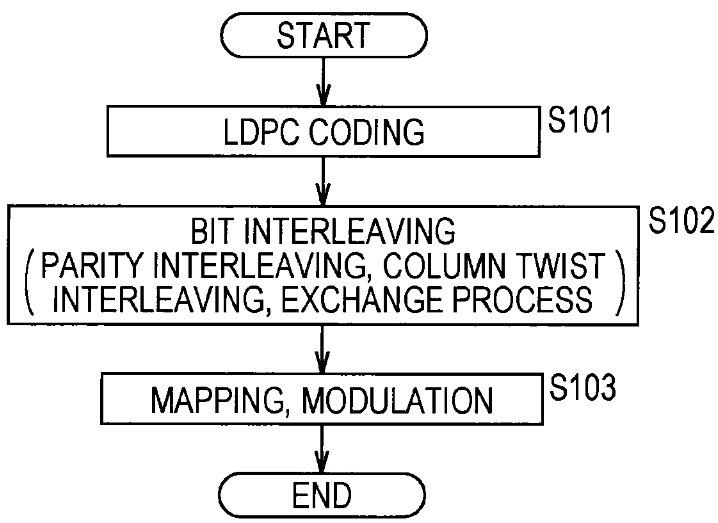
FIG. 27 is a flowchart for describing processing performed by a bit interleaver 116 and a QAM encoder 117.

FIG. 27 is a flowchart for describing processing by the LDPC encoder 115, the bit interleaver 116, and the QAM encoder 117 of FIG. 8.

The LDPC encoder 115 is on standby for supply of LDPC target data from the BCH encoder 114, and in step S101, the LDPC encoder 115 encodes the LDPC target data into an LDPC code, and supplies the LDPC code to the bit interleaver 116, and the process proceeds to step S102.

In step S102, the bit interleaver 116 performs bit interleaving on the LDPC code from the LDPC encoder 115, and supplies a symbol obtained by symbolizing the bit-interleaved LDPC code to the QAM encoder 117, and then the process proceeds to step S103.

In other words, in step S102, the parity interleaver 23 in the bit interleaver 116 (FIG. 9) performs parity interleaving on the LDPC code from the LDPC encoder 115, and supplies the parity-interleaved LDPC code to the column twist interleaver 24.

The column twist interleaver 24 performs column twist interleaving on the LDPC code from the parity interleaver 23, and supplies the resultant LDPC code to the demultiplexer 25.

The demultiplexer 25 performs the exchange process of exchanging the code bits of the LDPC code that has been subjected to column twist interleaving by the column twist interleaver 24 and using the exchanged code bits as symbol bits of a symbol (bits representing a symbol).

Here, the exchange process by the demultiplexer 25 can be performed according to not only the first to fourth exchanging methods illustrated in FIGS. 18 and 19 but also an allocation rule. The allocation rule is a rule for allocating code bits of an LDPC code to symbol bits representing a symbol, and the details thereof will be described later.

The symbol obtained by the exchange process by the demultiplexer 25 is supplied from the demultiplexer 25 to the QAM encoder 117.

In step S103, the QAM encoder 117 performs quadrature modulation by mapping the symbol from the demultiplexer 25 to a signal point decided by a modulation method of quadrature modulation performed by the QAM encoder 117, and supplies the resultant data to the time interleaver 118.

As described above, as parity interleaving and column twist interleaving are performed, it is possible to improve tolerance for erasure or a burst error occurring when a plurality of code bits of an LDPC code are transmitted as a single symbol.

Here, in FIG. 9, for the sake of convenience of description, the parity interleaver 23 serving as a block performing parity interleaving and the column twist interleaver 24 serving as a block performing column twist interleaving are separately configured, but the parity interleaver 23 and the column twist interleaver 24 may be configured integrally with each other.

In other words, both parity interleaving and column twist interleaving can be performed by writing and reading of code bits to and from a memory and represented by a matrix of converting an address (write address) used to write code bits into an address (read address) used to read code bits.

Thus, when a matrix is obtained by multiplying a matrix representing parity interleaving by a matrix representing column twist interleaving, by converting code bits through the matrix, a result of performing parity interleaving and further performing column twist interleaving on the parity-interleaved LDPC code can be obtained.

Further, the demultiplexer 25 can be integrally configured in addition to the parity interleaver 23 and the column twist interleaver 24.

In other words, the exchange process performed by the demultiplexer 25 can be also represented by a matrix of converting the write address of the memory 31 storing an LDPC code to the read address.

Thus, when a matrix is obtained by multiplying a matrix representing parity interleaving by a matrix representing column twist interleaving and a matrix representing the exchange process, parity interleaving, column twist interleaving, and the exchange process can be performed together through the matrix.

Further, either or both of parity interleaving and column twist interleaving may not be performed.

Next, simulation of measuring an error rate (bit error rate) performed on the transmitting device 11 of FIG. 8 will be described with reference to FIGS. 28 to 30.

The simulation was performed using a communication path that is a flutter having the D/U of 0 dB.

FIG. 28 illustrates a model of the communication path employed in the simulation.

In other words, A of FIG. 28 illustrates a model of a flutter employed in the simulation.

Further, B of FIG. 28 illustrates a model of the communication path that is the flutter represented by the model of A of FIG. 28.

In B of FIG. 28, H represents the model of the flutter of A of FIG. 28. Further, in B of FIG. 28, N represents ICI (Inter Carrier Interference), and in the simulation, an expectation value $E[N^2]$ of power thereof was approximated by the AWGN.

Figure 29:
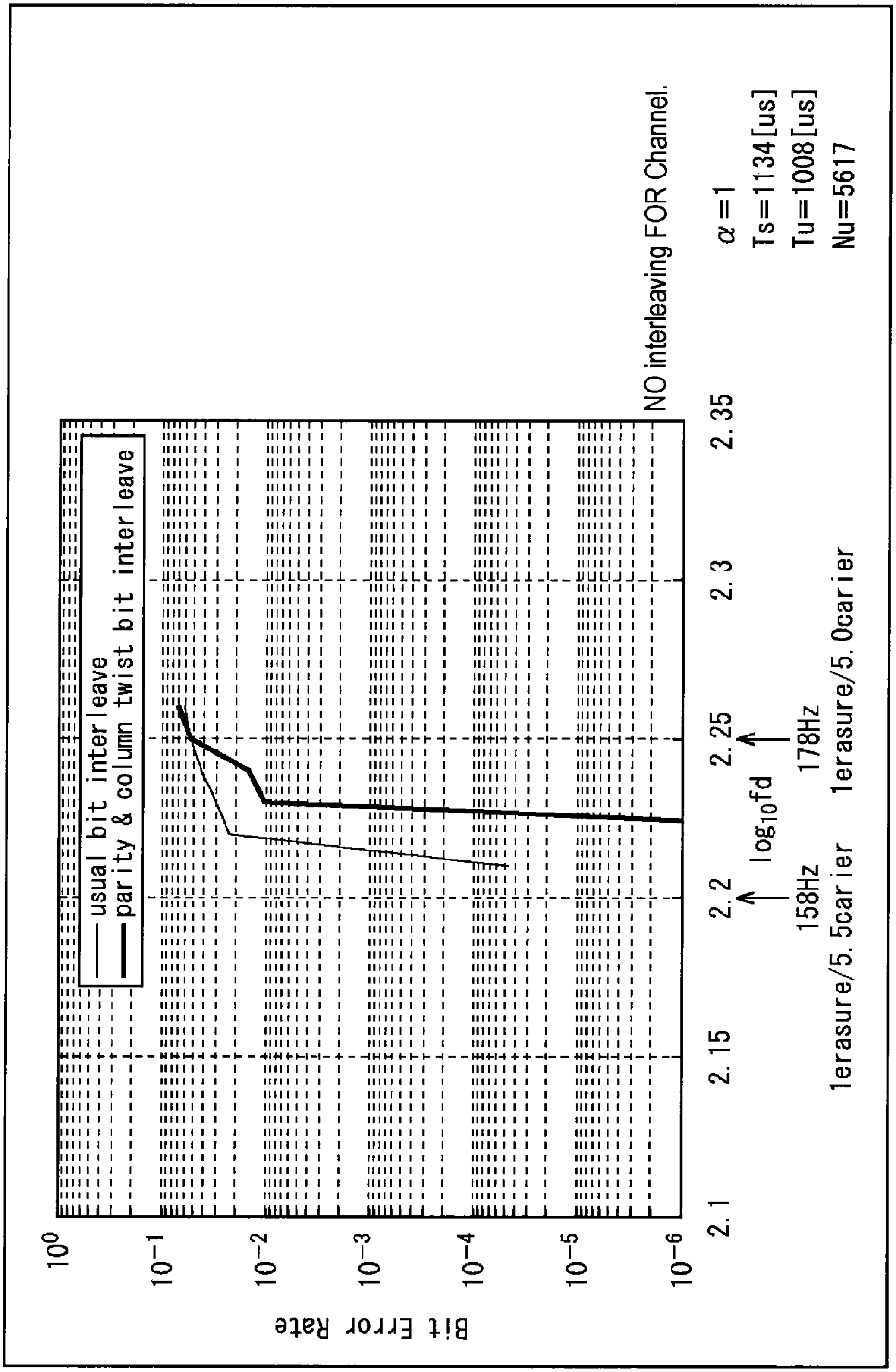
FIG. 29 is a diagram illustrating a relation between an error rate obtained in a simulation and a Doppler frequency $f_d$ of a flutter.
Figure 30:
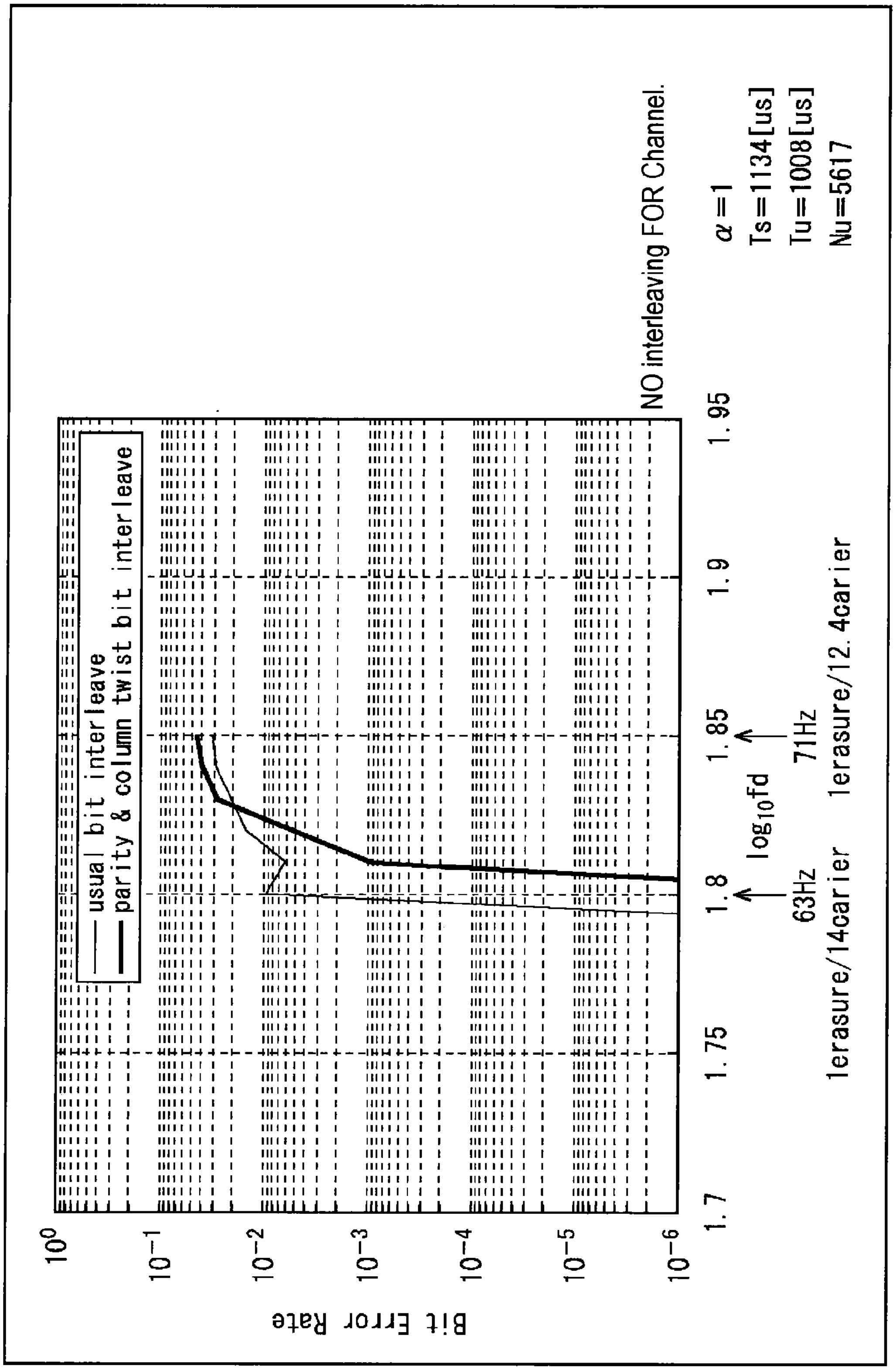
FIG. 30 is a diagram illustrating a relation between an error rate obtained in a simulation and a Doppler frequency $f_d$ of a flutter.

FIGS. 29 and 30 illustrate a relation between an error rate obtained in the simulation and a Doppler frequency $f_d$ of the flutter.

FIG. 29 illustrates a relation between the error rate and the Doppler frequency $f_d$ when the modulation method is 16 QAM, the coding rate (r) is (3/4), and the exchanging method is the first exchanging method. FIG. 30 illustrates a relation between the error rate and the Doppler frequency $f_d$ when the modulation method is 64 QAM, the coding rate (r) is (5/6), and the exchanging method is the first exchanging method.

Further, in FIGS. 29 and 30, a thick line represents a relation between the error rate and the Doppler frequency $f_d$ when all of parity interleaving, column twist interleaving, and the exchange process are performed, and a thin line represents a relation between the error rate and the Doppler frequency $f_d$ when among parity interleaving, column twist interleaving, and the exchange process, only the exchange process is performed.

In both FIGS. 29 and 30, it can be understood that the error rate is more improved (decreases) when all of parity interleaving, column twist interleaving, and the exchange process are performed than when only the exchange process is performed.

[Configuration Example of LDPC Encoder 115]

Figure 31:
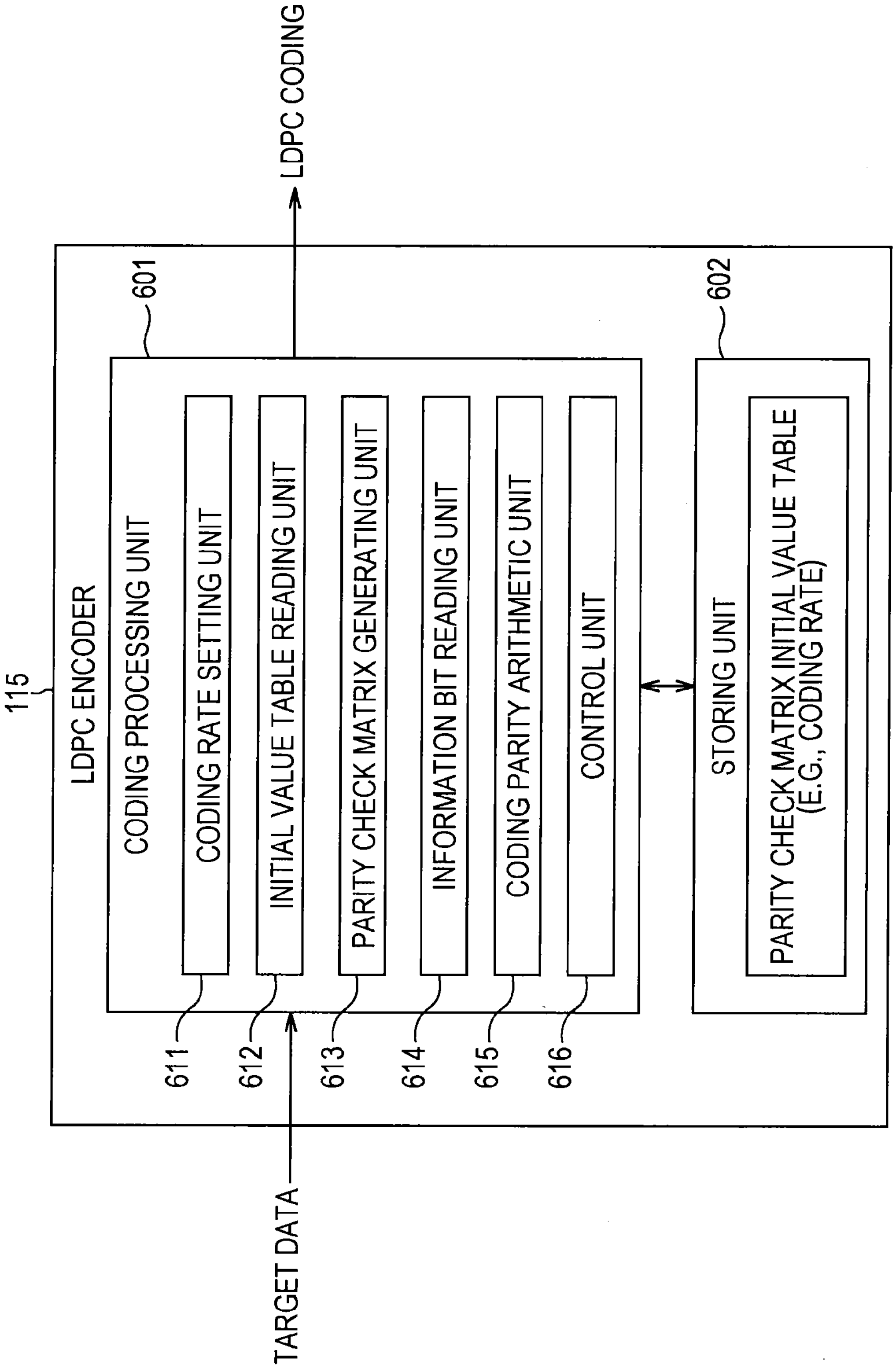
FIG. 31 is a block diagram illustrating a configuration example of an LDPC encoder 115.

FIG. 31 is a block diagram illustrating a configuration example of the LDPC encoder 115 of FIG. 8.

The LDPC encoder 122 of FIG. 8 has a similar configuration.

As described above with reference to FIGS. 12 and 13, LDPC codes having two types of code lengths N of 64800 bits and 16200 bits are specified in the DVB-T.2 standard.

For the LDPC code having the code length N of 64800 bits, 11 coding rates 1/4, 1/3, 2/5, 1/2, 3/5, 2/3, 3/4, 4/5, 5/6, 8/9, and 9/10 are specified, and for the LDPC code having the code length N of 16200 bits, 10 coding rates 1/4, 1/3, 2/5, 1/2, 3/5, 2/3, 3/4, 4/5, 5/6, and 8/9 are specified (FIGS. 12 and 13).

For example, the LDPC encoder 115 performs encoding (error correction coding) by an LDPC code of each coding rate having the code length N of 64800 bits or 16200 bits according to the parity check matrix H prepared for each code length N and each coding rate.

The LDPC encoder 115 includes a coding processing unit 601 and a storing unit 602.

The coding processing unit 601 includes a coding rate setting unit 611, an initial value table reading unit 612, a parity check matrix generation unit 613, an information bit reading unit 614, a coding parity arithmetic unit 615, and a control unit 616, and performs LDPC coding on the LDPC target data supplied to the LDPC encoder 115, and supplies the resultant LDPC code to the bit interleaver 116 (FIG. 8).

In other words, the coding rate setting unit 611 sets the code length N and the coding rate of the LDPC code, for example, according to the operator's operation.

The initial value table reading unit 612 reads a parity check matrix initial value (which will be described later) corresponding to the code length N and the coding rate set by the coding rate setting unit 611 from the storing unit 602.

The parity check matrix generation unit 613 arranges elements of "1" of the information matrix $H_A$ corresponding to the information length K (=the code length N−the parity length M) according to the code length N and the coding rate set by the coding rate setting unit 611 in the column direction with a period of 360 columns (the unit column number P of the cyclic structure) based on a parity check matrix initial value table read by the initial value table reading unit 612, generates the parity check matrix H, and stores the parity check matrix H in the storing unit 602.

The information bit reading unit 614 reads (extracts) information bits corresponding to the information length K from the LDPC target data supplied to the LDPC encoder 115.

The coding parity arithmetic unit 615 reads the parity check matrix H generated by the parity check matrix generation unit 613 from the storing unit 602, calculates a parity bit on the information bit read by the information bit reading unit 614 based on a predetermined formula using the parity check matrix H, and generates a code word (an LDPC code).

The control unit 616 controls the blocks configuring the coding processing unit 601.

For example, the storing unit 602 stores a plurality of parity check matrix initial value tables respectively corresponding to a plurality of coding rates illustrated in FIGS. 12 and 13 on each code length N such as 64800 bits and 16200 bits. Further, the storing unit 602 temporarily stores data necessary for processing of the coding processing unit 601.

Figures 32, 33:
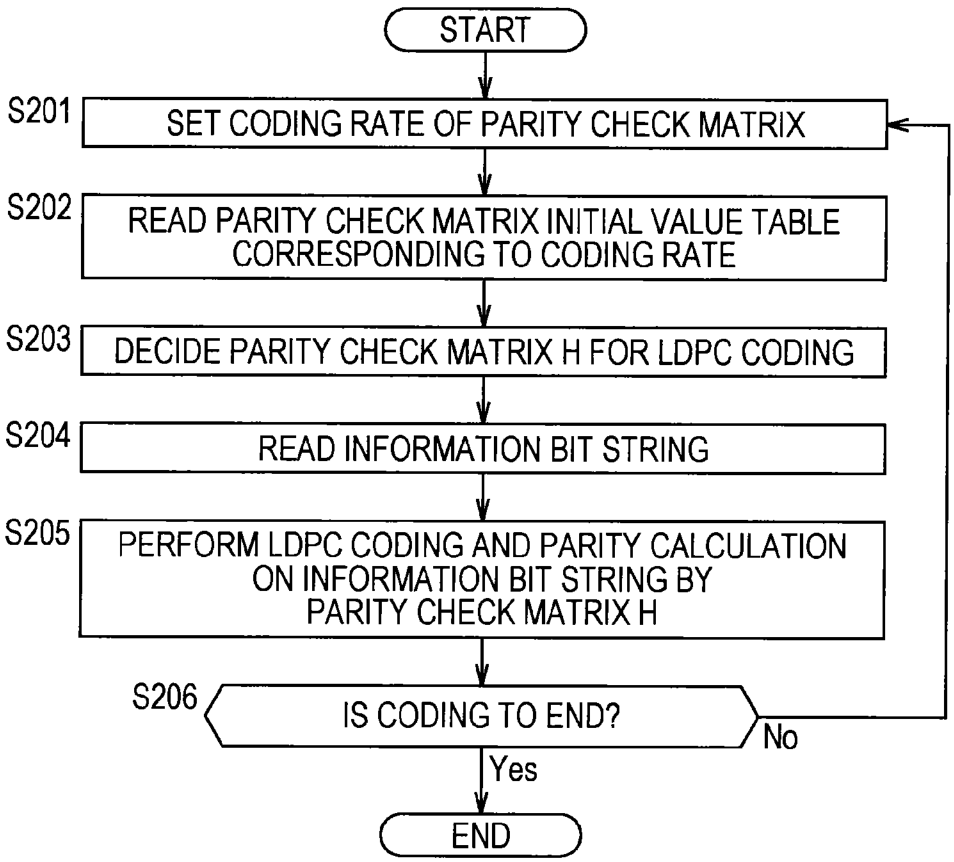
FIG. 32 is a flowchart for describing processing of the LDPC encoder 115.
FIG. 33 is a diagram illustrating an example of a parity check matrix initial value table in which a coding rate is 1/4 and a code length is 16200.

FIG. 32 is a flowchart for describing processing of the LDPC encoder 115 of FIG. 31.

In step S201, the coding rate setting unit 611 decides (sets) the code length N and the coding rate r which LDPC coding is performed based on.

In step S202, the initial value table reading unit 612 reads a predetermined parity check matrix initial value table corresponding to the code length N and the coding rate r decided by the coding rate setting unit 611 from the storing unit 602.

In step S203, the parity check matrix generation unit 613 obtains (generates) the parity check matrix H of the LDPC code of the code length N and the coding rate r decided by the coding rate setting unit 611 using the parity check matrix initial value table read from the storing unit 602 by the initial value table reading unit 612, and supplies the parity check matrix H to be stored in the storing unit 602.

In step S204, the information bit reading unit 614 reads information bits of the information length K (=N×r) corresponding to the code length N and the coding rate r decided by the coding rate setting unit 611 from the LDPC target data supplied to the LDPC encoder 115, reads the parity check matrix H obtained by the parity check matrix generation unit 613 from the storing unit 602, and supplies the read information bits and the parity check matrix H to the coding parity arithmetic unit 615.

In step S205, the coding parity arithmetic unit 615 sequentially calculates parity bits of the code word c satisfying Formula (8):

$$Hc^T=0 \tag{8}$$

In Formula (8), c represents the row vector serving as the code word (the LDPC code), and $c^T$ represents transposition of the row vector c.

Here, as described above, when a portion of the information bit in the row vector c serving as the LDPC code (one code word) is represented by the row vector A and a portion of the parity bit is represented by the row vector T, the row vector c can be expressed by a formula c=[A|T] by the row vector A serving as the information bit and the row vector T serving as the parity bit.

The parity check matrix H and the row vector c=[A|T] serving as the LDPC code need to satisfy a formula $Hc^T=0$, and the row vector T serving as the parity bit configuring the row vector c=[A|T] satisfying the formula $Hc^T=0$ may be sequentially obtained by causing an element of each row to be zero (0) in order starting from an element of a first row of a column vector $Hc^T$ in the formula $Hc^T=0$ when the parity matrix $H_T$ of the parity check matrix $H=[H_A|H_T]$ has the staircase structure illustrated in FIG. 11.

When the parity bit T is obtained for the information bit A, the coding parity arithmetic unit 615 outputs the code word c=[A|T] represented by the information bit A and the parity bit T as an LDPC coding result of the information bit A.

Thereafter, in step S206, the control unit 616 determines whether or not LDPC coding is to end. When it is determined in step S206 that LDPC coding is not to end, that is, for example, when there is still LDPC target data that is to be subjected to LDPC coding, the process returns to step S201 (or step S204), and then the process of steps S201 (or step S204) to S206 is repeated.

Further, when it is determined in step S206 that LDPC coding is to end, that is, for example, when there is no LDPC target data that is to be subjected to LDPC coding, the LDPC encoder 115 ends the process.

As described above, the parity check matrix initial value table corresponding to each code length N and each coding rate r remains prepared, and the LDPC encoder 115 performs LDPC coding of a predetermined code length N and a predetermined coding rate r using the parity check matrix H generated from the parity check matrix initial value table corresponding to the predetermined code length N and the predetermined coding rate r.

[Example of Parity Check Matrix Initial Value Table]

The parity check matrix initial value table is a table that represents a position of an element of "1" of the information matrix $H_A$ (FIG. 10) of the parity check matrix H corresponding to the information length K according to the code length N and the coding rate r of the LDPC code (the LDPC code defined by the parity check matrix H) for every 360 columns (the unit column number P of the cyclic structure) and is generated in advance for each parity check matrix H of each code length N and each coding rate r.

FIG. 33 is a diagram illustrating an example of the parity check matrix initial value table.

In other words, FIG. 33 illustrates a parity check matrix initial value table corresponding to a parity check matrix H, in which the code length N is 16200 bits and the coding rate (the coding rate described in DVB-T.2) r is 1/4, specified in the DVB-T.2 standard.

The parity check matrix generation unit 613 (FIG. 31) obtains the parity check matrix H using the parity check matrix initial value table as follows.

In other words, FIG. 34 illustrates a method of obtaining the parity check matrix H from the parity check matrix initial value table.

The parity check matrix initial value table of FIG. 34 is a parity check matrix initial value table corresponding to a parity check matrix H, in which the code length N is 16200 bits and the coding rate r is 2/3, specified in the DVB-T.2 standard.

The parity check matrix initial value table is a table that represents a position of an element of "1" of the information matrix $H_A$ (FIG. 10) corresponding to the information length K according to the code length N and the coding rate r of the LDPC code for every 360 columns (the unit column number P of the cyclic structure) as described above, and in an i-th row thereof, row numbers (row numbers causing a first row number of the parity check matrix H to be 0) of elements of "1" of a (1+360×(i−1))-th column of the parity check matrix H are arranged by a number of a column weight of the (1+360×(i−1))-th column.

Here, since the parity matrix $H_T$ (FIG. 10) of the parity check matrix H corresponding to the parity length M is set as illustrated in FIG. 21, the information matrix $H_A$ (FIG. 10) of the parity check matrix H corresponding to the information length K is obtained according to the parity check matrix initial value table.

A row number k+1 of the parity check matrix initial value table differs according to the information length K.

A relation of Formula (9) is established between the information length K and the row number k+1 of the parity check matrix initial value table.

$$K=(k+1)\times 360 \tag{9}$$

Here, 360 of Formula (9) is the unit column number P of the cyclic structure described in FIG. 22.

In the parity check matrix initial value table of FIG. 34, 13 numerical numbers are arranged in each of a first row to a third row, and 3 numerical numbers are arranged in each of a fourth row to a (k+1)-th row (a 30-th row in FIG. 34).

Thus, the column weight of the parity check matrix H obtained from the parity check matrix initial value table of FIG. 34 is 13 for columns from a first column to a (1+360×(3−1)−1)-th column, and 3 for columns from a (1+360×(3−1))-th column to a K-th column.

0, 2084, 1613, 1548, 1286, 1460, 3196, 4297, 2481, 3369, 3451, 4620, and 2622 are arranged in the first row of the parity check matrix initial value table of FIG. 34, and in the first column of the parity check matrix H, this represents that elements of rows whose row numbers are 0, 2084, 1613, 1548, 1286, 1460, 3196, 4297, 2481, 3369, 3451, 4620, and 2622 are "1" (other elements are "0").

Further, 1, 122, 1516, 3448, 2880, 1407, 1847, 3799, 3529, 373, 971, 4358, and 3108 are arranged in the second column of the parity check matrix initial value table of FIG. 34, and in the 361 (=1+360×(2−1))-th column of the parity check matrix H, this represents that elements of rows whose row numbers are 1, 122, 1516, 3448, 2880, 1407, 1847, 3799, 3529, 373, 971, 4358, and 3108 are "1."

As described above, the parity check matrix initial value table represents the position of an element of 1 of the information matrix $H_A$ of the parity check matrix H for every 360 columns.

Columns of the parity check matrix H other than a (1+360×(i−1))-th column, that is, columns from a (2+360×(i−1))-th column to a (360×i)-th column are ones in which elements of 1 of the (1+360×(i−1))-th column decided by the parity check matrix initial value table are periodically cyclic-shifted downward (downward in the column direction) according to the parity length M and arranged.

In other words, for example, the (2+360×(i−1))-th column is one which the (1+360×(i−1))-th column is cyclic-shifted downward by M/360 (=q), and a next (3+360×(i−1))-th column is one in which the (1+360×(i−1))-th column is cyclic-shifted downward by 2×M/360 (=2×q) (one in which the (2+360×(i−1))-th column is cyclic-shifted downward by M/360 (=q)).

Here, when a numerical number of a j-th column (a j-th column from the left) of an i-th row (an i-th row from the top) of the parity check matrix initial value table is represented by $h_{i,j}$ and a row number of a j-th element of 1 of a w-th column of the parity check matrix H is represented by $H_{w-j}$, the row number $H_{w-j}$ of an element of 1 of the w-th column that is a column of the parity check matrix H other than the (1+360×(i−1))-th column may be obtained by Formula (10).

$$H_{w-j}=\mathrm{mod}\{h_{i,j}+\mathrm{mod}((w-1),P)\times q,M) \tag{10}$$

Here, mod(x, y) means a remainder when x is divided by y.

Further, P is the unit column number of the cyclic structure described above, and for example, 360 in the DVB-T.2 standard. Further, q is a value M/360 obtained by dividing the parity length M by the unit column number P of the cyclic structure (=360).

The parity check matrix generation unit 613 (FIG. 31) specifies the row number of an element of 1 of the (1+360×(i−1))-th column of the parity check matrix H based on the parity check matrix initial value table.

Further, the parity check matrix generation unit 613 (FIG. 31) obtains the row number $H_{w-j}$ of an element of 1 of the w-th column that is a column of the parity check matrix H other than the (1+360×(i−1))-th column according to Formula (10), and generates a parity check matrix H in which an element of the obtained row number is 1.

[LDPC Code Appropriate to Mobile Terminal]

Meanwhile, digital broadcasting for mobile terminals is advantages in cost if specifications of a transmitting device and a receiving device confirming to, for example, DVB-T.2 which is a digital broadcasting standard for fixed terminals can be implemented without any change if possible.

Here, LDPC codes of two code lengths, that is, the code lengths N of 64 k bits and 16 k bits are specified in DVB-T.2.

If an LDPC code specified in DVB-T.2 is employed in digital broadcasting for mobile terminals, since an LDPC code of a short code length rather than an LDPC code of a long code length is advantages in reducing a memory or a delay necessary at the time of LDPC code decoding or the like, it is desirable to employ the LDPC code having the short code length of 16 k bits in the LDPC codes of the two code lengths specified in DVB-T.2 in digital broadcasting for mobile terminals.

However, in mobile terminals, in order to reduce a load necessary for processing such as LDPC code decoding, for example, a repeat count (repeated decoding number C) of LDPC code decoding may be more restricted than in fixed terminals, and in digital broadcasting for mobile terminals, the LDPC code of 16 k bits specified in DVB-T.2 may not have sufficient tolerance for an error.

In this regard, the transmitting device 11 (FIG. 7) can perform digital broadcasting for mobile terminals using a new LDPC code of 16 k bits having more tolerance for an error than the LDPC code of 16 k bits specified in DVB-T.2 as an LDPC code (hereinafter, also referred to as a "mobile LDPC code") suitable for digital broadcasting for mobile terminals.

In the mobile LDPC code, in order to maintain compatibility with DVB-T.2 as much as possible, a parity matrix $H_T$ of a parity check matrix H has the staircase structure (FIG. 11), similarly to the LDPC code specified in DVB-T.2.

Further, in the mobile LDPC code, similarly to the LDPC code specified in DVB-T.2, the information matrix $H_A$ of the parity check matrix H has the cyclic structure, and the unit column number P of the cyclic structure is assumed to be 360.

FIGS. 35 to 43 are diagrams illustrating examples of a parity check matrix initial value table of the (mobile) LDPC code in which the code length N is 16 k bits.

In other words, FIG. 35 illustrates a parity check matrix initial value table for a parity check matrix H in which the code length N is 16 k bits and the coding rate r is 1/5.

FIG. 36 illustrates a parity check matrix initial value table for a parity check matrix H in which the code length N is 16 k bits and the coding rate r is 4/15.

FIG. 37 illustrates a parity check matrix initial value table for a parity check matrix H in which the code length N is 16 k bits and the coding rate r is 1/3.

FIG. 38 illustrates a parity check matrix initial value table for a parity check matrix H in which the code length N is 16 k bits and the coding rate r is 2/5.

FIG. 39 illustrates a parity check matrix initial value table for a parity check matrix H in which the code length N is 16 k bits and the coding rate r is 4/9.

FIG. 40 illustrates a parity check matrix initial value table for a parity check matrix H in which the code length N is 16 k bits and the coding rate r is 7/15.

FIG. 41 illustrates a parity check matrix initial value table for a parity check matrix H in which the code length N is 16 k bits and the coding rate r is 8/15.

FIG. 42 illustrates a parity check matrix initial value table for a parity check matrix H in which the code length N is 16 k bits and the coding rate r is 3/5.

FIG. 43 illustrates a parity check matrix initial value table for a parity check matrix H in which the code length N is 16 k bits and the coding rate r is 2/3.

The LDPC encoder 115 (FIGS. 8 and 31) performs encoding to an LDPC code in which the code length N is 16 k bits and the coding rate r is one of nine types of 1/5, 4/15, 1/3, 2/5, 4/9, 7/15, 8/15, 3/5, and 2/3 for digital broadcasting for mobile terminal using the parity check matrix H obtained from the parity check matrix initial value tables illustrated in FIGS. 35 to 43.

An LDPC code obtained using the parity check matrix H obtained from the parity check matrix initial value tables of FIGS. 35 to 43 is an LDPC code having excellent performance.

Here, the LDPC code having excellent performance is an LDPC code obtained from an appropriate parity check matrix H.

Further, the appropriate parity check matrix H is a parity check matrix that is low in BER (Bit Error Rate) and satisfies a predetermined condition when the LDPC code obtained from the parity check matrix H is transmitted at low $E_s/N_o$ (a signal power to noise power ratio per symbol) or at low $E_b/N_o$ (a signal power to noise power ratio per bit).

For example, the appropriate parity check matrix H can be obtained by performing simulation of measuring BER when LDPC codes obtained from various parity check matrices satisfying a predetermined condition are transmitted at low $E_s/N_o$.

Examples of the predetermined condition that has to be satisfied by the appropriate parity check matrix H include a condition that an analysis result obtained by a code performance analysis method called a density evolution is good and a condition that there is no loop of elements of 1 called cycle 4.

Here, when elements of 1 are densely arranged in the information matrix $H_A$ as in cycle 4, LDPC code decoding performance is known to deteriorate, and for this reason, a condition that there is no cycle 4 is necessary as the predetermined condition that has to be satisfied by the appropriate parity check matrix H.

Further, the predetermined condition that has to be satisfied by the appropriate parity check matrix H may be appropriately decided from a point of view of improvement in LDPC code decoding performance or easiness (simplification) of an LDPC code decoding process.

Figure 44:
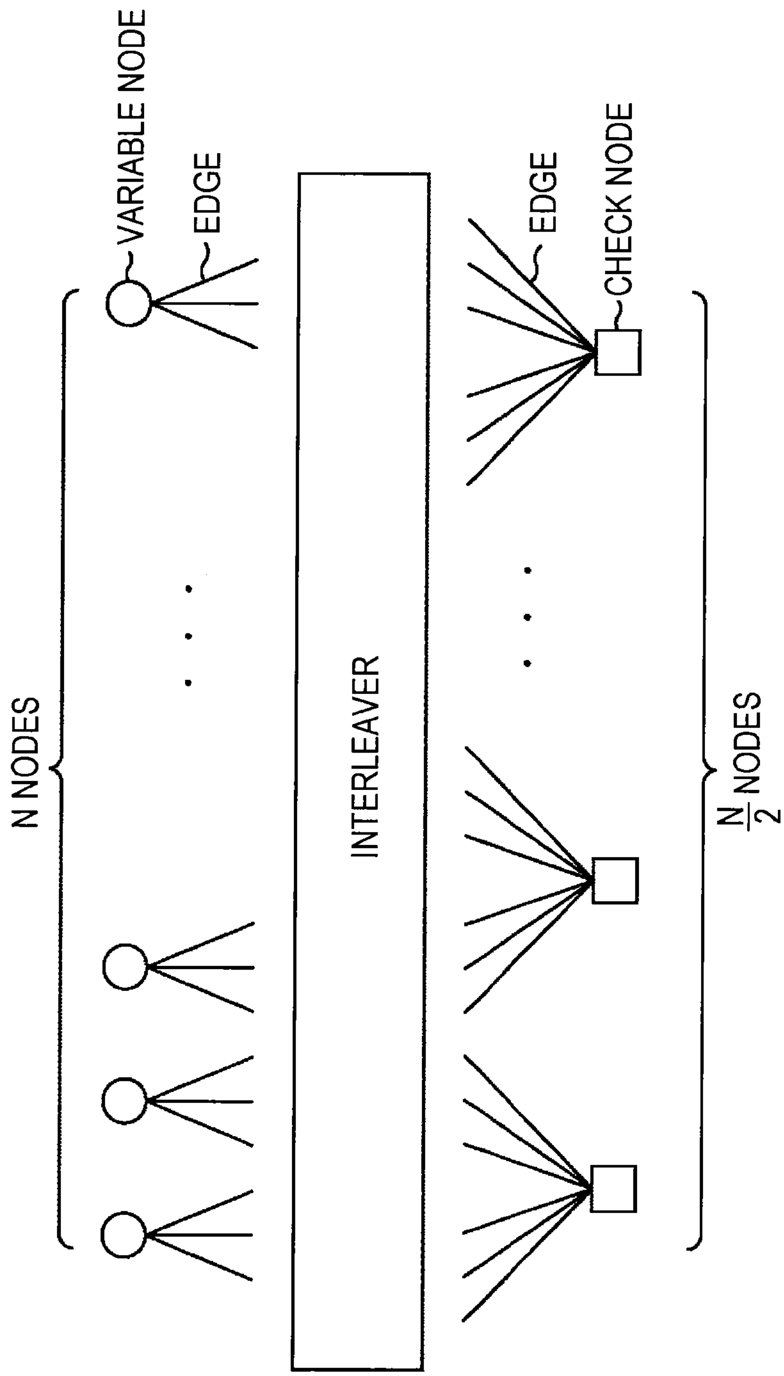
FIG. 44 is a diagram illustrating an example of a tanner graph of an ensemble of a degree sequence in which a column weight is 3 and a row weight is 6.
Figure 45:
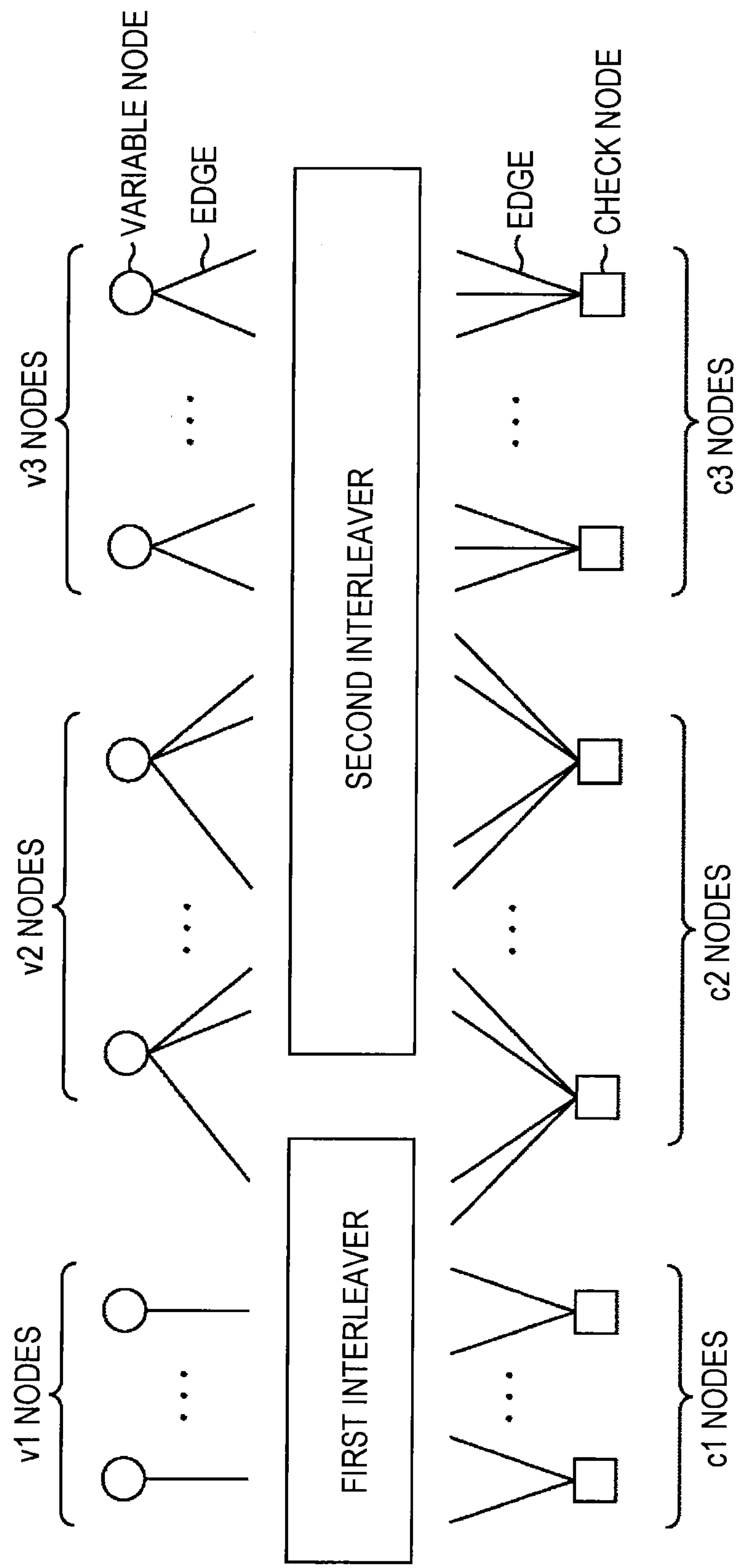
FIG. 45 is a diagram illustrating an example of a tanner graph of an ensemble of a multi-edge type.

FIGS. 44 and 45 are diagrams for describing a density evolution by which an analysis result serving as the predetermined condition that has to be satisfied by the appropriate parity check matrix H is obtained.

The density evolution is a code analysis technique of calculating an expectation value of an error probability on all LDPC codes (an ensemble) in which the code length N characterized by a degree sequence which will be described later is infinite (∞).

For example, when a variance value of noise continuously increases from 0 on an AWGN channel, an expectation value of an error probability of a certain ensemble is 0 at the beginning but is not 0 when a variance value of noise is a certain threshold value or more.

According to the density evolution, it can be decided whether performance of an ensemble is good or bad (a parity check matrix is appropriate or not) by comparing a threshold value (hereinafter, also referred to as a "performance threshold value") of the variance value of noise from which an expectation value of an error probability is not 0.

Further, when an ensemble to which a specific LDPC code belongs is decided for the specific LDPC code and then the density evolution is performed on the ensemble, rough performance of the LDPC code can be predicted.

Thus, when an ensemble having excellent performance is found, an LDPC code having excellent performance can be found from LDPC codes belonging to the ensemble.

Here, the degree sequence represents a ratio at which a variable node and a check node having a weight of each value are present on the code length N of the LDPC code.

For example, a regular (3, 6) LDPC code in which the coding rate is 1/2 belongs to an ensemble characterized by a degree sequence in which weights (column weights) of all variable nodes are 3 and weights (row weights) of all check nodes are 6.

FIG. 44 illustrates a tanner graph of such an ensemble.

In the tanner graph of FIG. 44, variable nodes indicated by a circle mark (○ mark) are present by N that is equal to the code length N, and check nodes indicated by a rectangle (□ mark) are present by N/2 that is equal to a multiplication value obtained by multiplying the code length N by the coding rate 1/2.

Three (which is equal to a column weight) edges are connected to each variable node, and thus edges connected to N variable nodes are present by 3N in total.

Further, six (which is equal to a row weight) edges are connected to each check node, and thus edges connected to N/2 check nodes are present by 3N in total.

Further, in the tanner graph of FIG. 44, there is one interleaver.

The interleaver randomly sorts the 3N edges connected to the N variable nodes, and connects each of the sorted edges to one of the 3N edges connected to the N/2 check nodes.

The number of sorting patterns of sorting the 3N edges connected to the N variable nodes is (3N)!(=(3N)×(3N−1)× . . . ×1). Thus, an ensemble characterized by a degree sequence in which weights of all variable nodes are 3 and weights of all check nodes are 6 becomes a set of (3N)! LDPC codes.

In the simulation of obtaining an LDPC code having excellent performance (an appropriate parity check matrix), an ensemble of a multi-edge type was used in the density evolution.

In the multi-edge type, an interleaver through which an edge connected to a variable node and an edge connected to a check node pass is divided into two or more (multiple edges), and thus an ensemble is more strictly characterized.

FIG. 45 illustrates an example of a tanner graph of an ensemble of a multi-edge type.

In the tanner graph of FIG. 45, there are two interleavers, that is, a first interleaver and a second interleaver.

Further, in the tanner graph of FIG. 45, there are v1 variable nodes in which one edge is connected to the first interleaver and no edge is connected to the second interleaver, v2 variable nodes in which one edge is connected to the first interleaver and two edges are connected to the second interleaver, and v3 variable nodes in which no edge is connected to the first interleaver and two edges are connected to the second interleaver.

Further, in the tanner graph of FIG. 45, there are c1 check nodes in which two edges are connected to the first interleaver and no edge is connected to the second interleaver, c2 check nodes in which two edges are connected to the first interleaver and two edges are connected to the second interleaver, and c3 check nodes in which no edge is connected to the first interleaver and three edges are connected to the second interleaver.

Here, the density evolution and implementation thereof are described, for example, in "On the Design of Low-Density Parity-Check Codes within 0.0045 dB of the Shannon Limit," S. Y. Chung, G. D. Formey, T. J. Richardson, R. Urbanke, IEEE Communications Leggers, VOL. 5, NO. 2, February 2001.

In the simulation of obtaining (the parity check matrix initial value table of) the mobile LDPC code of FIGS. 35 to 43, an ensemble in which a performance threshold value that is $E_b/N_o$ at which the BER starts to drop (starts to decrease) is a predetermined value or less is found by the density evolution of the multi-edge type, and among LDPC codes belonging to the ensemble, an LDPC code that is low in the BER in a plurality of modulation methods used by digital broadcasting for mobile terminals such as 16 QAM and 64 QAM is selected as the LDPC code having excellent performance.

Here, since mobile terminals are lower in tolerance for an error than fixed terminals, in digital broadcasting for mobile terminals, in order to improve tolerance for an error, for example, a modulation method that is relatively small in the number of signal points such as QPSK, 16 QAM, or 64 QAM is employed.

The parity check matrix initial value tables of FIGS. 35 to 43 are the parity check matrix initial value tables of an LDPC code, in which the code length N is 16 k bits, which is obtained by the above simulation.

Figures 46, 47:
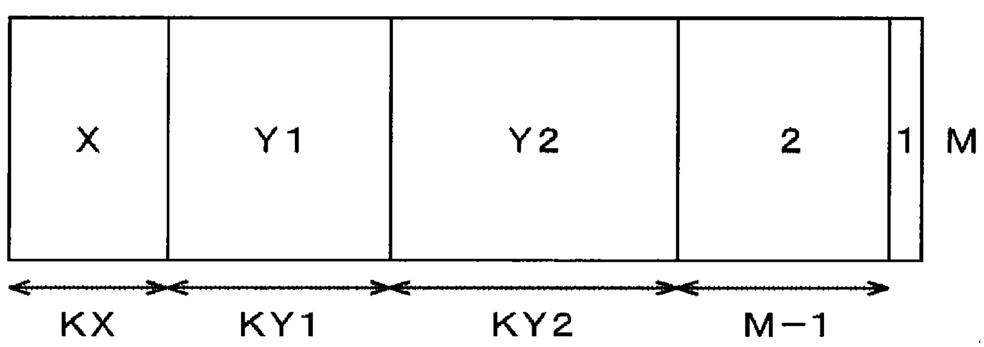
FIG. 46 is a diagram illustrating a minimum cycle length and a performance threshold value of a parity check matrix of an LDPC code having a code length of 16200.
FIG. 47 is a diagram for describing a parity check matrix of an LDPC code having a code length of 16200.

FIG. 46 is a diagram illustrating minimum cycle lengths and performance threshold values of parity check matrices H obtained from the parity check matrix initial value table of LDPC codes of FIGS. 35 to 43, where each LDPC code has the code length N of 16 k bits and one of nine types of 1/5, 4/15, 1/3, 2/5, 4/9, 7/15, 8/15, 3/5 and 2/3.

Among the parity check matrices H obtained from the parity check matrix initial value tables of FIGS. 35 to 43, the minimum cycle length of the parity check matrix H in which the coding rate r is 1/5, 4/15, or 3/5 is 8 cycles, and the minimum cycle length of the parity check matrix H in which the coding rate r is 1/3, 2/5, 4/9, 7/15, 8/15, or 2/3 is 6 cycles.

Thus, cycle 4 is not present in the parity check matrices H obtained from the parity check matrix initial value tables of FIGS. 35 to 43.

Further, since as the coding rate r decreases, redundancy of the LDPC code increases, the performance threshold value tends to be improved (decrease) as the coding rate r decreases.

FIG. 47 is a diagram for describing the parity check matrix H (hereinafter, also referred to as a parity check matrix H of a mobile LDPC code) (obtained from the parity check matrix initial value tables) of FIGS. 35 to 43.

The column weight for KX columns from the first column of the parity check matrix H of the mobile LDPC code is X, the column weight for subsequent KY1 columns is Y1, the column weight for subsequent KY2 columns is Y2, the column weight for subsequent (M−1) columns is 2, and the column weight for the last column is 1.

Here, KX+KY1+KY2+M−1+1 is equal to the code length N (=16200 bits)

FIG. 48 is a diagram illustrating the column numbers KX, KY1, KY2, and M, and the column weights X, Y1, and Y2 of FIG. 47 for the coding rates r (=1/5, 4/15, 1/3, 2/5, 4/9, 7/15, 8/15, 3/5, and 2/3) of the mobile LDPC code.

In the parity check matrix H of the mobile LDPC code in which the code length N is 16 k, similarly to the parity check matrix specified in DVB-T.2 described in FIGS. 12 and 13, a column at the beginning side (the left side) tends to be large in the column weight, and thus code bits at the beginning of the mobile LDPC code tend to be robust to an error (have tolerance for an error).

Figure 49:
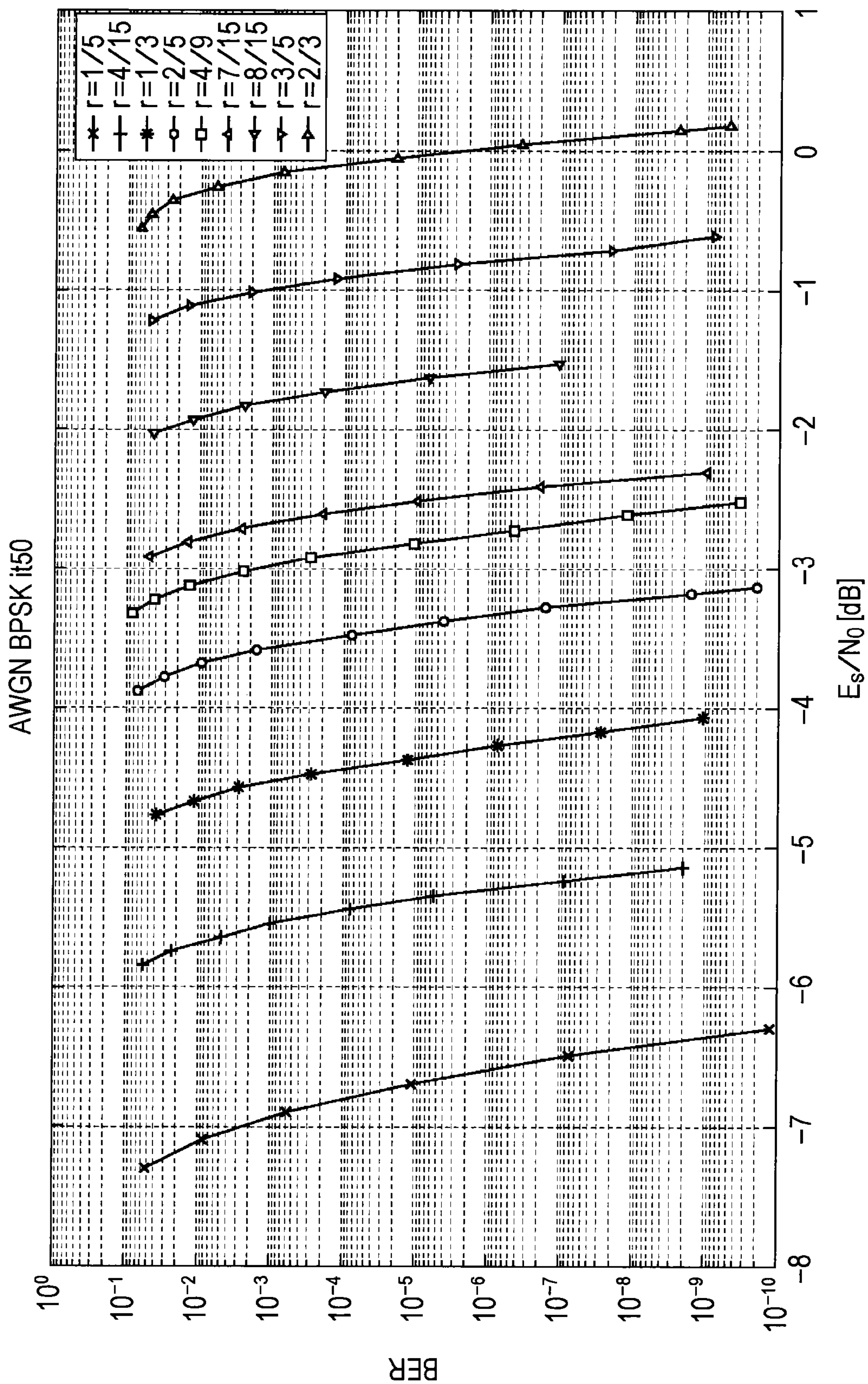
FIG. 49 is a diagram illustrating a simulation result of a BER of an LDPC code having a code length of 16200.

FIG. 49 is a diagram illustrating a BER simulation result of the mobile LDPC codes of FIGS. 35 to 43.

In the simulation, the AWGN communication path (channel) was assumed, BPSK was employed as a modulation method, and 50 was employed as the repeated decoding number C.

In FIG. 49, a horizontal axis represents $E_s/N_o$ (a signal power to noise power ratio per symbol), and a vertical axis represents a BER.

Here, among the coding rates r (=1/5, 4/15, 1/3, 2/5, 4/9, 7/15, 8/15, 3/5, and 2/3) of the mobile LDPC code, for 1/5, 1/3, 2/5, 4/9, 3/5, and 2/3, an LDPC code (hereinafter, also referred to as a "standard 16 k code") of the same coding rate in which the code length N is 16 k is specified in DVB-T.2.

In the simulation, for the mobile LDPC codes having the coding rates r of 1/5, 1/3, 2/5, 4/9, 3/5, and 2/3, the BER of an mobile LDPC code of any coding rate r is also specified in DVB-T.2 and known to be improved more than the BER of the standard 16 k code of the same coding rate, and thus tolerance for an error can be improved according to the mobile LDPC code.

Here, among 1/5, 4/15, 1/3, 2/5, 4/9, 7/15, 8/15, 3/5, and 2/3 which are the coding rates r of the mobile LDPC code, the same coding rates as 4/15, 7/15, and 8/15 are not present in the standard 16 k code.

In other words, the LDPC codes of the coding rates r (=4/15, 7/15, and 8/15), which are not present in the standard 16 k code, are present in the mobile LDPC code.

As described above, since the LDPC codes of the coding rates r (=4/15, 7/15, and 8/15), which are not present in the standard 16 k code, are present in the mobile LDPC code, the BERs for the coding rates r (=1/5, 4/15, 1/3, 2/5, 4/9, 7/15, 8/15, 3/5, and 2/3) of the mobile LDPC code are arranged at relatively equal intervals in which an interval in a $E_s/N_o$ direction is a short interval of a predetermined interval of about 1 dB or less, as illustrated in FIG. 49.

Meanwhile, since the standard 16 k code does not have 4/15, 7/15, and 8/15 as the coding rate r of the standard 16 k code, there are relatively large gaps of about 2 dB in a $E_s/N_o$ direction between the BER when the coding rate r is 1/5 (1/4 in the specification of DVB-T.2) and the BER when the coding rate r is 1/3 and between the BER when the coding rate r is 4/9 (1/2 in the specification of DVB-T.2) and the BER when the coding rate r is 3/5, and thus due to the large gaps, the BERs of the standard 16 k code are non-uniformly arranged.

For a broadcasting organization performing broadcasting of program through the transmitting device 11, rather than the standard 16 k code in which there is a large gap of about 2 db in the BER arrangement and the BER arrangement is not uniform, the mobile LDPC code in which the BERs are arranged at relatively small equal intervals of about 1 db or less has the advantage of easily selecting a coding rate used for broadcasting according to a status of a channel (the communication path 13) or the like.

[Exchange Process of LDPC Code Having Code Length N of 16200 Bits]

In digital broadcasting for mobile terminals, when the mobile LDPC code described above, that is, the LDPC code having the code length N of 16200 bits is employed, for example, tolerance for an error in the communication path 13 (FIG. 7) decreases compared to the LDPC code having the long code length N of 64800 bits specified in DVB-T.2.

In this regard, in digital broadcasting for mobile terminals, it is desirable to execute a countermeasure for improving tolerance for an error.

As a countermeasure for improving tolerance for an error, for example, there is an exchange process performed by the demultiplexer 25 (FIG. 9) as well as a method of employing a modulation method in which the number of signal points is relatively small such as 16 QAM or 64 QAM as described above.

In the exchange process, as an exchanging method of exchanging the code bits of the LDPC code specified in the standard such as DVB-T.2, for example, the first to fourth exchanging methods and an exchanging method specified in the standard such as DVB-T.2 may be used.

Here, when digital broadcasting for mobile terminals is performed using the mobile LDPC code having the code length N of 16200 bits, it is desirable to employ the exchange process suitable for the mobile LDPC code.

In other words, as the exchange process employed for the mobile LDPC code, it is desirable to employ an exchange process in a method of further improving tolerance for an error.

In this regard, the demultiplexer 25 (FIG. 9) is configured to be able to perform the exchange process according to the allocation rule as described above with reference to FIG. 27.

The exchange process according to the allocation rule will be described below, but, before that, an exchange process according to an already proposed exchanging method (hereinafter, also referred to as a "current method") will be first described.

The exchange process will be described with reference to FIGS. 50 and 51 in connection with an example in which the demultiplexer 25 performs the exchange process on the LDPC code (hereinafter, also referred to as a "specified code") specified in DVB-T.2 or the like according to the current method.

Figure 50:
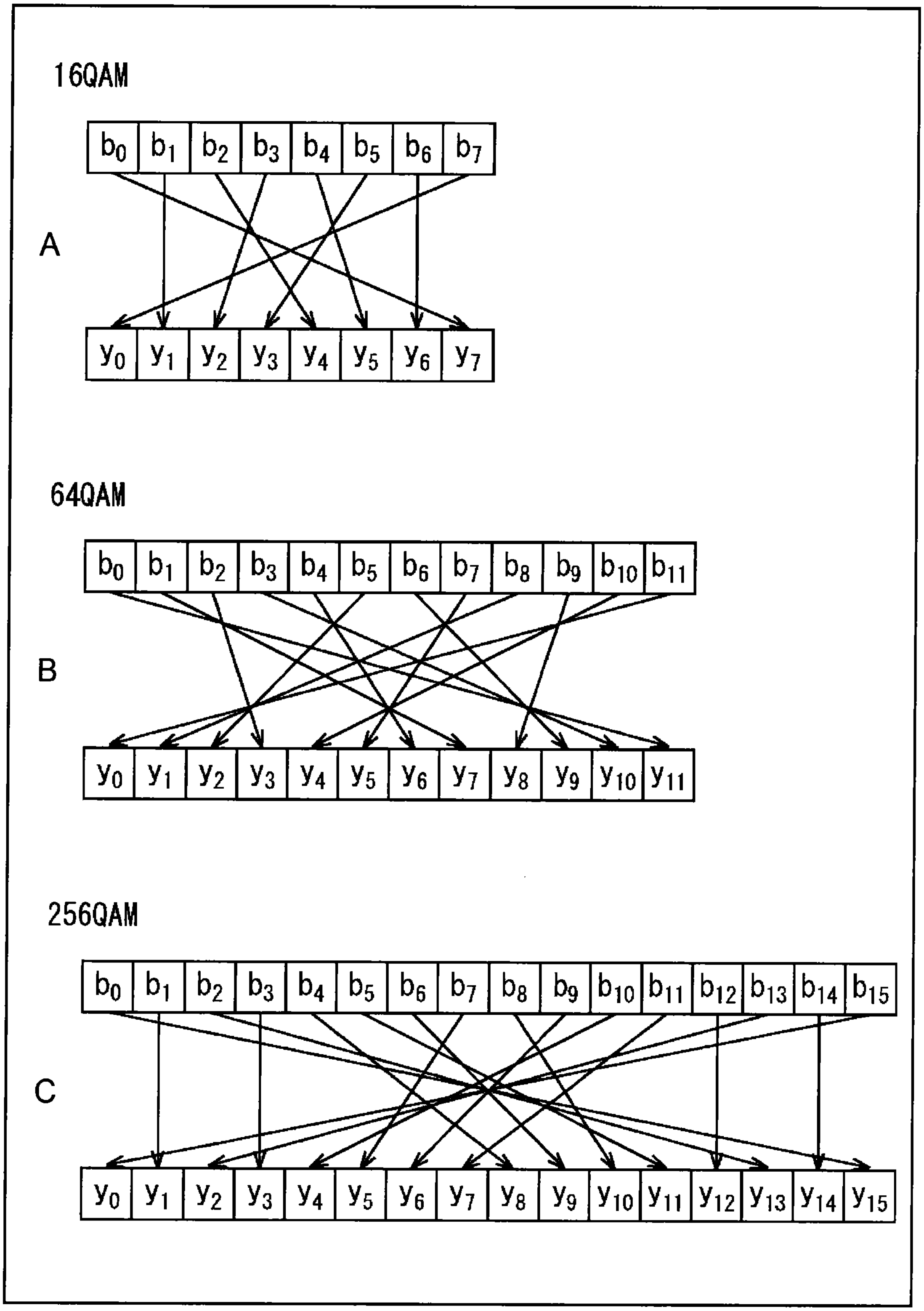
FIG. 50 is a diagram for describing an exchange process of a current method.

FIG. 50 illustrates an example of the exchange process of the current method when the LDPC code is an LDPC code in which the code length N is 64800 bits and the coding rate is 3/5, which is specified in the DVB-T.2.

In other words, A of FIG. 50 illustrates an example of the exchange process of the current method when the LDPC code is a specified code in which the code length N is 64800 bits, the coding rate is 3/5, the modulation method is 16 QAM, and the multiple b is 2.

When the modulation method is 16 QAM, 4(=m) code bits are mapped to any one of 16 signal points set in 16 QAM as a single symbol.

Further, when the code length N is 64800 bits and the multiple b is 2, the memory 31 of the demultiplexer 25 (FIGS. 18 and 19) includes 8 columns storing 4×2 (=mb) bits in the row direction and stores 64800/(4×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 4×2 (=mb) bits and then supplied to the exchange unit 32 (FIGS. 18 and 19).

The exchange unit 32 exchanges the code bits $b_0$ to $b_7$ of 4×2(=mb) bits such that the code bits $b_0$, $b_1$, $b_2$, $b_3$, $b_4$, $b_5$, $b_6$, and $b_7$ of 4×2(=mb) bits read from the memory 31 are allocated to the symbol bits $y_0$, $y_1$, $y_2$, $y_3$, $y_4$, $y_5$, $y_6$, and $y_7$ of 4×2 (=mb) bits of consecutive 2 (=b) symbols, for example, as illustrated in A of FIG. 50.

In other words, the exchange unit 32 performs exchanging such that the code bit $b_0$ is allocated to the symbol bit $y_7$;
the code bit $b_1$ is allocated to the symbol bit $y_1$;
the code bit $b_2$ is allocated to the symbol bit $y_4$;
the code bit $b_3$ is allocated to the symbol bit $y_2$;
the code bit $b_4$ is allocated to the symbol bit $y_5$;
the code bit $b_5$ is allocated to the symbol bit $y_3$;
the code bit $b_6$ is allocated to the symbol bit $y_6$; and
the code bit $b_7$ is allocated to the symbol bit $y_0$.

B of FIG. 50 illustrates an example of the exchange process of the current method when the LDPC code is a specified code in which the code length N is 64800 bits, the coding rate is 3/5, the modulation method is 64 QAM, and the multiple b is 2.

When the modulation method is 64 QAM, 6(=m) code bits are mapped to any one of 64 signal points set in 64 QAM as a single symbol.

Further, when the code length N is 64800 bits and the multiple b is 2, the memory 31 of the demultiplexer 25 (FIGS.

18 and 19) includes 12 columns storing 6×2(=mb) bits in the row direction and stores 64800/(6×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 6×2(=mb) bits and then supplied to the exchange unit 32 (FIGS. 18 and 19).

The exchange unit 32 exchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$, and $y_{11}$ of 6×2(=mb) bits of consecutive 2 (=b) symbols, for example, as illustrated in B of FIG. 50.

In other words, the exchange unit 32 performs exchanging such that the code bit $b_0$ is allocated to the symbol bit $y_{11}$,
the code bit $b_1$ is allocated to the symbol bit $y_7$;
the code bit $b_2$ is allocated to the symbol bit $y_3$;
the code bit $b_3$ is allocated to the symbol bit $y_{10}$;
the code bit $b_4$ is allocated to the symbol bit $y_6$;
the code bit $b_5$ is allocated to the symbol bit $y_2$;
the code bit $b_6$ is allocated to the symbol bit $y_9$;
the code bit $b_7$ is allocated to the symbol bit $y_5$;
the code bit $b_8$ is allocated to the symbol bit $y_1$;
the code bit $b_9$ is allocated to the symbol bit $y_8$;
the code bit $b_{10}$ is allocated to the symbol bit $y_4$; and
the code bit $b_{11}$ is allocated to the symbol bit $y_0$.

C of FIG. 50 illustrates an example of the exchange process of the current method when the LDPC code is a specified code in which the code length N is 64800 bits, the coding rate is 3/5, the modulation method is 256 QAM, and the multiple b is 2.

When the modulation method is 256 QAM, 8 (=m) code bits are mapped to any one of 256 signal points set in 256 QAM as a single symbol.

Further, when the code length N is 64800 bits and the multiple b is 2, the memory 31 of the demultiplexer 25 (FIGS. 18 and 19) includes 16 columns storing 8×2(=mb) bits in the row direction and stores 64800/(8×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 8×2(=mb) bits and then supplied to the exchange unit 32 (FIGS. 18 and 19).

The exchange unit 32 exchanges the code bits $b_0$ to $b_{15}$ of 8×2 (=mb) bits such that the code bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ of 8×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 8×2 (=mb) bits of consecutive 2 (=b) symbols, for example, as illustrated in C of FIG. 50.

In other words, the exchange unit 32 performs exchanging such that the code bit $b_0$ is allocated to the symbol bit $y_{15}$,
the code bit $b_1$ is allocated to the symbol bit $y_1$;
the code bit $b_2$ is allocated to the symbol bit $y_{13}$;
the code bit $b_3$ is allocated to the symbol bit $y_3$;
the code bit $b_4$ is allocated to the symbol bit $y_8$;
the code bit $b_5$ is allocated to the symbol bit $y_{11}$;
the code bit $b_6$ is allocated to the symbol bit $y_9$;
the code bit $b_7$ is allocated to the symbol bit $y_5$;
the code bit $b_8$ is allocated to the symbol bit $y_{10}$;
the code bit $b_9$ is allocated to the symbol bit $y_6$;
the code bit $b_{10}$ is allocated to the symbol bit $y_4$;
the code bit $b_{11}$ is allocated to the symbol bit $y_7$;
the code bit $b_{12}$ is allocated to the symbol bit $y_{12}$;
the code bit $b_{13}$ is allocated to the symbol bit $y_2$;
the code bit $b_{14}$ is allocated to the symbol bit $y_{14}$; and
the code bit $b_{15}$ is allocated to the symbol bit $y_0$.

Figure 51:
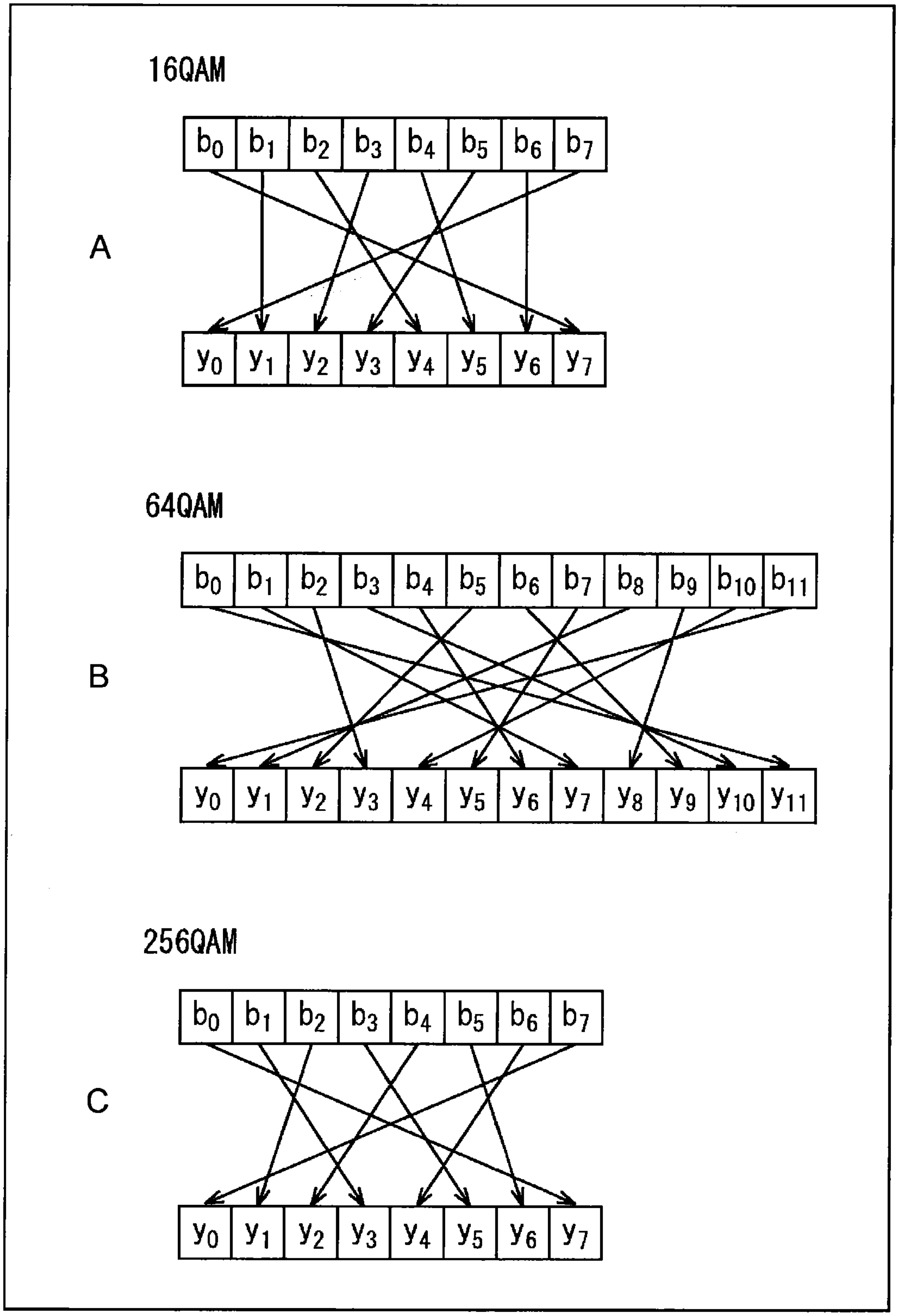
FIG. 51 is a diagram for describing an exchange process of a current method.

FIG. 51 illustrates an example of the exchange process of the current method when the LDPC code is a specified code in which the code length N is 16200 bits and the coding rate is 3/5.

In other words, A of FIG. 51 illustrates an example of the exchange process of the current method when the LDPC code is an LDPC code in which the code length N is 16200 bits, the coding rate is 3/5, the modulation method is 16 QAM, and the multiple b is 2.

When the modulation method is 16 QAM, 4(=m) code bits are mapped to any one of 16 signal points set in 16 QAM as a single symbol.

Further, when the code length N is 16200 bits and the multiple b is 2, the memory 31 of the demultiplexer 25 (FIGS. 18 and 19) includes 8 columns storing 4×2 (=mb) bits in the row direction and stores 16200/(4×2) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 4×2(=mb) bits and then supplied to the exchange unit 32 (FIGS. 18 and 19).

The exchange unit 32 exchanges the code bits $b_0$ to $b_7$ of 4×2 (=mb) bits such that the code bits $b_0$, $b_1$, $b_2$, $b_3$, $b_4$, $b_5$, $b_6$, and $b_7$ of 4×2 (=mb) bits read from the memory 31 are allocated to the symbol bits $y_0$, $y_1$, $y_2$, $y_3$, $y_4$, $y_5$, $y_6$, and $y_7$ of 4×2(=mb) bits of consecutive 2 (=b) symbols, for example, as illustrated in A of FIG. 51.

In other words, the exchange unit 32 performs exchanging such that the code bits $b_0$ to $b_7$ are allocated to the symbol bits $y_0$ to $y_7$, similarly to the example of A of FIG. 50.

B of FIG. 51 illustrates an example of the exchange process of the current method when the LDPC code is a specified code in which the code length N is 16200 bits, the coding rate is 3/5, the modulation method is 64 QAM, and the multiple b is 2.

When the modulation method is 64 QAM, 6(=m) code bits are mapped to any one of 64 signal points set in 64 QAM as a single symbol.

Further, when the code length N is 16200 bits and the multiple b is 2, the memory 31 of the demultiplexer 25 (FIGS. 18 and 19) includes 12 columns storing 6×2(=mb) bits in the row direction and stores 16200/(6×2) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 6×2 (=mb) bits and then supplied to the exchange unit 32 (FIGS. 18 and 19).

The exchange unit 32 exchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$, and $y_{11}$ of 6×2(=mb) bits of consecutive 2 (=b) symbols, for example, as illustrated in B of FIG. 51.

In other words, the exchange unit 32 performs exchanging such that the code bits $b_0$ to $b_{11}$ are allocated to the symbol bits $y_0$ to $y_{11}$, similarly to the example of B of FIG. 50.

C of FIG. 51 illustrates an example of the exchange process of the current method when the LDPC code is a specified code in which the code length N is 16200 bits, the coding rate is 3/5, the modulation method is 256 QAM, and the multiple b is 1.

When the modulation method is 256 QAM, 8 (=m) code bits are mapped to any one of 256 signal points set in 256 QAM as a single symbol.

Further, when the code length N is 16200 bits and the multiple b is 1, the memory 31 of the demultiplexer 25 (FIGS. 18 and 19) includes 8 columns storing 8×1 (=mb) bits in the row direction and stores 16200/(8×1) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 8×1(=mb) bits and then supplied to the exchange unit 32 (FIGS. 18 and 19).

The exchange unit 32 exchanges the code bits $b_0$ to $b_7$ of 8×1(=mb) bits such that the code bits $b_0$, $b_1$, $b_2$, $b_3$, $b_4$, $b_5$, $b_6$, and $b_7$ of 8×1(=mb) bits read from the memory 31 are allocated to the symbol bits $y_0$, $y_1$, $y_2$, $y_3$, $y_4$, $y_5$, $y_6$, and $y_7$ of 8×1 (=mb) bits of 1(=b) symbol, for example, as illustrated in C of FIG. 51.

In other words, the exchange unit 32 performs exchanging such that the code bit $b_0$ is allocated to the symbol bit $y_7$,
the code bit $b_1$ is allocated to the symbol bit $y_3$;
the code bit $b_2$ is allocated to the symbol bit $y_1$;
the code bit $b_3$ is allocated to the symbol bit $y_5$;
the code bit $b_4$ is allocated to the symbol bit $y_2$;
the code bit $b_5$ is allocated to the symbol bit $y_6$;
the code bit $b_6$ is allocated to the symbol bit $y_4$; and
the code bit $b_7$ is allocated to the symbol bit $y_0$.

Next, the exchange process according to the allocation rule (hereinafter, also referred to as an "exchange process of a new exchanging method") will be described.

In digital broadcasting for mobile terminals, a modulation method having a small number of signal points such as QPSK, 16 QAM, or 64 QAM is employed, and the new exchanging method will be described in connection with an example in which the modulation method is 16 QAM and an example in which the modulation method is 64 QAM.

Further, when the modulation method is QPSK, since symbol bits $y_0$ and $y_1$ of 2 bits representing four symbols (signal points) of QPSK do not have a relation in which one is robust to an error and the other is weak to an error which is described above with reference to FIGS. 14 to 17, it is unnecessary to perform the exchange process (even when the exchange process is performed, tolerance for an error does not change)

Figure 52:
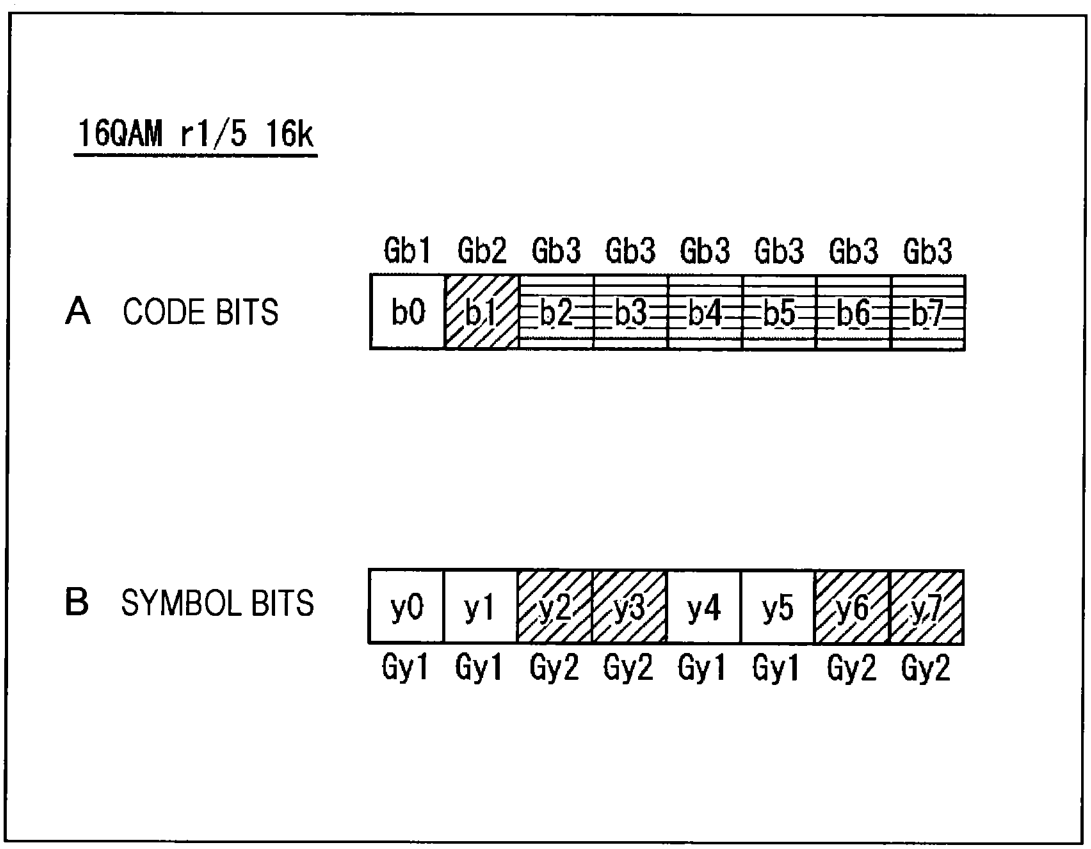
FIG. 52 is a diagram illustrating a code bit group and a symbol bit group when an LDPC code having a code length of 16200 and a coding rate of 1/5 is modulated by 16 QAM, and a multiple b is 2.
Figure 53:
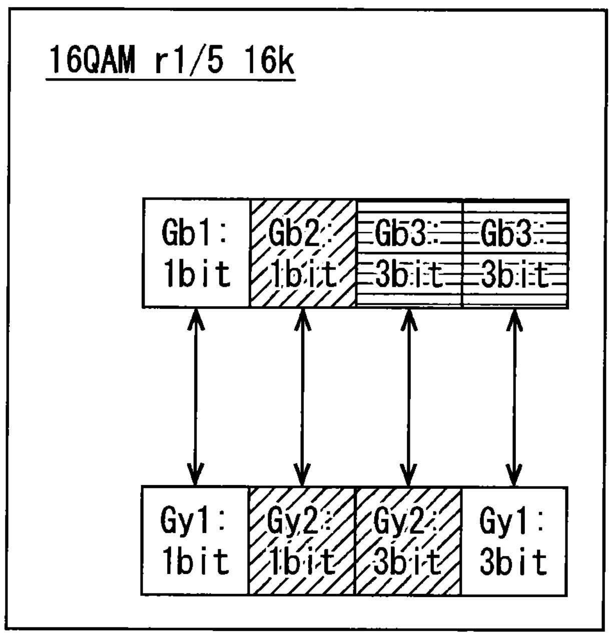
FIG. 53 is a diagram illustrating an allocation rule when an LDPC code having a code length of 16200 and a coding rate of 1/5 is modulated by 16 QAM, and a multiple b is 2.
Figure 54:
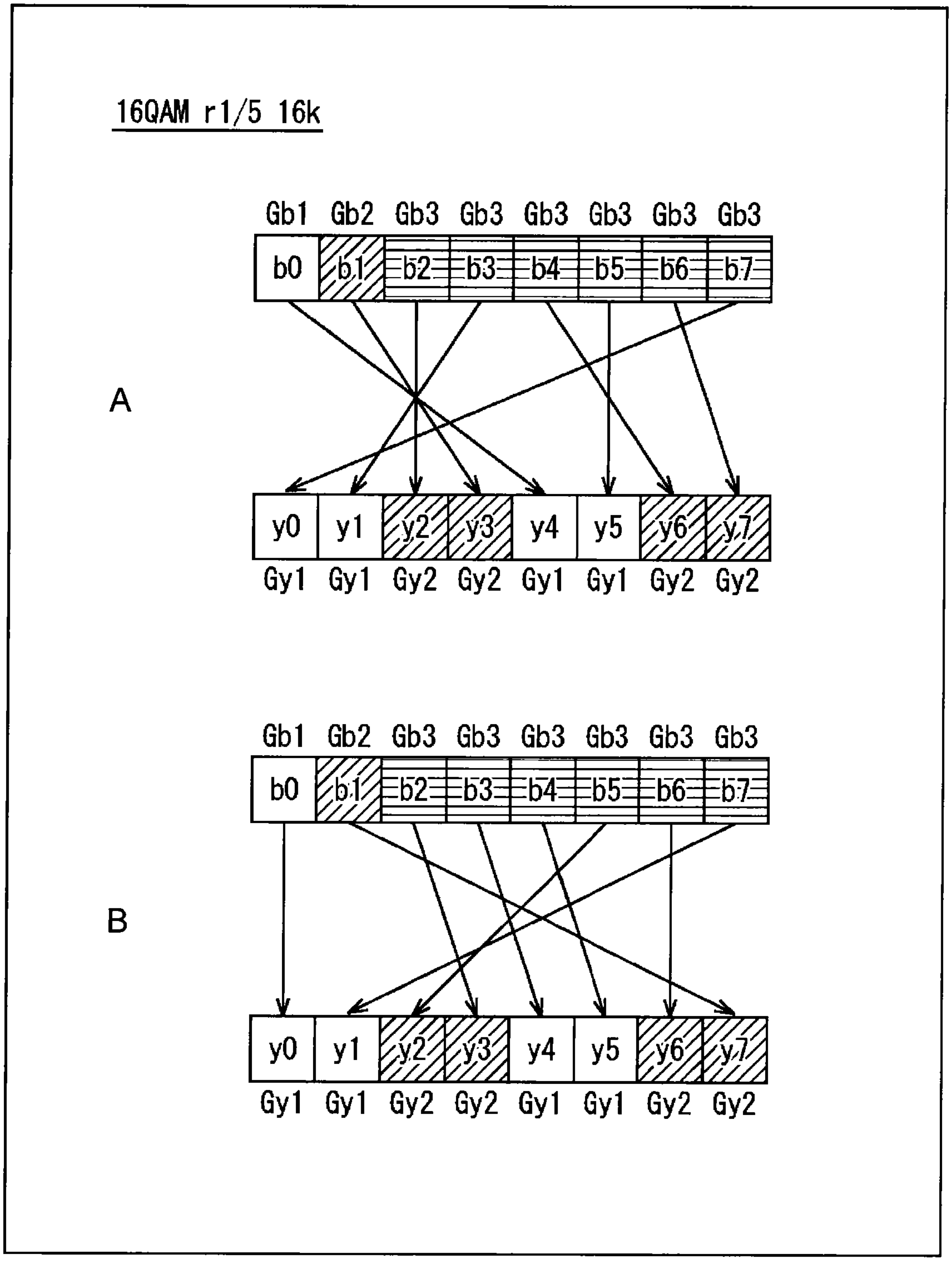
FIG. 54 is a diagram illustrating exchanging of code bits according to an allocation rule when an LDPC code having a code length of 16200 and a coding rate of 1/5 is modulated by 16 QAM, and a multiple b is 2.

FIGS. 52 to 54 (and FIGS. 55 to 105) are diagrams for describing the new exchanging method.

In the new exchanging method, the exchange unit 32 of the demultiplexer 25 performs exchanging of code bits of mb bits according to a predetermined allocation rule.

The allocation rule is a rule of allocating the code bits of the LDPC code to the symbol bits. The allocation rule specifies a group set that is a combination of a code bit group of code bits and a symbol bit group of symbol bits to which code bits of the code bit group are allocated, and bit numbers (hereinafter, also referred to as a "group bit number") of code bits and symbol bits of the code bit group and the symbol bit group of the group set.

Here, as described above, there is a difference in an error probability between code bits, and there is a difference in an error probability between symbol bits. The code bit group is a group for grouping code bits according an error probability, and the symbol bit group is a group of grouping symbol bits according to an error probability.

FIG. 52 illustrates a code bit group and a symbol bit group when an LDPC code is a mobile LDPC code in which the code length N is 16200 bits, the coding rate is 1/5, the modulation method is 16 QAM (thus, m=4), and the multiple b is 2.

In this case, the code bits of 4×2(=mb) bits read from the memory 31 may be grouped into 3 code bit groups Gb1, Gb2, and Gb3 according to the difference in the error probability as illustrated in A of FIG. 52.

Here, in a code bit group Gb#i, the smaller a suffix #i is, the better (smaller) a group is in the error probability of code bits belonging to the code bit group Gb#i.

In the following, among code bits of mb bits read from the memory 31 in the row direction, a (#i+1)-th bit from the most significant bit is also represented by a bit b#i, and among symbol bits of mb bits of consecutive b symbols, a (#i+1)-th bit from the most significant bit is also represented by a bit y#i.

In A of FIG. 52, the code bit b0 belongs to the code bit group Gb1, the code bit b1 belongs to the code bit group Gb2, and code bits b2, b3, b4, b5, b6, and b7 belong to the code bit group Gb3.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 52.

Here, in a symbol bit group Gy#i, similarly to the code bit group, the smaller a suffix #i is, the better a group is in the error probability of the symbol bits belonging to the symbol bit group Gy#i.

In B of FIG. 52, the symbol bits y0, y1, y4, and y5 belong to the symbol bit group Gy1, and the symbol bits y2, y3, y6, and y7 belong to the symbol bit group Gy2.

FIG. 53 illustrates an allocation rule when an LDPC code is a mobile LDPC code in which the code length N is 16200 bits and the coding rate is 1/5, the modulation method is 16 QAM, and the multiple b is 2.

In the allocation rule of FIG. 53, a combination of the code bit group Gb1 and the symbol bit group Gy1 is specified as one group set. Further, the group bit number of the group set is specified as 1.

Here, in the following, the group set and the group bit number thereof are referred to collectively as a "group set information." Further, for example, the group set of the code bit group Gb1 and the symbol bit group Gy1 and 1 which is the group bit number of the group set are represented by group set information (Gb1, Gy1, 1).

In the allocation rule of FIG. 53, in addition to the group set information (Gb1, Gy1, 1), pieces of group set information (Gb2, Gy2, 1), (Gb3, Gy2, 3), and (Gb3, Gy1, 3) are specified.

For example, the group set information (Gb1, Gy1, 1) means that 1 bit of the code bits belonging to the code bit group Gb1 is allocated to 1 bit of the symbol bits belonging to the symbol bit group Gy1.

In this regard, the allocation rule of FIG. 53 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 3 bits of the code bits of the code bit group Gb3 having the third highest error probability are allocated to 3 bits of the symbol bits of the symbol bit group Gy2 having the second highest error probability based on the group set information (Gb3, Gy2, 3); and that 3 bits of the code bits of the code bit group Gb3 having the third highest error probability are allocated to 3 bits of the symbol bits of the symbol bit group Gy1 having the highest error probability based on the group set information (Gb3, Gy1, 3).

As described above, the code bit group is a group for grouping code bits according the error probability, and the symbol bit group is a group of grouping symbol bits according to the error probability. Thus, it can be said that the allocation rule specifies a combination of the error probability of code bits and the error probability of symbol bits to which the code bits are allocated.

The allocation rule specifying a combination of the error probability of code bits and the error probability of symbol bits to which the code bits are allocated as described above is decide to further improve tolerance for an error (tolerance for noise), for example, through simulation of measuring a BER.

Further, even when an allocation destination of a code bit of a certain code bit group is changed among bits of the same symbol bit group, tolerance for an error is not (or hardly) affected.

Thus, in order to improve tolerance for an error, preferably, group set information causing a BER (Bit Error Rate) to be minimum, that is, a combination (a group set) of a code bit group of code bits and a symbol bit group of symbol bits to which the code bits of the code bit group are allocated and a bit number (a group bit number) of code bits and symbol bits of the code bit group and the symbol bit group of the group set are specified as the allocation rule, and exchanging of code bits is performed according to the allocation rule such that code bits are allocated to symbol bits.

Here, a concrete allocation method of allocating code bits to symbol bit according to the allocation rule need be decided in advance between the transmitting device 11 and the receiving device 12 (FIG. 7).

FIG. 54 illustrates an example of exchanging of code bits according to the allocation rule of FIG. 53.

In other words, A of FIG. 54 illustrates a first example of exchanging of code bits according to the allocation rule of FIG. 53 when an LDPC code is a mobile LDPC code in which the code length N is 16200 bits, the coding rate is 1/5, the modulation method is 16 QAM, and the multiple b is 2.

When an LDPC code is a mobile LDPC code in which the code length N is 16200 bits and the coding rate is 1/5, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 53 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 54.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;
the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 54 illustrates a second example of exchanging of code bits according to the allocation rule of FIG. 53 when an LDPC code is a mobile LDPC code in which the code length N is 16200 bits and the coding rate is 1/5, the modulation method is 16 QAM, and the multiple b is 2.

According to B of FIG. 54, the exchange unit 32 exchanges the code bits b0 to b7 of 4×2 (=mb) bits read from the memory 31 according to the allocation rule of FIG. 53 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Here, both of the methods of allocating the code bit b#i to the symbol bit y#i illustrated in A and B of FIG. 54 follow the allocation rule of FIG. 53 (observe the allocation rule).

Figure 55:
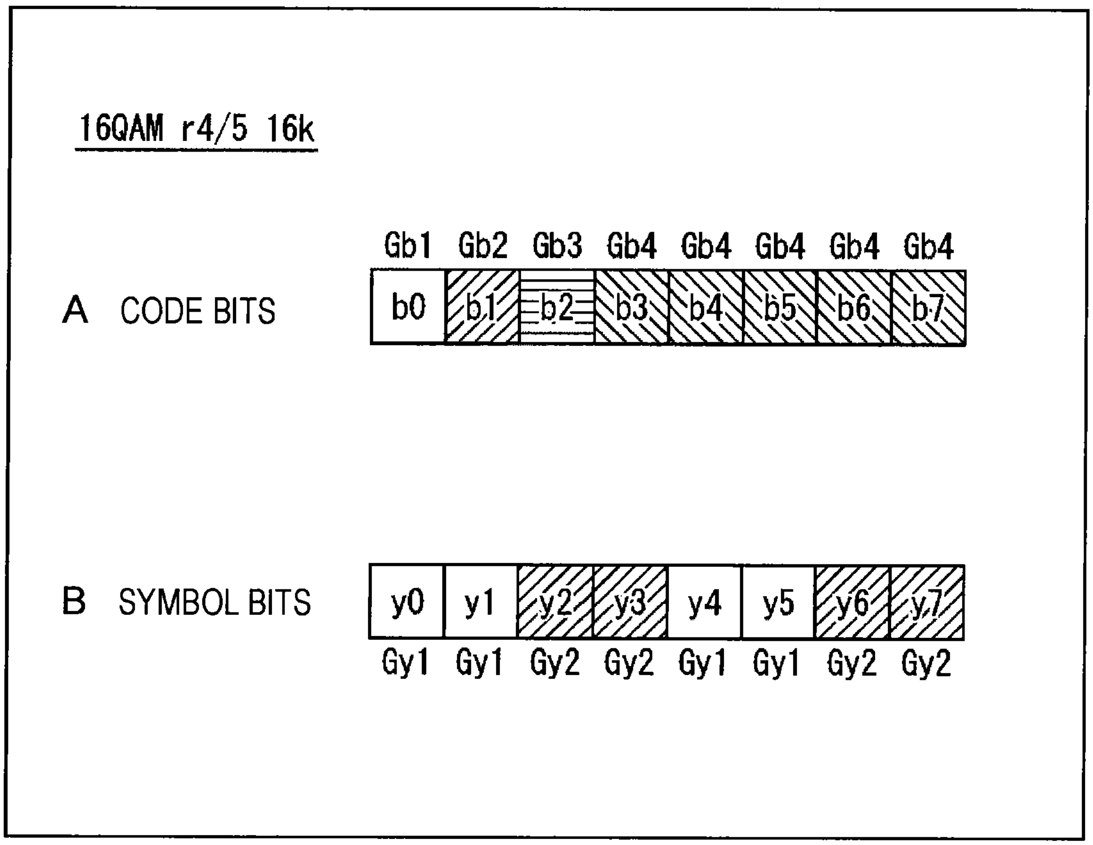
FIG. 55 is a diagram illustrating a code bit group and a symbol bit group when an LDPC code having a code length of 16200 and a coding rate of 4/15 is modulated by 16 QAM, and a multiple b is 2.

FIG. 55 illustrates a code bit group and a symbol bit group when an LDPC code is a mobile LDPC code in which the code length N is 16200 bits and the coding rate is 4/15, the modulation method is 16 QAM, and the multiple b is 2.

In this case, the code bits of 4×2(=mb) bits read from the memory 31 may be grouped into 4 code bit groups Gb1, Gb2, Gb3, and Gb4 according to the difference in the error probability as illustrated in A of FIG. 55.

In A of FIG. 55, the code bit b0 belongs to the code bit group Gb1, the code bit b1 belongs to the code bit group Gb2, the code bit b2 belongs to the code bit group Gb3, and the code bits b3 to b7 belong to the code bit group Gb4.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 55.

In B of FIG. 55, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 56:
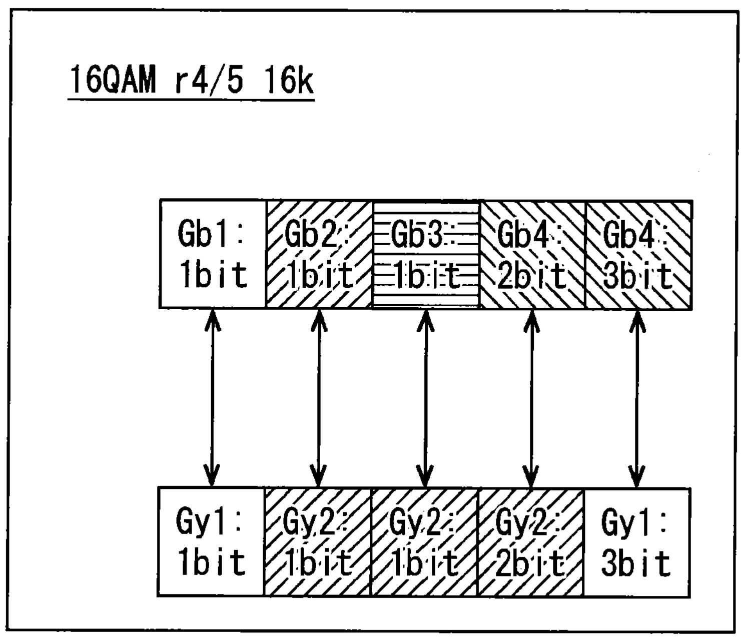
FIG. 56 is a diagram illustrating an allocation rule when an LDPC code having a code length of 16200 and a coding rate of 4/15 is modulated by 16 QAM, and a multiple b is 2.

FIG. 56 illustrates an allocation rule when an LDPC code is a mobile LDPC code in which the code length N is 16200 bits and the coding rate is 4/15, the modulation method is 16 QAM, and the multiple b is 2.

In the allocation rule of FIG. 56, pieces of group set information (Gb1, Gy1, 1), (Gb2, Gy2, 1), (Gb3, Gy2, 1), (Gb4, Gy2, 2), and (Gb4, Gy1, 3) are specified.

In other words, the allocation rule of FIG. 56 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 1 bit of the code bits of the code bit group Gb3 having the third highest error probability is allocated to 1 bit of the symbol bits of the symbol bit group Gy2 having the second highest error probability based on the group set information (Gb3, Gy2, 1);

that 2 bits of the code bits of the code bit group Gb4 having the fourth highest error probability are allocated to 2 bits of the symbol bits of the symbol bit group Gy2 having the second highest error probability based on the group set information (Gb4, Gy2, 2); and that 3 bits of the code bits of the code bit group Gb4 having the fourth highest error probability are allocated to 3 bits of the symbol bits of the symbol bit group Gy1 having the highest error probability based on the group set information (Gb4, Gy1, 3).

Figure 57:
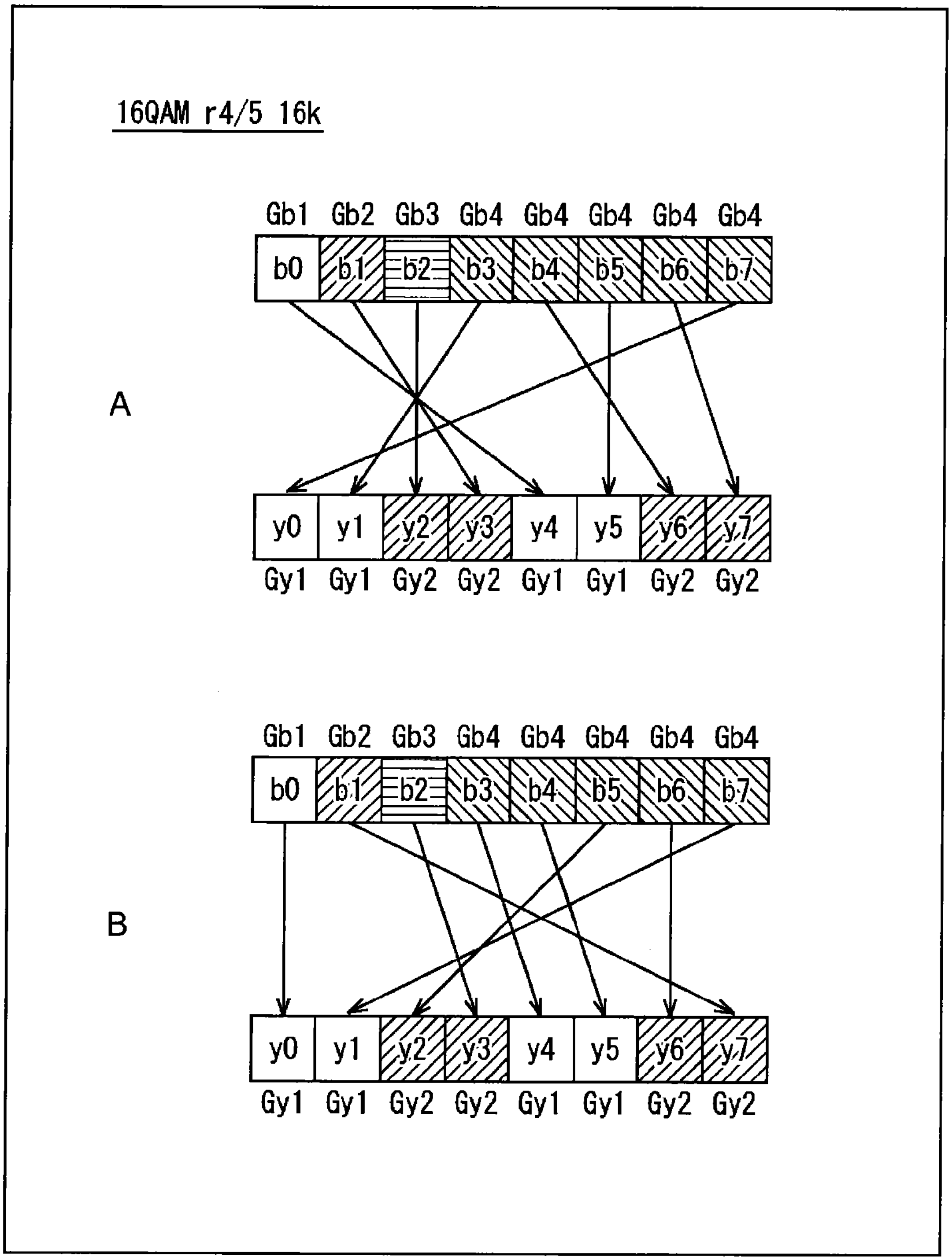
FIG. 57 is a diagram illustrating exchanging of code bits according to an allocation rule when an LDPC code having a code length of 16200 and a coding rate of 4/15 is modulated by 16 QAM, and a multiple b is 2.

FIG. 57 illustrates an example of exchanging of code bits according to the allocation rule of FIG. 56.

In other words, A of FIG. 57 illustrates a first example of exchanging of code bits according to the allocation rule of FIG. 56 when an LDPC code is a mobile LDPC code in which the code length N is 16200 bits and the coding rate is 4/15, the modulation method is 16 QAM, and the multiple b is 2.

When an LDPC code is a mobile LDPC code in which the code length N is 16200 bits and the coding rate is 4/15, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 56 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 57.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;
the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 57 illustrates a second example of exchanging of code bits according to the allocation rule of FIG. 56 when an LDPC code is a mobile LDPC code in which the code length N is 16200 bits and the coding rate is 4/15, the modulation method is 16 QAM, and the multiple b is 2.

According to B of FIG. 57, the exchange unit 32 exchanges the code bits b0 to b7 of 4×2 (=mb) bits read from the memory 31 according to the allocation rule of FIG. 56 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Figure 58:
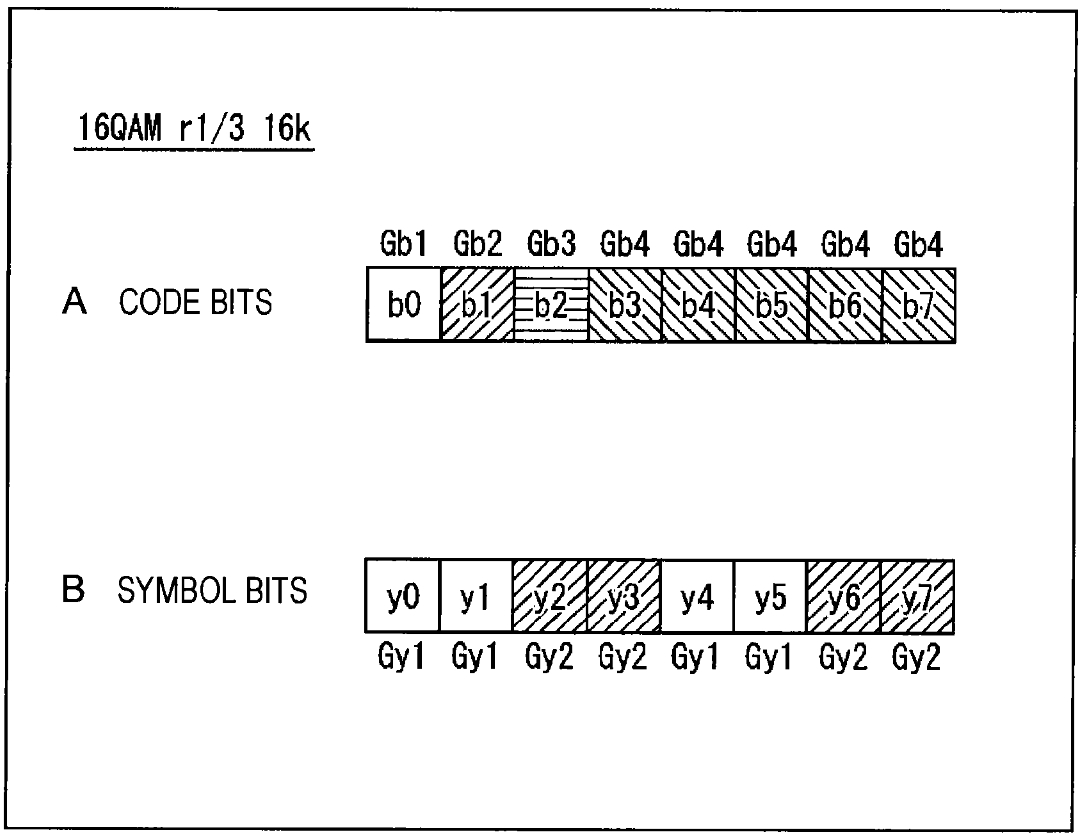
FIG. 58 is a diagram illustrating a code bit group and a symbol bit group when an LDPC code having a code length of 16200 and a coding rate of 1/3 is modulated by 16 QAM, and a multiple b is 2.

FIG. 58 illustrates a code bit group and a symbol bit group when an LDPC code is a mobile LDPC code in which the code length N is 16200 bits and the coding rate is 1/3, the modulation method is 16 QAM, and the multiple b is 2.

In this case, the code bits of 4×2(=mb) bits read from the memory 31 may be grouped into 4 code bit groups Gb1, Gb2, Gb3, and Gb4 according to the difference in the error probability as illustrated in A of FIG. 58.

In A of FIG. 58, the code bit b0 belongs to the code bit group Gb1, the code bit b1 belongs to the code bit group Gb2, the code bit b2 belongs to the code bit group Gb3, and the code bits b3 to b7 belong to the code bit group Gb4.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 58.

In B of FIG. 58, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 59:
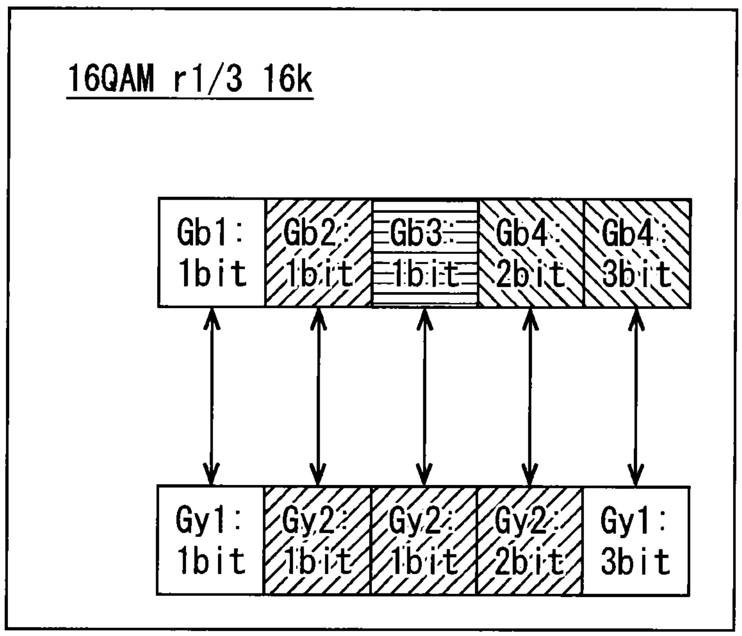
FIG. 59 is a diagram illustrating an allocation rule when an LDPC code having a code length of 16200 and a coding rate of 1/3 is modulated by 16 QAM, and a multiple b is 2.

FIG. 59 illustrates an allocation rule when an LDPC code is a mobile LDPC code in which the code length N is 16200 bits and the coding rate is 1/3, the modulation method is 16 QAM, and the multiple b is 2.

In the allocation rule of FIG. 59, pieces of group set information (Gb1, Gy1, 1), (Gb2, Gy2, 1), (Gb3, Gy2, 1), (Gb4, Gy2, 2), and (Gb4, Gy1, 3) are specified.

In other words, the allocation rule of FIG. 59 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 1 bit of the code bits of the code bit group Gb3 having the third highest error probability is allocated to 1 bit of the symbol bits of the symbol bit group Gy2 having the second highest error probability based on the group set information (Gb3, Gy2, 1);

that 2 bits of the code bits of the code bit group Gb4 having the fourth highest error probability are allocated to 2 bits of the symbol bits of the symbol bit group Gy2 having the second highest error probability based on the group set information (Gb4, Gy2, 2); and that 3 bits of the code bits of the code bit group Gb4 having the fourth highest error probability are allocated to 3 bits of the symbol bits of the symbol bit group Gy1 having the highest error probability based on the group set information (Gb4, Gy1, 3).

Figure 60:
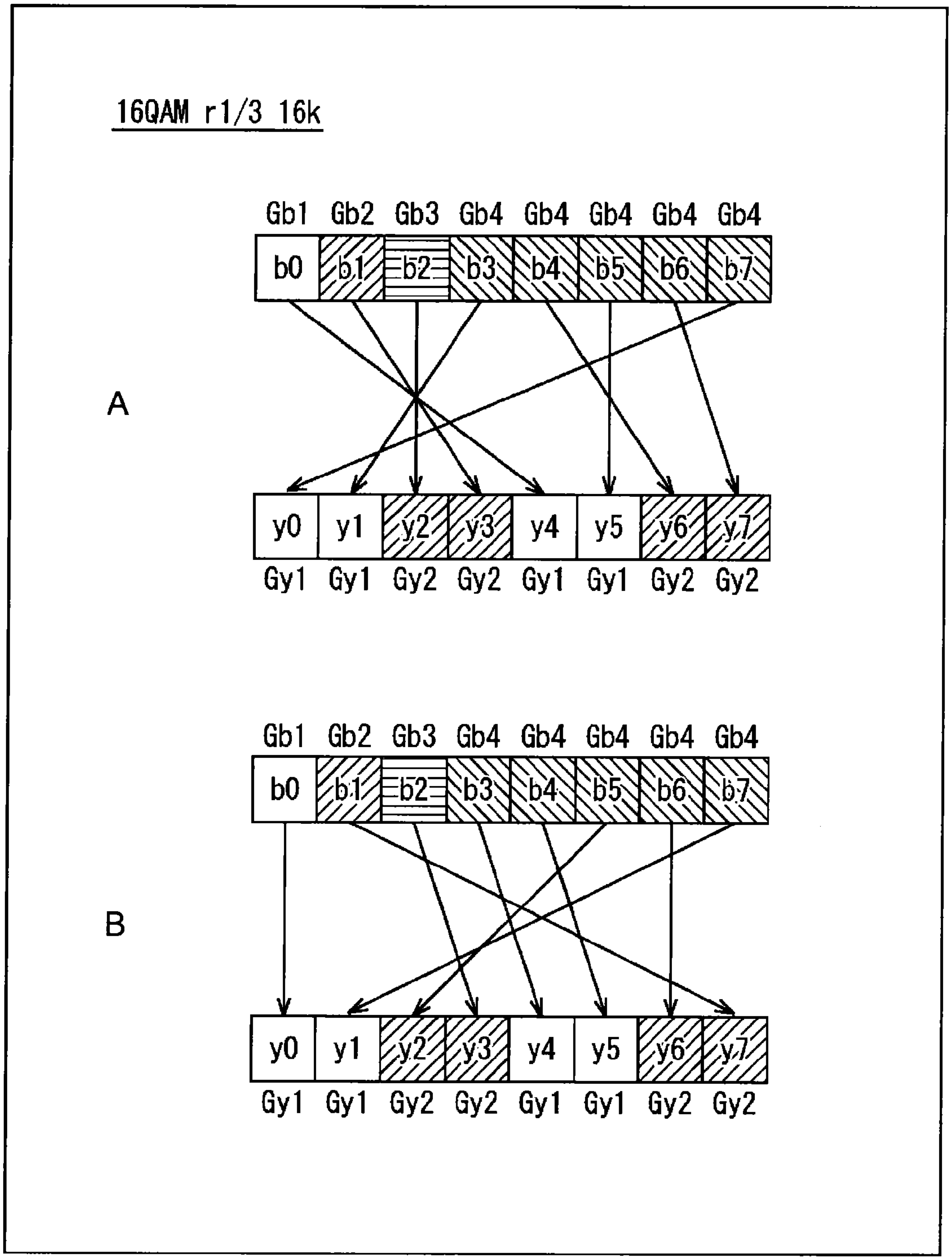
FIG. 60 is a diagram illustrating exchanging of code bits according to an allocation rule when an LDPC code having a code length of 16200 and a coding rate of 1/3 is modulated by 16 QAM, and a multiple b is 2.

FIG. 60 illustrates an example of exchanging of code bits according to the allocation rule of FIG. 59.

In other words, A of FIG. 60 illustrates a first example of exchanging of code bits according to the allocation rule of FIG. 59 when an LDPC code is a mobile LDPC code in which the code length N is 16200 bits and the coding rate is 1/3, the modulation method is 16 QAM, and the multiple b is 2.

When an LDPC code is a mobile LDPC code in which the code length N is 16200 bits and the coding rate is 1/3, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 59 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 60.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;

the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 60 illustrates a second example of exchanging of code bits according to the allocation rule of FIG. 59 when an LDPC code is a mobile LDPC code in which the code length N is 16200 bits and the coding rate is 1/3, the modulation method is 16 QAM, and the multiple b is 2.

According to B of FIG. 60, the exchange unit 32 exchanges the code bits b0 to b7 of 4×2 (=mb) bits read from the memory 31 according to the allocation rule of FIG. 59 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Figure 61:
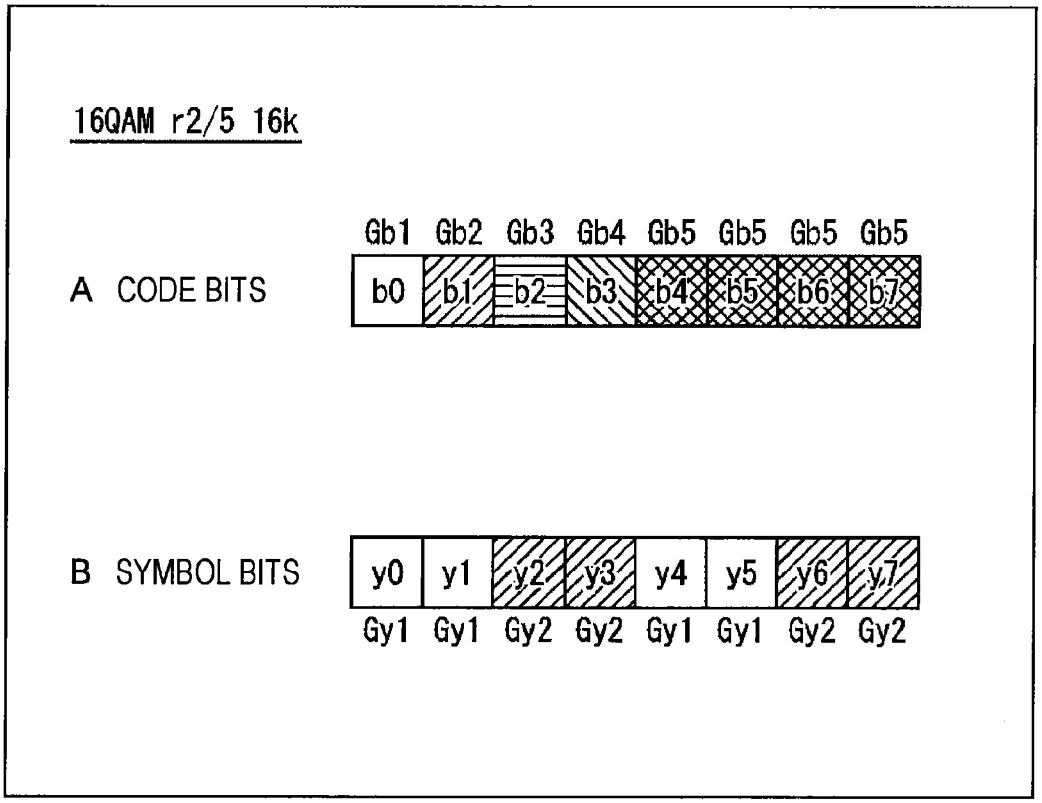
FIG. 61 is a diagram illustrating a code bit group and a symbol bit group when an LDPC code having a code length of 16200 and a coding rate of 2/5 is modulated by 16 QAM, and a multiple b is 2.

FIG. 61 illustrates a code bit group and a symbol bit group when an LDPC code is a mobile LDPC code in which the code length N is 16200 bits and the coding rate is 2/5, the modulation method is 16 QAM, and the multiple b is 2.

In this case, the code bits of 4×2(=mb) bits read from the memory 31 may be grouped into 5 code bit groups Gb1, Gb2, Gb3, Gb4, and Gb5 according to the difference in the error probability as illustrated in A of FIG. 61.

In A of FIG. 61, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 61.

In B of FIG. 61, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 62:
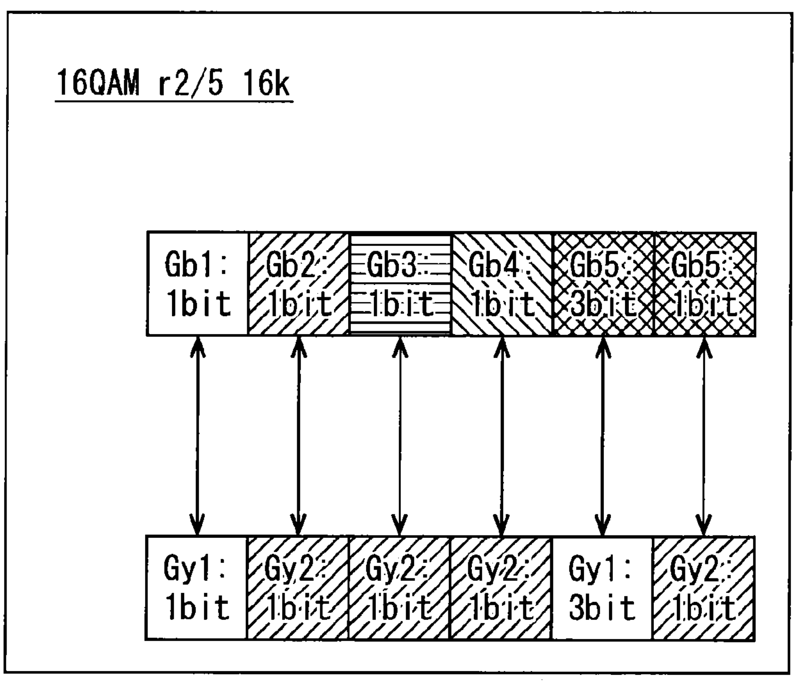
FIG. 62 is a diagram illustrating an allocation rule when an LDPC code having a code length of 16200 and a coding rate of 2/5 is modulated by 16 QAM, and a multiple b is 2.

FIG. 62 illustrates an allocation rule when an LDPC code is a mobile LDPC code in which the code length N is 16200 bits and the coding rate is 2/5, the modulation method is 16 QAM, and the multiple b is 2.

In the allocation rule of FIG. 62, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 62 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 1 bit of the code bits of the code bit group Gb3 having the third highest error probability is allocated to 1 bit of the symbol bits of the symbol bit group Gy2 having the second highest error probability based on the group set information (Gb3, Gy2, 1);

that 1 bit of the code bits of the code bit group Gb4 having the fourth highest error probability is allocated to 1 bit of the symbol bits of the symbol bit group Gy2 having the second highest error probability based on the group set information (Gb4, Gy2, 1);

that 3 bits of the code bits of the code bit group Gb5 having the fifth highest error probability are allocated to 3 bits of the symbol bits of the symbol bit group Gy1 having the highest error probability based on the group set information (Gb5, Gy1, 3); and that 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 63:
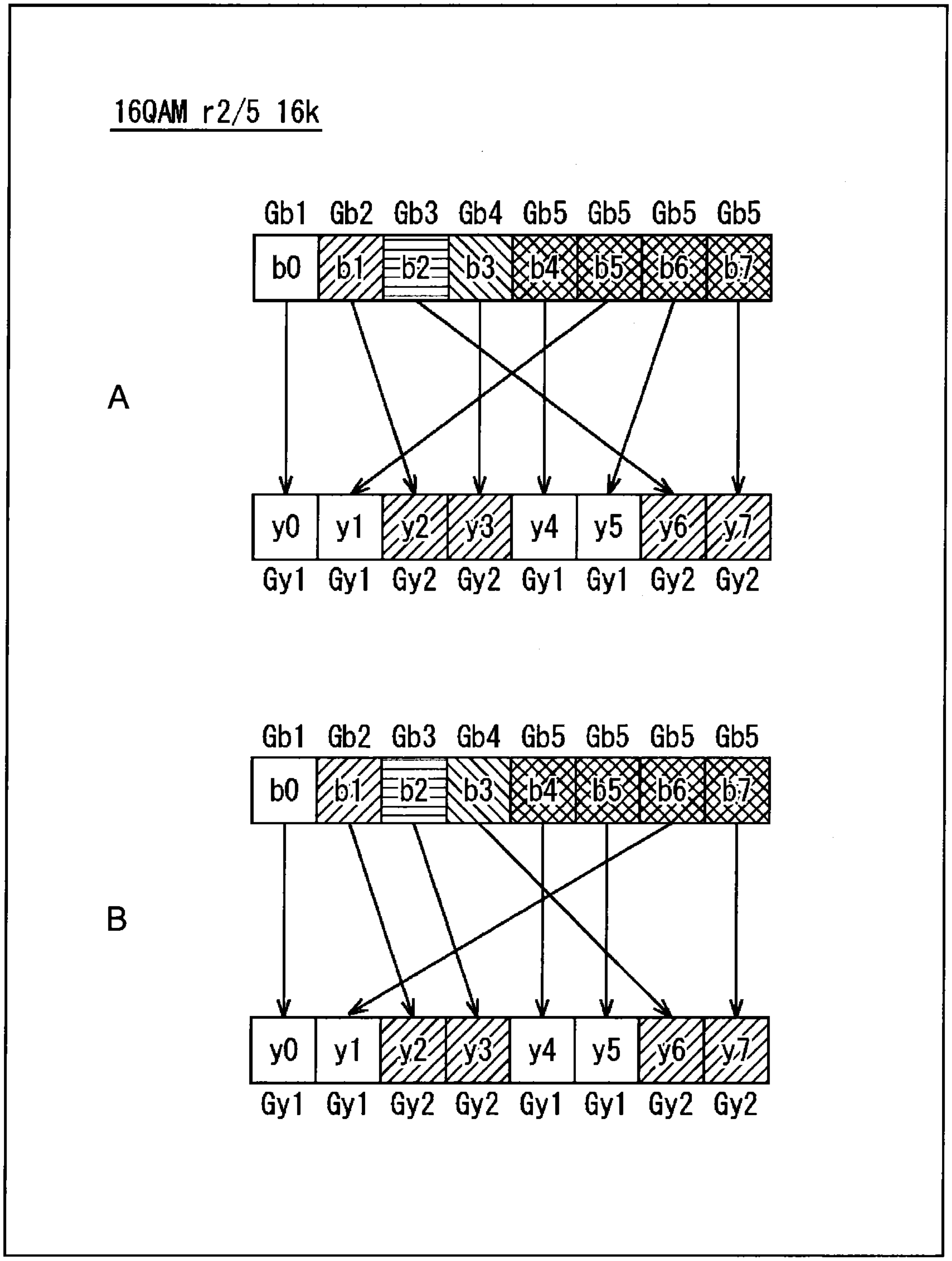
FIG. 63 is a diagram illustrating exchanging of code bits according to an allocation rule when an LDPC code having a code length of 16200 and a coding rate of 2/5 is modulated by 16 QAM, and a multiple b is 2.

FIG. 63 illustrates an example of exchanging of code bits according to the allocation rule of FIG. 62.

In other words, A of FIG. 63 illustrates a first example of exchanging of code bits according to the allocation rule of FIG. 62 when an LDPC code is a mobile LDPC code in which the code length N is 16200 bits and the coding rate is 2/5, the modulation method is 16 QAM, and the multiple b is 2.

When an LDPC code is a mobile LDPC code in which the code length N is 16200 bits and the coding rate is 2/5, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 62 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 63.

In other words, the exchange unit 32 performs exchanging such that the code bit b0 is allocated to the symbol bit y0;
the code bit b1 is allocated to the symbol bit y2;
the code bit b2 is allocated to the symbol bit y6;
the code bit b3 is allocated to the symbol bit y3;
the code bit b4 is allocated to the symbol bit y4;
the code bit b5 is allocated to the symbol bit y1;
the code bit b6 is allocated to the symbol bit y5; and
the code bit b7 is allocated to the symbol bit y7.

B of FIG. 63 illustrates a second example of exchanging of code bits according to the allocation rule of FIG. 62 when an LDPC code is a mobile LDPC code in which the code length N is 16200 bits and the coding rate is 2/5, the modulation method is 16 QAM, and the multiple b is 2.

According to B of FIG. 63, the exchange unit 32 exchanges the code bits b0 to b7 of 4×2 (=mb) bits read from the memory 31 according to the allocation rule of FIG. 62 such that the code bit b0 is allocated to the symbol bit y0;
the code bit b1 is allocated to the symbol bit y2;
the code bit b2 is allocated to the symbol bit y3;
the code bit b3 is allocated to the symbol bit y6;
the code bit b4 is allocated to the symbol bit y4;
the code bit b5 is allocated to the symbol bit y5;
the code bit b6 is allocated to the symbol bit y1; and
the code bit b7 is allocated to the symbol bit y7.

Figure 64:
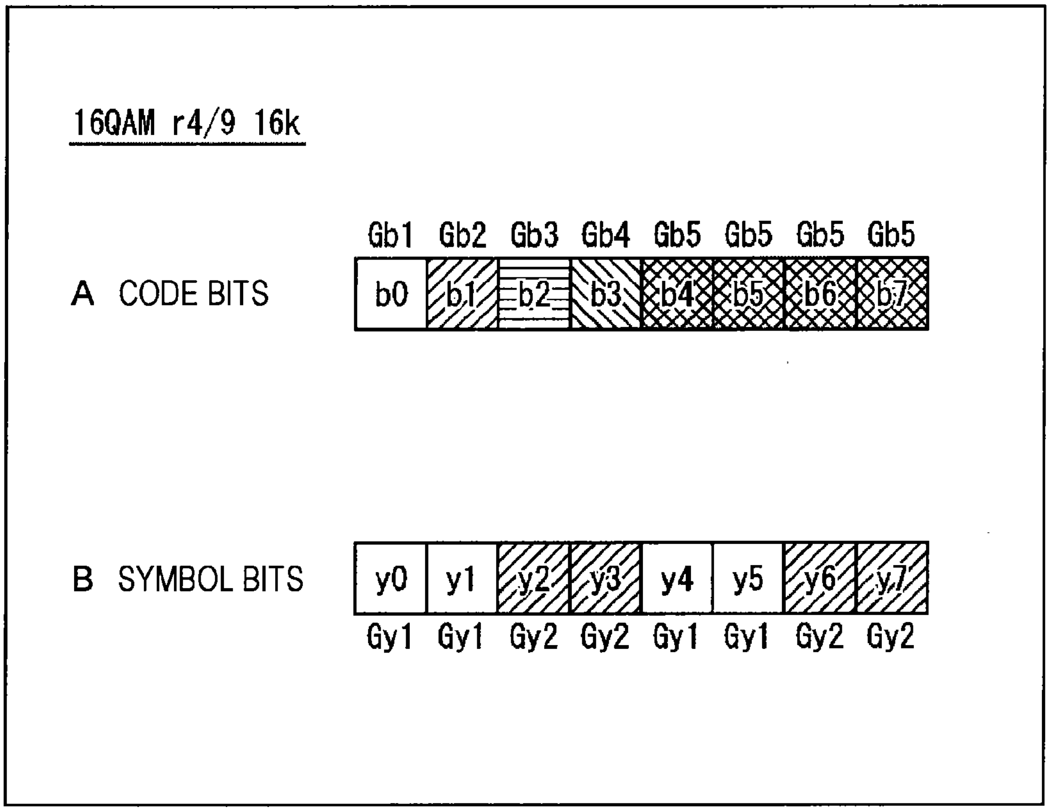
FIG. 64 is a diagram illustrating a code bit group and a symbol bit group when an LDPC code having a code length of 16200 and a coding rate of 4/9 is modulated by 16 QAM, and a multiple b is 2.

FIG. 64 illustrates a code bit group and a symbol bit group when an LDPC code is a mobile LDPC code in which the code length N is 16200 bits and the coding rate is 4/9, the modulation method is 16 QAM, and the multiple b is 2.

In this case, the code bits of 4×2(=mb) bits read from the memory 31 may be grouped into 5 code bit groups Gb1, Gb2, Gb3, Gb4, and Gb5 according to the difference in the error probability as illustrated in A of FIG. 64.

In A of FIG. 64, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 64.

In B of FIG. 64, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 65:
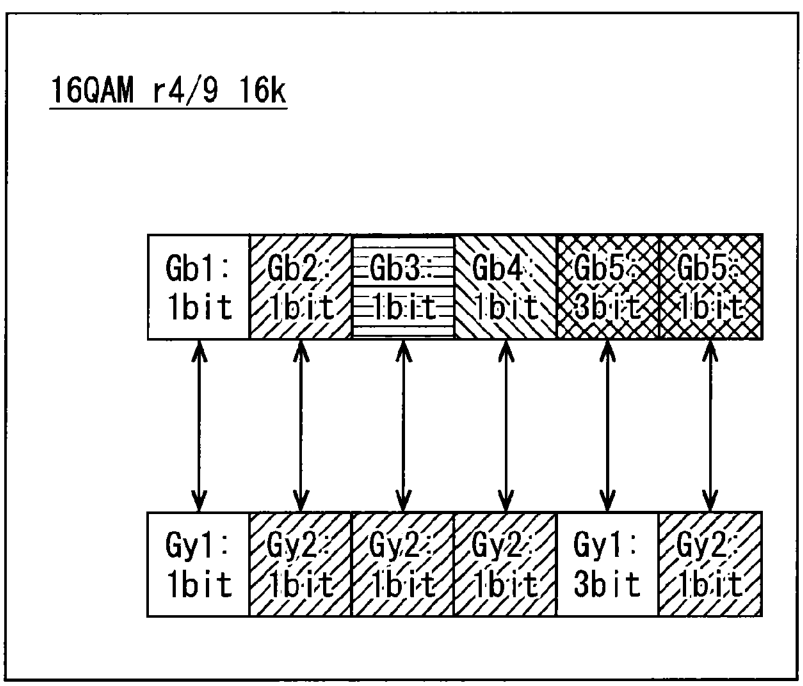
FIG. 65 is a diagram illustrating an allocation rule when an LDPC code having a code length of 16200 and a coding rate of 4/9 is modulated by 16 QAM, and a multiple b is 2.

FIG. 65 illustrates an allocation rule when an LDPC code is a mobile LDPC code in which the code length N is 16200 bits, the coding rate is 4/9 and the modulation method is 16 QAM, and the multiple b is 2.

In the allocation rule of FIG. 65, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 65 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 1 bit of the code bits of the code bit group Gb3 having the third highest error probability is allocated to 1 bit of the symbol bits of the symbol bit group Gy2 having the second highest error probability based on the group set information (Gb3, Gy2, 1);

that 1 bit of the code bits of the code bit group Gb4 having the fourth highest error probability is allocated to 1 bit of the symbol bits of the symbol bit group Gy2 having the second highest error probability based on the group set information (Gb4, Gy2, 1);

that 3 bits of the code bits of the code bit group Gb5 having the fifth highest error probability are allocated to 3 bits of the symbol bits of the symbol bit group Gy1 having the highest error probability based on the group set information (Gb5, Gy1, 3); and that 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 66:
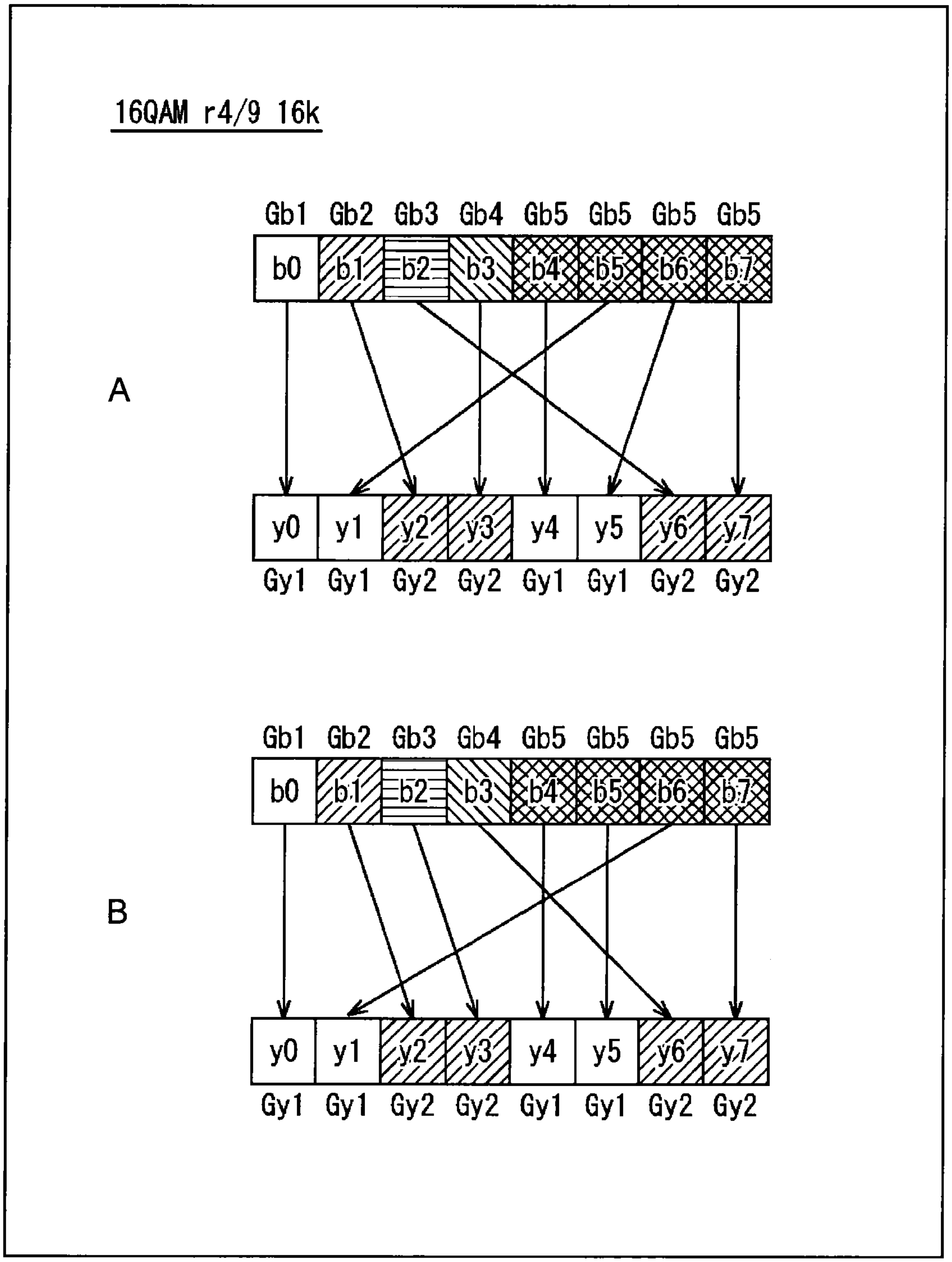
FIG. 66 is a diagram illustrating exchanging of code bits according to an allocation rule when an LDPC code having a code length of 16200 and a coding rate of 4/9 is modulated by 16 QAM, and a multiple b is 2.

FIG. 66 illustrates an example of exchanging of code bits according to the allocation rule of FIG. 65.

In other words, A of FIG. 66 illustrates a first example of exchanging of code bits according to the allocation rule of FIG. 65 when an LDPC code is a mobile LDPC code in which the code length N is 16200 bits and the coding rate is 4/9, the modulation method is 16 QAM, and the multiple b is 2.

When an LDPC code is a mobile LDPC code in which the code length N is 16200 bits and the coding rate is 4/9, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 65 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 66.

In other words, the exchange unit 32 performs exchanging such that the code bit b0 is allocated to the symbol bit y0;
the code bit b1 is allocated to the symbol bit y2;
the code bit b2 is allocated to the symbol bit y6;
the code bit b3 is allocated to the symbol bit y3;
the code bit b4 is allocated to the symbol bit y4;
the code bit b5 is allocated to the symbol bit y1;
the code bit b6 is allocated to the symbol bit y5; and
the code bit b7 is allocated to the symbol bit y7.

B of FIG. 66 illustrates a second example of exchanging of code bits according to the allocation rule of FIG. 65 when an LDPC code is a mobile LDPC code in which the code length N is 16200 bits and the coding rate is 4/9, the modulation method is 16 QAM, and the multiple b is 2.

According to B of FIG. 66, the exchange unit 32 exchanges the code bits b0 to b7 of 4×2 (=mb) bits read from the memory 31 according to the allocation rule of FIG. 65 such that the code bit b0 is allocated to the symbol bit y0;
the code bit b1 is allocated to the symbol bit y2;
the code bit b2 is allocated to the symbol bit y3;
the code bit b3 is allocated to the symbol bit y6;
the code bit b4 is allocated to the symbol bit y4;
the code bit b5 is allocated to the symbol bit y5;
the code bit b6 is allocated to the symbol bit y1; and
the code bit b7 is allocated to the symbol bit y7.

Figure 67:
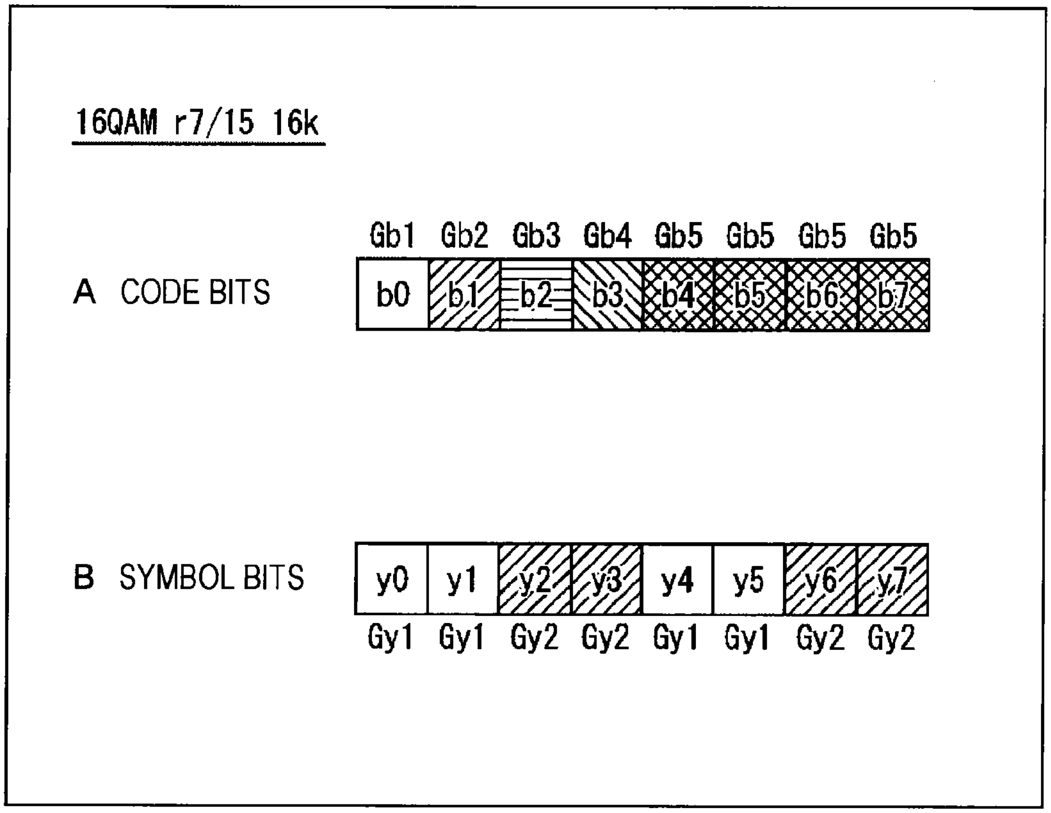
FIG. 67 is a diagram illustrating a code bit group and a symbol bit group when an LDPC code having a code length of 16200 and a coding rate of 7/15 is modulated by 16 QAM, and a multiple b is 2.

FIG. 67 illustrates a code bit group and a symbol bit group when an LDPC code is a mobile LDPC code in which the code length N is 16200 bits and the coding rate is 7/15, the modulation method is 16 QAM, and the multiple b is 2.

In this case, the code bits of 4×2(=mb) bits read from the memory 31 may be grouped into 5 code bit groups Gb1, Gb2, Gb3, Gb4, and Gb5 according to the difference in the error probability as illustrated in A of FIG. 67.

In A of FIG. 67, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation method is 16 QAM and the multiple b is 2, the symbol bits of 4×2(=mb) bits may be grouped into two symbol bit groups Gy1 and Gy2 according to the difference in the error probability as illustrated in B of FIG. 67.

In B of FIG. 67, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 68:
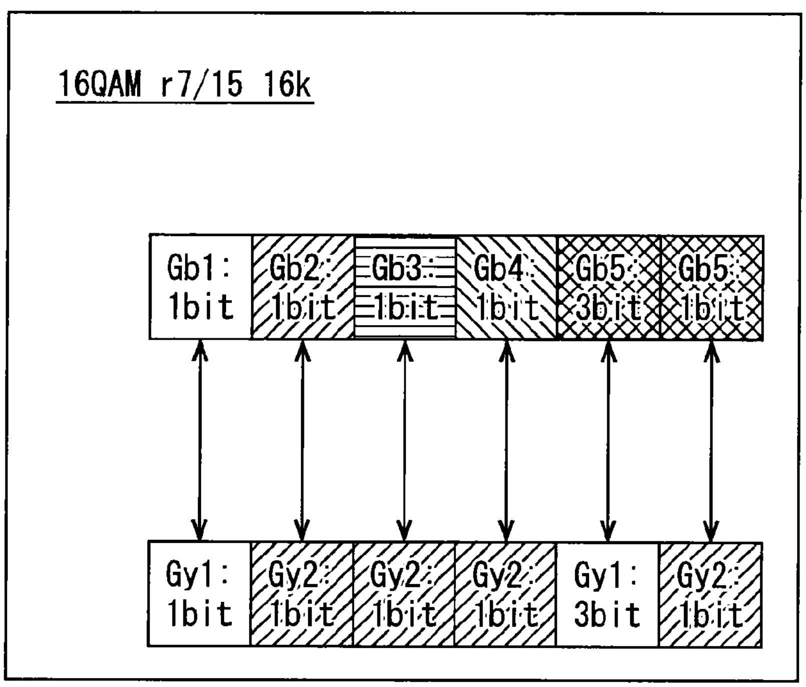
FIG. 68 is a diagram illustrating an allocation rule when an LDPC code having a code length of 16200 and a coding rate of 7/15 is modulated by 16 QAM, and a multiple b is 2.

FIG. 68 illustrates an allocation rule when an LDPC code is a mobile LDPC code in which the code length N is 16200 bits and the coding rate is 7/15, the modulation method is 16 QAM, and the multiple b is 2.

In the allocation rule of FIG. 68, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 68 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

that 1 bit of the code bits of the code bit group Gb2 having the second highest error probability is allocated to 1 bit of the symbol bits of the symbol bit group Gy2 having the second highest error probability based on the group set information (Gb2, Gy2, 1);

that 1 bit of the code bits of the code bit group Gb3 having the third highest error probability is allocated to 1 bit of the symbol bits of the symbol bit group Gy2 having the second highest error probability based on the group set information (Gb3, Gy2, 1);

that 1 bit of the code bits of the code bit group Gb4 having the fourth highest error probability is allocated to 1 bit of the symbol bits of the symbol bit group Gy2 having the second highest error probability based on the group set information (Gb4, Gy2, 1);

that 3 bits of the code bits of the code bit group Gb5 having the fifth highest error probability are allocated to 3 bits of the symbol bits of the symbol bit group Gy1 having the highest error probability based on the group set information (Gb5, Gy1, 3); and that 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 69:
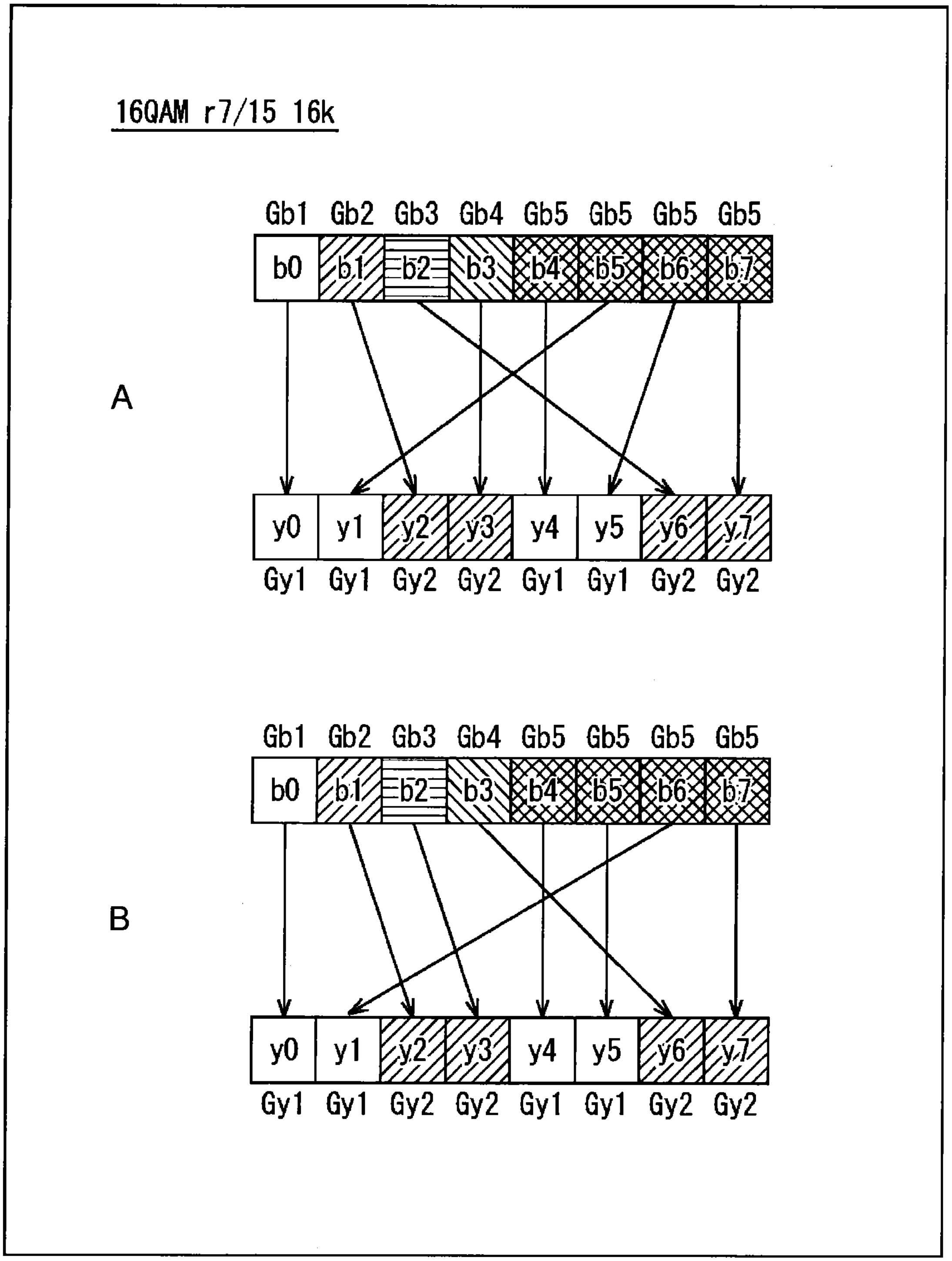
FIG. 69 is a diagram illustrating exchanging of code bits according to an allocation rule when an LDPC code having a code length of 16200 and a coding rate of 7/15 is modulated by 16 QAM, and a multiple b is 2.

FIG. 69 illustrates an example of exchanging of code bits according to the allocation rule of FIG. 68.

In other words, A of FIG. 69 illustrates a first example of exchanging of code bits according to the allocation rule of FIG. 68 when an LDPC code is a mobile LDPC code in which the code length N is 16200 bits and the coding rate is 7/15, the modulation method is 16 QAM, and the multiple b is 2.

When an LDPC code is a mobile LDPC code in which the code length N is 16200 bits and the coding rate is 7/15, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits $b_0$ to $b_7$ of 4×2 (=mb) bits according to the allocation rule of FIG. 68 such that the code bits $b_0$ to $b_7$ of 4×2 (=mb) bits read from the memory 31 are allocated to the symbol bits $y_0$ to $y_7$ of 4×2 (=mb) bits of 2 (=b) symbols, for example, as illustrated in A of FIG. 69.

In other words, the exchange unit 32 performs exchanging such that the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 69 illustrates a second example of exchanging of code bits according to the allocation rule of FIG. 68 when an LDPC code is a mobile LDPC code in which the code length N is 16200 bits and the coding rate is 7/15, the modulation method is 16 QAM, and the multiple b is 2.

According to B of FIG. 69, the exchange unit 32 exchanges the code bits b0 to b7 of 4×2 (=mb) bits read from the memory 31 according to the allocation rule of FIG. 68 such that the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 70:
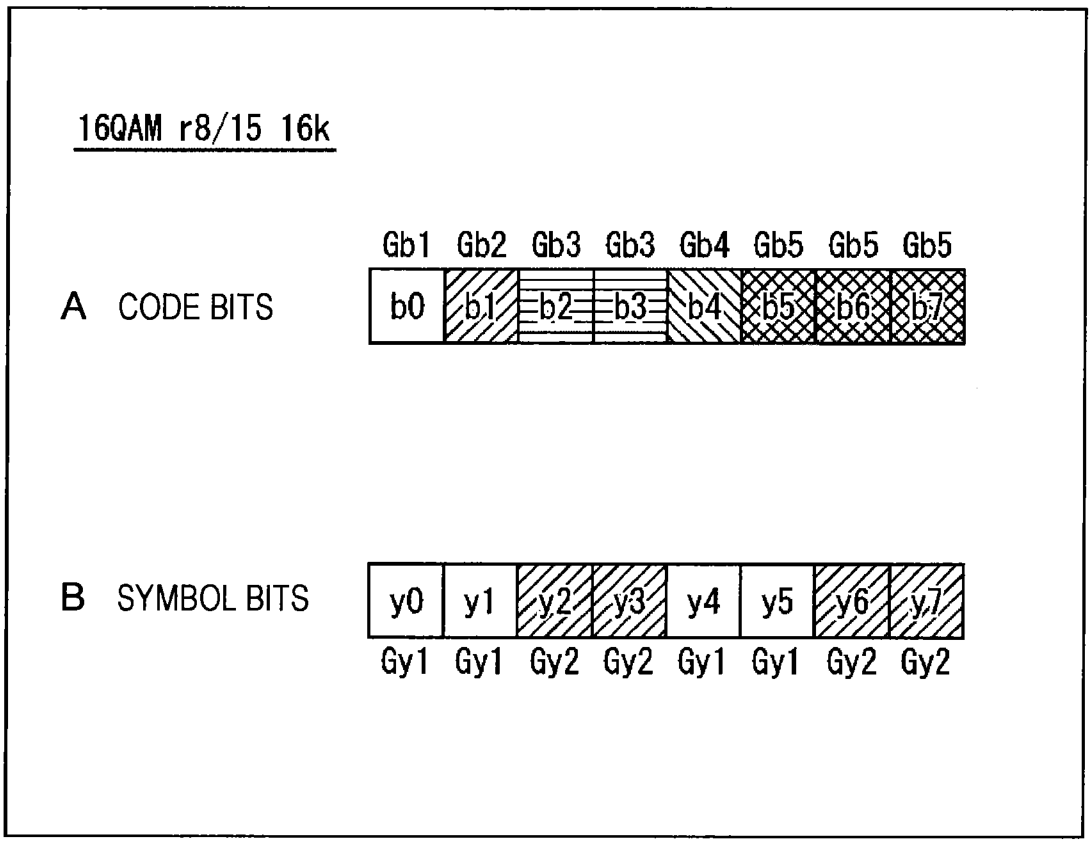
FIG. 70 is a diagram illustrating a code bit group and a symbol bit group when an LDPC code having a code length of 16200 and a coding rate of 8/15 is modulated by 16 QAM, and a multiple b is 2.

FIG. 70 illustrates a code bit group and a symbol bit group when an LDPC code is a mobile LDPC code in which the code length N is 16200 bits and the coding rate is 8/15, the modulation method is 16 QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 70.

In A of FIG. 70, the code bit b0 belongs to the code bit group Gb1, the code bit b1 belongs to the code bit group Gb2, the code bits b2 and b3 belong to the code bit group Gb3, the code bit b4 belongs to the code bit group Gb4, and the code bits b5 to b7 belong to the code bit group Gb5.

When the modulation method is 16 QAM and the multiple b is 2, the symbol bits of 4×2 (=mb) bits may be grouped into two symbol bit groups Gy1 and Gy2 according to the difference in the error probability as illustrated in B of FIG. 70.

In B of FIG. 70, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 71:
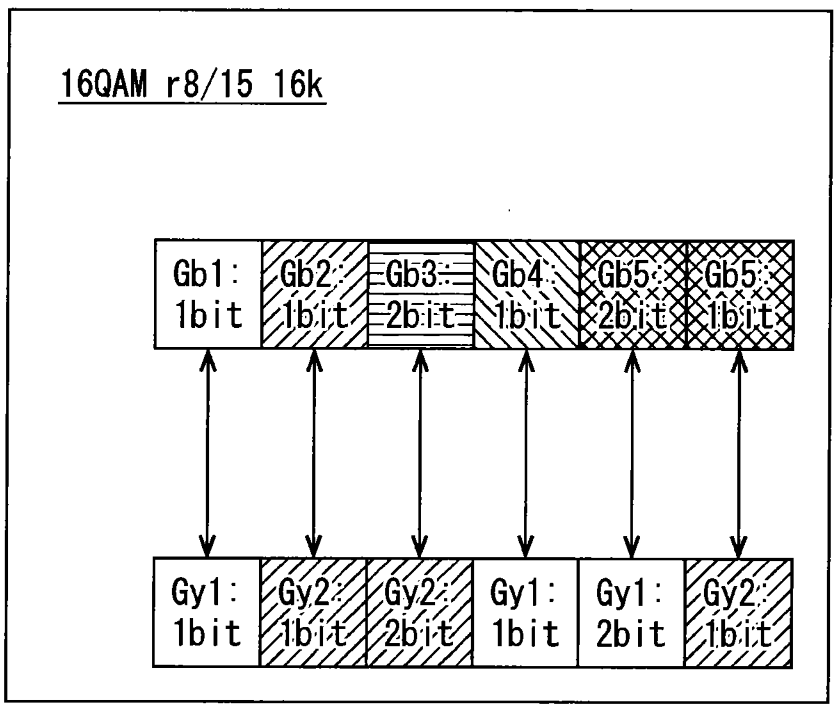
FIG. 71 is a diagram illustrating an allocation rule when an LDPC code having a code length of 16200 and a coding rate of 8/15 is modulated by 16 QAM, and a multiple b is 2.

FIG. 71 illustrates an allocation rule when an LDPC code is a mobile LDPC code in which the code length N is 16200 bits and the coding rate is 8/15, the modulation method is 16 QAM, and the multiple b is 2.

In the allocation rule of FIG. 71, pieces of group set information (Gb1, Gy1, 1), (Gb2, Gy2, 1), (Gb3, Gy2, 2), (Gb4, Gy1, 1), (Gb5, Gy1, 2), and (Gb5, Gy2, 1) are specified.

In other words, the allocation rule of FIG. 71 specifies that 1 bit of the code bits of the code bit group Gb1 having the highest error probability is allocated to 1 bit of the symbol bits of the symbol bit group Gy1 having the highest error probability based on the group set information (Gb1, Gy1, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 2 bits of the code bits of the code bit group Gb3 having the third highest error probability are allocated to 2 bits of the symbol bits of the symbol bit group Gy2 having the second highest error probability based on the group set information (Gb3, Gy2, 2), that 1 bit of the code bits of the code bit group Gb4 having the fourth highest error probability is allocated to 1 bit of the symbol bits of the symbol bit group Gy1 having the highest error probability based on the group set information (Gb4, Gy1, 1), that 2 bits of the code bits of the code bit group Gb5 having the fifth highest error probability are allocated to 2 bits of the symbol bits of the symbol bit group Gy1 having the highest error probability based on the group set information (Gb5, Gy1, 2), and that 1 bit of the code bits of the code bit group Gb5 having the fifth highest error probability is allocated to a 1 bit of the symbol bits of the symbol bit group Gy2 having the second highest error probability based on the group set information (Gb5, Gy2, 1).

Figure 72:
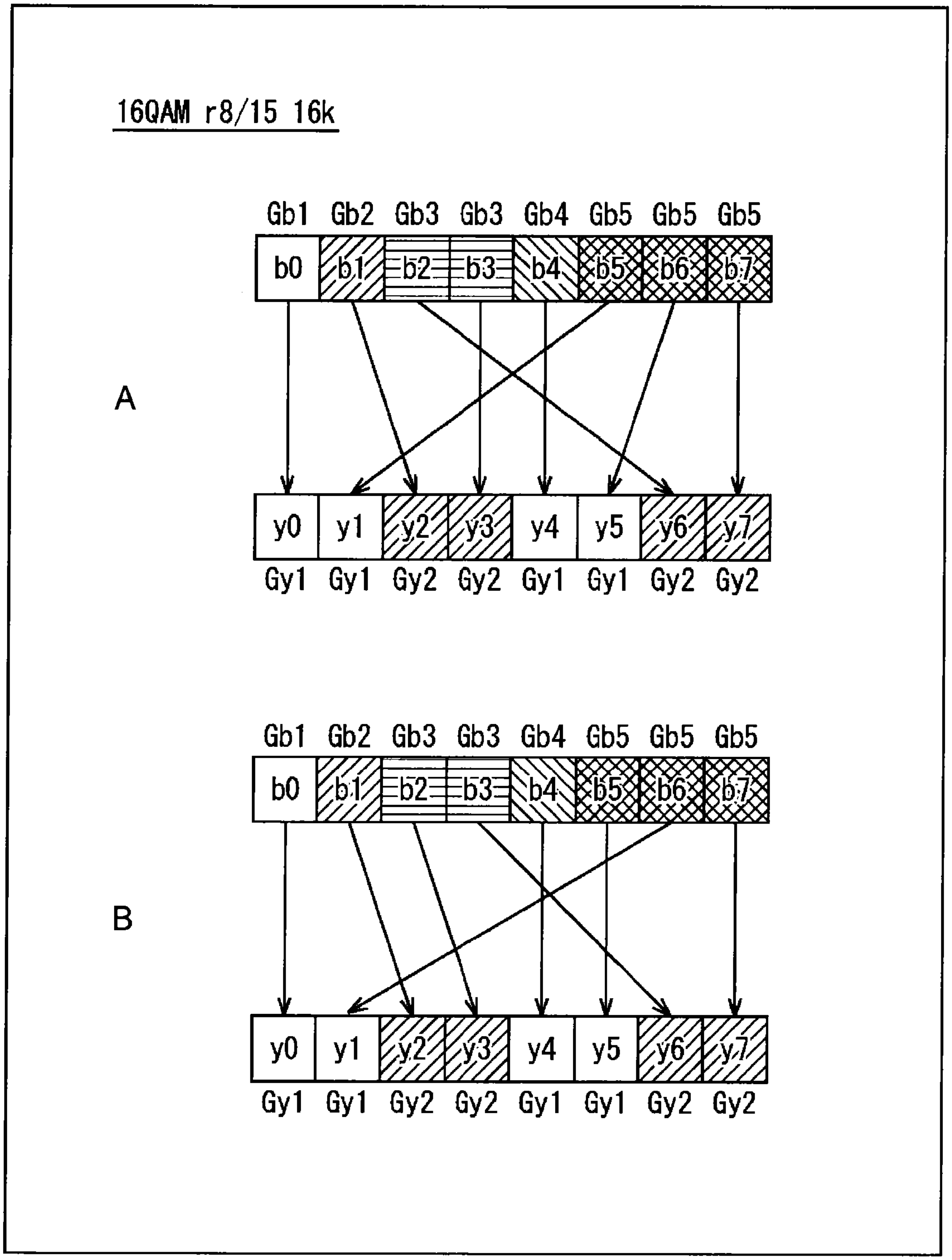
FIG. 72 is a diagram illustrating exchanging of code bits according to an allocation rule when an LDPC code having a code length of 16200 and a coding rate of 8/15 is modulated by 16 QAM, and a multiple b is 2.

FIG. 72 illustrates an example of exchanging of code bits according to the allocation rule of FIG. 71.

In other words, A of FIG. 72 illustrates a first example of exchanging of code bits according to the allocation rule of FIG. 71 when an LDPC code is a mobile LDPC code in which the code length N is 16200 bits and the coding rate is 8/15, the modulation method is 16 QAM, and the multiple b is 2.

When an LDPC code is a mobile LDPC code in which the code length N is 16200 bits and the coding rate is 8/15, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 71 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 72.

In other words, the exchange unit 32 performs exchanging such that the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 72 illustrates a second example of exchanging of code bits according to the allocation rule of FIG. 71 when an LDPC code is a mobile LDPC code in which the code length N is 16200 bits and the coding rate is 8/15, the modulation method is 16 QAM, and the multiple b is 2.

According to B of FIG. 72, the exchange unit 32 exchanges the code bits b0 to b7 of 4×2 (=mb) bits read from the memory 31 according to the allocation rule of FIG. 71 such that the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 73:
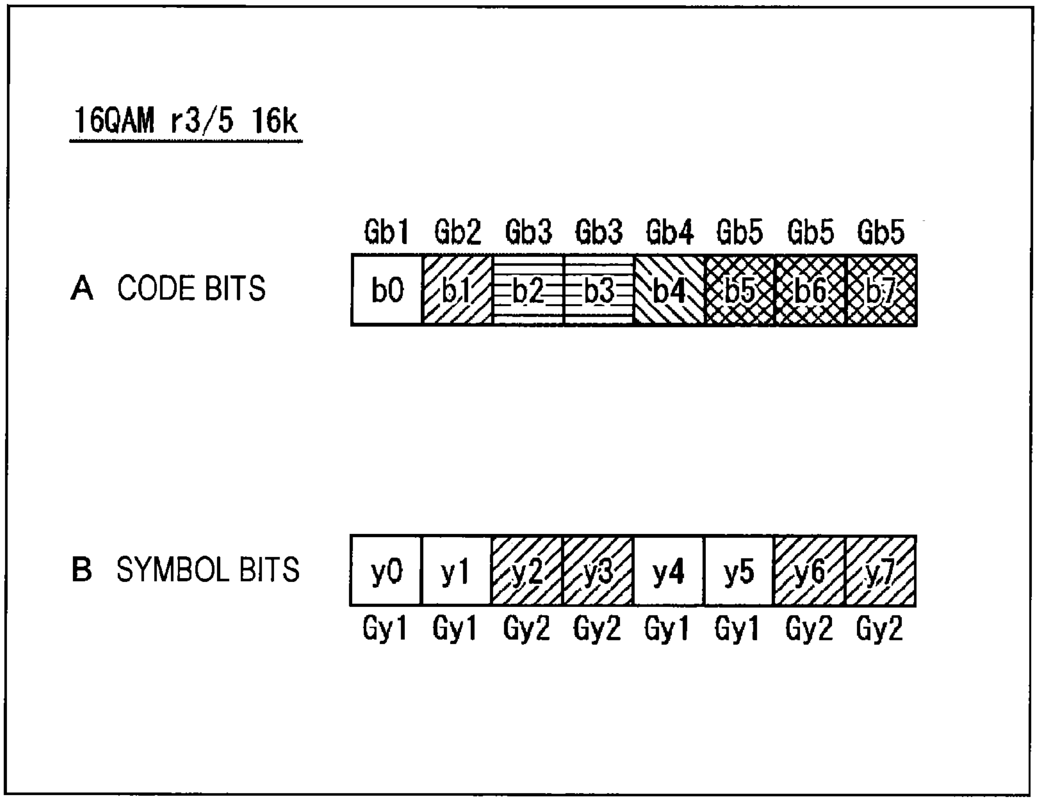
FIG. 73 is a diagram illustrating a code bit group and a symbol bit group when an LDPC code having a code length of 16200 and a coding rate of 3/5 is modulated by 16 QAM, and a multiple b is 2.

FIG. 73 illustrates a code bit group and a symbol bit group when an LDPC code is a mobile LDPC code in which the code length N is 16200 bits and the coding rate is 3/5, the modulation method is 16 QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 73.

In A of FIG. 73, the code bit b0 belongs to the code bit group Gb1, the code bit b1 belongs to the code bit group Gb2, the code bits b2 and b3 belong to the code bit group Gb3, the code bit b4 belongs to the code bit group Gb4, and the code bits b5 to b7 belong to the code bit group Gb5.

When the modulation method is 16 QAM and the multiple b is 2, the symbol bits of 4×2 (=mb) bits may be grouped into two symbol bit groups Gy1 and Gy2 according to the difference in the error probability as illustrated in B of FIG. 73.

In B of FIG. 73, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 74:
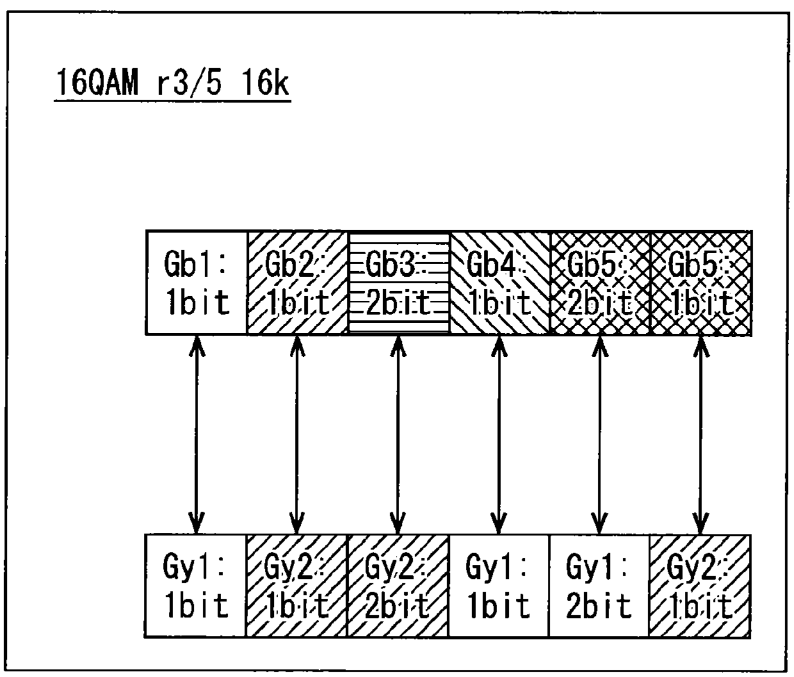
FIG. 74 is a diagram illustrating an allocation rule when an LDPC code having a code length of 16200 and a coding rate of 3/5 is modulated by 16 QAM, and a multiple b is 2.

FIG. 74 illustrates an allocation rule when an LDPC code is a mobile LDPC code in which the code length N is 16200 bits and the coding rate is 3/5, the modulation method is 16 QAM, and the multiple b is 2.

In the allocation rule of FIG. 74, pieces of group set information (Gb1, Gy1, 1), (Gb2, Gy2, 1), (Gb3, Gy2, 2), (Gb4, Gy1, 1), (Gb5, Gy1, 2), and (Gb5, Gy2, 1) are specified.

In other words, the allocation rule of FIG. 74 specifies that 1 bit of the code bits of the code bit group Gb1 having the highest error probability is allocated to 1 bit of the symbol bits of the symbol bit group Gy1 having the highest error probability based on the group set information (Gb1, Gy1, 1), that 1 bit of the code bits of the code bit group Gb2 having the second highest error probability is allocated to a 1 bit of the symbol bits of the symbol bit group Gy2 having the second highest error probability based on the group set information (Gb2, Gy2, 1), that 2 bits of the code bits of the code bit group Gb3 having the third highest error probability are allocated to 2 bits of the symbol bits of the symbol bit group Gy2 having the second highest error probability based on the group set information (Gb3, Gy2, 2), that 1 bit of the code bits of the code bit group Gb4 having the fourth highest error probability is allocated to a 1 bit of the symbol bits of the symbol bit group Gy1 having the highest error probability based on the group set information (Gb4, Gy1, 1), that 2 bits of the code bits of the code bit group Gb5 having the fifth highest error probability are allocated to 2 bits of the symbol bits of the symbol bit group Gy1 having the highest error probability based on the group set information (Gb5, Gy1, 2), and that 1 bit of the code bits of the code bit group Gb5 having the fifth highest error probability is allocated to a 1 bit of the symbol bits of the symbol bit group Gy2 having the second highest error probability based on the group set information (Gb5, Gy2, 1).

Figure 75:
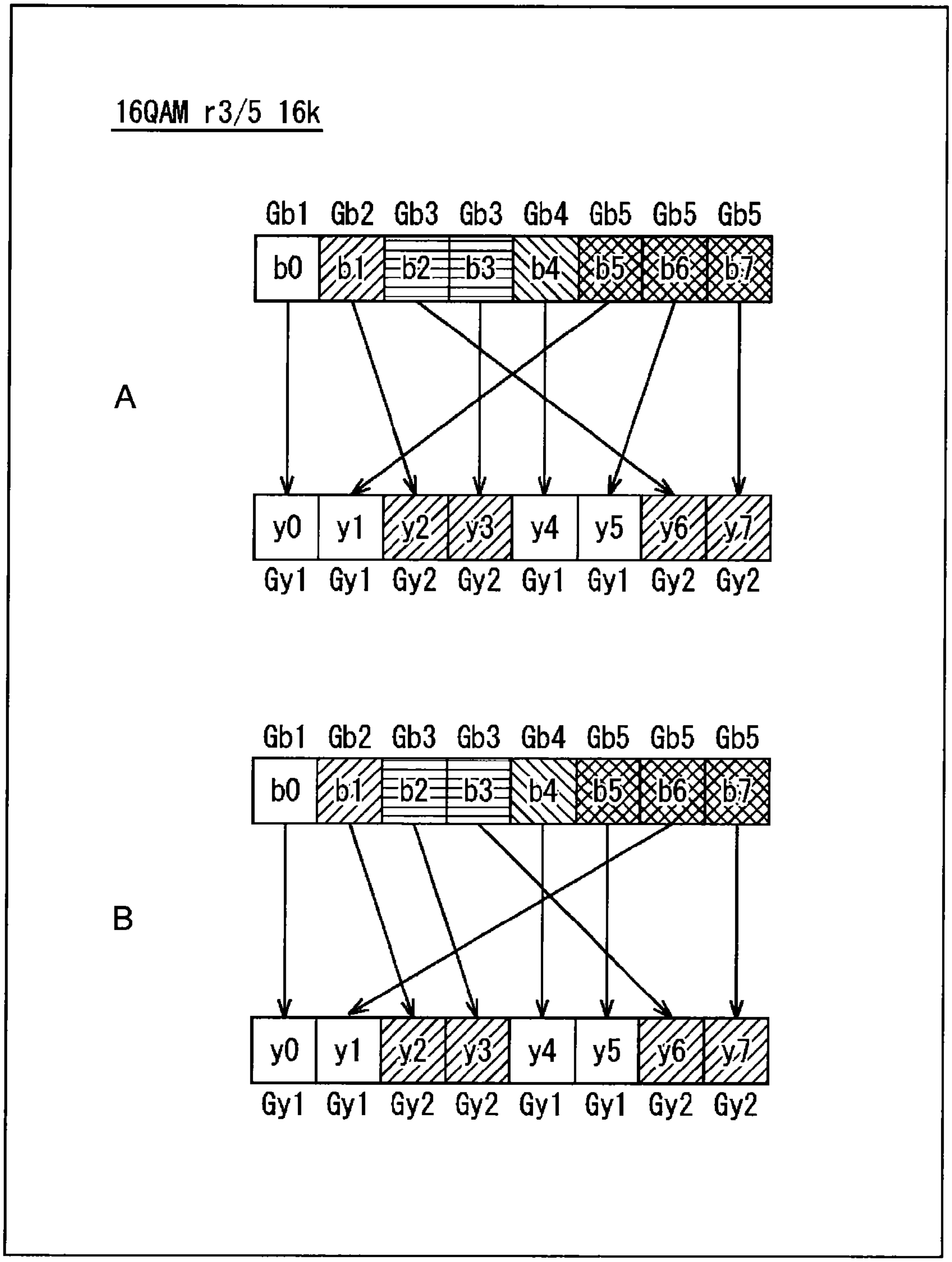
FIG. 75 is a diagram illustrating exchanging of code bits according to an allocation rule when an LDPC code having a code length of 16200 and a coding rate of 3/5 is modulated by 16 QAM, and a multiple b is 2.

FIG. 75 illustrates an example of exchanging of code bits according to the allocation rule of FIG. 74.

In other words, A of FIG. 75 illustrates a first example of exchanging of code bits according to the allocation rule of FIG. 74 when an LDPC code is a mobile LDPC code in which the code length N is 16200 bits and the coding rate is 3/5, the modulation method is 16 QAM, and the multiple b is 2.

When an LDPC code is a mobile LDPC code in which the code length N is 16200 bits and the coding rate is 3/5, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 74 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 75.

In other words, the exchange unit 32 performs exchanging such that the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 75 illustrates a second example of exchanging of code bits according to the allocation rule of FIG. 74 when an LDPC code is a mobile LDPC code in which the code length N is 16200 bits and the coding rate is 3/5, the modulation method is 16 QAM, and the multiple b is 2.

According to B of FIG. 75, the exchange unit 32 exchanges the code bits b0 to b7 of 4×2 (=mb) bits read from the memory 31 according to the allocation rule of FIG. 74 such that the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 76:
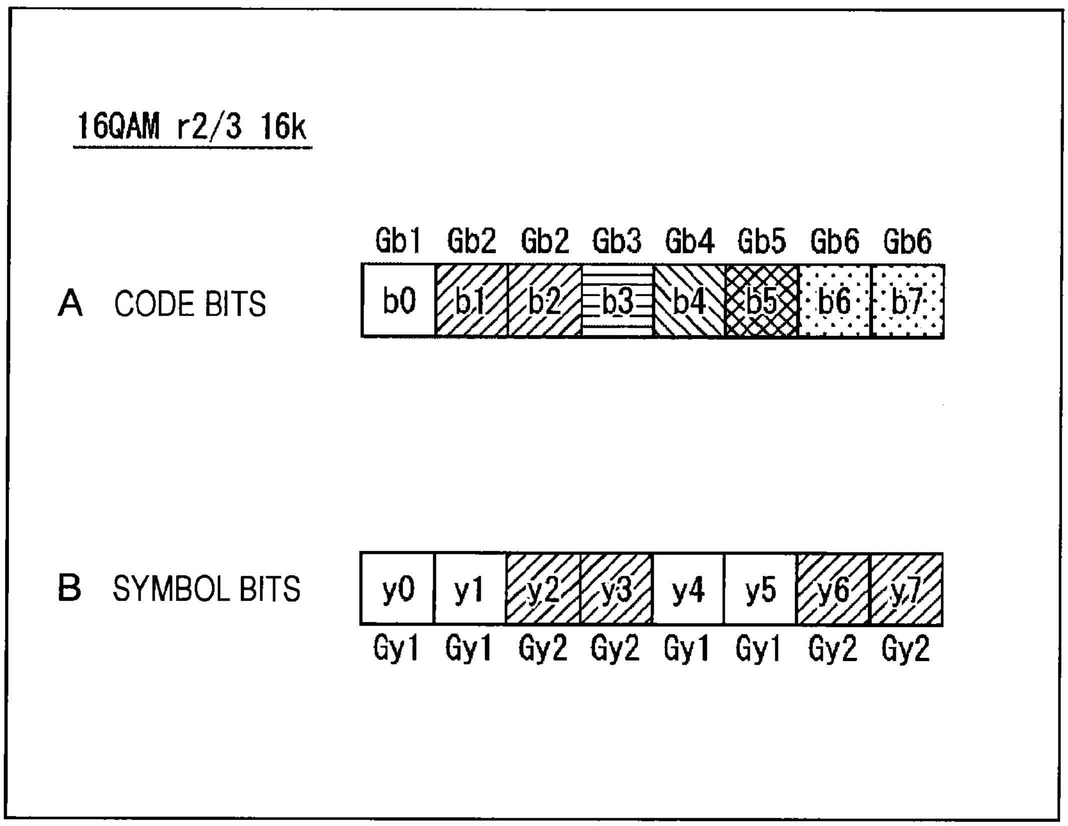
FIG. 76 is a diagram illustrating a code bit group and a symbol bit group when an LDPC code having a code length of 16200 and a coding rate of 2/3 is modulated by 16 QAM, and a multiple b is 2.

FIG. 76 illustrates a code bit group and a symbol bit group when an LDPC code is a mobile LDPC code in which the code length N is 16200 bits and the coding rate is 2/3, the modulation method is 16 QAM, and the multiple b is 2.

In this case, the code bits of 4×2 (=mb) bits read from the memory 31 may be grouped into 6 code bit groups Gb1, Gb2, Gb3, Gb4, Gb5, and Gb6 according to the difference in the error probability as illustrated in A of FIG. 76.

In A of FIG. 76, the code bit b0 belongs to the code bit group Gb1, the code bits b1 and b2 belong to the code bit group Gb2, the code bit b3 belongs to the code bit group Gb3, the code bit b4 belongs to the code bit group Gb4, the code bit b5 belongs to the code bit group Gb5, and the code bits b6 and b7 belong to the code bit group Gb6.

When the modulation method is 16 QAM and the multiple b is 2, the symbol bits of 4×2 (=mb) bits may be grouped into two symbol bit groups Gy1 and Gy2 according to the difference in the error probability as illustrated in B of FIG. 76.

In B of FIG. 76, the symbol bits y0, y1, y4, and y5 belong to the symbol bit group Gy1, and the symbol bits y2, y3, y6, and $y_7$ belong to the symbol bit group Gy2, similarly to the example of B of FIG. 52.

Figure 77:
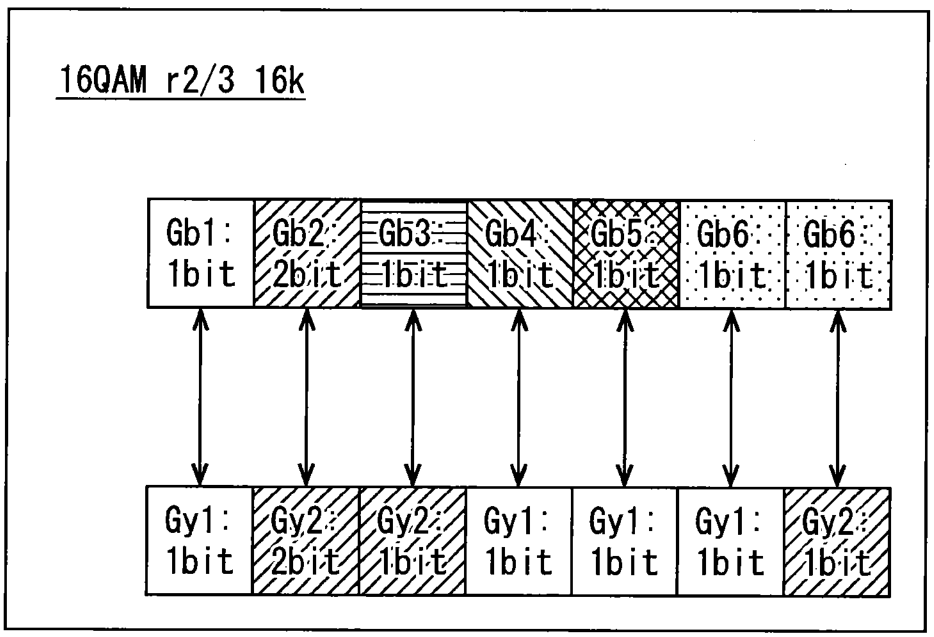
FIG. 77 is a diagram illustrating an allocation rule when an LDPC code having a code length of 16200 and a coding rate of 2/3 is modulated by 16 QAM, and a multiple b is 2.

FIG. 77 illustrates an allocation rule when an LDPC code is a mobile LDPC code in which the code length N is 16200 bits and the coding rate is 2/3, the modulation method is 16 QAM, and the multiple b is 2.

In the allocation rule of FIG. 77, pieces of group set information (Gb1, Gy1, 1), (Gb2, Gy2, 2), (Gb3, Gy2, 1), (Gb4, Gy1, 1), (Gb5, Gy1, 1), (Gb6, Gy1, 1), and (Gb6, Gy2, 1) are specified.

In other words, the allocation rule of FIG. 77 specifies that 1 bit of the code bits of the code bit group Gb1 having the highest error probability is allocated to 1 bit of the symbol bits of the symbol bit group Gy1 having the highest error probability based on the group set information (Gb1, Gy1, 1), that 2 bits of the code bits of the code bit group Gb2 having the second highest error probability are allocated to 2 bits of the symbol bits of the symbol bit group Gy2 having the second highest error probability based on the group set information (Gb2, Gy2, 2), that 1 bit of the code bits of the code bit group Gb3 having the third highest error probability is allocated to a 1 bit of the symbol bits of the symbol bit group Gy2 having the second highest error probability based on the group set information (Gb3, Gy2, 1), that 1 bit of the code bits of the code bit group Gb4 having the fourth highest error probability is allocated to a 1 bit of the symbol bits of the symbol bit group Gy1 having the highest error probability based on the group set information (Gb4, Gy1, 1), that 1 bit of the code bits of the code bit group Gb5 having the fifth highest error probability is allocated to 1 bit of the symbol bits of the symbol bit group Gy1 having the highest error probability based on the group set information (Gb5, Gy1, 1), that 1 bit of the code bits of the code bit group Gb6 having the sixth highest error probability is allocated to 1 bit of the symbol bits of the symbol bit group Gy1 having the highest error probability based on the group set information (Gb6, Gy1, 1), and that 1 bit of the code bits of the code bit group Gb6 having the sixth highest error probability is allocated to 1 bit of the symbol bits of the symbol bit group Gy2 having the second highest error probability based on the group set information (Gb6, Gy2, 1).

Figure 78:
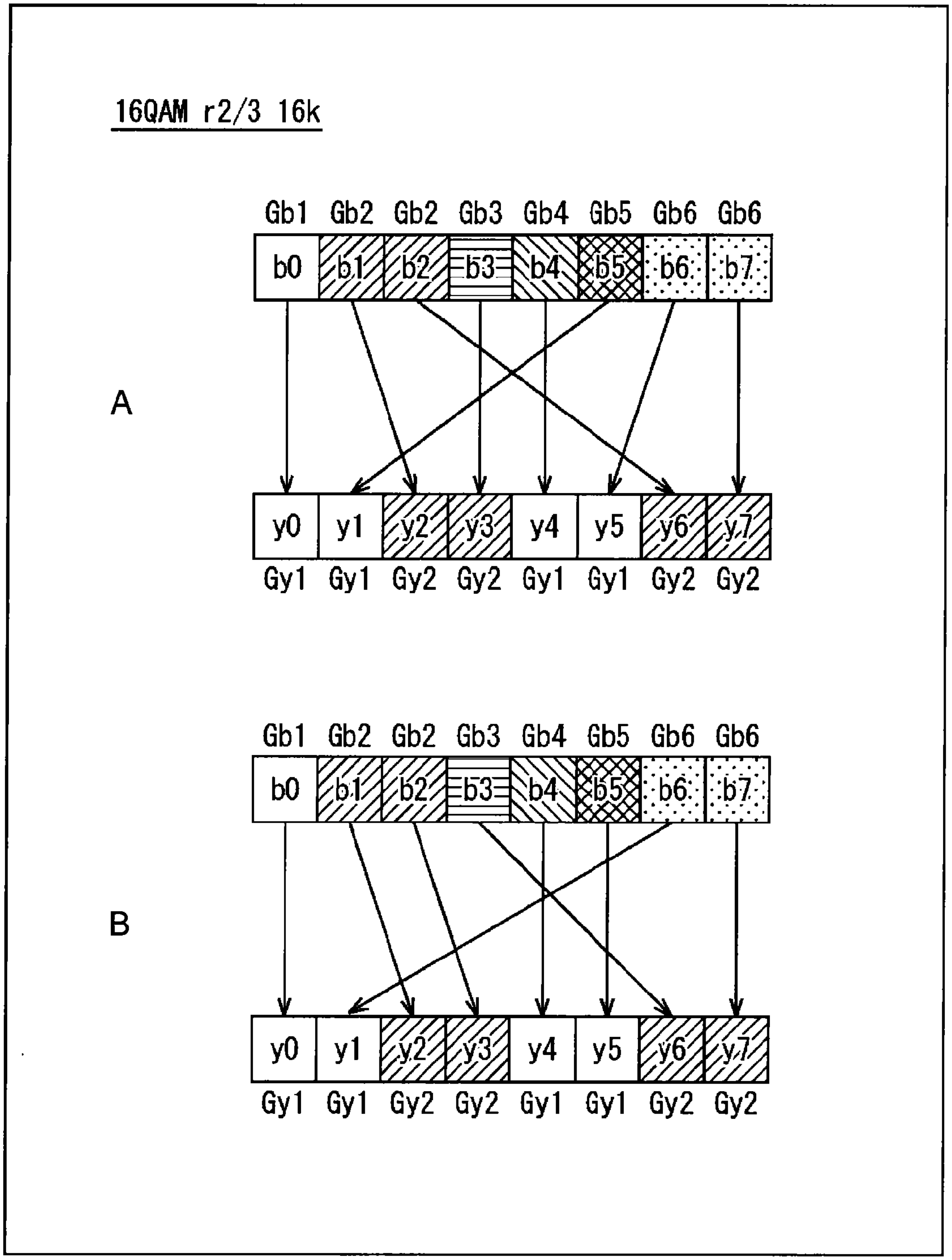
FIG. 78 is a diagram illustrating exchanging of code bits according to an allocation rule when an LDPC code having a code length of 16200 and a coding rate of 2/3 is modulated by 16 QAM, and a multiple b is 2.

FIG. 78 illustrates an example of exchanging of code bits according to the allocation rule of FIG. 77.

In other words, A of FIG. 78 illustrates a first example of exchanging of code bits according to the allocation rule of FIG. 77 when an LDPC code is a mobile LDPC code in which the code length N is 16200 bits and the coding rate is 2/3, the modulation method is 16 QAM, and the multiple b is 2.

When an LDPC code is a mobile LDPC code in which the code length N is 16200 bits and the coding rate is 2/3, the modulation method is 16 QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 77 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 78.

In other words, the exchange unit 32 performs exchanging such that the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 78 illustrates a second example of exchanging of code bits according to the allocation rule of FIG. 77 when an LDPC code is a mobile LDPC code in which the code length N is 16200 bits and the coding rate is 2/3, the modulation method is 16 QAM, and the multiple b is 2.

According to B of FIG. 78, the exchange unit 32 exchanges the code bits b0 to b7 of 4×2 (=mb) bits read from the memory 31 according to the allocation rule of FIG. 77 such that the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 79:
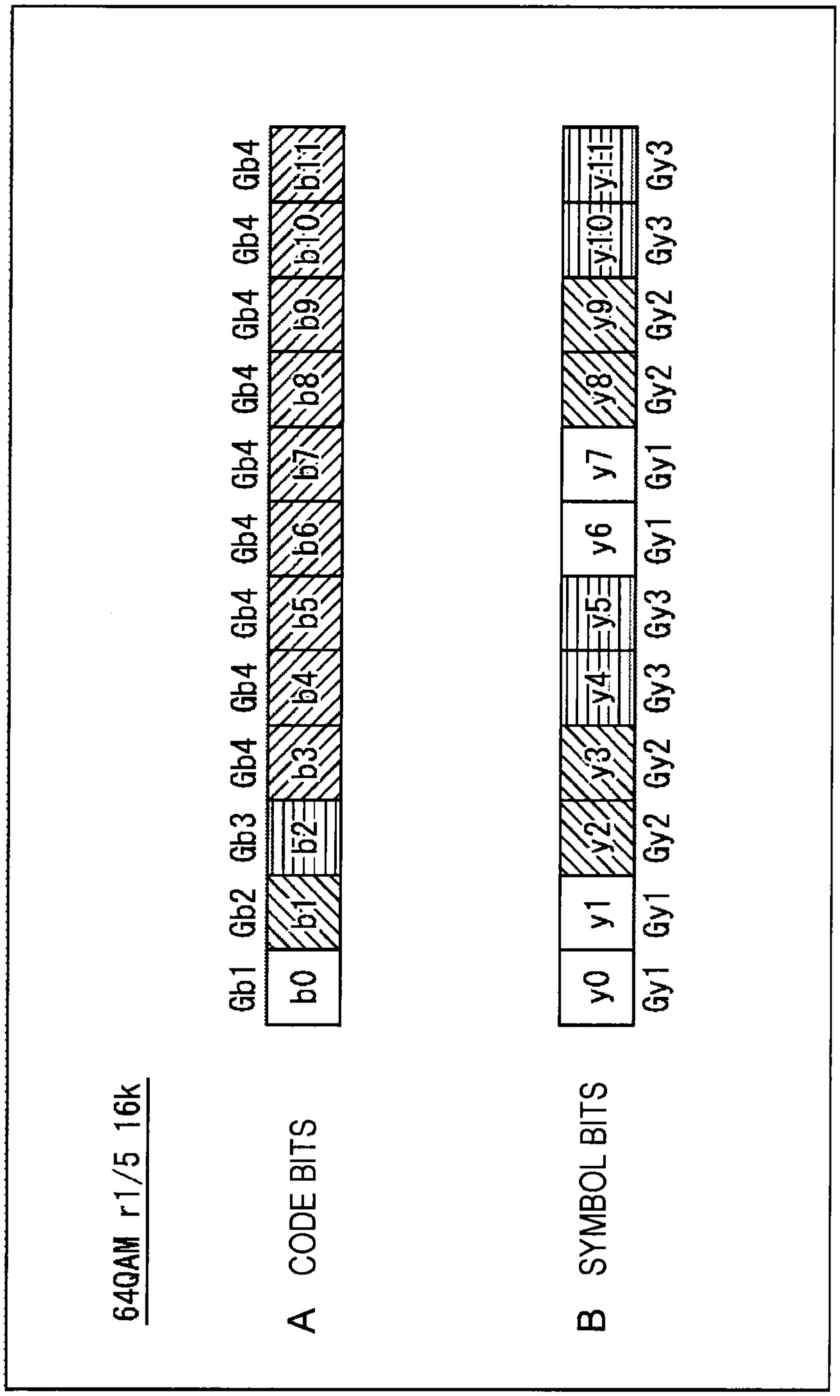
FIG. 79 is a diagram illustrating a code bit group and a symbol bit group when an LDPC code having a code length of 16200 and a coding rate of 1/5 is modulated by 64 QAM, and a multiple b is 2.

FIG. 79 illustrates a code bit group and a symbol bit group when an LDPC code is a mobile LDPC code in which the code length N is 16200 bits and the coding rate is 1/5, the modulation method is 64 QAM (thus, m=6), and the multiple b is 2.

In this case, the code bits of 4×2 (=mb) bits read from the memory 31 may be grouped into 4 code bit groups Gb1, Gb2, Gb3, and Gb4 according to the difference in the error probability as illustrated in A of FIG. 79.

In A of FIG. 79, the code bit b0 belongs to the code bit group Gb1, the code bit b1 belongs to the code bit group Gb2, the code bit b2 belongs to the code bit group Gb3, and the code bits b3 and b11 belong to the code bit group Gb4.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 79.

In B of FIG. 79, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3.

Figure 80:
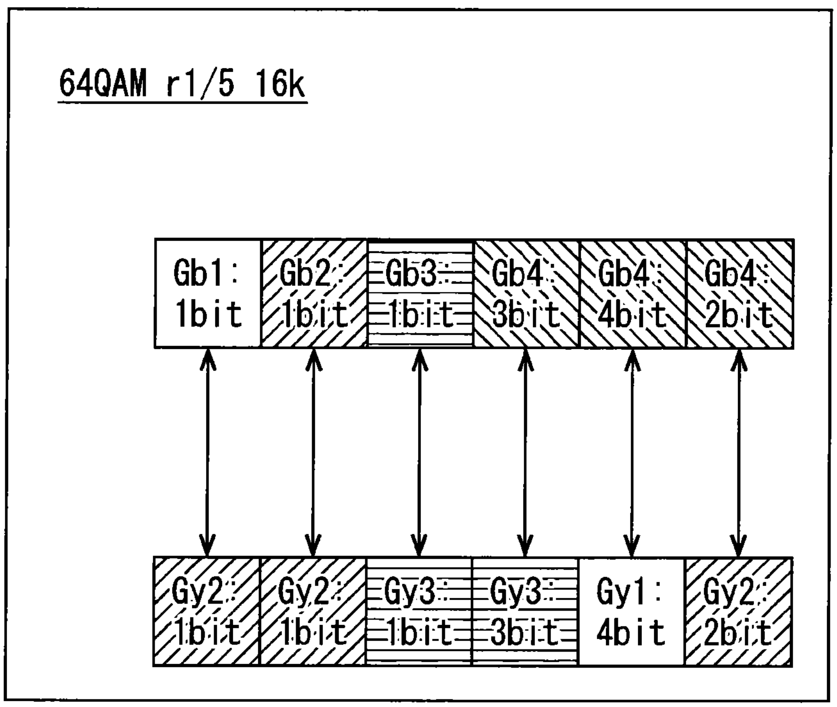
FIG. 80 is a diagram illustrating an allocation rule when an LDPC code having a code length of 16200 and a coding rate of 1/5 is modulated by 64 QAM, and a multiple b is 2.

FIG. 80 illustrates an allocation rule when an LDPC code is a mobile LDPC code in which the code length N is 16200 bits and the coding rate is 1/5, the modulation method is 64 QAM, and the multiple b is 2.

In the allocation rule of FIG. 80, pieces of group set information (Gb1, Gy2, 1), (Gb2, Gy2, 1), (Gb3, Gy3, 1), (Gb4, Gy3, 3), (Gb4, Gy1, 4), and (Gb4, Gy2, 2) are specified.

In other words, the allocation rule of FIG. 80 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 3 bits of the code bits of the code bit group Gb4 having the fourth highest error probability are allocated to 3 bits of the symbol bits of the symbol bit group Gy3 having the third highest error probability based on the group set information (Gb4, Gy3, 3), that 4 bits of the code bits of the code bit group Gb4 having the fourth highest error probability is allocated to 4 bits of the symbol bits of the symbol bit group Gy1 having the highest error probability based on the group set information (Gb4, Gy1, 4), and that 2 bits of the code bits of the code bit group Gb4 having the fourth highest error probability are allocated to 2 bits of the symbol bits of the symbol bit group Gy2 having the second highest error probability based on the group set information (Gb4, Gy2, 2).

Figure 81:
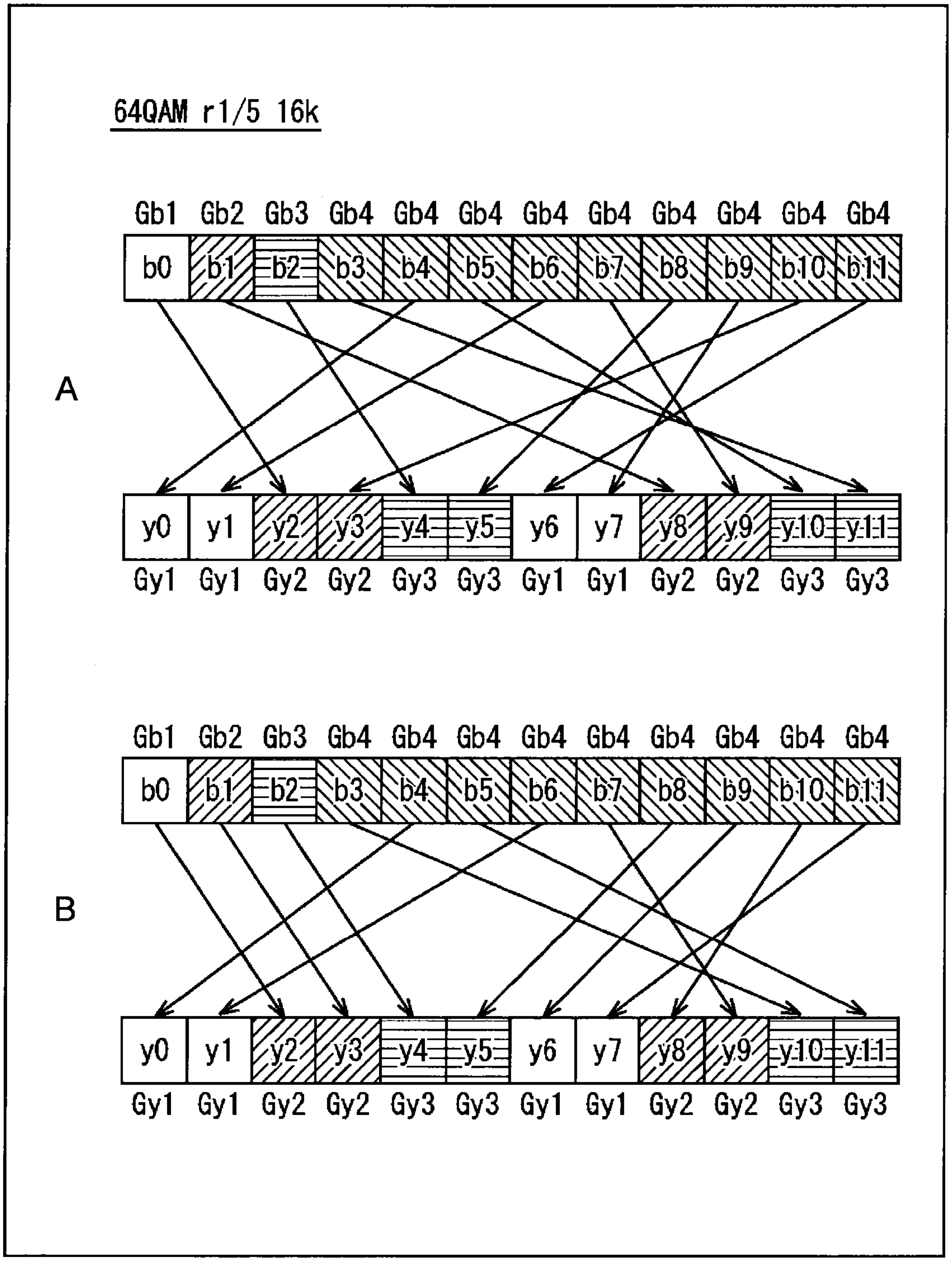
FIG. 81 is a diagram illustrating exchanging of code bits according to an allocation rule when an LDPC code having a code length of 16200 and a coding rate of 1/5 is modulated by 64 QAM, and a multiple b is 2.

FIG. 81 illustrates an example of exchanging of code bits according to the allocation rule of FIG. 80.

In other words, A of FIG. 81 illustrates a first example of exchanging of code bits according to the allocation rule of FIG. 80 when an LDPC code is a mobile LDPC code in which the code length N is 16200 bits and the coding rate is 1/5, the modulation method is 64 QAM, and the multiple b is 2.

When an LDPC code is a mobile LDPC code in which the code length N is 16200 bits and the coding rate is 1/5, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 80 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 81.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 81 illustrates a second example of exchanging of code bits according to the allocation rule of FIG. 80 when an LDPC code is a mobile LDPC code in which the code length N is 16200 bits and the coding rate is 1/5, the modulation method is 64 QAM, and the multiple b is 2.

According to B of FIG. 81, the exchange unit 32 exchanges the code bits b0 to b11 of 6×2 (=mb) bits read from the memory 31 according to the allocation rule of FIG. 80 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 82:
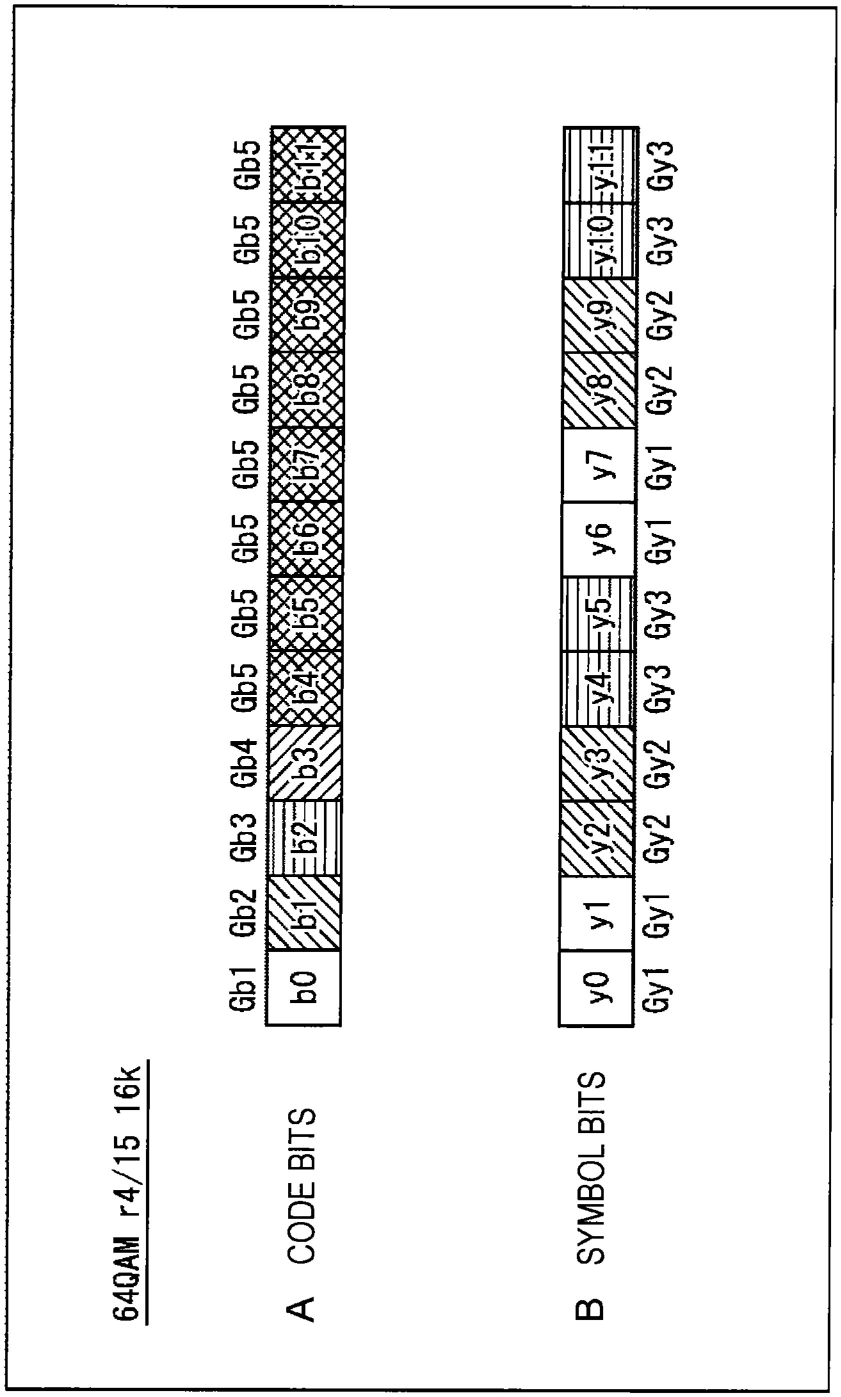
FIG. 82 is a diagram illustrating a code bit group and a symbol bit group when an LDPC code having a code length of 16200 and a coding rate of 4/15 is modulated by 64 QAM, and a multiple b is 2.

FIG. 82 illustrates a code bit group and a symbol bit group when an LDPC code is a mobile LDPC code in which the code length N is 16200 bits and the coding rate is 4/15, the modulation method is 64 QAM (thus, m=6), and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 82.

In A of FIG. 82, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 and b11 belong to the code bit group Gb5.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 82.

In B of FIG. 82, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 83:
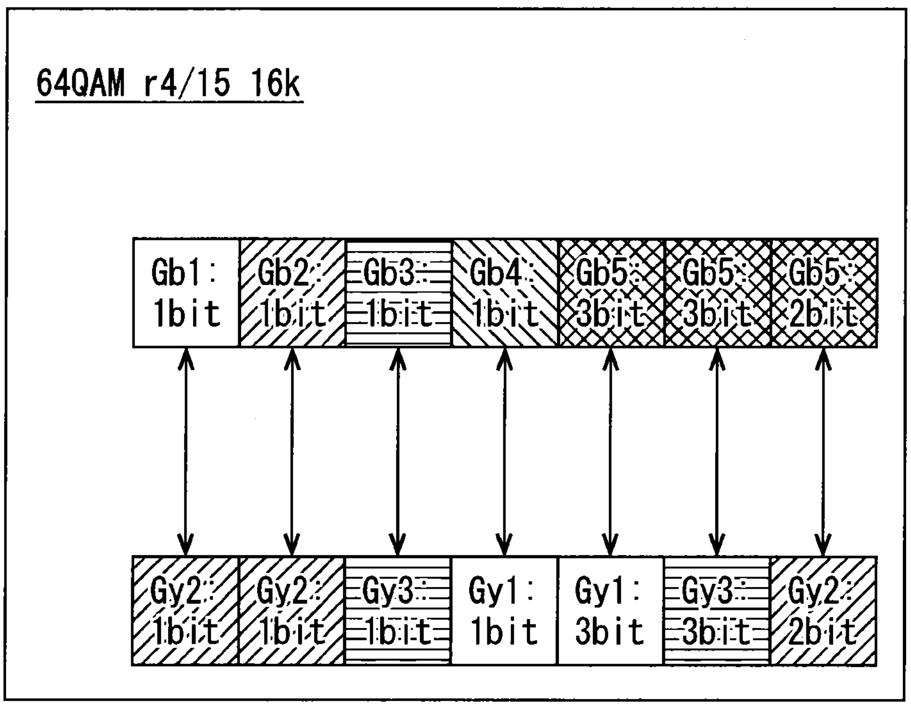
FIG. 83 is a diagram illustrating an allocation rule when an LDPC code having a code length of 16200 and a coding rate of 4/15 is modulated by 64 QAM, and a multiple b is 2.

FIG. 83 illustrates an allocation rule when an LDPC code is a mobile LDPC code in which the code length N is 16200 bits and the coding rate is 4/15, the modulation method is 64 QAM, and the multiple b is 2.

In the allocation rule of FIG. 83, pieces of group set information (Gb1, Gy2, 1), (Gb2, Gy2, 1), (Gb3, Gy3, 1), (Gb4, Gy1, 1), (Gb5, Gy1, 3), (Gb5, Gy3, 3), and (Gb5, Gy2, 2) are specified.

In other words, the allocation rule of FIG. 83 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 1 bit of the code bits of the code bit group Gb4 having the fourth highest error probability is allocated to 1 bit of the symbol bits of the symbol bit group Gy1 having the highest error probability based on the group set information (Gb4, Gy1, 1), that 3 bits of the code bits of the code bit group Gb5 having the fifth highest error probability are allocated to 3 bits of the symbol bits of the symbol bit group Gy1 having the highest error probability based on the group set information (Gb5, Gy1, 3), that 3 bits of the code bits of the code bit group Gb5 having the fifth highest error probability are allocated to 3 bits of the symbol bits of the symbol bit group Gy3 having the third highest error probability based on the group set information (Gb5, Gy3, 3), and that 2 bits of the code bits of the code bit group Gb5 having the fifth highest error probability are allocated to 2 bits of the symbol bits of the symbol bit group Gy2 having the second highest error probability based on the group set information (Gb5, Gy2, 2).

Figure 84:
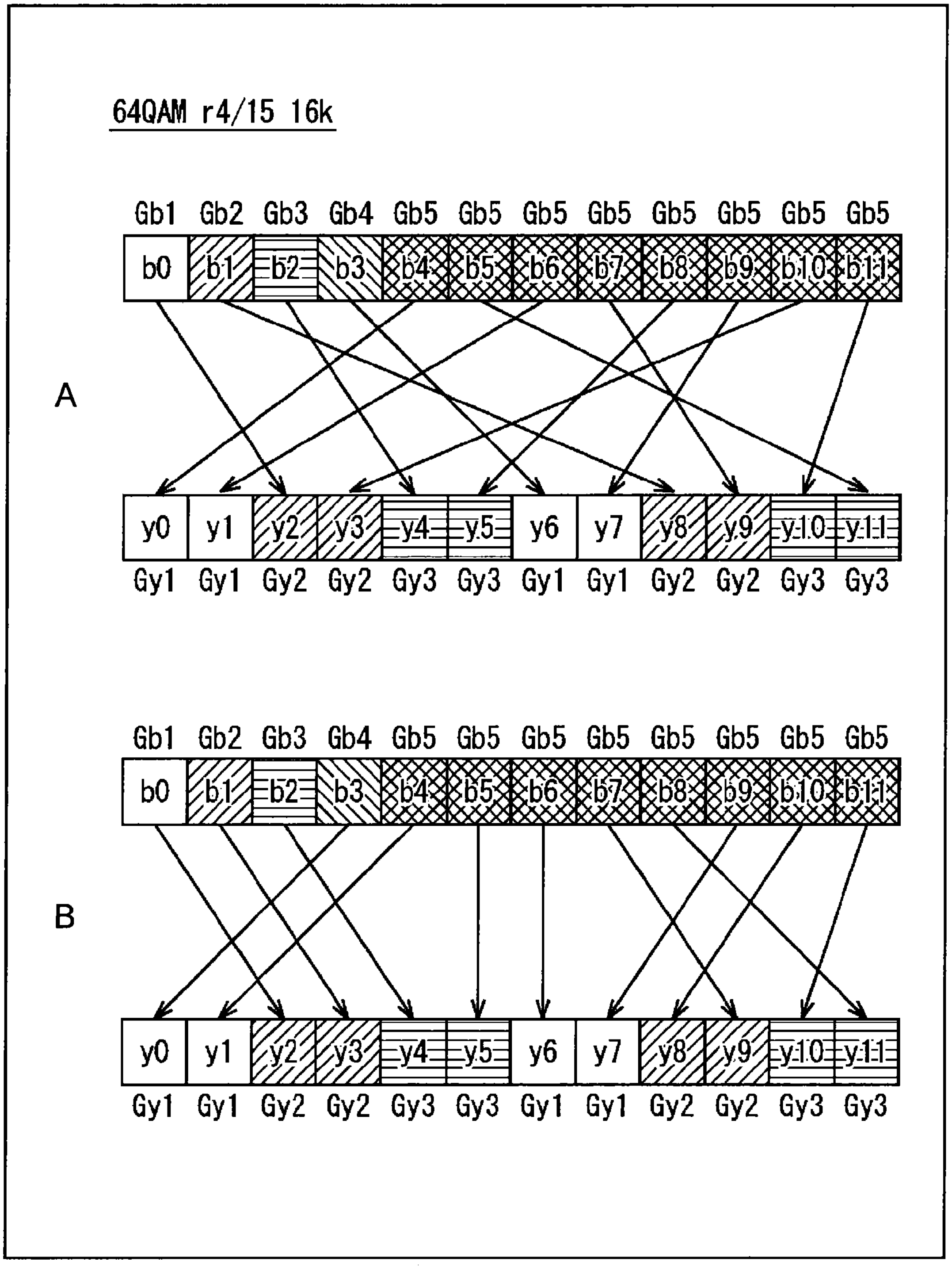
FIG. 84 is a diagram illustrating exchanging of code bits according to an allocation rule when an LDPC code having a code length of 16200 and a coding rate of 4/15 is modulated by 64 QAM, and a multiple b is 2.

FIG. 84 illustrates an example of exchanging of code bits according to the allocation rule of FIG. 83.

In other words, A of FIG. 84 illustrates a first example of exchanging of code bits according to the allocation rule of FIG. 83 when an LDPC code is a mobile LDPC code in which the code length N is 16200 bits and the coding rate is 4/15, the modulation method is 64 QAM, and the multiple b is 2.

When an LDPC code is a mobile LDPC code in which the code length N is 16200 bits and the coding rate is 4/15, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 83 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 84.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y10.

B of FIG. 84 illustrates a second example of exchanging of code bits according to the allocation rule of FIG. 83 when an LDPC code is a mobile LDPC code in which the code length N is 16200 bits and the coding rate is 4/15, the modulation method is 64 QAM, and the multiple b is 2.

According to B of FIG. 84, the exchange unit 32 exchanges the code bits b0 to b11 of 6×2 (=mb) bits read from the memory 31 according to the allocation rule of FIG. 83 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10.

Figure 85:
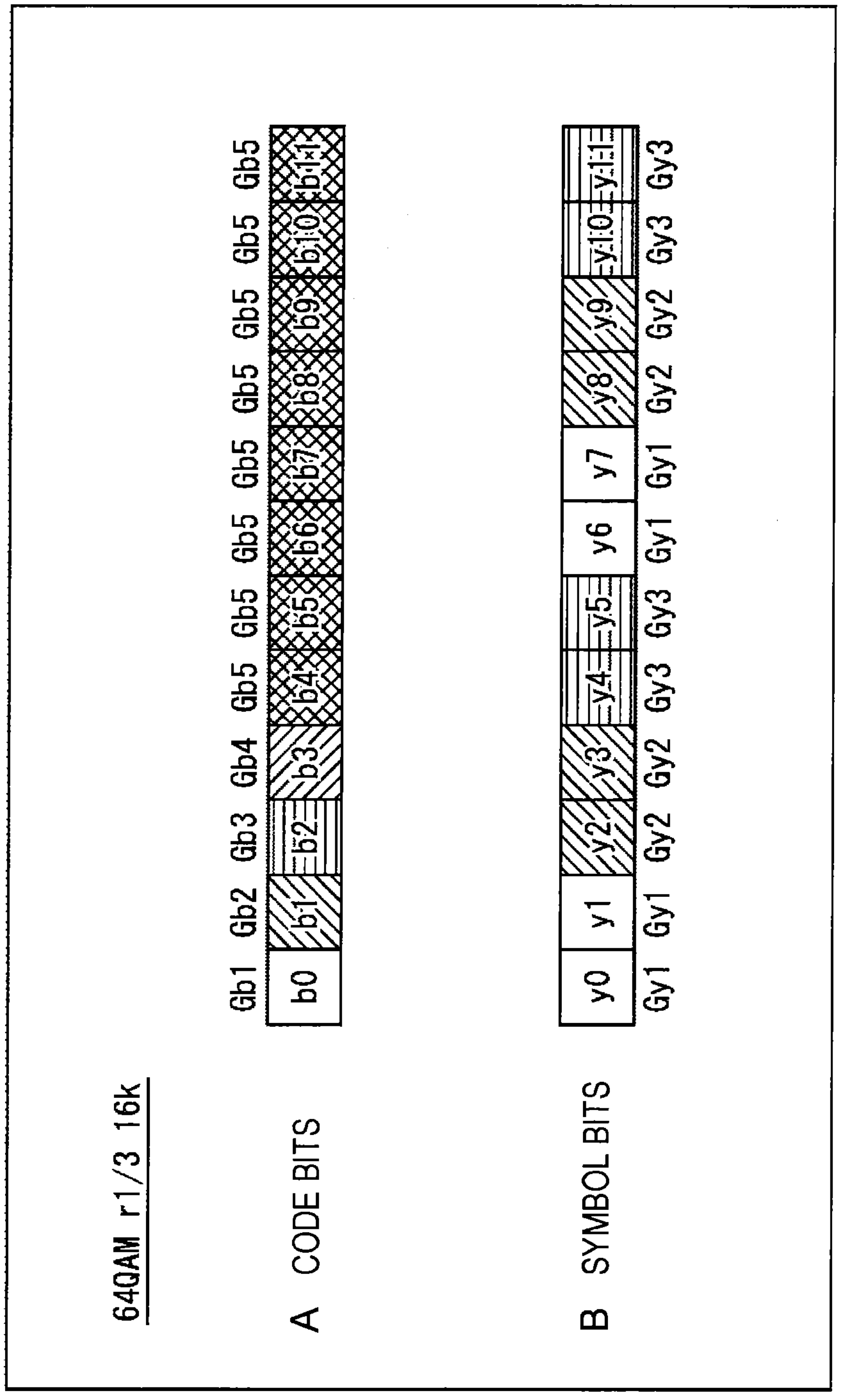
FIG. 85 is a diagram illustrating a code bit group and a symbol bit group when an LDPC code having a code length of 16200 and a coding rate of 1/3 is modulated by 64 QAM, and a multiple b is 2.

FIG. 85 illustrates a code bit group and a symbol bit group when an LDPC code is a mobile LDPC code in which the code length N is 16200 bits and the coding rate is 1/3, the modulation method is 64 QAM, and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 85.

In A of FIG. 85, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 and b11 belong to the code bit group Gb5.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 85.

In B of FIG. 85, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 86:
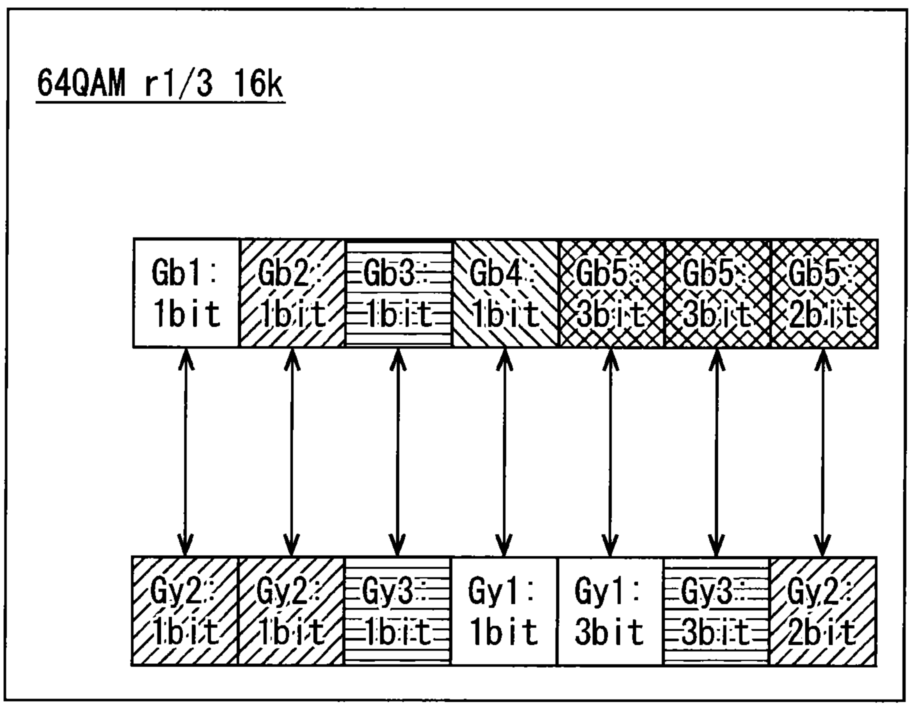
FIG. 86 is a diagram illustrating an allocation rule when an LDPC code having a code length of 16200 and a coding rate of 1/3 is modulated by 64 QAM, and a multiple b is 2.

FIG. 86 illustrates an allocation rule when an LDPC code is a mobile LDPC code in which the code length N is 16200 bits and the coding rate is 1/3, the modulation method is 64 QAM, and the multiple b is 2.

In the allocation rule of FIG. 86, pieces of group set information (Gb1, Gy2, 1), (Gb2, Gy2, 1), (Gb3, Gy3, 1), (Gb4, Gy1, 1), (Gb5, Gy1, 3), (Gb5, Gy3, 3), and (Gb5, Gy2, 2) are specified.

In other words, the allocation rule of FIG. 86 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 1 bit of the code bits of the code bit group Gb4 having the fourth highest error probability is allocated to 1 bit of the symbol bits of the symbol bit group Gy1 having the highest error probability based on the group set information (Gb4, Gy1, 1), that 3 bits of the code bits of the code bit group Gb5 having the fifth highest error probability are allocated to 3 bits of the symbol bits of the symbol bit group Gy1 having the highest error probability based on the group set information (Gb5, Gy1, 3), that 3 bits of the code bits of the code bit group Gb5 having the fifth highest error probability are allocated to 3 bits of the symbol bits of the symbol bit group Gy3 having the third highest error probability based on the group set information (Gb5, Gy3, 3), and that 2 bits of the code bits of the code bit group Gb5 having the fifth highest error probability are allocated to 2 bits of the symbol bits of the symbol bit group Gy2 having the second highest error probability based on the group set information (Gb5, Gy2, 2).

Figure 87:
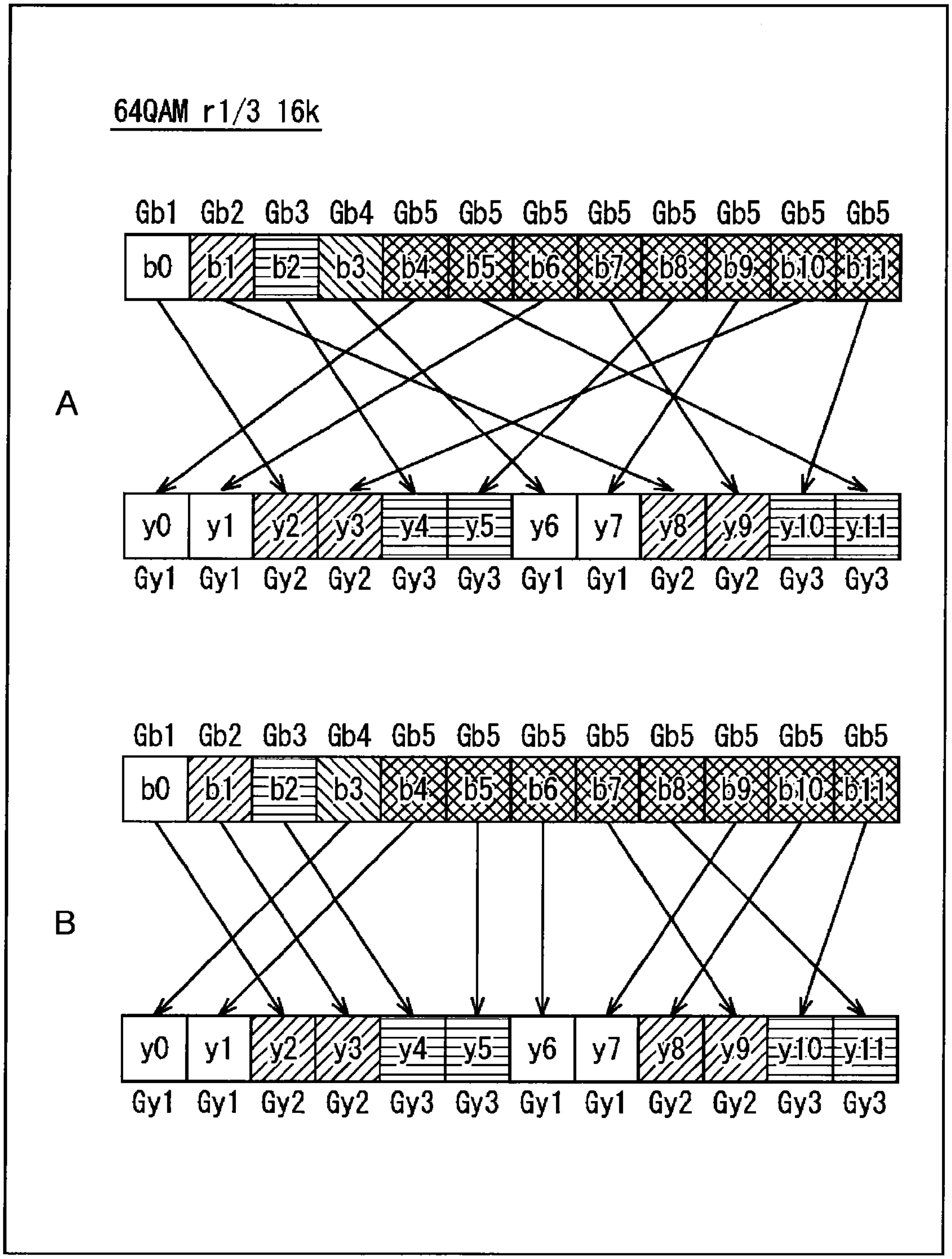
FIG. 87 is a diagram illustrating exchanging of code bits according to an allocation rule when an LDPC code having a code length of 16200 and a coding rate of 1/3 is modulated by 64 QAM, and a multiple b is 2.

FIG. 87 illustrates an example of exchanging of code bits according to the allocation rule of FIG. 86.

In other words, A of FIG. 87 illustrates a first example of exchanging of code bits according to the allocation rule of FIG. 86 when an LDPC code is a mobile LDPC code in which the code length N is 16200 bits and the coding rate is 1/3, the modulation method is 64 QAM, and the multiple b is 2.

When an LDPC code is a mobile LDPC code in which the code length N is 16200 bits and the coding rate is 1/3, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 86 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 87.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y10.

B of FIG. 87 illustrates a second example of exchanging of code bits according to the allocation rule of FIG. 86 when an LDPC code is a mobile LDPC code in which the code length N is 16200 bits and the coding rate is 1/3, the modulation method is 64 QAM, and the multiple b is 2.

According to B of FIG. 87, the exchange unit 32 exchanges the code bits b0 to b11 of 6×2 (=mb) bits read from the memory 31 according to the allocation rule of FIG. 86 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10.

Figure 88:
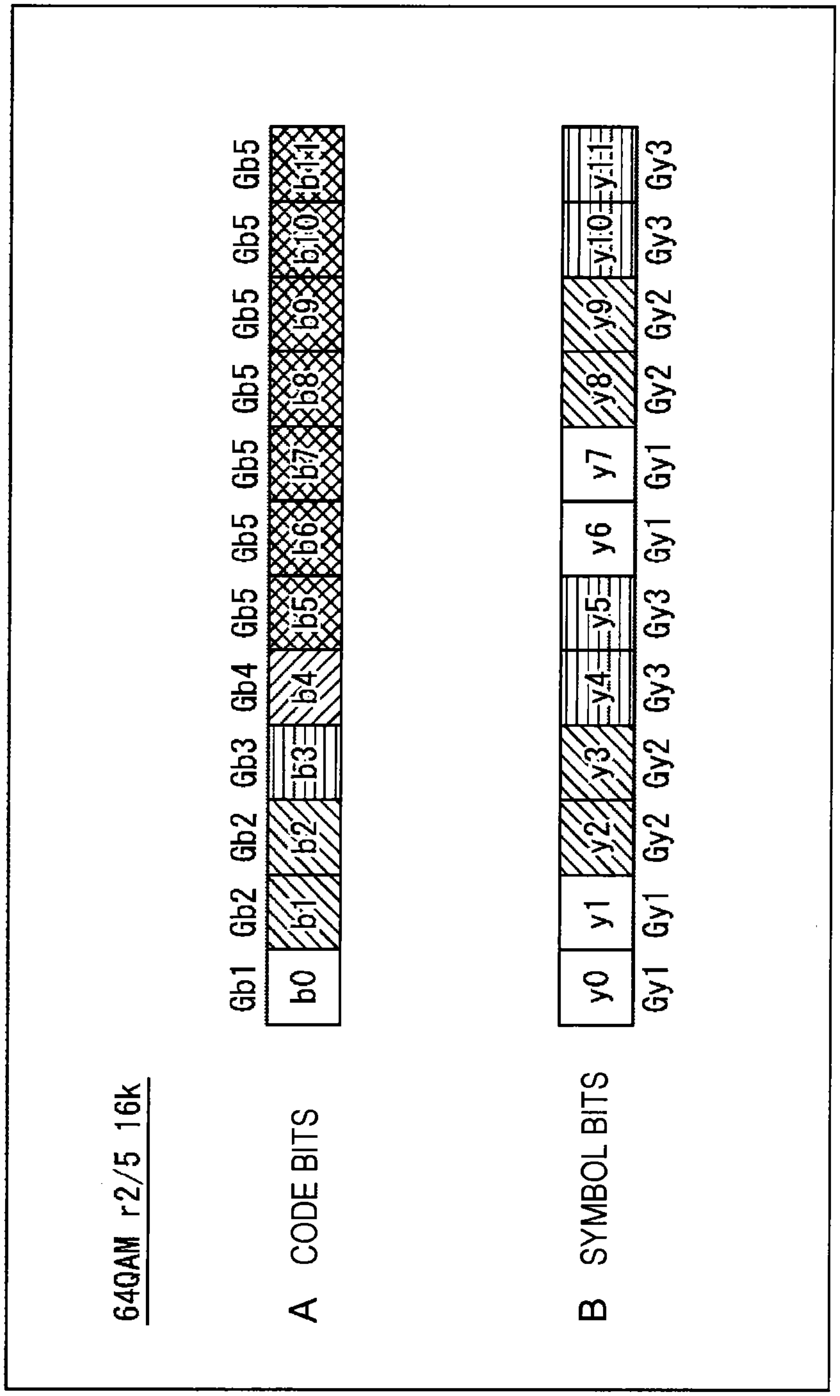
FIG. 88 is a diagram illustrating a code bit group and a symbol bit group when an LDPC code having a code length of 16200 and a coding rate of 2/5 is modulated by 64 QAM, and a multiple b is 2.

FIG. 88 illustrates a code bit group and a symbol bit group when an LDPC code is a mobile LDPC code in which the code length N is 16200 bits and the coding rate is 2/5, the modulation method is 64 QAM, and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 88.

In A of FIG. 88, the code bit b0 belongs to the code bit group Gb1, the code bits b1 and b2 belong to the code bit group Gb2, the code bit b3 belongs to the code bit group Gb3, the code bit b4 belongs to the code bit group Gb4, and the code bits b5 to b11 belong to the code bit group Gb5.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 88.

In B of FIG. 88, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 89:
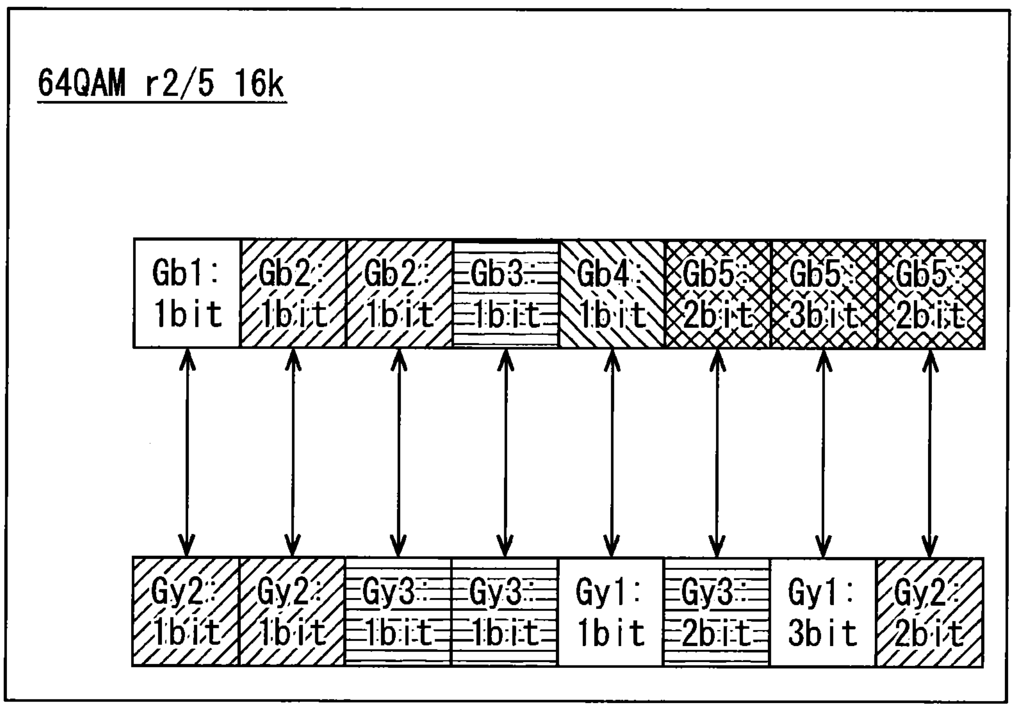
FIG. 89 is a diagram illustrating an allocation rule when an LDPC code having a code length of 16200 and a coding rate of 2/5 is modulated by 64 QAM, and a multiple b is 2.

FIG. 89 illustrates an allocation rule when an LDPC code is a mobile LDPC code in which the code length N is 16200 bits and the coding rate is 2/5, the modulation method is 64 QAM, and the multiple b is 2.

In the allocation rule of FIG. 89, pieces of group set information (Gb1, Gy2, 1), (Gb2, Gy2, 1), (Gb2, Gy3, 1), (Gb3, Gy3, 1), (Gb4, Gy1, 1), (Gb5, Gy3, 2), (Gb5, Gy1, 3), and (Gb5, Gy2, 2) are specified.

In other words, the allocation rule of FIG. 89 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb2 having the second highest error probability is allocated to 1 bit of the symbol bits of the symbol bit group Gy3 having the third highest error probability based on the group set information (Gb2, Gy3, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 1 bit of the code bits of the code bit group Gb4 having the fourth highest error probability is allocated to 1 bit of the symbol bits of the symbol bit group Gy1 having the highest error probability based on the group set information (Gb4, Gy1, 1), that 2 bits of the code bits of the code bit group Gb5 having the fifth highest error probability are allocated to 2 bits of the symbol bits of the symbol bit group Gy3 having the third highest error probability based on the group set information (Gb5, Gy3, 2), that 3 bits of the code bits of the code bit group Gb5 having the fifth highest error probability are allocated to 3 bits of the symbol bits of the symbol bit group Gy1 having the highest error probability based on the group set information (Gb5, Gy1, 3), and that 2 bits of the code bits of the code bit group Gb5 having the fifth highest error probability are allocated to 2 bits of the symbol bits of the symbol bit group Gy2 having the second highest error probability based on the group set information (Gb5, Gy2, 2).

Figure 90:
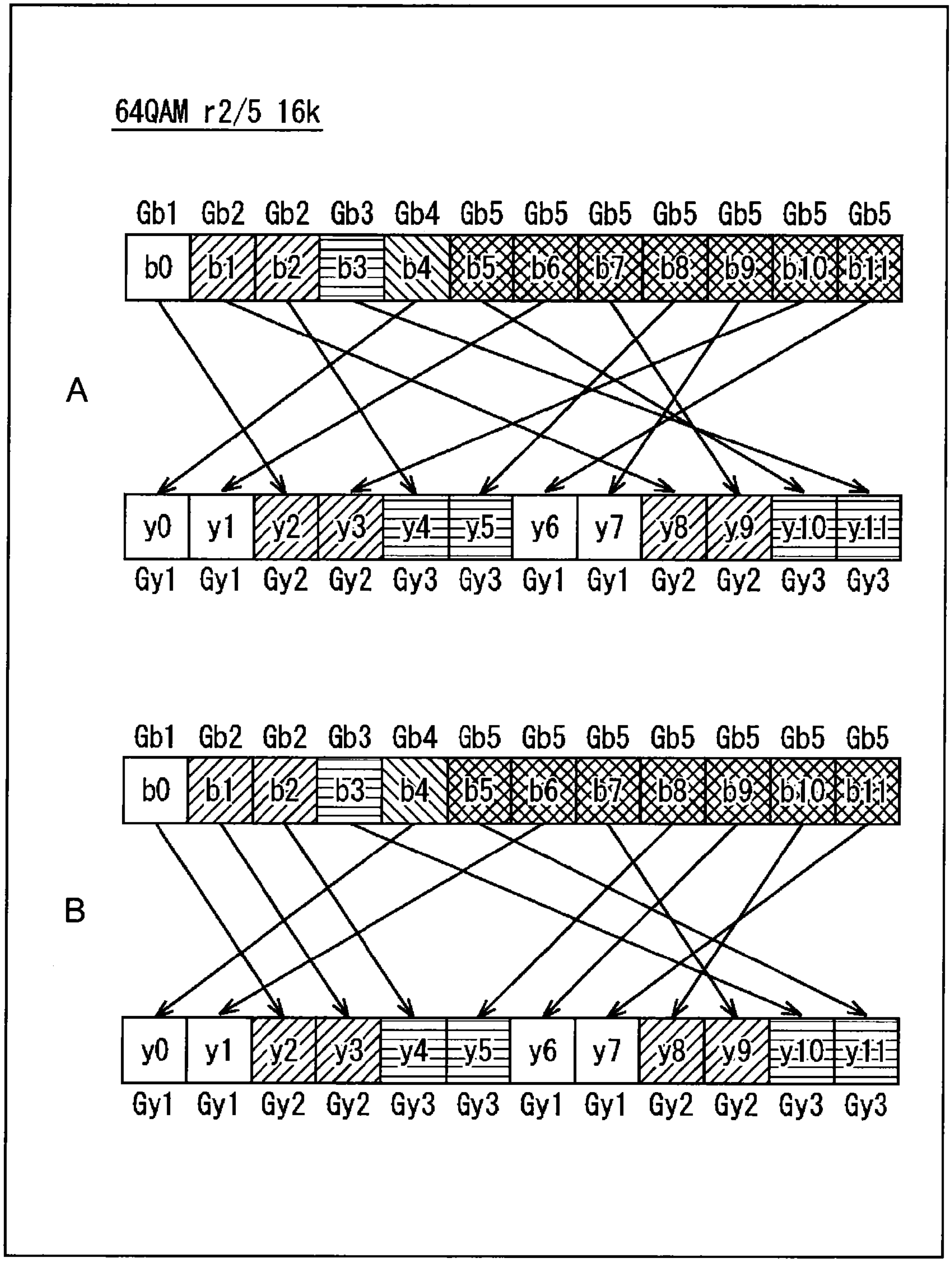
FIG. 90 is a diagram illustrating exchanging of code bits according to an allocation rule when an LDPC code having a code length of 16200 and a coding rate of 2/5 is modulated by 64 QAM, and a multiple b is 2.

FIG. 90 illustrates an example of exchanging of code bits according to the allocation rule of FIG. 89.

In other words, A of FIG. 90 illustrates a first example of exchanging of code bits according to the allocation rule of FIG. 89 when an LDPC code is a mobile LDPC code in which the code length N is 16200 bits and the coding rate is 2/5, the modulation method is 64 QAM, and the multiple b is 2.

When an LDPC code is a mobile LDPC code in which the code length N is 16200 bits and the coding rate is 2/5, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 89 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 90.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 90 illustrates a second example of exchanging of code bits according to the allocation rule of FIG. 89 when an LDPC code is a mobile LDPC code in which the code length N is 16200 bits and the coding rate is 2/5, the modulation method is 64 QAM, and the multiple b is 2.

According to B of FIG. 90, the exchange unit 32 exchanges the code bits b0 to b11 of 6×2 (=mb) bits read from the memory 31 according to the allocation rule of FIG. 89 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 91:
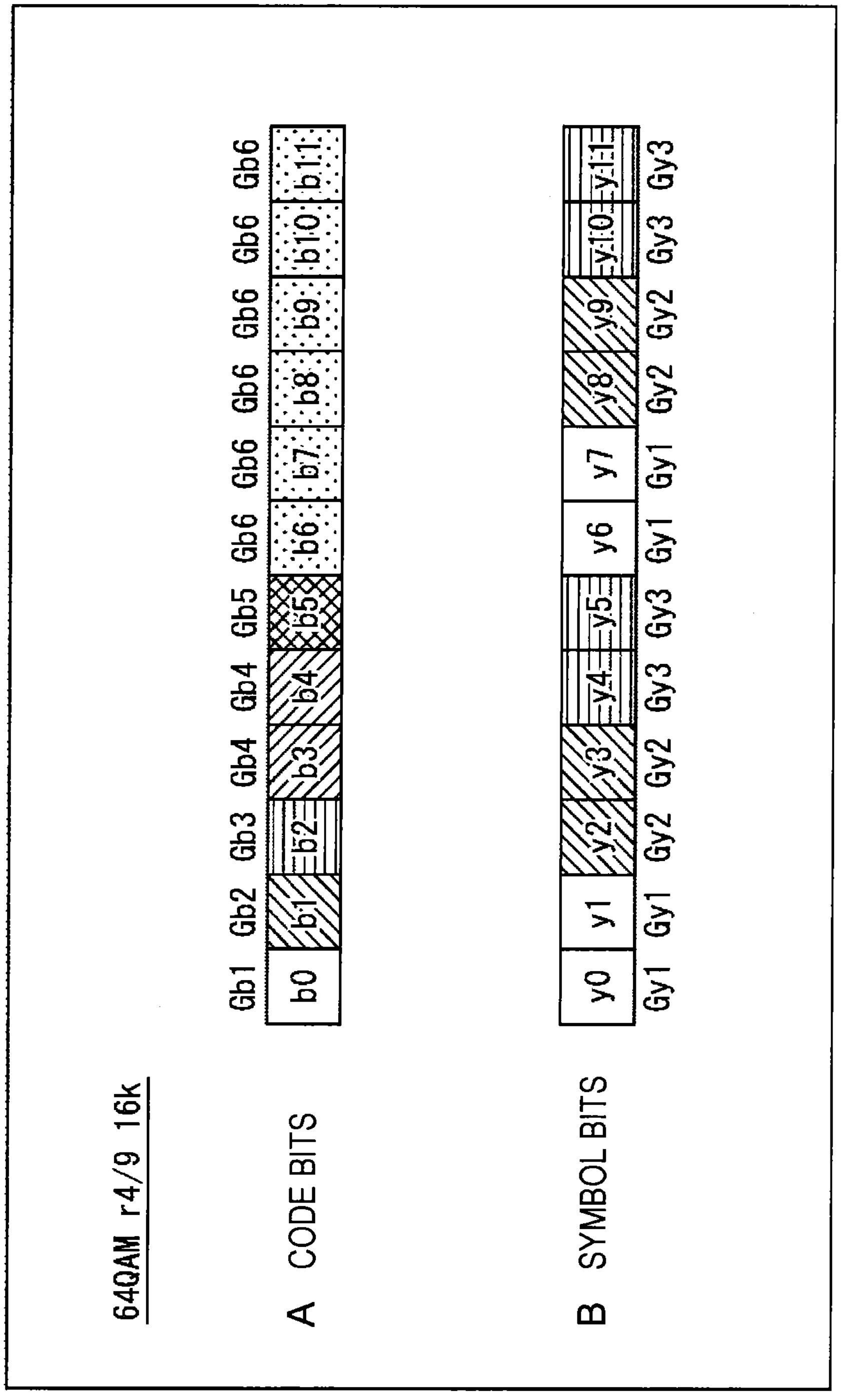
FIG. 91 is a diagram illustrating a code bit group and a symbol bit group when an LDPC code having a code length of 16200 and a coding rate of 4/9 is modulated by 64 QAM, and a multiple b is 2.

FIG. 91 illustrates a code bit group and a symbol bit group when an LDPC code is a mobile LDPC code in which the code length N is 16200 bits and the coding rate is 4/9, the modulation method is 64 QAM, and the multiple b is 2.

In this case, the code bits of 6×2 (=mb) bits read from the memory 31 may be grouped into 6 code bit groups Gb1, Gb2, Gb3, Gb4, Gb5, and Gb6 according to the difference in the error probability as illustrated in A of FIG. 91.

In A of FIG. 91, the code bit b0 belongs to the code bit group Gb1, the code bit b1 belongs to the code bit group Gb2, the code bit b2 belongs to the code bit group Gb3, the code bits b3 and b4 belong to the code bit group Gb4, the code bit b5 belongs to the code bit group Gb5, and the code bits b6 to b11 belong to the code bit group Gb6.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 91.

In B of FIG. 91, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 92:
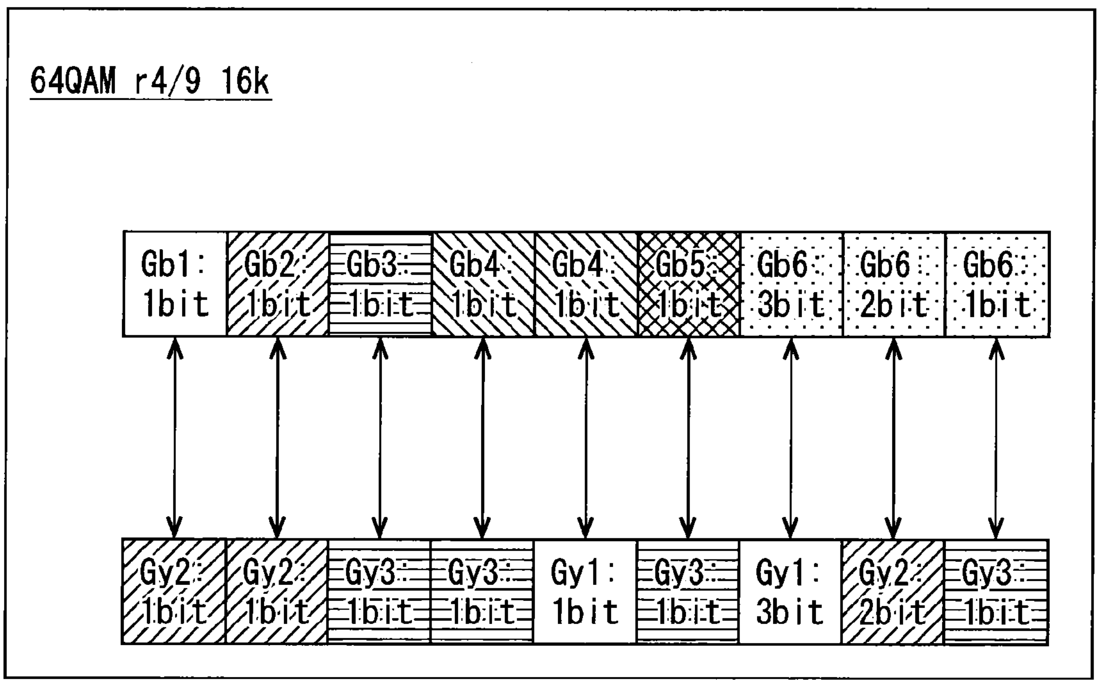
FIG. 92 is a diagram illustrating an allocation rule when an LDPC code having a code length of 16200 and a coding rate of 4/9 is modulated by 64 QAM, and a multiple b is 2.

FIG. 92 illustrates an allocation rule when an LDPC code is a mobile LDPC code in which the code length N is 16200 bits and the coding rate is 4/9, the modulation method is 64 QAM, and the multiple b is 2.

In the allocation rule of FIG. 92, pieces of group set information (Gb1, Gy2, 1), (Gb2, Gy2, 1), (Gb3, Gy3, 1), (Gb4, Gy3, 1), (Gb4, Gy1, 1), (Gb5, Gy3, 1), (Gb6, Gy1, 3), (Gb6, Gy2, 2), and (Gb6, Gy3, 1) are specified.

In other words, the allocation rule of FIG. 92 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated t 1 bit of the symbol bits of the symbol bit group Gy3 having the third highest error probability based on the group set information (Gb3, Gy3, 1), that 1 bit of the code bits of the code bit group Gb4 having the fourth highest error probability is allocated to 1 bit of the symbol bits of the symbol bit group Gy3 having the third highest error probability based on the group set information (Gb4, Gy3, 1), that 1 bit of the code bits of the code bit group Gb4 having the fourth highest error probability is allocated to 1 bit of the symbol bits of the symbol bit group Gy1 having the highest error probability based on the group set information (Gb4, Gy1, 1), that 1 bit of the code bits of the code bit group Gb5 having the fifth highest error probability is allocated to 1 bit of the symbol bits of the symbol bit group Gy3 having the third highest error probability based on the group set information (Gb5, Gy3, 1), that 3 bits of the code bits of the code bit group Gb6 having the sixth highest error probability are allocated to 3 bits of the symbol bits of the symbol bit group Gy1 having the highest error probability based on the group set information (Gb6, Gy1, 3), that 2 bits of the code bits of the code bit group Gb6 having the sixth highest error probability are allocated to 2 bits of the symbol bits of the symbol bit group Gy2 having the second highest error probability based on the group set information (Gb6, Gy2, 2), and that 1 bit of the code bits of the code bit group Gb6 having the sixth highest error probability is allocated to 1 bit of the symbol bits of the symbol bit group Gy3 having the third highest error probability based on the group set information (Gb6, Gy3, 1).

Figure 93:
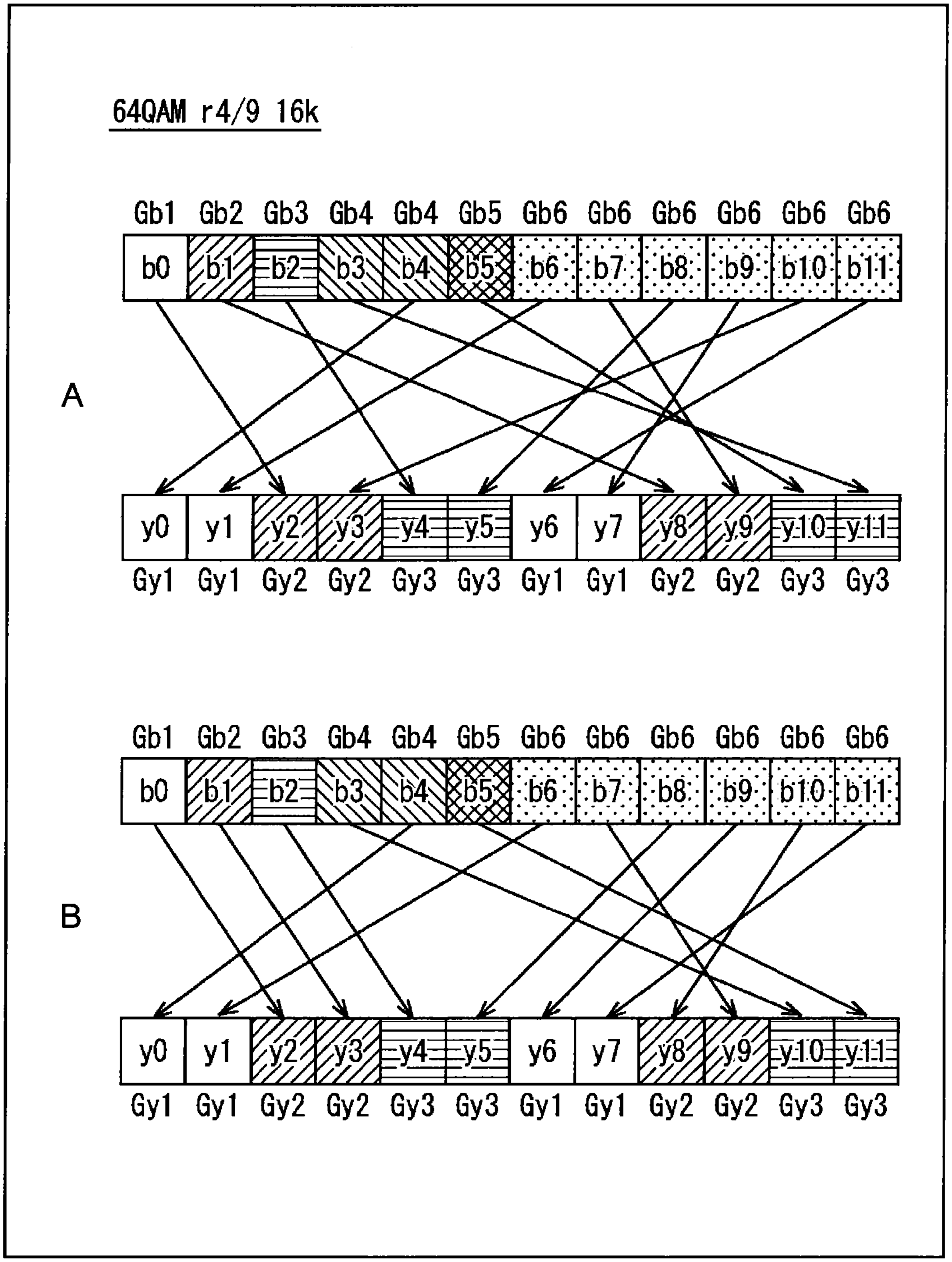
FIG. 93 is a diagram illustrating exchanging of code bits according to an allocation rule when an LDPC code having a code length of 16200 and a coding rate of 4/9 is modulated by 64 QAM, and a multiple b is 2.

FIG. 93 illustrates an example of exchanging of code bits according to the allocation rule of FIG. 92.

In other words, A of FIG. 93 illustrates a first example of exchanging of code bits according to the allocation rule of FIG. 92 when an LDPC code is a mobile LDPC code in which the code length N is 16200 bits and the coding rate is 4/9, the modulation method is 64 QAM, and the multiple b is 2.

When an LDPC code is a mobile LDPC code in which the code length N is 16200 bits and the coding rate is 4/9, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 92 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 93.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 93 illustrates a second example of exchanging of code bits according to the allocation rule of FIG. 92 when an LDPC code is a mobile LDPC code in which the code length N is 16200 bits and the coding rate is 4/9, the modulation method is 64 QAM, and the multiple b is 2.

According to B of FIG. 93, the exchange unit 32 exchanges the code bits b0 to b11 of 6×2 (=mb) bits read from the memory 31 according to the allocation rule of FIG. 92 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 94:
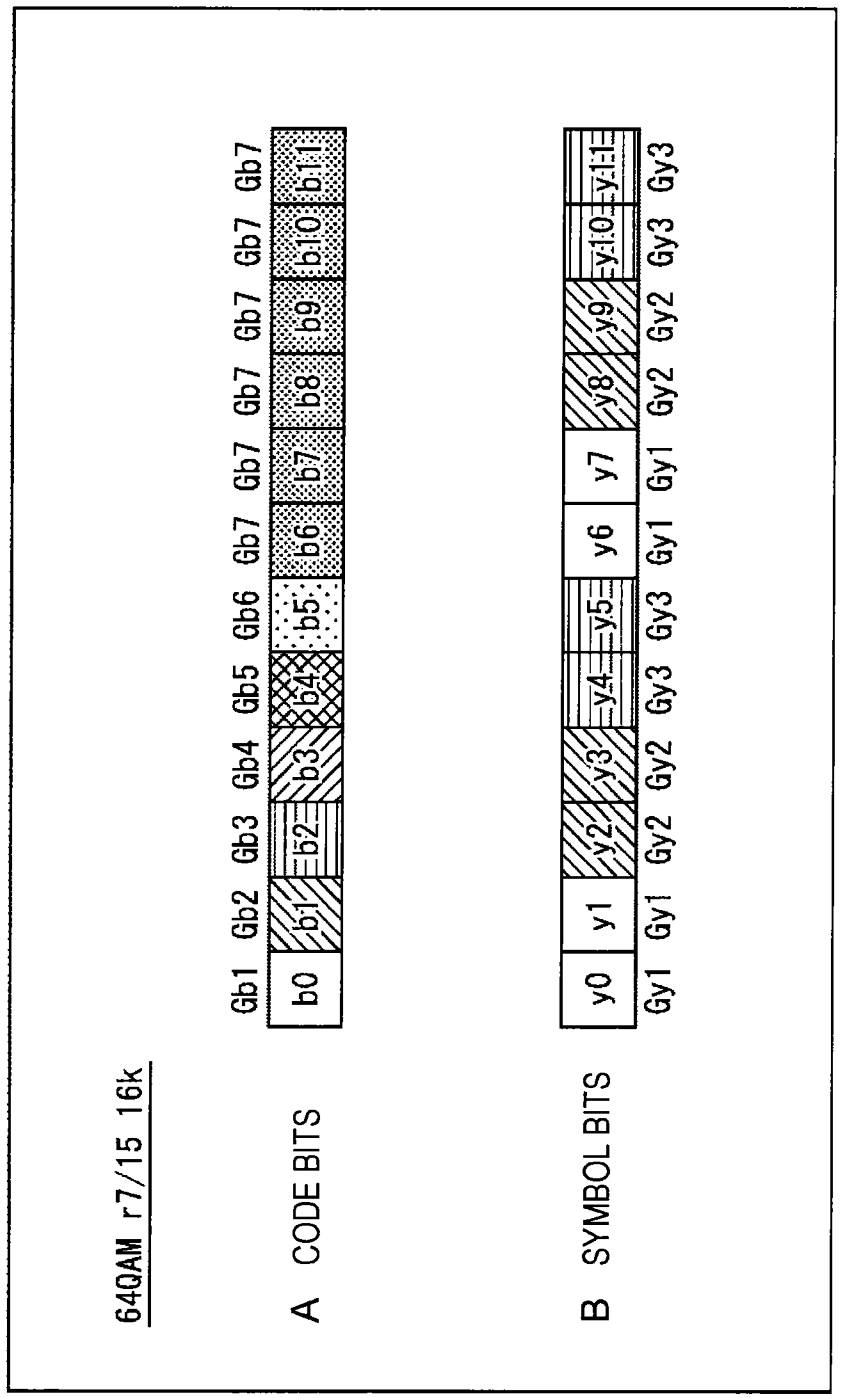
FIG. 94 is a diagram illustrating a code bit group and a symbol bit group when an LDPC code having a code length of 16200 and a coding rate of 7/15 is modulated by 64 QAM, and a multiple b is 2.

FIG. 94 illustrates a code bit group and a symbol bit group when an LDPC code is a mobile LDPC code in which the code length N is 16200 bits and the coding rate is 7/15, the modulation method is 64 QAM, and the multiple b is 2.

In this case, the code bits of 6×2 (=mb) bits read from the memory 31 may be grouped into 7 code bit groups Gb1, Gb2, Gb3, Gb4, Gb5, Gb6, and Gb7 according to the difference in the error probability as illustrated in A of FIG. 94.

In A of FIG. 94, the code bit b0 belongs to the code bit group Gb1, the code bit b1 belongs to the code bit group Gb2, the code bit b2 belongs to the code bit group Gb3, the code bit b3 belongs to the code bit group Gb4, the code bit b4 belongs to the code bit group Gb5, the code bit b5 belongs to the code bit group Gb6, and the code bits b6 to b11 belong to the code bit group Gb7.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 94.

In B of FIG. 94, the symbol bits y0, y1, y6, and y7 belong to the symbol bit group Gy1, the symbol bits y2, y3, y8, and y9 belong to the symbol bit group Gy2, and the symbol bits y4, y5, y10, and $y_{11}$ belong to the symbol bit group Gy3, similarly to B of FIG. 79.

Figure 95:
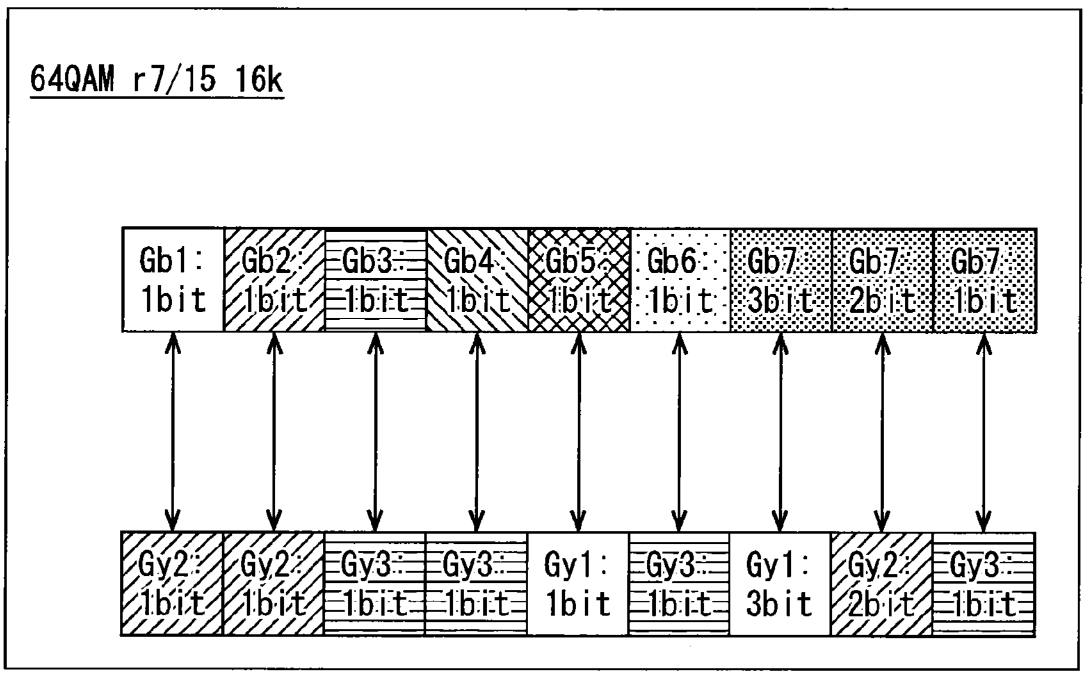
FIG. 95 is a diagram illustrating an allocation rule when an LDPC code having a code length of 16200 and a coding rate of 7/15 is modulated by 64 QAM, and a multiple b is 2.

FIG. 95 illustrates an allocation rule when an LDPC code is a mobile LDPC code in which the code length N is 16200 bits and the coding rate is 7/15, the modulation method is 64 QAM, and the multiple b is 2.

In the allocation rule of FIG. 95, pieces of group set information (Gb1, Gy2, 1), (Gb2, Gy2, 1), (Gb3, Gy3, 1), (Gb4, Gy3, 1), (Gb5, Gy1, 1), (Gb6, Gy3, 1), (Gb7, Gy1, 3), (Gb7, Gy2, 2), and (Gb7, Gy3, 1) are specified.

In other words, the allocation rule of FIG. 95 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 1 bit of the code bits of the code bit group Gb4 having the fourth highest error probability is allocated to 1 bit of the symbol bits of the symbol bit group Gy3 having the third highest error probability based on the group set information (Gb4, Gy3, 1), that 1 bit of the code bits of the code bit group Gb5 having the fifth highest error probability is allocated to 1 bit of the symbol bits of the symbol bit group Gy1 having the highest error probability based on the group set information (Gb5, Gy1, 1), that 1 bit of the code bits of the code bit group Gb6 having the sixth highest error probability is allocated to 1 bit of the symbol bits of the symbol bit group Gy3 having the third highest error probability based on the group set information (Gb6, Gy3, 1), that 3 bits of the code bits of the code bit group Gb7 having the seventh highest error probability are allocated to 3 bits of the symbol bits of the symbol bit group Gy1 having the highest error probability based on the group set information (Gb7, Gy1, 3), that 2 bits of the code bits of the code bit group Gb7 having the seventh highest error probability are allocated to 2 bits of the symbol bits of the symbol bit group Gy2 having the second highest error probability based on the group set information (Gb7, Gy2, 2), and that 1 bit of the code bits of the code bit group Gb7 having the seventh highest error probability is allocated to 1 bit of the symbol bits of the symbol bit group Gy3 having the third highest error probability based on the group set information (Gb7, Gy3, 1).

Figure 96:
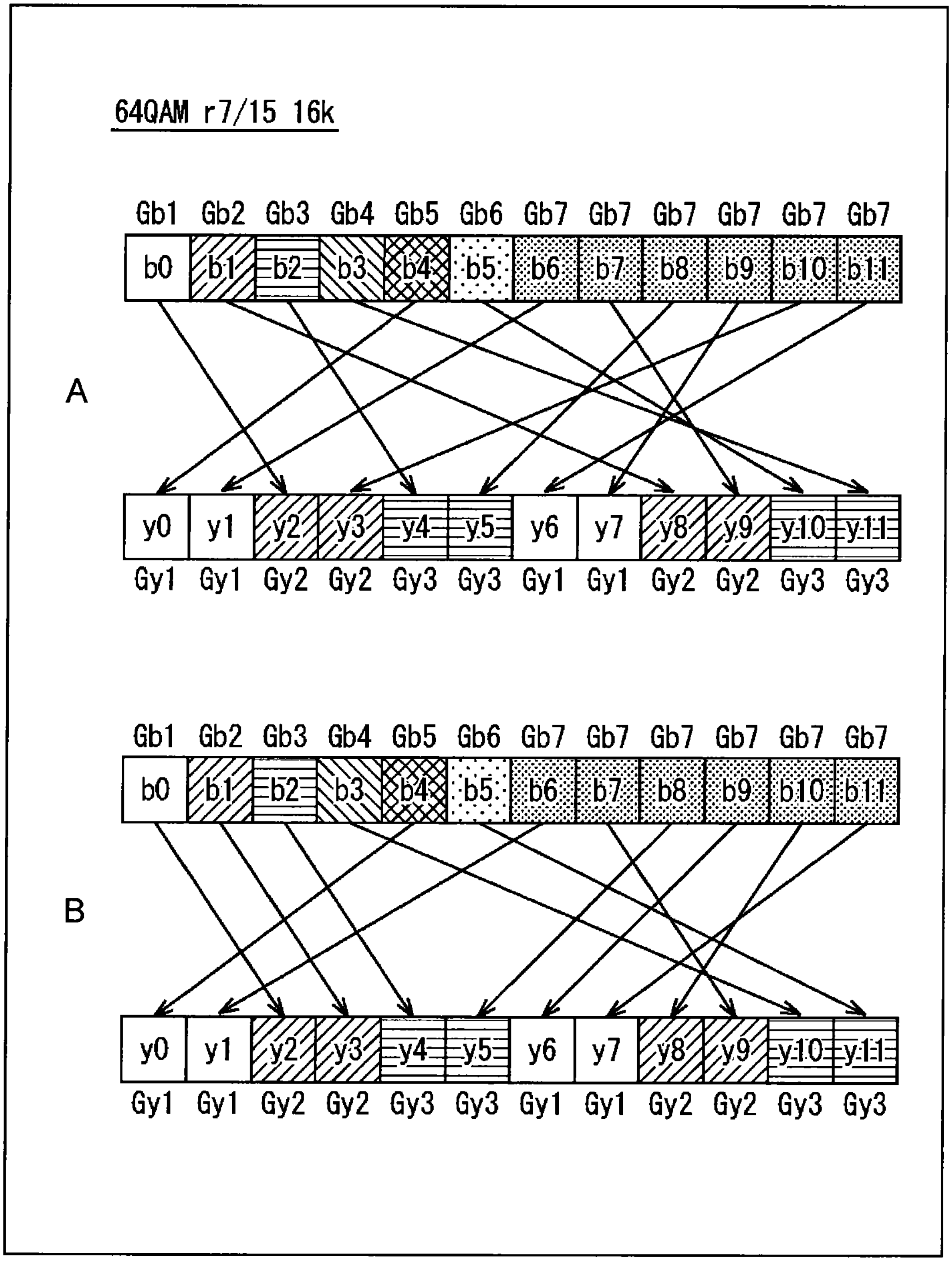
FIG. 96 is a diagram illustrating exchanging of code bits according to an allocation rule when an LDPC code having a code length of 16200 and a coding rate of 7/15 is modulated by 64 QAM, and a multiple b is 2.

FIG. 96 illustrates an example of exchanging of code bits according to the allocation rule of FIG. 95.

In other words, A of FIG. 96 illustrates a first example of exchanging of code bits according to the allocation rule of FIG. 95 when an LDPC code is a mobile LDPC code in which the code length N is 16200 bits and the coding rate is 7/15, the modulation method is 64 QAM, and the multiple b is 2.

When an LDPC code is a mobile LDPC code in which the code length N is 16200 bits and the coding rate is 7/15, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 95 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 96.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3,
the code bit b11 is allocated to the symbol bit y6.

B of FIG. 96 illustrates a second example of exchanging of code bits according to the allocation rule of FIG. 95 when an LDPC code is a mobile LDPC code in which the code length N is 16200 bits and the coding rate is 7/15, the modulation method is 64 QAM, and the multiple b is 2.

According to B of FIG. 96, the exchange unit 32 exchanges the code bits b0 to b11 of 6×2 (=mb) bits read from the memory 31 according to the allocation rule of FIG. 95 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 97:
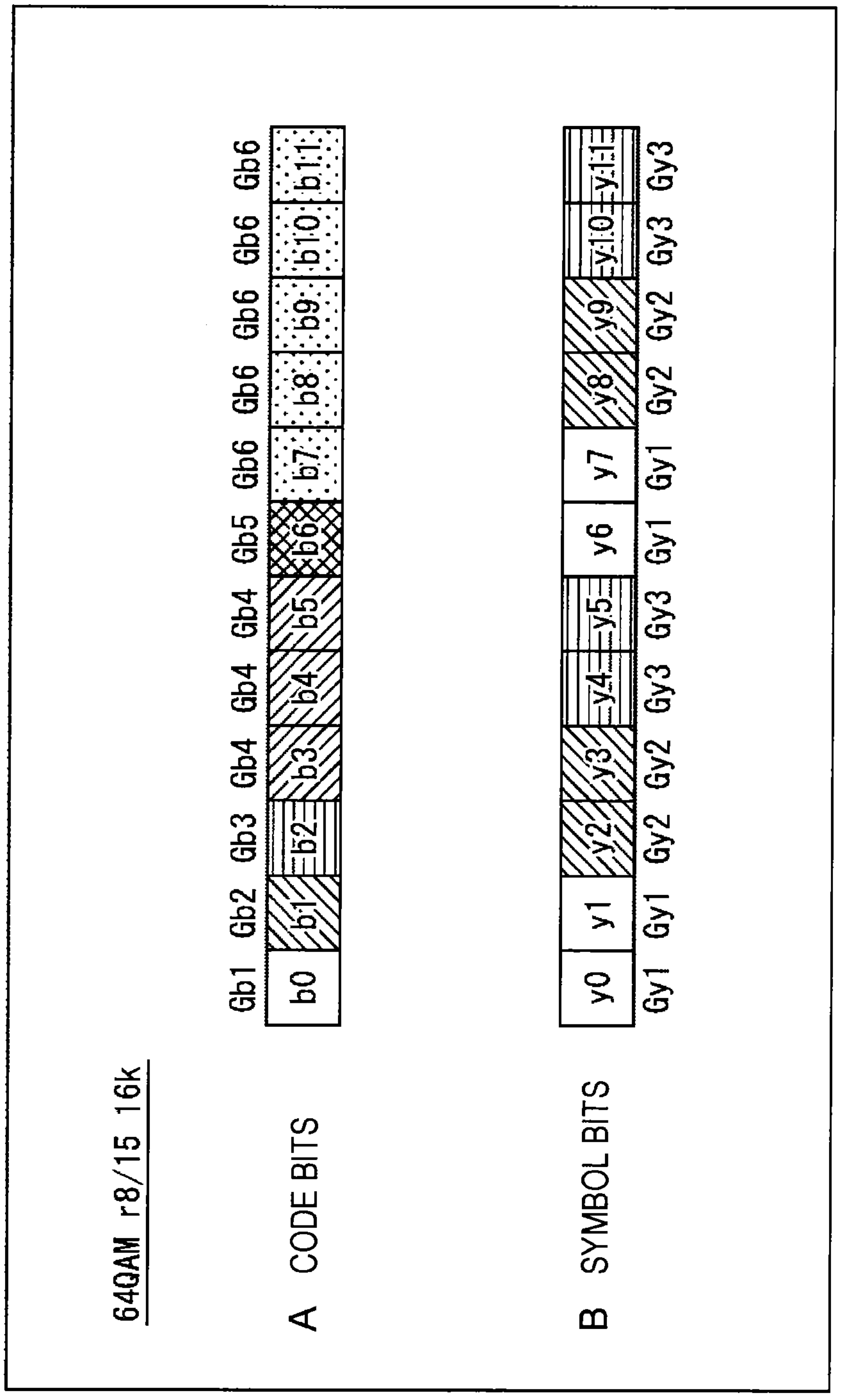
FIG. 97 is a diagram illustrating a code bit group and a symbol bit group when an LDPC code having a code length of 16200 and a coding rate of 8/15 is modulated by 64 QAM, and a multiple b is 2.

FIG. 97 illustrates a code bit group and a symbol bit group when an LDPC code is a mobile LDPC code in which the code length N is 16200 bits and the coding rate is 8/15, the modulation method is 64 QAM, and the multiple b is 2.

In this case, the code bits of 6×2 (=mb) bits read from the memory 31 may be grouped into 6 code bit groups Gb1, Gb2, Gb3, Gb4, Gb5, and Gb6 according to the difference in the error probability as illustrated in A of FIG. 97.

In A of FIG. 97, the code bit b0 belongs to the code bit group Gb1, the code bit b1 belongs to the code bit group Gb2, the code bit b2 belongs to the code bit group Gb3, the code bits b3 to b5 belong to the code bit group Gb4, the code bit b6 belongs to the code bit group Gb5, and the code bits b7 to b11 belong to the code bit group Gb6.

When the modulation method is 64 QAM and the multiple b is 2, the symbol bits of 6×2 (=mb) bits may be grouped into three symbol bit groups Gy1, Gy2, and Gy3 according to the difference in the error probability as illustrated in B of FIG. 97.

In B of FIG. 97, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 98:
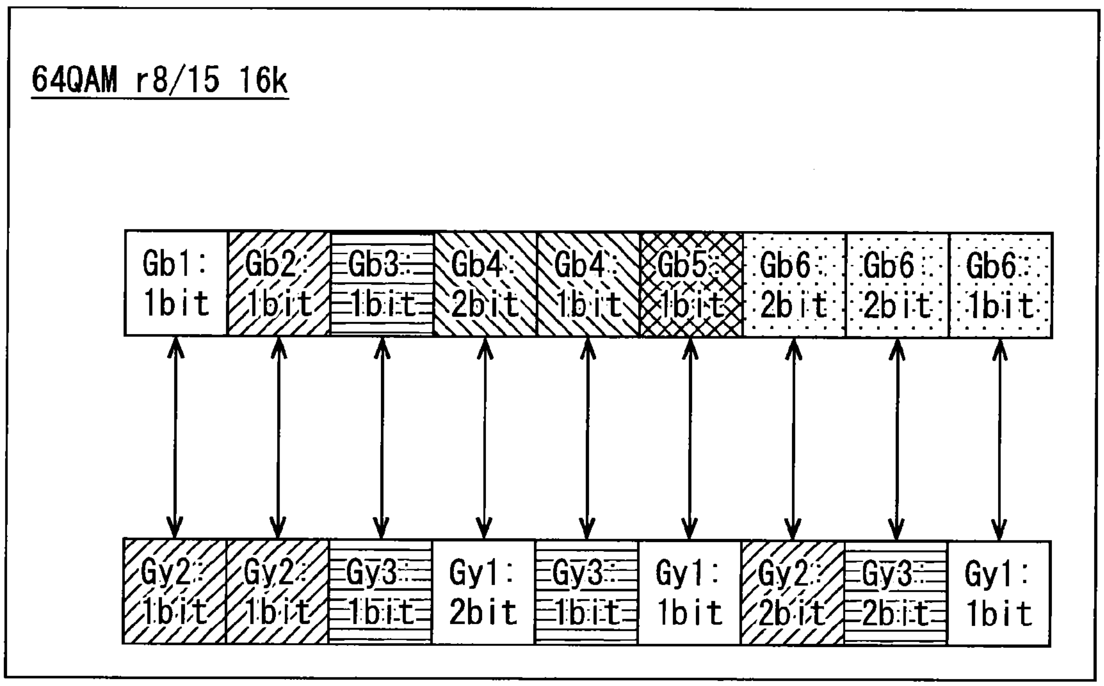
FIG. 98 is a diagram illustrating an allocation rule when an LDPC code having a code length of 16200 and a coding rate of 8/15 is modulated by 64 QAM, and a multiple b is 2.

FIG. 98 illustrates an allocation rule when an LDPC code is a mobile LDPC code in which the code length N is 16200 bits and the coding rate is 8/15, the modulation method is 64 QAM, and the multiple b is 2.

In the allocation rule of FIG. 98, pieces of group set information (Gb1, Gy2, 1), (Gb2, Gy2, 1), (Gb3, Gy3, 1), (Gb4, Gy1, 2), (Gb4, Gy3, 1), (Gb5, Gy1, 1), (Gb6, Gy2, 2), (Gb6, Gy3, 2), and (Gb6, Gy1, 1) are specified.

In other words, the allocation rule of FIG. 98 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 1 bit of the code bits of the code bit group Gb3 having the third highest error probability is allocated to 1 bit of the symbol bits of the symbol bit group Gy3 having the third highest error probability based on the group set information (Gb3, Gy3, 1), that 2 bits of the code bits of the code bit group Gb4 having the fourth highest error probability are allocated to 2 bits of the symbol bits of the symbol bit group Gy1 having the highest error probability based on the group set information (Gb4, Gy1, 2), that 1 bit of the code bits of the code bit group Gb4 having the fourth highest error probability is allocated to 1 bit of the symbol bits of the symbol bit group Gy3 having the third highest error probability based on the group set information (Gb4, Gy3, 1), that 1 bit of the code bits of the code bit group Gb5 having the fifth highest error probability is allocated to a 1 bit of the symbol bits of the symbol bit group Gy1 having the highest error probability based on the group set information (Gb5, Gy1, 1), that 2 bits of the code bits of the code bit group Gb6 having the sixth highest error probability are allocated to 2 bits of the symbol bits of the symbol bit group Gy2 having the second highest error probability based on the group set information (Gb6, Gy2, 2), that 2 bits of the code bits of the code bit group Gb6 having the sixth highest error probability are allocated to 2 bits of the symbol bits of the symbol bit group Gy3 having the third highest error probability based on the group set information (Gb6, Gy3, 2), and that 1 bit of the code bits of the code bit group Gb6 having the sixth highest error probability is allocated to 1 bit of the symbol bits of the symbol bit group Gy1 having the highest error probability based on the group set information (Gb6, Gy1, 1).

Figure 99:
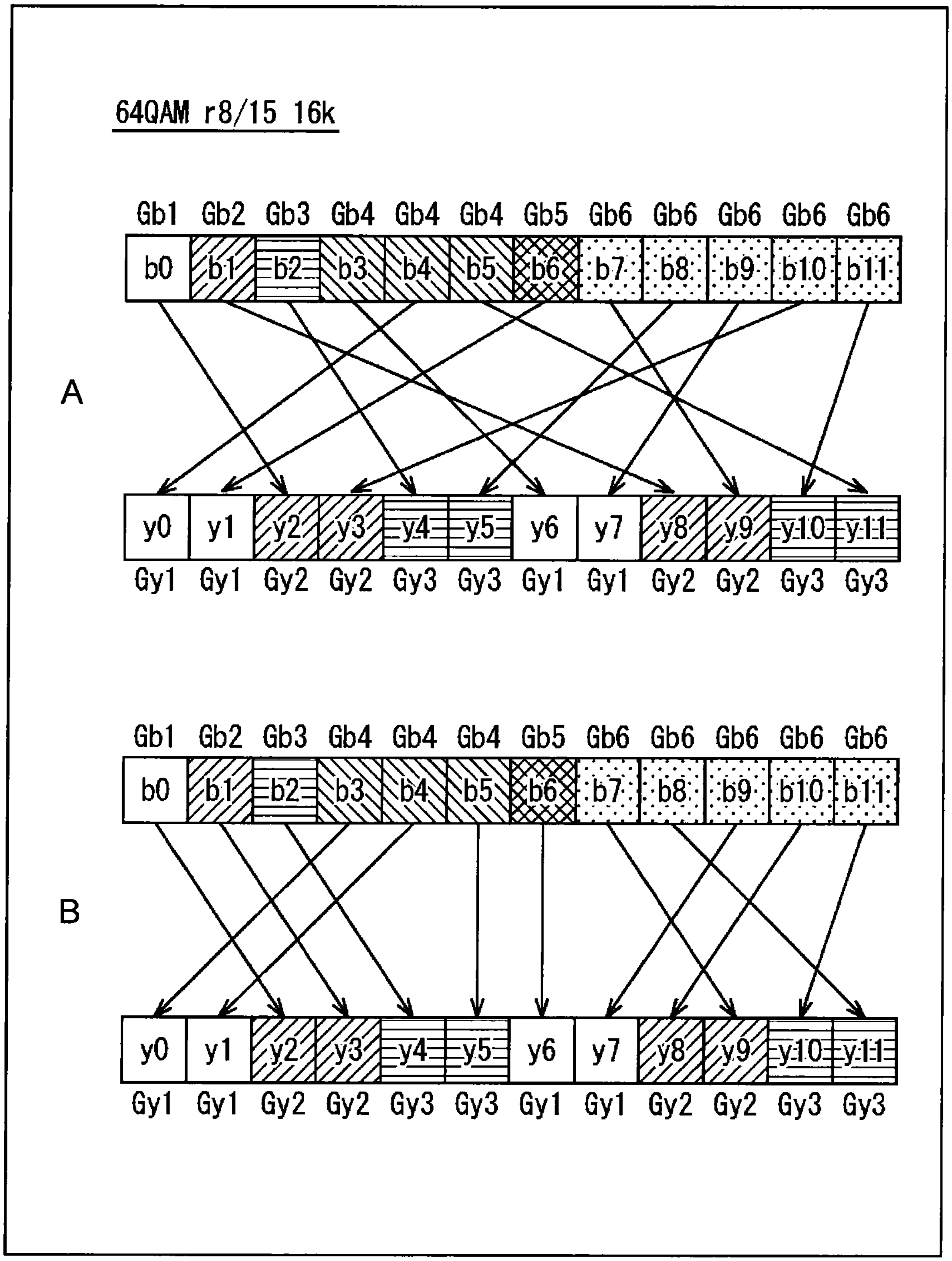
FIG. 99 is a diagram illustrating exchanging of code bits according to an allocation rule when an LDPC code having a code length of 16200 and a coding rate of 8/15 is modulated by 64 QAM, and a multiple b is 2.

FIG. 99 illustrates an example of exchanging of code bits according to the allocation rule of FIG. 98.

In other words, A of FIG. 99 illustrates a first example of exchanging of code bits according to the allocation rule of FIG. 98 when an LDPC code is a mobile LDPC code in which the code length N is 16200 bits and the coding rate is 8/15, the modulation method is 64 QAM, and the multiple b is 2.

When an LDPC code is a mobile LDPC code in which the code length N is 16200 bits and the coding rate is 8/15, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 98 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 99.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y10, B of FIG. 99 illustrates a second example of exchanging of code bits according to the allocation rule of FIG. 98 when an LDPC code is a mobile LDPC code in which the code length N is 16200 bits and the coding rate is 8/15, the modulation method is 64 QAM, and the multiple b is 2.

According to B of FIG. 99, the exchange unit 32 exchanges the code bits b0 to b11 of 6×2 (=mb) bits read from the memory 31 according to the allocation rule of FIG. 98 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10.

Figure 100:
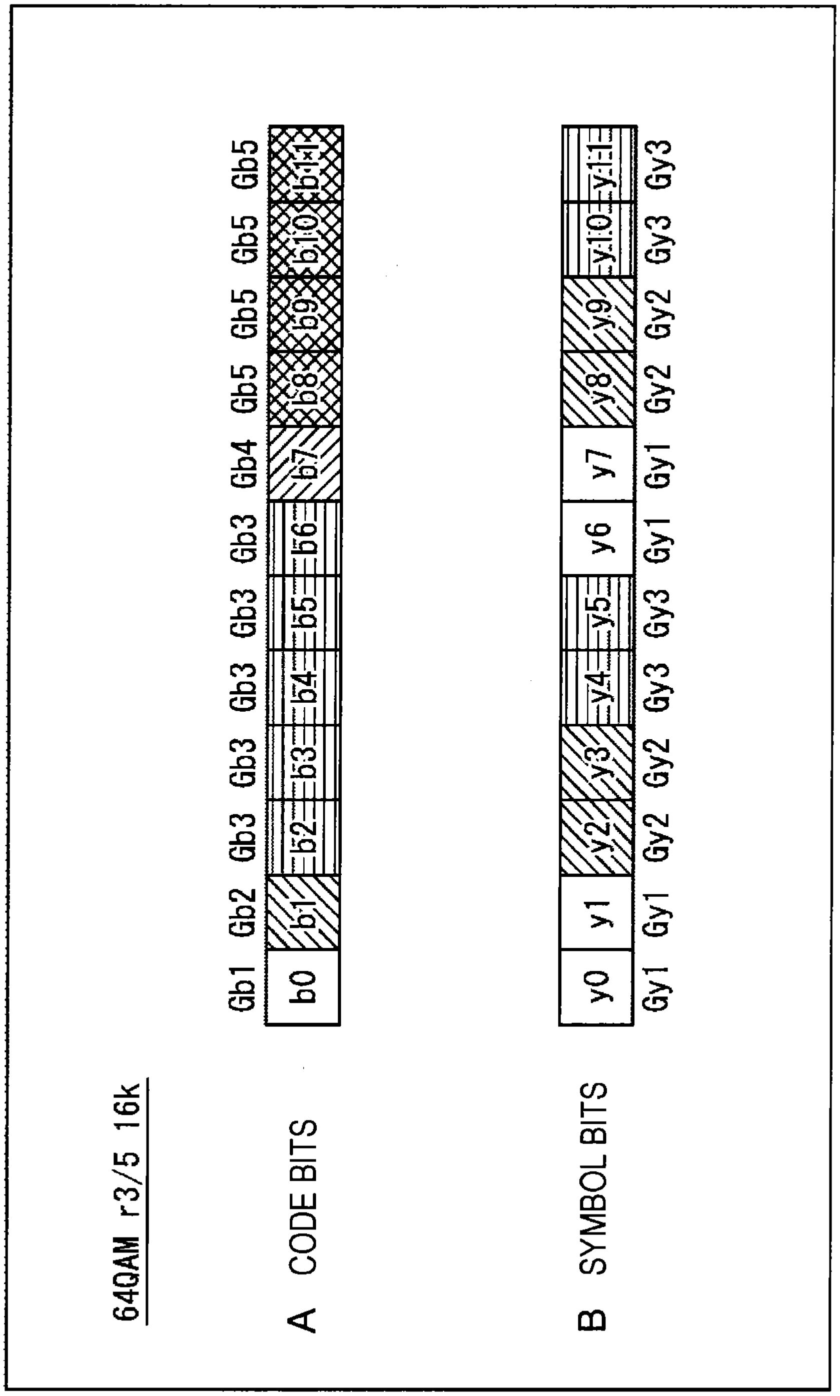
FIG. 100 is a diagram illustrating a code bit group and a symbol bit group when an LDPC code having a code length of 16200 and a coding rate of 3/5 is modulated by 64 QAM, and a multiple b is 2.

FIG. 100 illustrates a code bit group and a symbol bit group when an LDPC code is a mobile LDPC code in which the code length N is 16200 bits and the coding rate is 3/5, the modulation method is 64 QAM, and the multiple b is 2.

In this case, the code bits of 6×2(=mb) bits read from the memory 31 may be grouped into 5 code bit groups Gb1, Gb2, Gb3, Gb4, and Gb5 according to the difference in the error probability as illustrated in A of FIG. 100.

In A of FIG. 100, the code bit b0 belongs to the code bit group Gb1, the code bit b1 belongs to the code bit group Gb2, the code bits b2 to b6 belong to the code bit group Gb3, the code bit b7 belongs to the code bit group Gb4, and the code bits b8 to b11 belong to the code bit group Gb5.

When the modulation method is 64 QAM and the multiple b is 2, the symbol bits of 6×2(=mb) bits may be grouped into three symbol bit groups Gy1, Gy2, and Gy3 according to the difference in the error probability as illustrated in B of FIG. 100.

In B of FIG. 100, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 101:
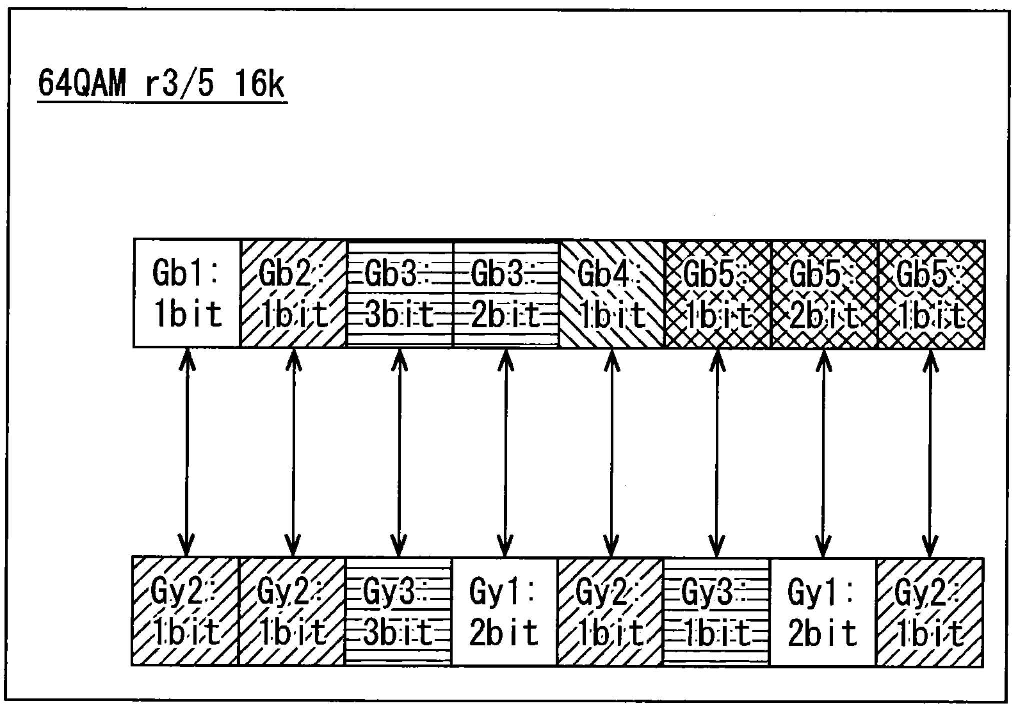
FIG. 101 is a diagram illustrating an allocation rule when an LDPC code having a code length of 16200 and a coding rate of 3/5 is modulated by 64 QAM, and a multiple b is 2.

FIG. 101 illustrates an allocation rule when an LDPC code is a mobile LDPC code in which the code length N is 16200 bits and the coding rate is 3/5, the modulation method is 64 QAM, and the multiple b is 2.

In the allocation rule of FIG. 101, pieces of group set information (Gb1, Gy2, 1), (Gb2, Gy2, 1), (Gb3, Gy3, 3), (Gb3, Gy1, 2), (Gb4, Gy2, 1), (Gb5, Gy3, 1), (Gb5, Gy1, 2), and (Gb5, Gy2, 1) are specified.

Figure 102:
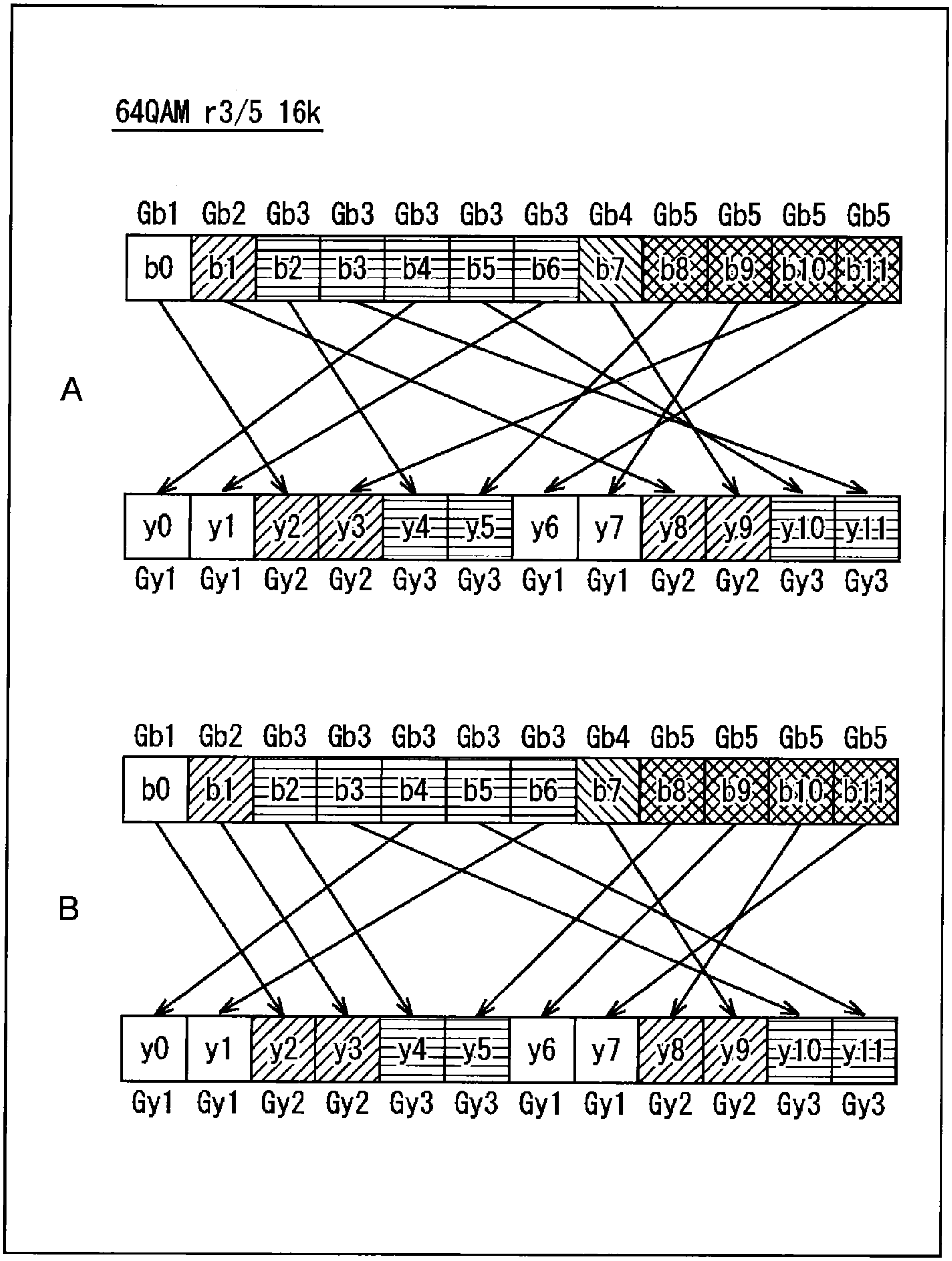
FIG. 102 is a diagram illustrating exchanging of code bits according to an allocation rule when an LDPC code having a code length of 16200 and a coding rate of 3/5 is modulated by 64 QAM, and a multiple b is 2.

In other words, the allocation rule of FIG. 101 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 3 bits of the code bits of the code bit group Gb3 having the third highest error probability are allocated to 3 bits of the symbol bits of the symbol bit group Gy3 having the third highest error probability based on the group set information (Gb3, Gy3, 3), that 2 bits of the code bits of the code bit group Gb3 having the third highest error probability are allocated to 1 bit of the symbol bits of the symbol bit group Gy1 having the highest error probability based on the group set information (Gb3, Gy1, 2), that 1 bit of the code bits of the code bit group Gb4 having the fourth highest error probability is allocated to 1 bit of the symbol bits of the symbol bit group Gy2 having the second highest error probability based on the group set information (Gb4, Gy2, 1), that 1 bit of the code bits of the code bit group Gb5 having the fifth highest error probability is allocated to 1 bit of the symbol bits of the symbol bit group Gy3 having the third highest error probability based on the group set information (Gb5, Gy3, 1), that 2 bits of the code bits of the code bit group Gb5 having the fifth highest error probability are allocated to 2 bits of the symbol bits of the symbol bit group Gy1 having the highest error probability based on the group set information (Gb5, Gy1, 2), and that 1 bit of the code bits of the code bit group Gb5 having the fifth highest error probability is allocated to 1 bit of the symbol bits of the symbol bit group Gy2 having the second highest error probability based on the group set information (Gb5, Gy2, 1), FIG. 102 illustrates an example of exchanging of code bits according to the allocation rule of FIG. 101.

In other words, A of FIG. 102 illustrates a first example of exchanging of code bits according to the allocation rule of FIG. 101 when an LDPC code is a mobile LDPC code in which the code length N is 16200 bits and the coding rate is 3/5, the modulation method is 64 QAM, and the multiple b is 2.

When an LDPC code is a mobile LDPC code in which the code length N is 16200 bits and the coding rate is 3/5, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2(=mb) bits according to the allocation rule of FIG. 101 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 102.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 102 illustrates a second example of exchanging of code bits according to the allocation rule of FIG. 101 when an LDPC code is a mobile LDPC code in which the code length N is 16200 bits and the coding rate is 3/5, the modulation method is 64 QAM, and the multiple b is 2.

According to B of FIG. 102, the exchange unit 32 exchanges the code bits b0 to b11 of 6×2 (=mb) bits read from the memory 31 according to the allocation rule of FIG. 101 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 103:
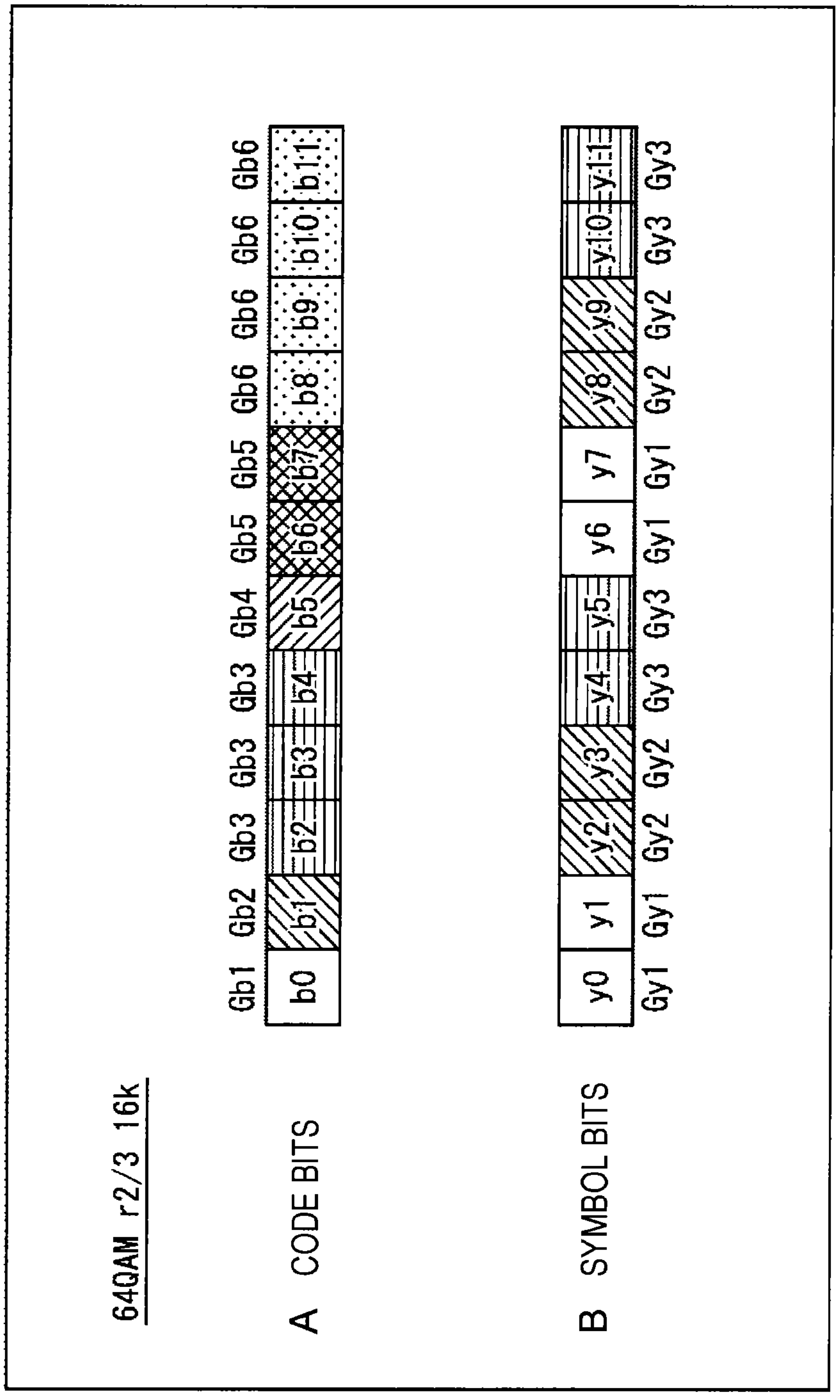
FIG. 103 is a diagram illustrating a code bit group and a symbol bit group when an LDPC code having a code length of 16200 and a coding rate of 2/3 is modulated by 64 QAM, and a multiple b is 2.

FIG. 103 illustrates a code bit group and a symbol bit group when an LDPC code is a mobile LDPC code in which the code length N is 16200 bits and the coding rate is 2/3, the modulation method is 64 QAM, and the multiple b is 2.

In this case, the code bits of 6×2(=mb) bits read from the memory 31 may be grouped into 6 code bit groups Gb1, Gb2, Gb3, Gb4, Gb5, and Gb6 according to the difference in the error probability as illustrated in A of FIG. 103.

In A of FIG. 103, the code bit b0 belongs to the code bit group Gb1, the code bit b1 belongs to the code bit group Gb2, the code bits b2 to b4 belong to the code bit group Gb3, the code bit b5 belongs to the code bit group Gb4, the code bits b6 and b7 belong to the code bit group Gb5, and the code bits b8 to b11 belong to the code bit group Gb6.

When the modulation method is 64 QAM and the multiple b is 2, the symbol bits of 6×2(=mb) bits may be grouped into three symbol bit groups Gy1, Gy2, and Gy3 according to the difference in the error probability as illustrated in B of FIG. 103.

In B of FIG. 103, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 104:
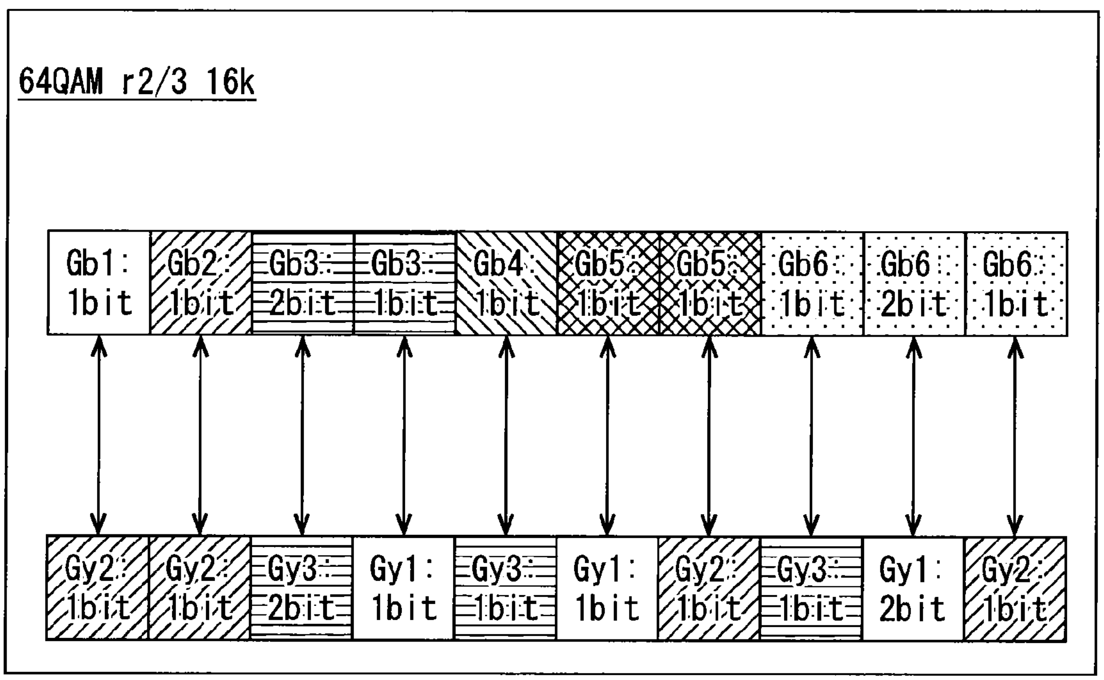
FIG. 104 is a diagram illustrating an allocation rule when an LDPC code having a code length of 16200 and a coding rate of 2/3 is modulated by 64 QAM, and a multiple b is 2.

FIG. 104 illustrates an allocation rule when an LDPC code is a mobile LDPC code in which the code length N is 16200 bits and the coding rate is 2/3, the modulation method is 64 QAM, and the multiple b is 2.

In the allocation rule of FIG. 104, pieces of group set information (Gb1, Gy2, 1), (Gb2, Gy2, 1), (Gb3, Gy3, 2), (Gb3, Gy1, 1), (Gb4, Gy3, 1), (Gb5, Gy1, 1), (Gb5, Gy2, 1), (Gb6, Gy3, 1), (Gb6, Gy1, 2), and (Gb6, Gy2, 1) are specified.

In other words, the allocation rule of FIG. 104 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 2 bits of the code bits of the code bit group Gb3 having the third highest error probability are allocated to 2 bits of the symbol bits of the symbol bit group Gy3 having the third highest error probability based on the group set information (Gb3, Gy3, 2), that 1 bit of the code bits of the code bit group Gb3 having the third highest error probability is allocated to 1 bit of the symbol bits of the symbol bit group Gy1 having the highest error probability based on the group set information (Gb3, Gy1, 1), that 1 bit of the code bits of the code bit group Gb4 having the fourth highest error probability is allocated to 1 bit of the symbol bits of the symbol bit group Gy3 having the third highest error probability based on the group set information (Gb4, Gy3, 1), that 1 bit of the code bits of the code bit group Gb5 having the fifth highest error probability is allocated to 1 bit of the symbol bits of the symbol bit group Gy1 having the highest error probability based on the group set information (Gb5, Gy1, 1), that 1 bit of the code bits of the code bit group Gb5 having the fifth highest error probability is allocated to 1 bit of the symbol bits of the symbol bit group Gy2 having the second highest error probability based on the group set information (Gb5, Gy2, 1), that 1 bit of the code bits of the code bit group Gb6 having the sixth highest error probability is allocated to 1 bit of the symbol bits of the symbol bit group Gy3 having the third highest error probability based on the group set information (Gb6, Gy3, 1), that 2 bits of the code bits of the code bit group Gb6 having the sixth highest error probability are allocated to 2 bits of the symbol bits of the symbol bit group Gy1 having the highest error probability based on the group set information (Gb6, Gy1, 2), and that 1 bit of the code bits of the code bit group Gb6 having the sixth highest error probability is allocated to 1 bit of the symbol bits of the symbol bit group Gy2 having the second highest error probability based on the group set information (Gb6, Gy2, 1).

Figure 105:
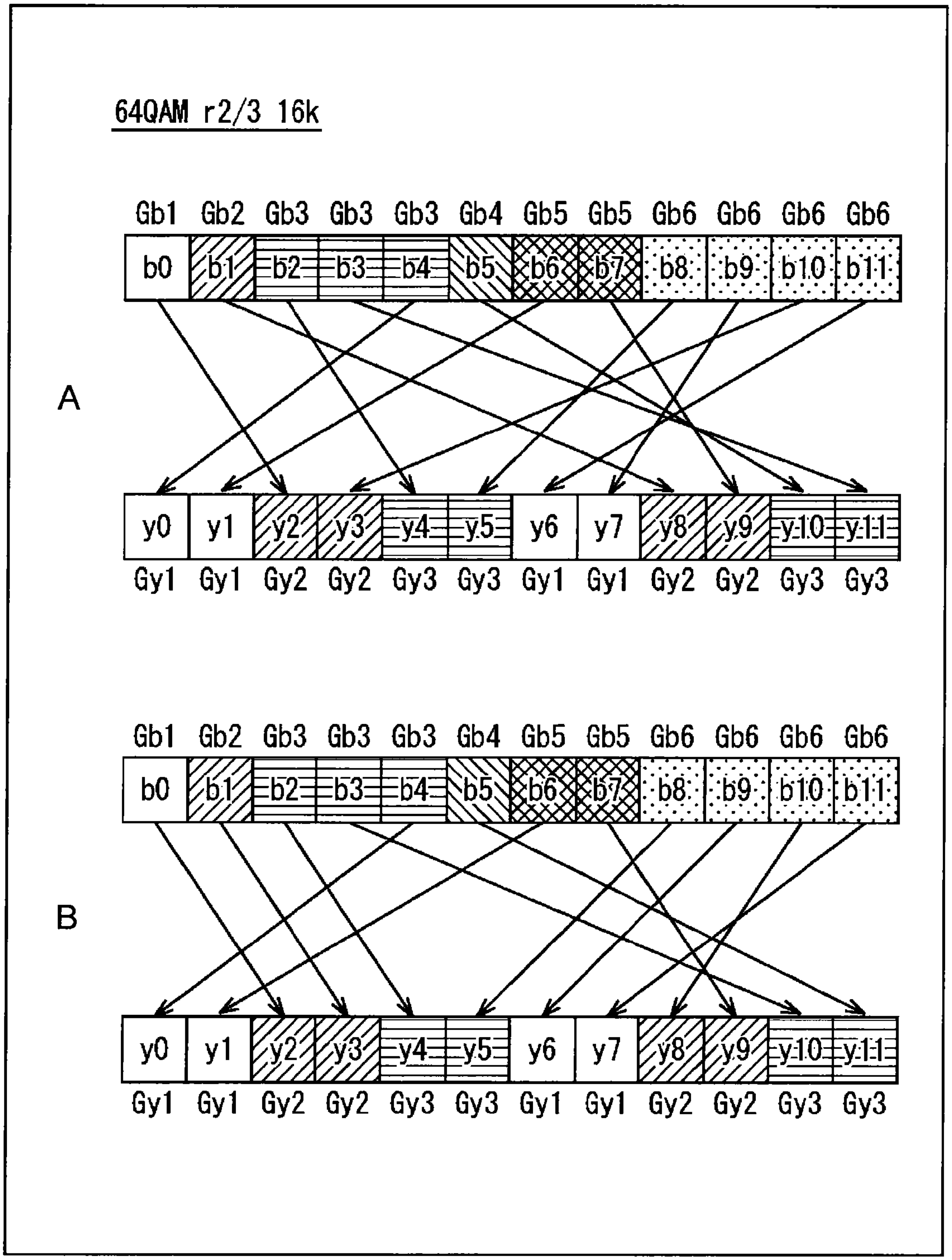
FIG. 105 is a diagram illustrating exchanging of code bits according to an allocation rule when an LDPC code having a code length of 16200 and a coding rate of 2/3 is modulated by 64 QAM, and a multiple b is 2.

FIG. 105 illustrates an example of exchanging of code bits according to the allocation rule of FIG. 104.

In other words, A of FIG. 105 illustrates a first example of exchanging of code bits according to the allocation rule of FIG. 104 when an LDPC code is a mobile LDPC code in which the code length N is 16200 bits and the coding rate is 2/3, the modulation method is 64 QAM, and the multiple b is 2.

When an LDPC code is a mobile LDPC code in which the code length N is 16200 bits and the coding rate is 2/3, the modulation method is 64 QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2(=mb) bits according to the allocation rule of FIG. 104 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 105.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 105 illustrates a second example of exchanging of code bits according to the allocation rule of FIG. 104 when an LDPC code is a mobile LDPC code in which the code length N is 16200 bits and the coding rate is 2/3, the modulation method is 64 QAM, and the multiple b is 2.

According to B of FIG. 105, the exchange unit 32 exchanges the code bits b0 to b11 of 6×2 (=mb) bits read from the memory 31 according to the allocation rule of FIG. 104 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

According to the simulation performed by the inventor (s) of the present application, it has been found out that when the exchange process of the new exchanging method is performed, compared to when the exchange process is not performed, the BER has been improved, and thus according to the exchange process of the new exchanging method, tolerance for an error can be improved.

Here, as the exchanging method of the code bits of the LDPC code by the exchange process through the exchange unit 32, that is, an allocation pattern (hereinafter, also referred to as a "bit allocation pattern") of the code bits of the LDPC code and the symbol bits representing a symbol, for each of LDPC codes having different coding rates, a bit allocation pattern dedicated for a corresponding LDPC code may be employed.

However, when a bit allocation pattern dedicated for a corresponding LDPC code may be employed for each of LDPC codes having different coding rates, it is necessary to implement a plurality of bit allocation patterns in the transmitting device 11, and it is necessary to change (switch) a bit allocation pattern for each of LDPC codes having different types of coding rates.

Meanwhile, according to the exchange process described above with reference to FIGS. 52 to 105, the number of bit allocation patterns implemented in the transmitting device 11 can be reduced.

In other words, when the modulation method is 16 QAM, for mobile LDPC codes having the coding rates of 1/5, 4/15 and 1/3, employed is a bit allocation pattern of allocating the code bits b0 to b7 to the symbol bits y4, y3, y2, y1, y6, y5, y7, y0, respectively, which are illustrated in A of FIGS. 54, 57, and 60, and for mobile LDPC codes having the coding rates of 2/5, 4/9, 7/15, 8/15, 3/5, and 2/3, employed is a bit allocation pattern of allocating the code bits b0 to b7 to the symbol bits y0, y2, y6, y3, y4, y1, y5, y7, respectively, which are illustrated in A of FIGS. 63, 66, 69, 72, 75, and 78, and thus the transmitting device 11 needs only to implement the bit allocation patterns of the two patterns.

Further, when the modulation method is 64 QAM, for mobile LDPC codes having the coding rates of 1/5, 2/5, 4/9, 7/15, 3/5, and 2/3, employed is a bit allocation pattern of allocating the code bits b0 to b11 to the symbol bits y2, y8, y4, y11, y0, y10, y1, y9, y5, y7, y3, y6, respectively, which are illustrated in A of FIGS. 81, 90, 93, 96, 102, and 105, and for mobile LDPC codes having the coding rates of 4/15, 1/3, and 8/15, employed is a bit allocation pattern of allocating the code bits b0 to b11 to the symbol bits y2, y8, y4, y6, y0, y11, y1, y9, y5, y7, y3, y10, respectively, which are illustrated in A of FIGS. 84, 87, and 99, and thus the transmitting device 11 needs only to implement the bit allocation patterns of the two patterns.

In the present embodiment, for the sake of convenience of description, the demultiplexer 25 is configured to perform the exchange process on the code bits read from the memory 31 through the exchange unit 32, but the exchange process may be performed by controlling writing and reading of code bits to and from the memory 31.

In other words, for example, the exchange process may be performed by controlling an address (read address) to read a code bit such that code bits are read from the memory 31 in the order of exchanged code bits.

[Column Twist Interleaving of 16 k LDPC Code]

When the LDPC encoder 115 (FIGS. 8 and 31) performs LDPC coding to generate a mobile LDPC code, which is a 16-kbit LDPC code, using the parity check matrix (calculated from the parity check matrix initial value table) illustrated in FIGS. 35 to 43, the write start position of each column (FIG. 24) in the memory 31 in column twist interleaving which is a sorting process performed by the column twist interleaver 24 (FIG. 9) is different from the write start position (FIGS. 25 and 26) in the LDPC code specified in DVB-T.2.

FIG. 106 is a diagram illustrating the number of columns of the memory 31 required for the column twist interleaving and the address of the write start position for the mobile LDPC code.

That is, FIG. 106 illustrates the number of columns of the memory 31 required for the column twist interleaving and the address of the write start position in each modulation method for nine types of mobile LDPC codes (obtained from the parity check matrix which is calculated from the parity check matrix initial value table) illustrated in FIGS. 35 to 43 which have a code length N of 16 kbits and coding rates r of 1/5, 4/15, 1/3, 2/5, 4/9, 7/15, 8/15, 3/5, and, 2/3.

For example, QPSK, 16 QAM, 64 QAM, and 256 QAM with a relatively small number of signal points are used as the modulation method for the mobile LDPC codes.

When the multiple b is 1 and the bit number m of a single symbol is 2 as QPSK is employed as a modulation method, the memory 31 includes two columns storing 2×1 bits in the row direction and stores N/(mb)=16200/(2×1) bits in the column direction.

The write start position of the first column of the two columns of the memory 31 is the position having the address of 0, and the write start position of the second column is the position having the address of 3.

When the multiple b is 1 and the bit number m of a single symbol is 4 as 16 QAM is employed as a modulation method, the memory 31 includes four columns storing 4×1 bits in the row direction and stores N/(mb)=16200/(4×1) bits in the column direction.

When the multiple b is 2 and the bit number m of a single symbol is 2 as QPSK is employed as a modulation method, the memory 31 includes four columns storing 2×2 bits in the row direction and stores N/(mb)=16200/(2×2) bits in the column direction.

When the multiple b is 1 and the bit number m of a single symbol is 4 as 16 QAM is employed as a modulation method, and when the multiple b is 2 and the bit number m of a single symbol is 2 as QPSK is employed as a modulation method, among the four columns of the memory 31, the write start position of the first column is the position having the address of 0, the write start position of the second column is the position having the address of 2, the write start position of the third column is the position having the address of 3, and the write start position of the fourth column is the position having the address of 0.

When the multiple b is 1 and the bit number m of a single symbol is 6 as 64 QAM is employed as a modulation method, the memory 31 includes six columns storing 6×1 bits in the row direction and stores N/(mb)=16200/(6×1) bits in the column direction.

Among the six columns of the memory 31, the write start position of the first column is the position having the address of 0, the write start position of the second column is the position having the address of 1, the write start position of the third column is the position having the address of 3, the write start position of the fourth column is the position having the address of 8, the write start position of the fifth column is the position having the address of 1, and the write start position of the sixth column is the position having the address of 6.

When the multiple b is 1 and the bit number m of a single symbol is 8 as 256 QAM is employed as a modulation method, the memory 31 includes eight columns storing 8×1 bits in the row direction and stores N/(mb)=16200/(8×1) bits in the column direction.

When the multiple b is 2 and the bit number m of a single symbol is 4 as 16 QAM is employed as a modulation method, the memory 31 includes eight columns storing 4×2 bits in the row direction and stores N/(mb)=16200/(4×2) bits in the column direction.

Among the eight columns of the memory 31, the write start position of the first column is the position having the address of 0, the write start position of the second column is the position having the address of 1, the write start position of the third column is the position having the address of 0, the write start position of the fourth column is the position having the address of 8, the write start position of the fifth column is the position having the address of 2, the write start position of the sixth column is the position having the address of 0, the write start position of the seventh column is the position having the address of 1, and the write start position of the eighth column is the position having the address of 5.

When the multiple b is 2 and the bit number m of a single symbol is 6 as 64 QAM is employed as a modulation method, the memory 31 includes 12 columns storing 6×2 bits in the row direction and stores 16200/(6×2) bits in the column direction.

Among the 12 columns of the memory 31, the write start position of the first column is the position having the address of 0, the write start position of the second column is the position having the address of 12, the write start position of the third column is the position having the address of 7, the write start position of the fourth column is the position having the address of 1, the write start position of the fifth column is the position having the address of 3, the write start position of the sixth column is the position having the address of 1, the write start position of the seventh column is the position having the address of 8, the write start position of the eighth column is the position having the address of 7, the write start position of the ninth column is the position having the address of 1, the write start position of the tenth column is the position having the address of 0, the write start position of the eleventh column is the position having the address of 3, and the write start position of the twelfth column is the position having the address of 9.

The column twist interleaving performed for the mobile LDPC codes illustrated in FIGS. 35 to 43 makes it possible to prevent a plurality of code bits corresponding to a plurality of variable nodes connected to the same check node from being a single symbol (being included in the same symbol) of QPSK, 16 QAM, 64 QAM, or 256 QAM. As a result, it is possible to improve the decoding performance in the communication path in which erasure occurs, that is, to improve resistance to errors.

FIG. 107, FIG. 108, FIG. 109, FIG. 110, FIG. 111, FIG. 112, FIG. 113, FIG. 114, and FIG. 115 are diagrams illustrating the simulation results of a BER and a FER (Frame Error Rate) when the column twist interleaving is performed for the mobile LDPC code.

In FIGS. 107 to 115, the horizontal axis indicates $E_s/N_0$ (the signal power to noise power ratio per symbol) and the vertical axis indicates a BER and a FER.

Figure 107:
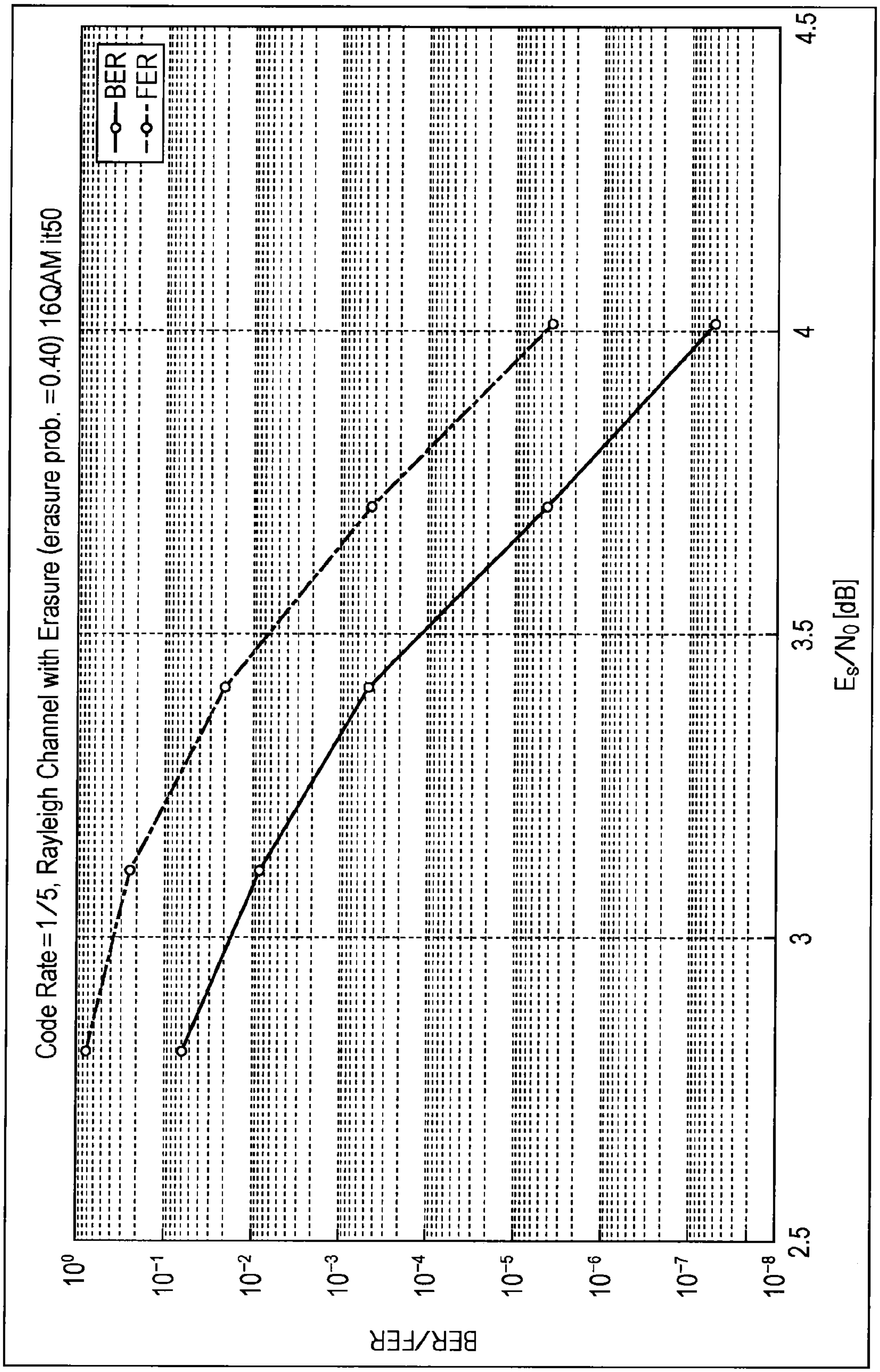
FIG. 107 is a diagram illustrating simulation results of a BER and a FER.
Figure 108:
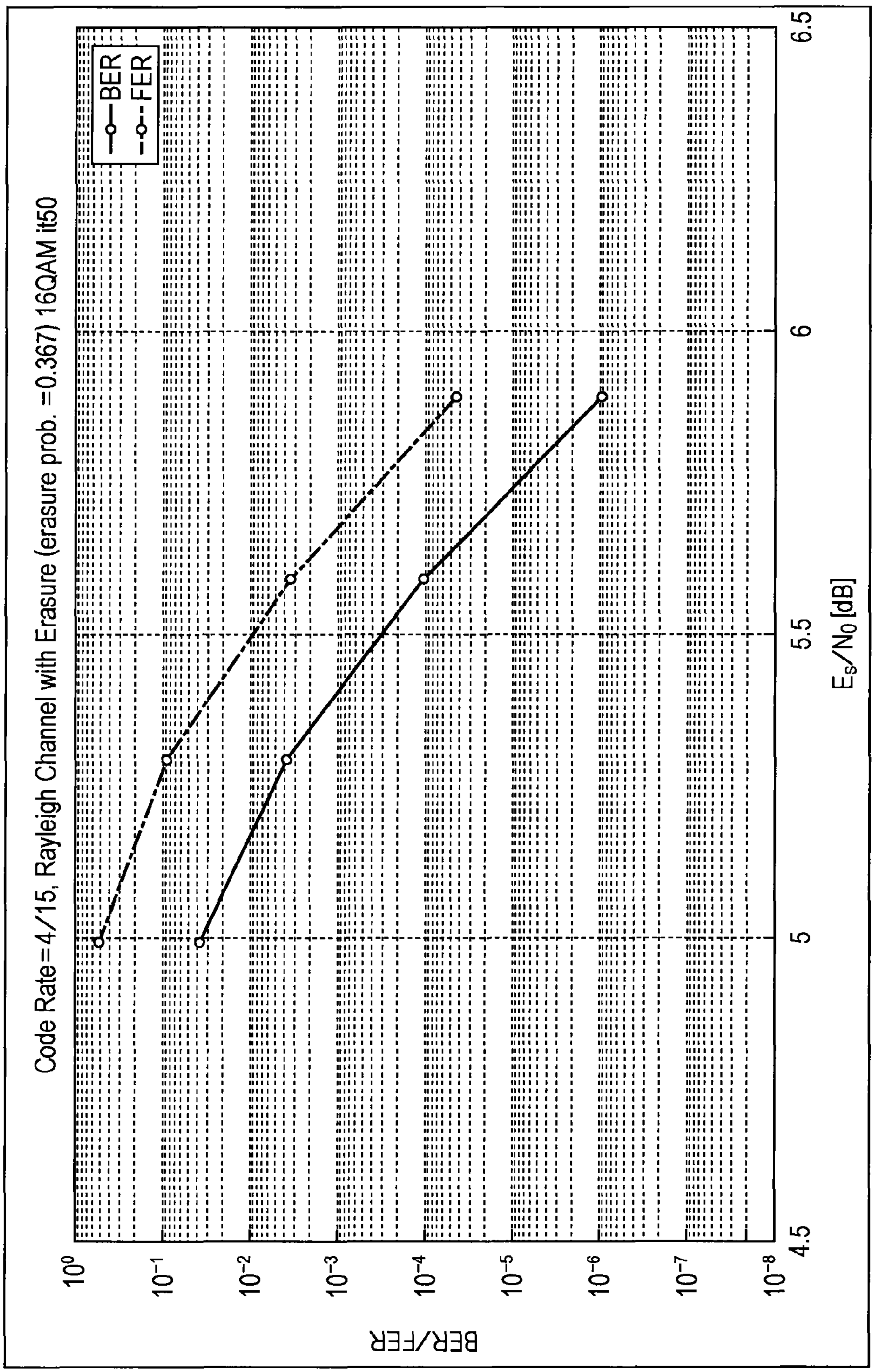
FIG. 108 is a diagram illustrating simulation results of a BER and a FER.
Figure 109:
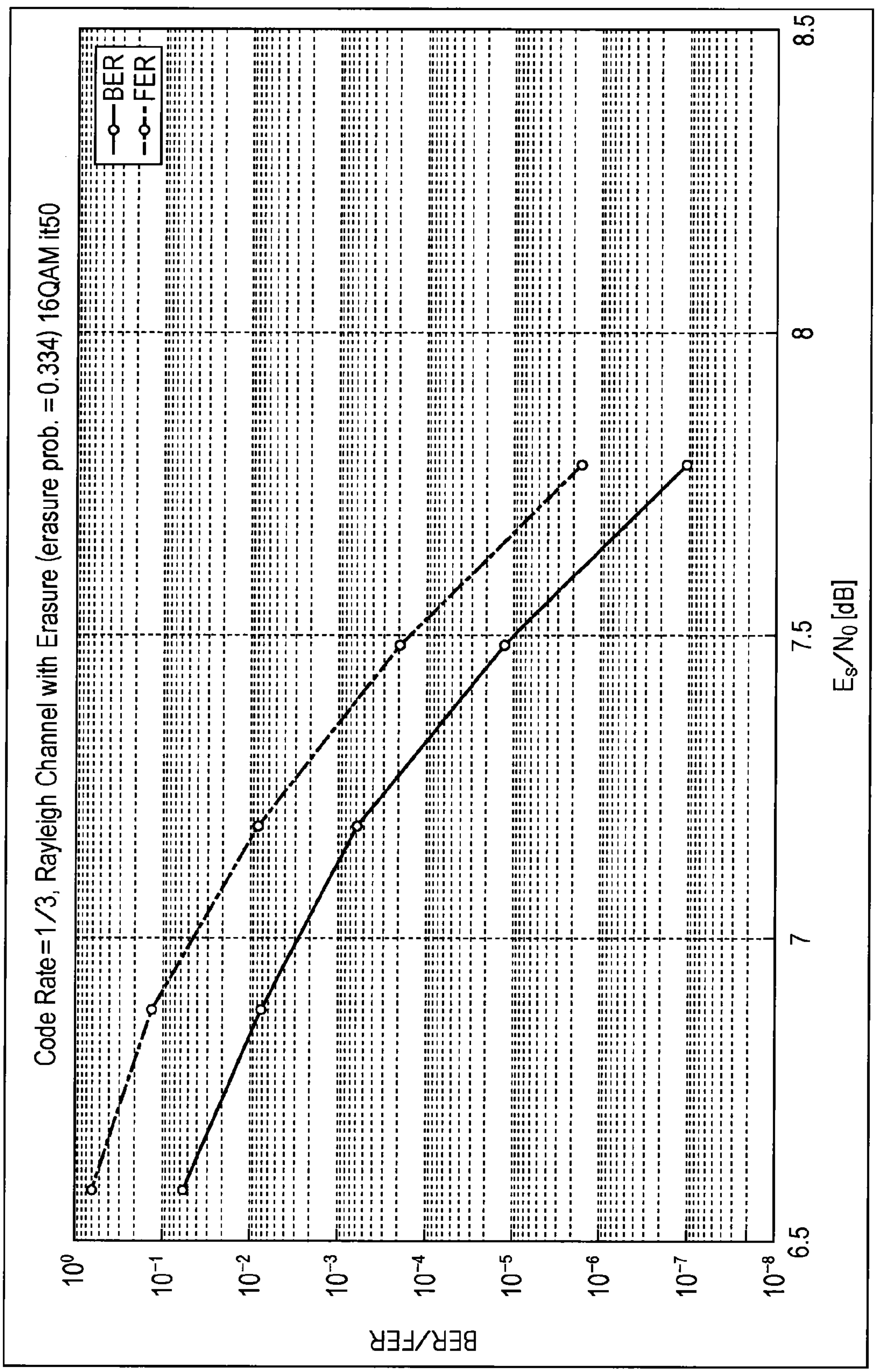
FIG. 109 is a diagram illustrating simulation results of a BER and a FER.
Figure 110:
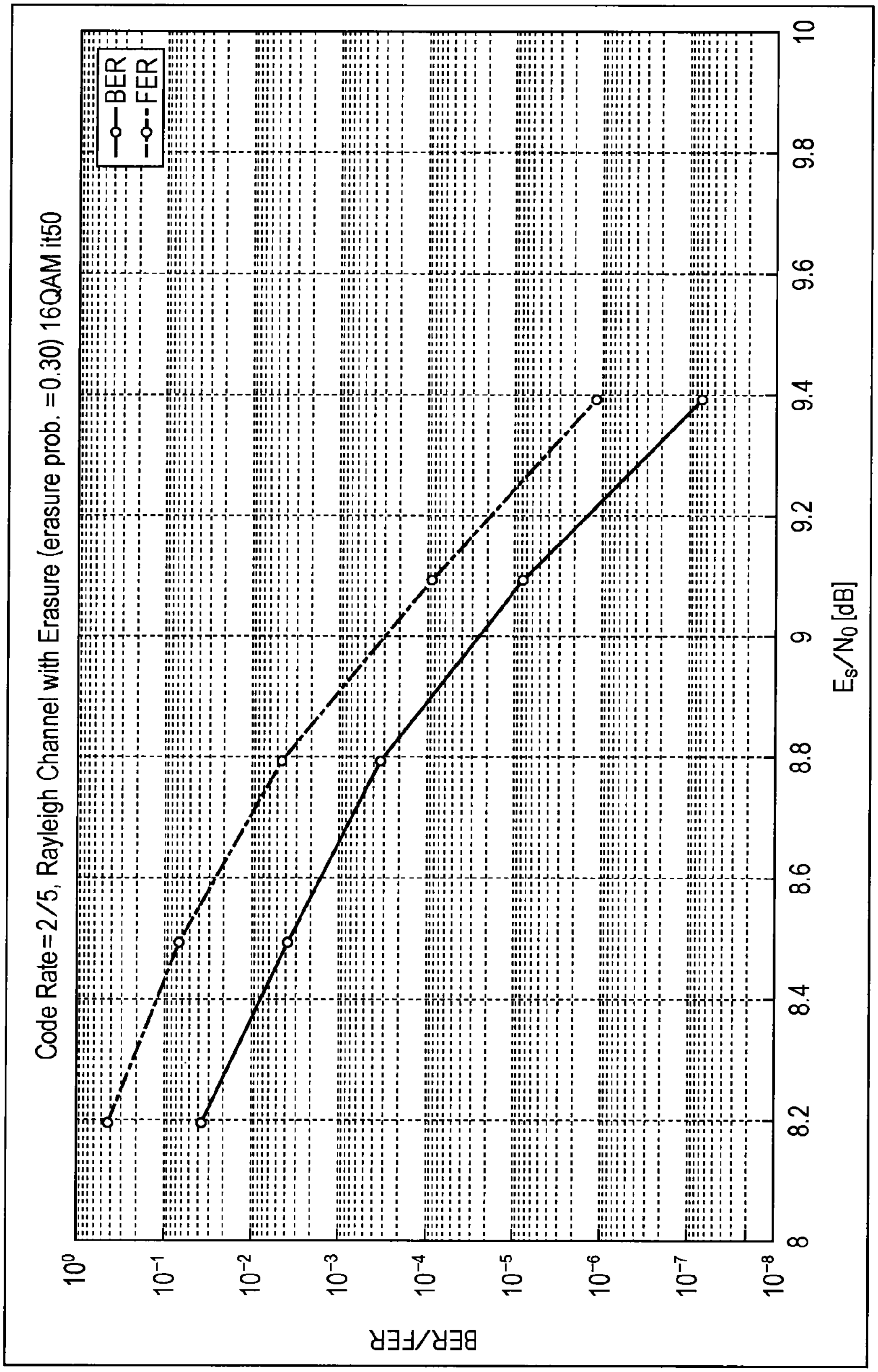
FIG. 110 is a diagram illustrating simulation results of a BER and a FER.
Figure 111:
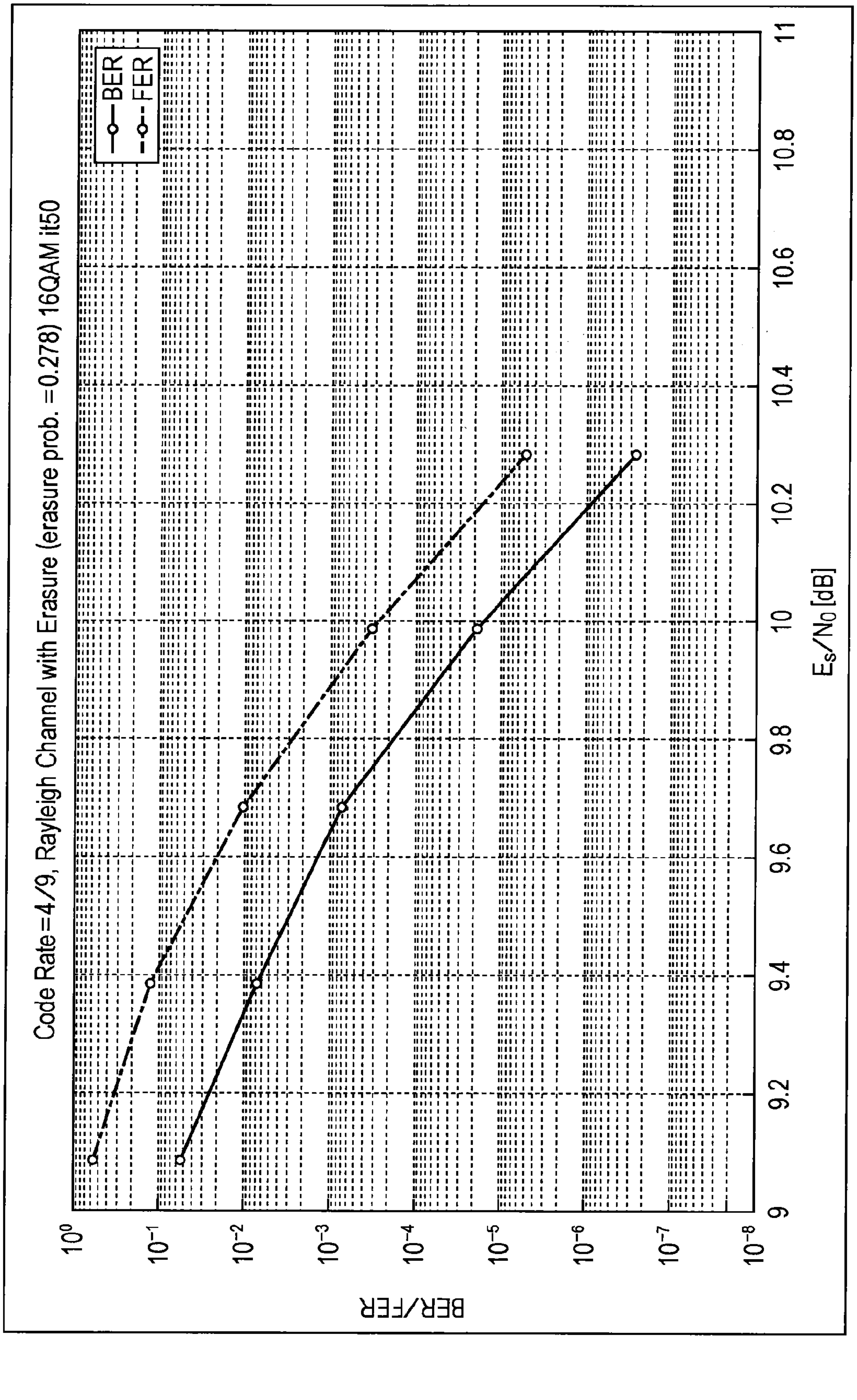
FIG. 111 is a diagram illustrating simulation results of a BER and a FER.
Figure 112:
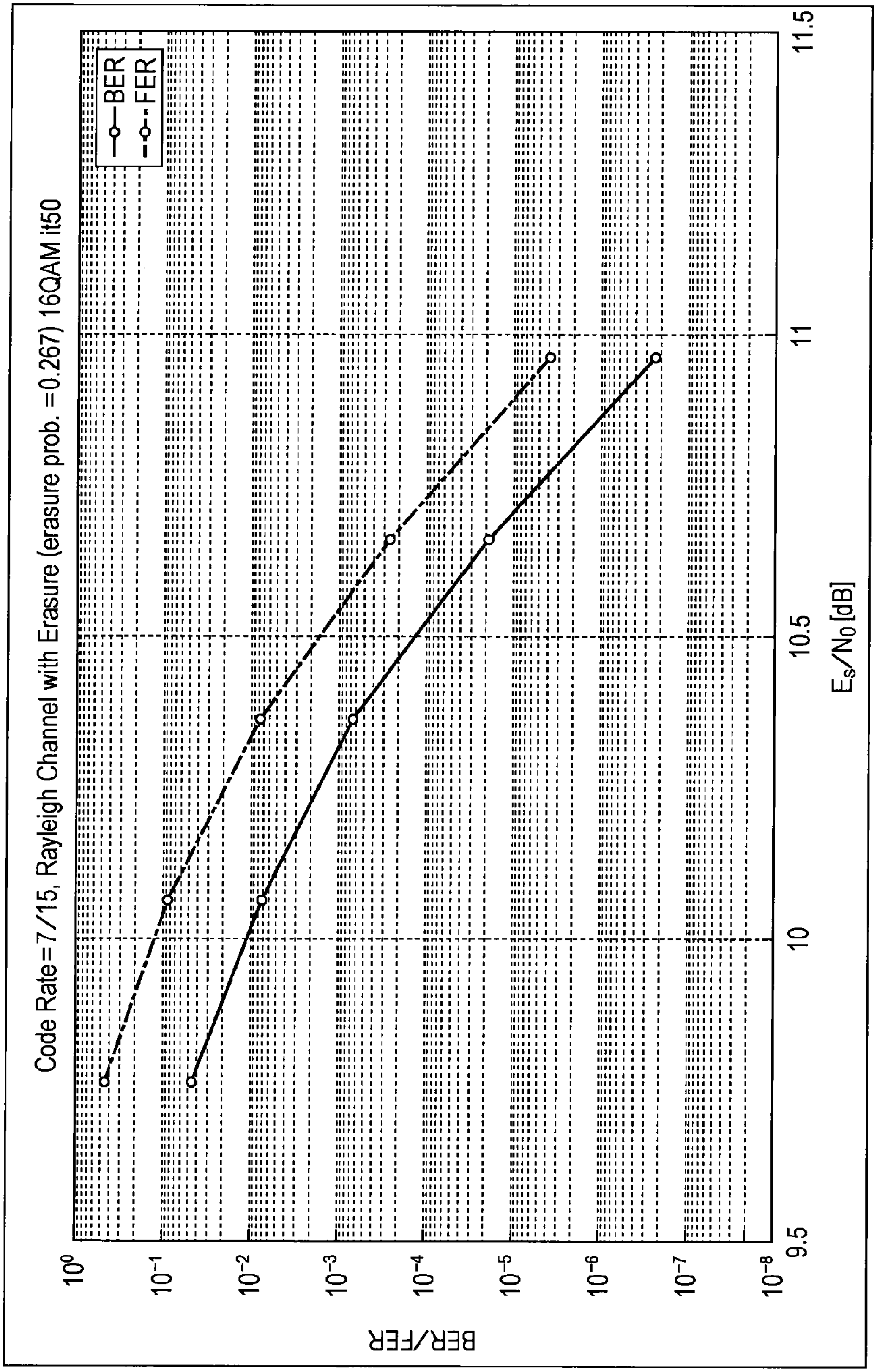
FIG. 112 is a diagram illustrating simulation results of a BER and a FER.
Figure 113:
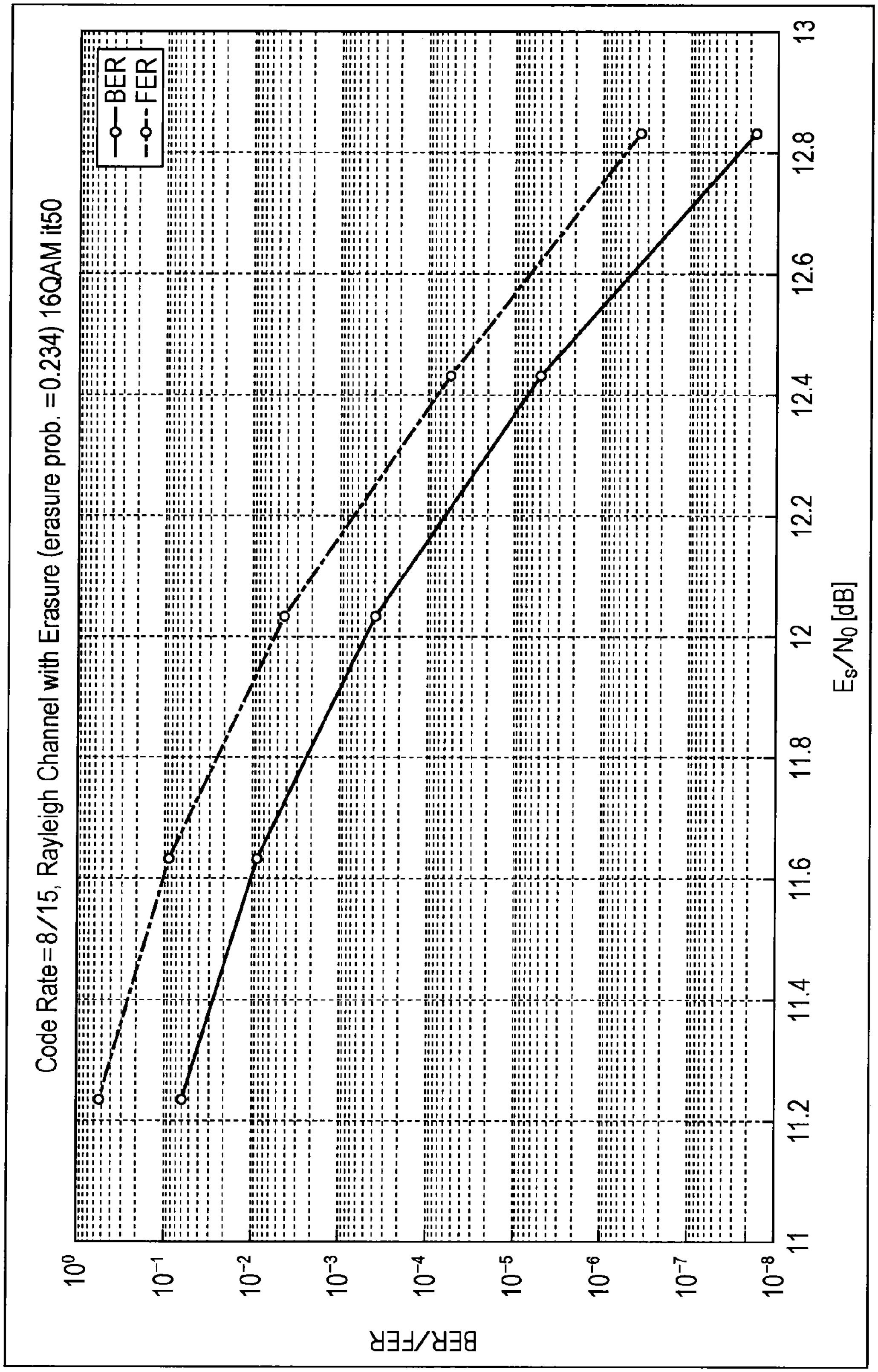
FIG. 113 is a diagram illustrating simulation results of a BER and a FER.
Figure 114:
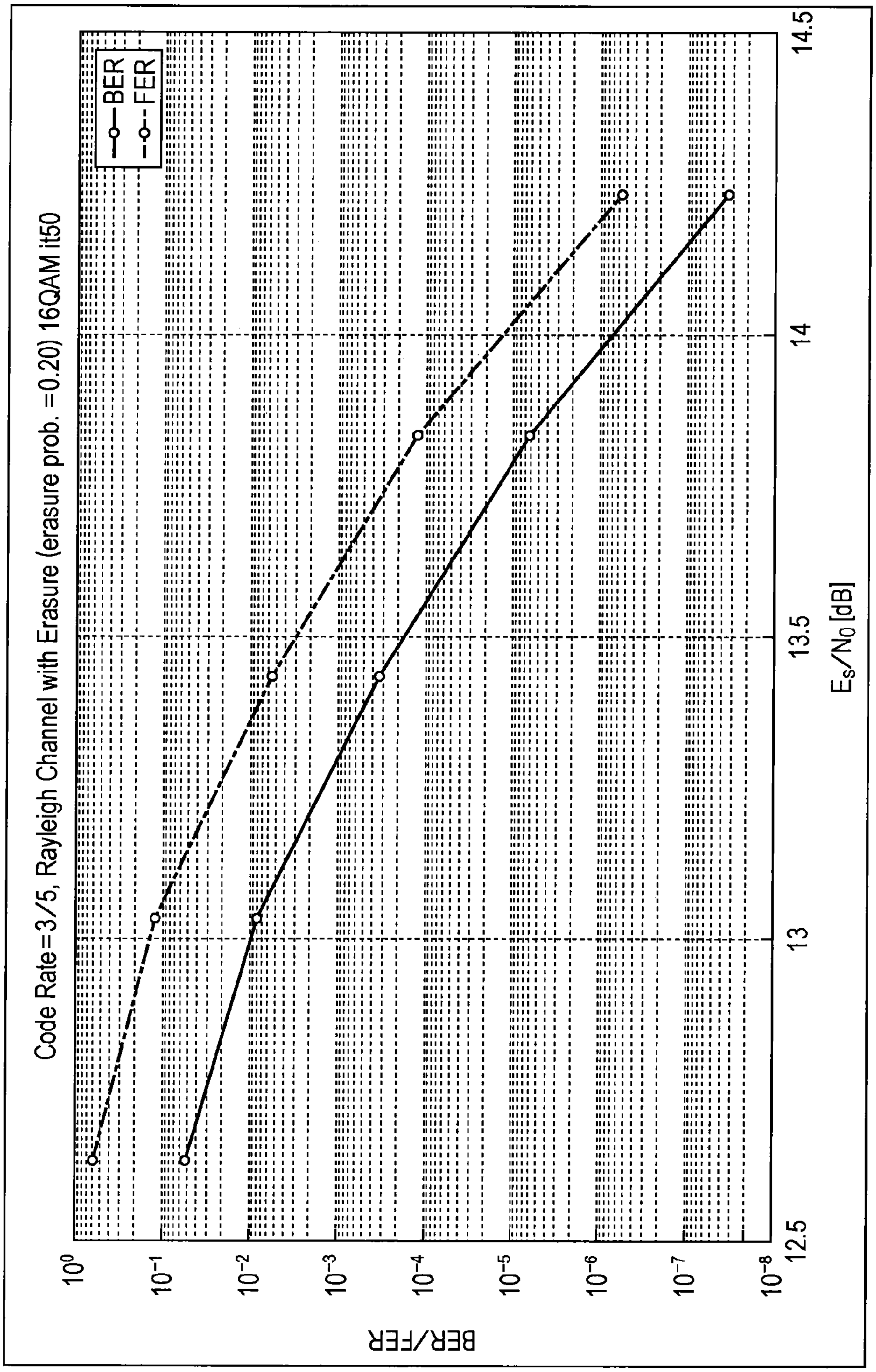
FIG. 114 is a diagram illustrating simulation results of a BER and a FER.
Figure 115:
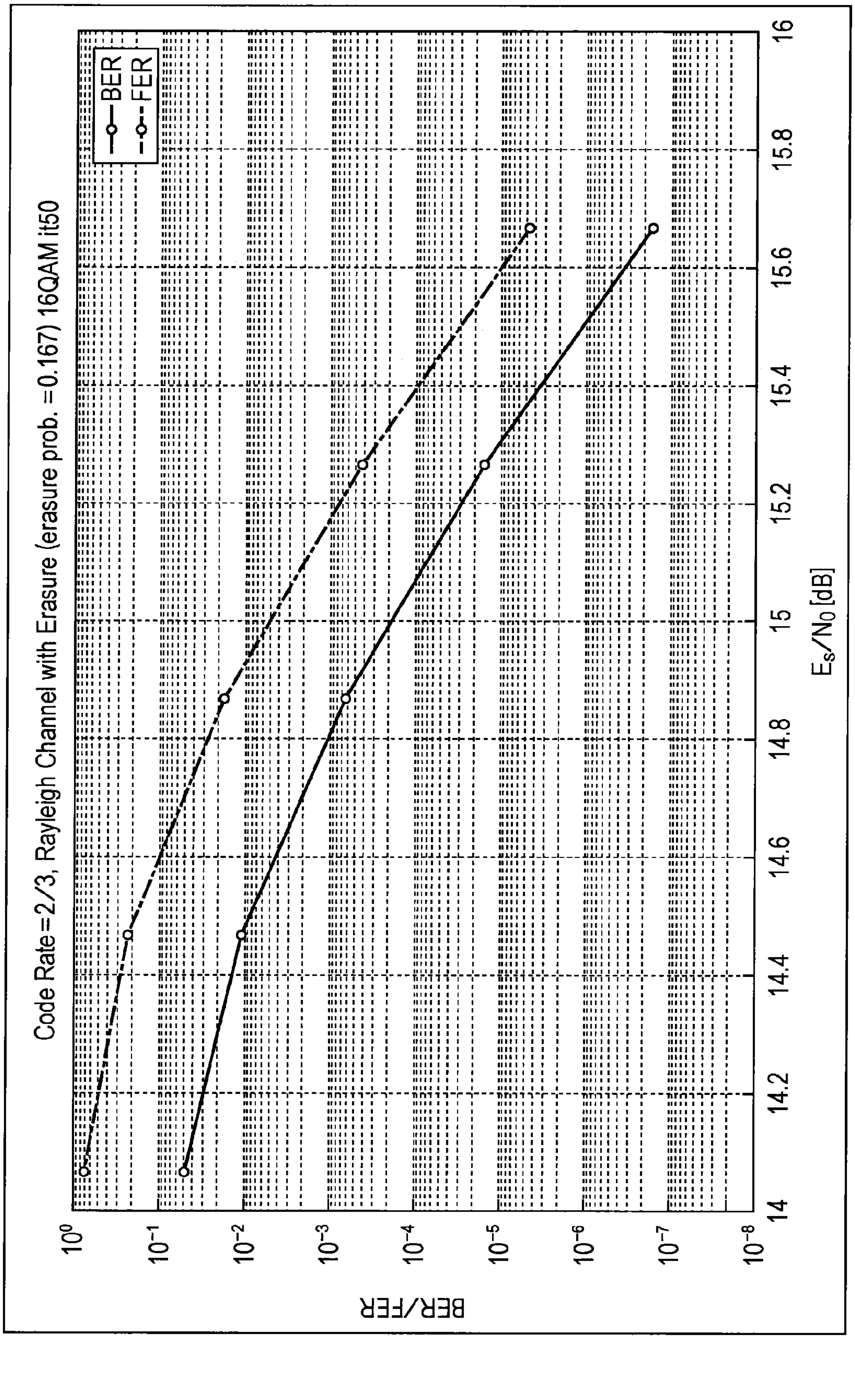
FIG. 115 is a diagram illustrating simulation results of a BER and a FER.

FIG. 107 illustrates the BER (solid line) and FER (dotted line) of the mobile LDPC code with a coding rate r of 1/5, FIG. 108 illustrates the BER and FER of the mobile LDPC code with a coding rate r of 4/15, FIG. 109 illustrates the BER and FER of the mobile LDPC code with a coding rate r of 1/3, FIG. 110 illustrates the BER and FER of the mobile LDPC code with a coding rate r of 2/5, FIG. 111 illustrates the BER and FER of the mobile LDPC code with a coding rate r of 4/9, FIG. 112 illustrates the BER and FER of the mobile LDPC code with a coding rate r of 7/15, FIG. 113 illustrates the BER and FER of the mobile LDPC code with a coding rate r of 8/15, FIG. 114 illustrates the BER and FER of the mobile LDPC code with a coding rate r of 3/5, and FIG. 115 illustrates the BER and FER of the mobile LDPC code with a coding rate r of 2/3.

In the simulation illustrated in FIG. 107, a communication path (Rayleigh channel) in which Rayleigh fading with a symbol erasure probability of 0.40 occurs is considered. In the simulation illustrated in FIG. 108, a communication path (Rayleigh channel) in which Rayleigh fading with a symbol erasure probability of 0.367 occurs is considered. In the simulation illustrated in FIG. 109, a communication path (Rayleigh channel) in which Rayleigh fading with a symbol erasure probability of 0.334 occurs is considered. In the simulation illustrated in FIG. 110, a communication path (Rayleigh channel) in which Rayleigh fading with a symbol erasure probability of 0.30 occurs is considered. In the simulation illustrated in FIG. 111, a communication path (Rayleigh channel) in which Rayleigh fading with a symbol erasure probability of 0.278 occurs is considered. In the simulation illustrated in FIG. 112, a communication path (Rayleigh channel) in which Rayleigh fading with a symbol erasure probability of 0.267 occurs is considered. In the simulation illustrated in FIG. 113, a communication path (Rayleigh channel) in which Rayleigh fading with a symbol erasure probability of 0.234 occurs is considered. In the simulation illustrated in FIG. 114, a communication path (Rayleigh channel) in which Rayleigh fading with a symbol erasure probability of 0.20 occurs is considered. In the simulation illustrated in FIG. 115, a communication path (Rayleigh channel) in which Rayleigh fading with a symbol erasure probability of 0.167 occurs is considered.

In all of the simulations illustrated in FIGS. 107 to 110, the multiple b was 2, 16 QAM was employed as the modulation method, the number of decoding operations C which were repeatedly performed was 50.

As can be seen from FIGS. 107 to 115, the BER and FER are reduced to small values.

The column twist interleaving illustrated in FIG. 106 can also be applied to an LDPC code with a code length of 16200 bits other than the mobile LDPC codes illustrated in FIGS. 35 to 43 (of the parity check matrix calculated from the parity check matrix initial value table).

That is, the column twist interleaving illustrated in FIG. 106 can be applied to LDPC codes (standard 16 k codes) which are specified in, for example, the DVB-T.2 standard and have a code length of 16200 bits, and a coding rates (coding rate described in DVB-T.2) of 1/4, 1/2, 3/5, 2/3, or 3/4 or LDPC codes which are specified in the DVB-S.2 standard and have a code length of 16200 bits and a coding rate of 1/3 or 2/5. In this case, similarly to the mobile LDPC code, it is possible to prevent a plurality of code bits corresponding to a plurality of variable nodes connected to the same check node from being a single symbol of QPSK, 16 QAM, 64 QAM, or 256 QAM.

As described above, the column twist interleaving illustrated in FIG. 106 can use both the mobile LDPC code and the LDPC code which is specified in DVB-T.2 or DVB-S.2 and has a code length of 16200 bits.

FIGS. 116 to 122 are diagrams illustrating the parity check matrix initial value tables of the LDPC codes which are specified in the DVB-T.2 standard and have a code length of 16200 bits and coding rates (coding rates based described in DVB-T.2) of 1/4, 1/2, 3/5, 2/3, and 3/4 and the LDPC codes which are specified in the DVB-S.2 standard and have a code length of 16200 bits and coding rates of 1/3 and 2/5.

Figures 118, 119:
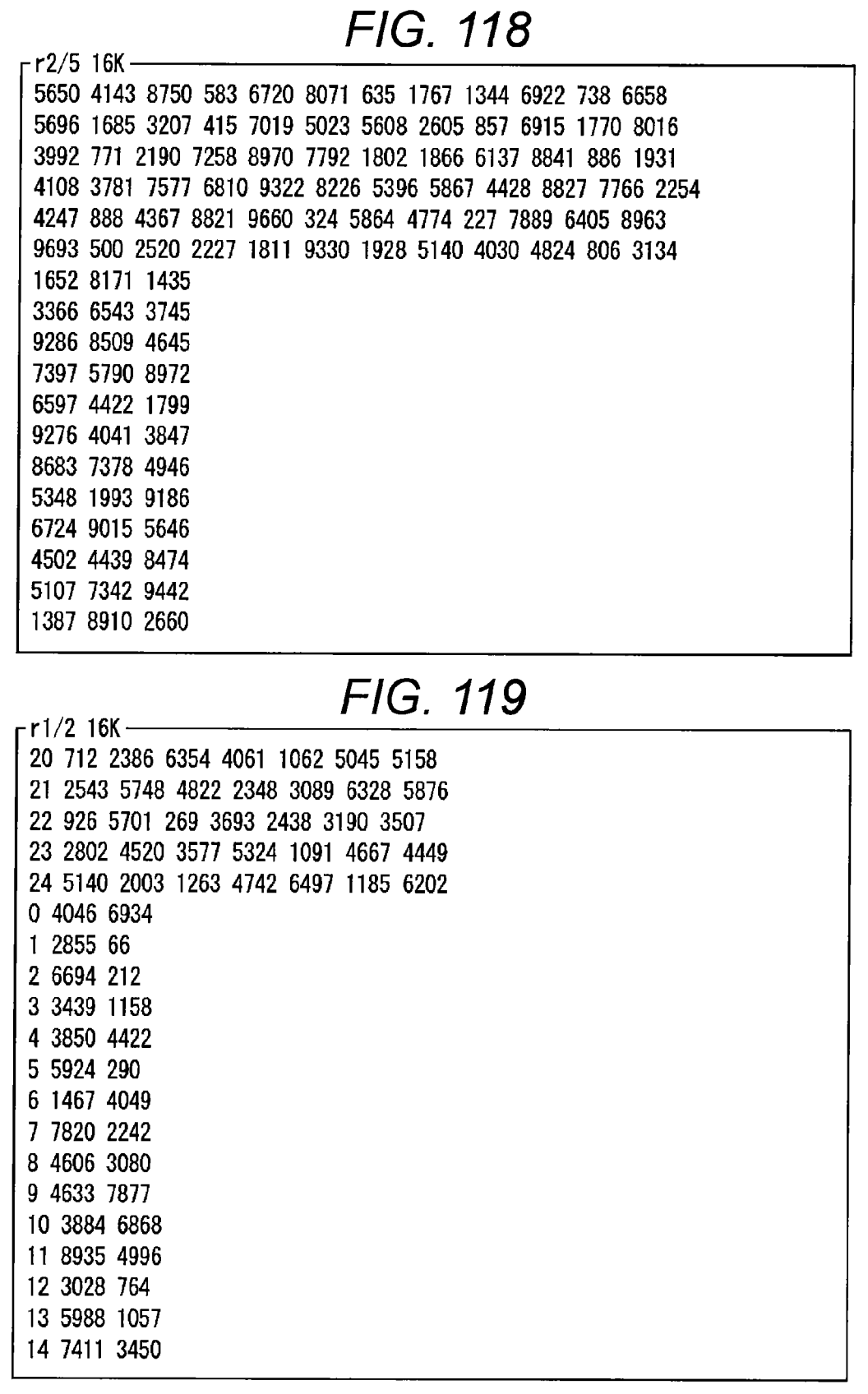
Figure 120:
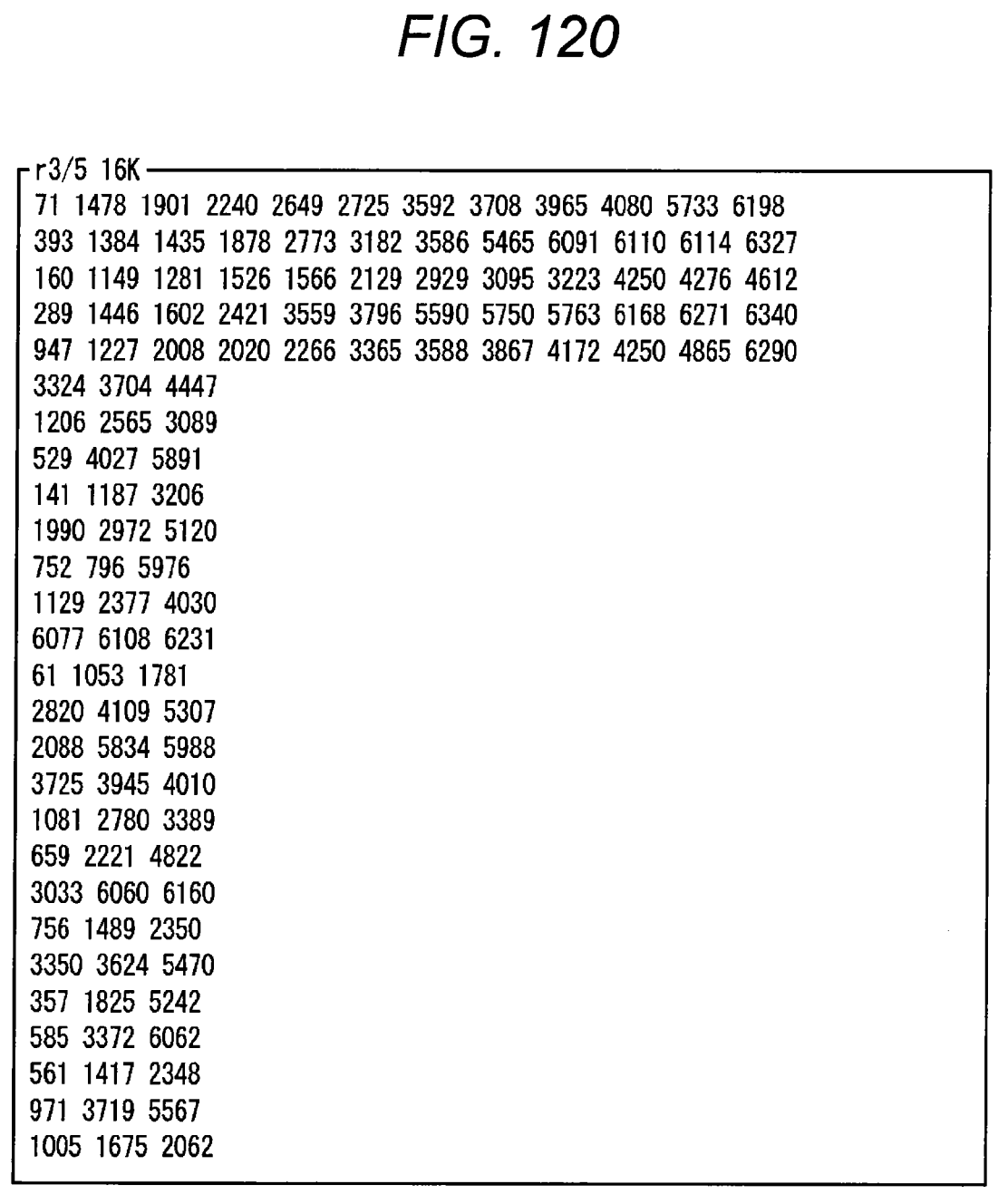

That is, FIG. 116 illustrates the parity check matrix initial value table of the LDPC code which is specified in the DVB-T.2 standard and has a code length of 16200 bits and a coding rate of 1/4. FIG. 117 illustrates the parity check matrix initial value table of the LDPC code which is specified in the DVB-S.2 standard and has a code length of 16200 bits and a coding rate of 1/3. FIG. 118 illustrates the parity check matrix initial value table of the LDPC code which is specified in the DVB-S.2 standard and has a code length of 16200 bits and a coding rate of 2/5. FIG. 119 illustrates the parity check matrix initial value table of the LDPC code which is specified in the DVB-T.2 standard and has a code length of 16200 bits and a coding rate of 1/2. FIG. 120 illustrates the parity check matrix initial value table of the LDPC code which is specified in the DVB-T.2 standard and has a code length of 16200 bits and a coding rate of 3/5. FIG. 121 illustrates the parity check matrix initial value table of the LDPC code which is specified in the DVB-T.2 standard and has a code length of 16200 bits and a coding rate of 2/3. FIG. 122 illustrates the parity check matrix initial value table of the LDPC code which is specified in the DVB-T.2 standard and has a code length of 16200 bits and a coding rate of 3/4.

In the above-described embodiment, the column twist interleaving is performed in a unit of one code word. That is, the LDPC code of one code word is written to the memory 31 in the column direction while the write start position of each column is changed. After the LDPC code of one code word is written, the LDPC code of one code word is read in the row direction. However, the column twist interleaving may be performed in a unit of a plurality of code words.

In this embodiment, it is assumed that an integer equal to or greater than 1 is represented by L.

Figure 123:
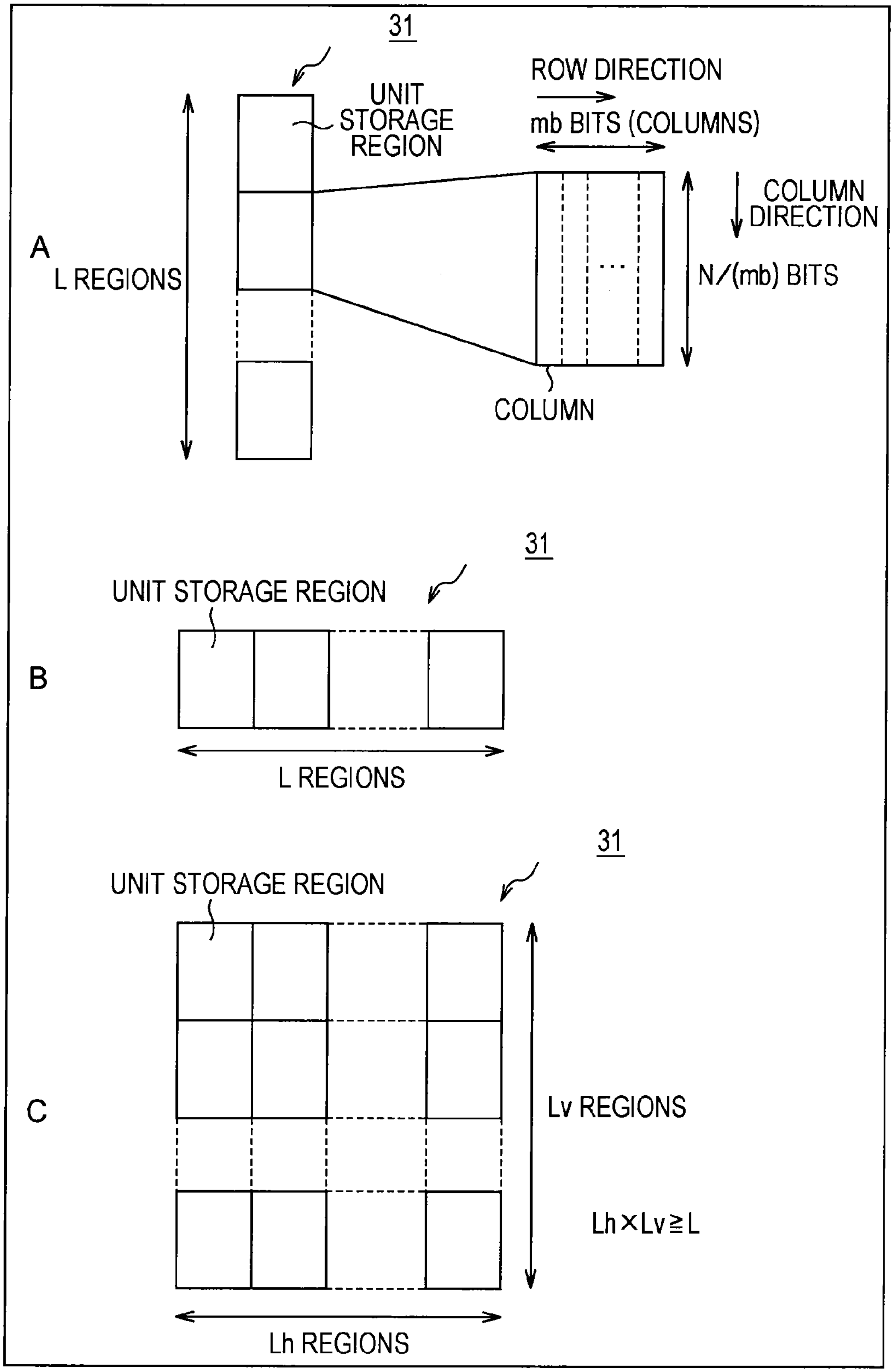

FIG. 123 is a diagram for describing column twist interleaving which is performed in a unit of L code words.

When the column twist interleaving is performed in a unit of L code words, the memory 31 (FIGS. 18 and 19) of the demultiplexer 25 includes L or more unit storage areas as the storage areas.

The unit storage area is a storage area in which the LDPC code is stored in the row direction and the column direction, stores mb bits in the row direction and stores N/(mb) bits in the column direction. That is, the unit area includes mb columns storing N/(mb) bits.

The unit storage area may be ensured in the memory 31 by any method.

A of FIG. 123 is a diagram illustrating an aspect in which L unit storage areas are arranged in a line in the column (vertical) direction in the memory 31 and B of FIG. 123 is a diagram illustrating an aspect in which L unit storage areas are arranged in the row (horizontal) direction in the memory 31.

In addition, C of FIG. 123 is a diagram illustrating an aspect in which Lh unit storage areas are arranged in the row direction and Lv unit storage areas are arranged in the column direction in the memory 31. In C of FIG. 123, Lh×Lv is equal to or greater than L.

When the column twist interleaving is performed in a unit of L code words, the first code word among L code words is written in the column direction of the first unit storage area among L (or more) unit storage areas of the memory 31.

When the writing of the first code word to the first unit storage area ends, the second code word is written in the column direction of the second unit storage area. Similarly, an i-th (i=1, 2, . . . , L) code word among the L code words is written in the column direction of an i-th unit storage area among the L unit storage areas of the memory 31.

In the writing of the i-th code word to the i-th unit storage area, as described above, the write start position of each column is controlled.

Then, when the writing of an L-th code word to an L-th unit storage area ends, that is, when the writing of all of the L code words ends, the first code word is read from the first unit storage area in the row direction.

When the reading of the first code word from the first unit storage area ends, the second code word is read from the second unit storage area in the row direction. Similarly, the L-th code word is read.

As described above, when the column twist interleaving is performed in a unit of L code words, it is possible to prevent a plurality of code bits corresponding to a plurality of variable nodes connected to the same check node from being a single symbol (from being included in the same symbol) for the LDPC codes, similarly to when the column twist interleaving is performed in a unit of one code word. As a result, it is possible to improve the decoding performance in the communication path in which erasure occurs.

When L is equal to or greater than 2, that is, when the column twist interleaving is performed in a unit of a plurality of code words, the time interleaver 118 or the frequency interleaver 120 of the transmitting device (FIG. 8) can perform one time interleaving operation or one frequency interleaving operation for the symbol obtained from a plurality of code words subjected to the column twist interleaving.

When one time interleaving operation or one frequency interleaving operation is performed for the symbol obtained from a plurality of code words, the influence of fading or erasure which depends on the time or frequency is mixed with the symbol obtained from the plurality of code words and it is possible to improve resistance to errors.

In digital broadcasting for a portable (mobile) terminal, since a reception environment (the transmission path characteristics of the communication path 13 (FIG. 7)) varies from hour to hour. Therefore, as described above, when one time interleaving operation or one frequency interleaving operation is performed for the symbol obtained from a plurality of code words, it is particularly effective to improve resistance to errors.

[Configuration Example of Receiving Device 12]

Figure 124:
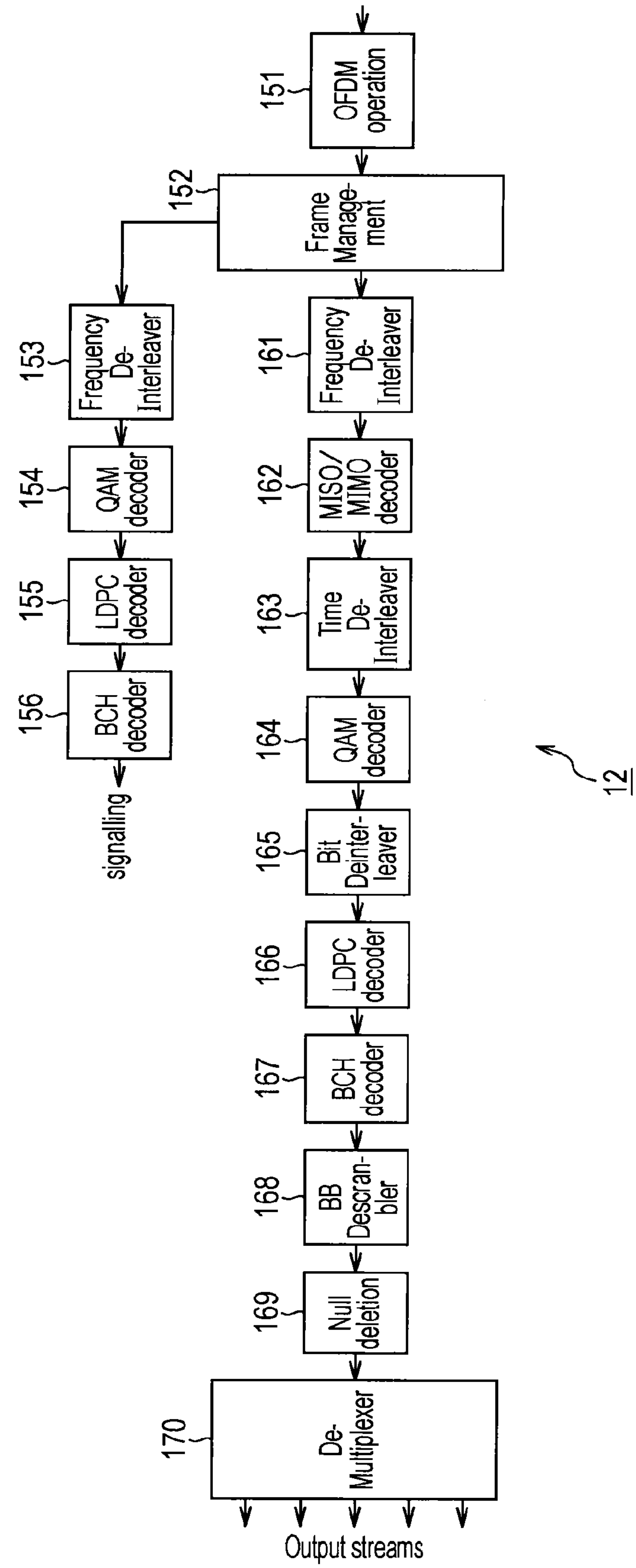

FIG. 124 is a block diagram illustrating a configuration example of the receiving device 12 illustrated in FIG. 7.

The OFDM processing unit (OFDM operation) 151 receives an OFDM signal from the transmitting device 11 (FIG. 7) and processes the OFDM signal. Data (symbol) obtained by the signal processing of the OFDM processing unit 151 is supplied to the frame management unit (Frame Management) 152.

The frame management unit 152 processes (interprets) the frame formed by the symbol supplied from the OFDM processing unit 151 and supplies the symbol of target data obtained from the processing result and the symbol of control data to the frequency deinterleavers 161 and 153.

The frequency deinterleaver 153 performs frequency deinterleaving for each symbol from the frame management unit 152 and supplies the result to the QAM decoder (QAM decoder) 154.

The QAM decoder 154 performs demapping (signal point arrangement decoding) and orthogonal demodulation for the symbol (the symbol arranged at the signal point) from the frequency deinterleaver 153 and supplies the obtained data (LDPC code) to the LDPC decoder (LDPC decoder) 155.

The LDPC decoder 155 performs LDPC decoding for the LDPC code from the QAM decoder 154 and supplies LDPC target data (here, a BCH code) obtained by the decoding process to the BCH decoder (BCH decoder) 156.

The BCH decoder 156 performs BCH decoding for the LDPC target data from the LDPC decoder 155 and outputs control data (signaling) obtained by the decoding process.

Meanwhile, the frequency deinterleaver 161 performs frequency deinterleaving for each symbol from the frame management unit 152 and supplies the symbol to the MISO/MIMO decoder (MISO/MIMO decoder) 162.

The MISO/MIMO decoder 162 performs space-time decoding for the data (symbol) from the frequency deinterleaver 161 and supplies the data to the time deinterleaver (Time Deinterleaver) 163.

The time deinterleaver 163 performs time deinterleaving for the data (symbol) from the MISO/MIMO decoder 162 in a symbol unit and supplies the data to the QAM decoder (QAM decoder) 164.

The QAM decoder 164 performs demapping (signal point arrangement decoding) and orthogonal demodulation for the symbol (the symbol arranged at the signal point) from the time deinterleaver 163 and supplies the obtained data (symbol) to the bit deinterleaver (Bit Deinterleaver) 165.

The bit deinterleaver 165 performs bit deinterleaving for the data (symbol) from the QAM decoder 164 and supplies the obtained LDPC code to the LDPC decoder 166.

The LDPC decoder 166 performs LDPC decoding for the LDPC code from the bit deinterleaver 165 and supplies the decoded LDPC target data (here, a BCH code) to the BCH decoder 167.

The BCH decoder 167 performs BCH decoding for the LDPC target data from the LDPC decoder 155 and supplies the decoded data to the BB descrambler (BB DeScrambler) 168.

The BB descrambler 168 performs an energy dispreading process for the data from the BCH decoder 167 and supplies the processed data to the null deletion unit (Null Deletion) 169.

The null deletion unit 169 deletes Null inserted by the padder 112 illustrated in FIG. 8 from the data transmitted from the BB descrambler 168 and supplies the data to the demultiplexer (Demultiplexer) 170.

The demultiplexer 170 demultiplexes one or more streams (target data) multiplexed into the data transmitted from the null deletion unit 169 and outputs the demultiplexed streams as the output streams.

Figure 125:
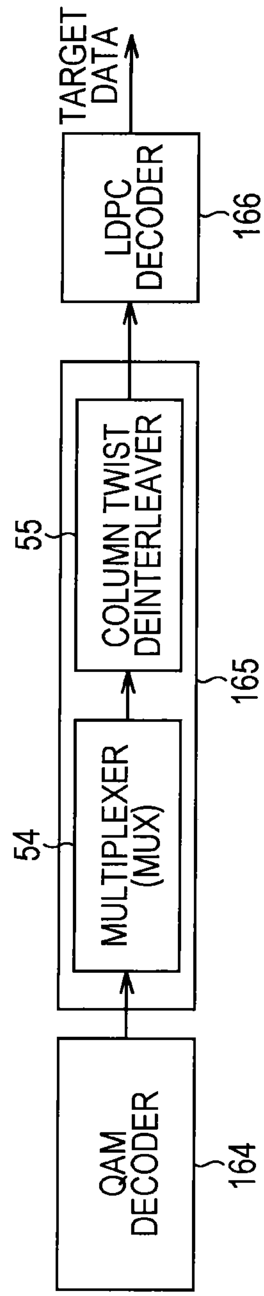

FIG. 125 is a block diagram illustrating a configuration example of the bit deinterleaver 165 illustrated in FIG. 124.

The bit deinterleaver 165 includes a multiplexer (MUX) 54 and a column twist deinterleaver 55 and (bit) deinterleaves the symbol bits of the symbol from the QAM decoder 164 (FIG. 124).

That is, the multiplexer 54 performs a reverse exchange process (a process reverse to the exchange process) corresponding to the exchange process performed by the demultiplexer 25 illustrated in FIG. 9 for the symbol bit of the symbol transmitted from the QAM decoder 164. That is, the multiplexer 54 performs a reverse exchange process of returning the position of the code bit (symbol bit) of the LDPC code exchanged by the exchange process to the original position. Then, the multiplexer 54 supplies the LDPC code obtained by the process to the column twist deinterleaver 55.

The column twist deinterleaver 55 performs column twist deinterleaving (a process reverse to column twist interleaving) corresponding to column twist interleaving as the sorting process performed by the column twist interleaver 24 illustrated in FIG. 9 for the LDPC code transmitted from the multiplexer 54. That is, the column twist deinterleaver 55 performs, for example, column twist deinterleaving which is a reverse sorting process of returning the code bit of the LDPC code whose arrangement has been changed by column twist interleaving serving as the sorting process to the original arrangement.

Specifically, the column twist deinterleaver 55 writes and reads the code bit of the LDPC code to and from a memory for deinterleaving which has the same structure as the memory 31 illustrated in FIG. 24 to perform column twist deinterleaving.

The column twist deinterleaver 55 writes code bits in the row direction of the memory for deinterleaving, using a read address used to read the code bits from the memory 31 as a write address. In addition, the column twist deinterleaver 55 reads code bits in the column direction of the memory for deinterleaving, using a write address used to write the code bits to the memory 31 as a read address.

The LDPC code obtained by the column twist deinterleaving is supplied from the column twist deinterleaver 55 to the LDPC decoder 166.

The parity interleaving, the column twist interleaving, and the exchange process are performed in this order for the LDPC code which is supplied from the QAM decoder 164 to the bit deinterleaver 165. However, the bit deinterleaver 165 performs only the reverse exchange process corresponding to the exchange process and the column twist deinterleaving corresponding to the column twist interleaving, but does not perform the parity deinterleaving (a process reverse to the parity interleaving) corresponding to the parity interleaving, that is, the parity deinterleaving for returning the code bit of the LDPC code whose arrangement has been changed by the parity interleaving to the original arrangement.

Therefore, the LDPC code which has been subjected to the reverse exchange process and the column twist deinterleaving but has not been subjected to the parity deinterleaving is supplied from (the column twist deinterleaver 55 of) the bit deinterleaver 165 to the LDPC decoder 166.

The LDPC decoder 166 performs LDPC decoding for the LDPC code from the bit deinterleaver 165, using the conversion parity check matrix obtained by performing at least column replacement corresponding to the parity interleaving for the parity check matrix H which is used for LDPC coding by the LDPC encoder 115 illustrated in FIG. 8, and outputs the decoded data as the decoding result of the LDPC target data.

FIG. 126 is a flowchart for describing processing performed by the QAM decoder 164, the bit deinterleaver 165, and the LDPC decoder 166 illustrated in FIG. 125.

In Step S111, the QAM decoder 164 performs demapping and orthogonal demodulation for the symbol (the symbol mapped to the signal point) from the time deinterleaver 163 and supplies the symbol to the bit deinterleaver 165. Then, the process proceeds to Step S112.

In Step S112, the bit deinterleaver 165 deinterleaves (bit-deinterleaves) the symbol bits of the symbol from the QAM decoder 164. Then, the process proceeds to Step S113.

That is, in Step S112, in the bit deinterleaver 165, the multiplexer 54 performs the reverse exchange process for the symbol bits of the symbol from the QAM decoder 164 and supplies the code bits of the LDPC code obtained by the reverse exchange process to the column twist deinterleaver 55.

The column twist deinterleaver 55 performs the column twist deinterleaving for the LDPC code from the multiplexer 54 and supplies the LDPC code obtained by the column twist deinterleaving to the LDPC decoder 166.

In Step S113, the LDPC decoder 166 performs LDPC decoding for the LDPC code from the column twist deinterleaver 55, using the conversion parity check matrix obtained by performing at least column replacement corresponding to the parity interleaving for the parity check matrix H which is used for LDPC coding by the LDPC encoder 115 illustrated in FIG. 8, and outputs the decoded data as the decoding result of the LDPC target data to the BCH decoder 167.

In FIG. 125, similarly to FIG. 9, for convenience of explanation, the multiplexer 54 which performs the reverse exchange process and the column twist deinterleaver 55 which performs the column twist deinterleaving are separately configured. However, the multiplexer 54 and the column twist deinterleaver 55 may be integrally configured.

When the bit interleaver 116 illustrated in FIG. 9 does not perform the column twist interleaving, the column twist deinterleaver 55 is not needed in the bit deinterleaver 165 illustrated in FIG. 125.

Next, LDPC decoding performed by the LDPC decoder 166 illustrated in FIG. 124 will be described.

As described above, the LDPC decoder 166 illustrated in FIG. 124 performs LDPC decoding for the LDPC code from the column twist deinterleaver 55 which has been subjected to the reverse exchange process and the column twist deinterleaving, but has not been subjected to the parity deinterleaving, using the conversion parity check matrix obtained by performing at least column replacement corresponding to the parity interleaving for the parity check matrix H which is used for LDPC coding by the LDPC encoder 115 illustrated in FIG. 8.

An LDPC decoding process has been proposed which is performed using the conversion parity check matrix to sufficiently reduce an operating frequency in a possible range while reducing a circuit size (for example, see Japanese Patent No. 4224777).

First, the proposed LDPC decoding process using the conversion parity check matrix will be described with reference to FIGS. 127 to 130.

FIG. 127 illustrates an example of the parity check matrix H of the LDPC code with a code length N of 90 and a coding rate of 2/3.

In FIG. 127, 0 is represented by a period (.) (which holds for the following FIGS. 128 and 129).

In the parity check matrix H illustrated in FIG. 127, the parity matrix has a staircase structure.

FIG. 128 illustrates a parity check matrix H' obtained by performing row replacement represented by Formula (11) and column replacement represented by Formula (12) for the parity check matrix H illustrated in FIG. 127.

$$\text{Row replacement: } (6s+t+1)\text{-th row} \rightarrow (5t+s+1)\text{-th row} \quad (11)$$

$$\text{Column replacement: } (6x+y+61)\text{-th column} \rightarrow (5y+x+61)\text{-th column} \quad (12)$$

In Formulae (11) and (12), s, t, x, and y are integers satisfying $0 \le s < 5$, $0 \le t < 6$, $0 \le x < 5$, and $0 \le t < 6$, respectively.

According to the row replacement represented by Formula (11), the first, seventh, thirteenth, nineteenth, and twenty-fifth rows that leave a remainder of 1 when they are divided by 6 are substituted with the first, second, third, fourth, and fifth rows, and the second, eighth, fourteenth, twentieth, and twenty-sixth rows that leave a remainder of 2 when they are divided by 6 are substituted with the sixth, seventh, eighth, ninth, and tenth rows.

According to the column replacement represented by Formula (12), for the 61st and subsequent columns (parity matrix), the 61st, 67th, 73rd, 79th, and 85th columns that leave a remainder of 1 when they are divided by 6 are substituted with the 61st, 62nd, 63rd, 64th, and 65th columns and the 62nd, 68th, 74th, 80th, and 86th columns that leave a remainder of 2 when they are divided by 6 are substituted with the 66th, 67th, 68th, 69th, and 70th columns.

In this way, the matrix obtained by substituting the rows and columns of the parity check matrix H illustrated in FIG. 127 is the parity check matrix H' illustrated in FIG. 128.

The arrangement of the code bits of the LDPC code is not affected by the row replacement of the parity check matrix H.

The column replacement represented by Formula (12) corresponds to parity interleaving for interleaving the (K+qx+y+1)-th code bit at the position of the (K+Py+x+1) code bit when the information length K is 60, the unit column number P of the cyclic structure is 5, and the divisor q (=M/P) of the parity length M (here 30) is 6.

When the parity check matrix (hereinafter, appropriately referred to as a conversion parity check matrix) H' illustrated in FIG. 128 is multiplied by the result of the same substitution as that represented by Formula (12) for the LDPC code of the parity check matrix H (hereinafter, appropriately referred to as the original parity check matrix) illustrated in FIG. 127, a 0 vector is output. That is, when a row vector obtained by performing the column replacement represented by Formula (12) for a row vector c as the LDPC code (one code word) of the original parity check matrix H is represented by c', $Hc^T$ is the 0 vector from the characteristics of the parity check matrix and $H'c'^T$ is also the 0 vector.

As described above, the conversion parity check matrix H' illustrated in FIG. 128 becomes the parity check matrix of the LDPC code c' obtained by performing the column replacement represented by Formula (12) for the LDPC code c of the original parity check matrix H.

Therefore, when the column replacement represented by Formula (12) is performed for the LDPC code c of the original parity check matrix H, the LDPC code c' after the column replacement is decoded (LDPC-decoded) using the parity check matrix H' illustrated in FIG. 128, and reverse replacement to the column replacement represented by Formula (12) is performed for the decoding result, it is possible to obtain the same decoding result as that obtained when the LDPC code of the original parity check matrix H is decoded using the parity check matrix H.

FIG. 129 illustrates the conversion parity check matrix H' illustrated in FIG. 128 in which there is a gap between the units of 5×5 matrices.

In FIG. 129, the conversion parity check matrix H' is represented by a 5×5 unit matrix, a matrix (hereinafter, appropriately referred to as a quasi-unit matrix) obtained by changing one or more 1s to 0 in the unit matrix, a matrix (hereinafter, appropriately referred to as a shift matrix) obtained by cyclically shifting the unit matrix or the quasi-unit matrix, a matrix (hereinafter, appropriately referred to as a sum matrix) which is the sum of two or more of the unit matrix, the quasi-unit matrix, and the shift matrix, and a combination of the zero matrices of size of 5×5.

It can be considered that the conversion parity check matrix H' illustrated in FIG. 129 includes the 5×5 unit matrix, the quasi-unit matrix, the shift matrix, the sum matrix, and the zero matrix. Therefore, hereinafter, the 5×5 matrices forming the conversion parity check matrix H' are appropriately referred to as component matrices.

An architecture which performs check node calculation and variable node calculation for P check nodes and P variable nodes at the same time can be used to decode the LDPC code of the parity check matrix represented by the P×P component matrix.

FIG. 130 is a block diagram illustrating a configuration example of the decoding device which performs the above-mentioned decoding process.

That is, FIG. 130 illustrates a configuration example of the decoding device which decodes the LDPC code using the conversion parity check matrix H' illustrated in FIG. 129 obtained by performing at least the column replacement represented by Formula (12) for the original parity check matrix H illustrated in FIG. 127.

The decoding device illustrated in FIG. 130 includes a memory for branch data storage 300 including six FIFOs $\mathbf{300}_1$ to $\mathbf{300}_6$, a selector 301 which selects the FIFOs $\mathbf{300}_1$ to $\mathbf{300}_6$, a check node calculation unit 302, two cyclic shift circuits 303 and 308, a memory for branch data storage 304 including 18 FIFOs $\mathbf{304}_1$ to $\mathbf{304}_{18}$, a selector 305 which selects the FIFOs $\mathbf{304}_1$ to $\mathbf{304}_{18}$, a memory for received data 306 which stores the received data, a variable node calculation unit 307, a decoded word calculation unit 309, a received data sorting unit 310, and a decoded data sorting unit 311.

First, a method of storing data in the memories for branch data storage 300 and 304 will be described.

The memory for branch data storage 300 includes the six FIFOs $\mathbf{300}_1$ to $\mathbf{300}_6$. The number of FIFOs is equal to a quotient when 30, which is the number of rows in the conversion parity check matrix H' illustrated in FIG. 129, is divided by 5, which is the number of rows in the component matrix. A FIFO $\mathbf{300}_y$ (y=1, 2, . . . , 6) has a plurality of stages of storage areas such that messages corresponding to five branches whose number is equal to the number of rows and the number of columns in the component matrix can be read from or written to the storage areas in each stage at the same time. The number of stages of the storage areas in the FIFO $\mathbf{300}_y$ is 9 which is the maximum number of 1s (Hamming weight) in the row direction of the conversion parity check matrix illustrated in FIG. 129.

In the FIFO $300_1$, data (messages $v_i$ from the variable node) corresponding to the positions of is in the first to fifth rows of the conversion parity check matrix H' illustrated in FIG. 129 are stored in each row in the horizontal direction (in the form in which 0 is ignored). That is, when a j-th row and an i-th column are represented by (j, i), data corresponding to the positions of 1s in the 5×5 unit matrix from (1, 1) to (5, 5) of the conversion parity check matrix H' is stored in the storage area in the first stage in the FIFO $300_1$. Data corresponding to the positions of is in the shift matrix from (1, 21) to (5, 25) (the shift matrix obtained by cyclically shifting the 5×5 unit matrix to the right by three) of the conversion parity check matrix H' is stored in the storage area in the second stage. Similarly, data is stored in the storage areas in the third to eighth stages so as to be associated with the conversion parity check matrix H'. Data corresponding to the positions of 1s in the shift matrix from (1, 86) to (5, 90) of the conversion parity check matrix H' (the shift matrix obtained by substituting 1 in the first row of the 5×5 unit matrix with 0 and then cyclically shifting the matrix to the left by one) is stored in the storage area in the ninth stage.

Data corresponding to the positions of is from the sixth row to the tenth row of the conversion parity check matrix H' illustrated in FIG. 129 is stored in the FIFO $300_2$. That is, data corresponding to the positions of is in the first shift matrix which forms the sum matrix from (6, 1) to (10, 5) of the conversion parity check matrix H' (the sum matrix which is the sum of the first shift matrix obtained by cyclically shifting the 5×5 unit matrix to the right by one and the second shift matrix obtained by cyclically shifting the 5×5 unit matrix to the right by two) is stored in the storage area in the first stage in the FIFO $300_2$. Data corresponding to the positions of is in the second shift matrix which forms the sum matrix from (6, 1) to (10, 5) of the conversion parity check matrix H' is stored in the storage area in the second stage.

That is, when a component matrix with a weight of 2 or more is represented by the sum of two or more of a P×P unit matrix with a weight of 1, a quasi-unit matrix obtained by changing one or more 1s to 0s in the unit matrix, and a shift matrix obtained by cyclically shifting the unit matrix or the quasi-unit matrix, data corresponding to the positions of is in the unit matrix with a weight of 1, the quasi-unit matrix, or the shift matrix (messages corresponding to the branches belonging to the unit matrix, the quasi-unit matrix, or the shift matrix) is stored at the same address (the same FIFO among the FIFOs $300_1$ to $300_6$).

Similarly, data is stored in the storage areas in the third to ninth stages so as to be associated with the conversion parity check matrix H'.

In the FIFOs $300_3$ to $300_6$, similarly, data is stored so as to be associated with the conversion parity check matrix H'.

The memory for branch data storage 304 includes 18 FIFOs $304_1$ to $304_{18}$. The number of FIFOs is equal to a quotient when 90, which is the number of columns in the conversion parity check matrix H', is divided by 5, which is the number of columns in the component matrix. A FIFO $304_x$ (x=1, 2, . . . , 18) has a plurality of stages of storage areas such that messages corresponding to five branches whose number is equal to the number of rows and the number of columns in the conversion component matrix H' can be read from or written to the storage areas in each stage at the same time.

In the FIFO $304_1$, data (a message $u_i$ from the check node) corresponding to the positions of 1s in the first to fifth columns of the conversion parity check matrix H' illustrated in FIG. 129 is stored in each column in the vertical direction (in the form in which 0 is ignored). That is, data corresponding to the positions of is in the 5×5 unit matrix from (1, 1) to (5, 5) of the conversion parity check matrix H' is stored in the storage area in the first stage in the FIFO $304_1$. Data corresponding to the positions of is in the first shift matrix which forms the sum matrix from (6, 1) to (10, 5) of the conversion parity check matrix H' (the sum matrix which is the sum of the first shift matrix obtained by cyclically shifting the 5×5 unit matrix to the right by one and the second shift matrix obtained by cyclically shifting the 5×5 unit matrix to the right by two) is stored in the storage area in the second stage. In addition, data corresponding to the positions of is in the second shift matrix which forms the sum matrix from (6, 1) to (10, 5) of the conversion parity check matrix H' is stored in the storage area in the third stage.

That is, when a component matrix with a weight of 2 or more is represented by the sum of two or more of a P×P unit matrix with a weight of 1, a quasi-unit matrix obtained by changing one or more is to 0s in the unit matrix, and a shift matrix obtained by cyclically shifting the unit matrix or the quasi-unit matrix, data corresponding to the positions of is in the unit matrix with a weight of 1, the quasi-unit matrix, or the shift matrix (messages corresponding to the branches belonging to the unit matrix, the quasi-unit matrix, or the shift matrix) is stored at the same address (the same FIFO among the FIFOs $304_1$ to $304_{18}$).

Similarly, data is stored in the storage areas in the fourth and fifth stages so as to be associated with the conversion parity check matrix H'. The number of stages of the storage areas in the FIFO $304_1$ is 5 which is the maximum number of 1s (Hamming weight) in the row direction in the first to fifth columns of the conversion parity check matrix H'.

Similarly, data is stored in the FIFOs $304_2$ and $304_3$ so as to be associated with the conversion parity check matrix H' and the length of the data (the number of stages) is 5. Similarly, data is stored in the FIFOs $304_4$ to $304_{12}$ so as to be associated with the conversion parity check matrix H' and the length of each FIFO is 3. Similarly, data is stored in the FIFOs $304_{13}$ to $304_{18}$ so as to be associated with the conversion parity check matrix H' and the length of the data is 2.

Next, the operation of the decoding device illustrated in FIG. 130 will be described.

The memory for branch data storage 300 includes six FIFOs $300_1$ to $300_6$, selects the FIFO which will store data from the FIFOs $300_1$ to $300_6$ on the basis of information (Matrix data) D312 indicating the row of the conversion parity check matrix H' including five messages D311 supplied from the cyclic shift circuit 308 in the previous stage, and sequentially stores the five messages D311 in the selected FIFO. When reading data, the memory for branch data storage 300 sequentially reads five messages D$300_1$ from the FIFO $300_1$ and supplies the read five messages D$300_1$ to the selector 301 in the next stage. After the reading of the messages from the FIFO $300_1$ ends, the memory for branch data storage 300 sequentially reads messages from the FIFOs $300_2$ to $300_6$ and supplies the read messages to the selector 301.

The selector 301 selects five messages from the FIFO from which data is currently read among the FIFOs $300_1$ to $300_6$ in response to a select signal D301 and supplies the selected messages as messages D302 to the check node calculation unit 302.

The check node calculation unit 302 includes five check node calculators $302_1$ to $302_5$, performs check node calculation according to Formula (7) using the messages D302 (D$302_1$ to D$302_5$) (messages $v_i$ represented by Formula (7)) supplied through the selector 301, and supplies five messages D303 (D$303_1$ to D$303_5$) (messages $u_j$ represented by Formula (7)) obtained by the check node calculation to the cyclic shift circuit 303.

The cyclic shift circuit 303 cyclically shifts the five message D303$_1$ to D303$_5$ calculated by the check node calculation unit 302 on the basis of information (Matrix data) D305 indicating by what number of original unit matrices the corresponding branch is cyclically shifted in the conversion parity check matrix H' and supplies the result of the cyclic shift as a message D304 to the memory for branch data storage 304.

The memory for branch data storage 304 includes 18 FIFOs 304$_1$ to 304$_{18}$, selects the FIFO which will store data from the FIFOs 304$_1$ to 304$_{18}$ on the basis of information D305 indicating the row of the conversion parity check matrix H' including the five messages D304 supplied from the cyclic shift circuit 303 in the previous stage, and sequentially stores the five messages D304 in the selected FIFO. When reading data, the memory for branch data storage 304 sequentially reads five messages D306$_1$ from the FIFO 304$_1$ and supplies the read five messages D306$_1$ to the selector 305 in the next stage. After the reading of the data from the FIFO 304$_1$ ends, the memory for branch data storage 304 sequentially reads messages from the FIFOs 304$_2$ to 304$_{18}$ and supplies the read messages to the selector 305.

The selector 305 selects five messages from the FIFO from which data is currently read among the FIFOs 304$_1$ to 304$_{18}$ in response to a select signal D307 and supplies the selected messages as messages D308 to the variable node calculation unit 307 and the decoded word calculation unit 309.

The received data sorting unit 310 performs the column replacement represented by Formula (12) for the LDPC code D313 received through the communication path 13 to sort the code and supplies the sorted code as received data D314 to the memory for received data 306. The memory for received data 306 calculates a reception LLR (logarithmic likelihood ratio) from the received data D314 supplied from the received data sorting unit 310, stores the reception LLR, and supplies each set of five reception LLRs as received values D309 to the variable node calculation unit 307 and the decoded word calculation unit 309.

The variable node calculation unit 307 includes five variable node calculators 307$_1$ to 307$_5$, performs variable node calculation according to Formula (1) using the messages D308 (D308$_1$ to D308$_5$) (the messages $u_j$ represented by Formula (1)) supplied through the selector 305 and the five received values D309 (the received values $u_{0i}$ represented by Formula (1)) supplied from the memory for received data 306, and supplies messages D310 (D310$_1$ to D310$_5$) (messages $v_i$ represented by Formula (1)) obtained by the calculation to the cyclic shift circuit 308.

The cyclic shift circuit 308 cyclically shifts the messages D310$_1$ to D310$_5$ calculated by the variable node calculation unit 307 on the basis of information indicating by what number of original unit matrices the corresponding branch is cyclically shifted in the conversion parity check matrix H', and supplies the result of the cyclic shift as a message D311 to the memory for branch data storage 300.

A series of the above-mentioned operation makes it possible to decode the LDPC code once. In the decoding device illustrated in FIG. 130, after the LDPC code is decoded a predetermined number of times, the decoded word calculation unit 309 and the decoded data sorting unit 311 calculate and output the final decoding result.

That is, the decoded word calculation unit 309 includes five decoded word calculators 309$_1$ to 309$_5$, calculates the decoding result (decoded word) as the final stage among a plurality of decoding stages, on the basis of Formula (5), using the five messages D308 (D308$_1$ to D308$_5$) (the messages $u_j$ represented by Formula (5)) output from the selector 305 and the five received values D309 (the received values $u_{0i}$ represented by Formula (5)) supplied from the memory for received data 306 and supplies decoded data D315 as the calculation result to the decoded data sorting unit 311.

The decoded data sorting unit 311 performs a process reverse to the column replacement represented by Formula (12) for the decoded data D315 supplied from the decoded word calculation unit 309 to sort the order of the data, and outputs the sorted decoded data as a final decoding result D316.

As described above, row replacement or/and column replacement are performed for the parity check matrix (the original parity check matrix) to convert the parity check matrix into a P×P unit matrix, a quasi-unit matrix obtained by changing one or more 1s to 0 in the unit matrix, a shift matrix obtained by cyclically shifting the unit matrix or the quasi-unit matrix, a sum matrix which is the sum of two or more of the unit matrix, the quasi-unit matrix, and the shift matrix, and a combination of the zero matrices of size of P×P, that is, a parity check matrix (conversion parity check matrix) which can be represented by a combination of the component matrices. Therefore, it is possible to use an architecture which performs check node calculation and variable node calculation for P check nodes and P variable nodes at the same time to decode the LDPC code. As a result, P nodes can be calculated at the same time and it is possible to suppress the operating frequency within a possible range and repeatedly perform a plurality of LDPC decoding processes.

The LDPC decoder 166 forming the receiving device 12 illustrated in FIG. 124 performs check node calculation and variable node calculation for P check nodes and P variable nodes at the same time to perform LDPC decoding, similarly to the decoding device illustrated in FIG. 130.

That is, for simplicity of explanation, it is assumed that the parity check matrix of the LDPC code output from the LDPC encoder 115 forming the transmitting device 11 illustrated in FIG. 8 is, for example, the parity check matrix H illustrated in FIG. 127 in which the parity matrix has a staircase structure. In this case, the parity interleaver 23 of the transmitting device 11 performs parity interleaving for interleaving the (K+qx+y+1)-th code bit to the position of the (K+Py+x+1)-th code bit, with the information length K set to 60, the unit column number P of the cyclic structure set to 5, and the devisor q (=M/P) of the parity length M set to 6.

As described above, since the parity interleaving corresponds to the column replacement represented by Formula (12), the LDPC decoder 166 does not need to perform the column replacement represented by Formula (12).

Therefore, in the receiving device 12 illustrated in FIG. 124, as described above, the LDPC code which has not been subjected to the parity deinterleaving, that is, the LDPC code which has been subjected to the column replacement represented by Formula (12) is supplied from the column twist deinterleaver 55 to the LDPC decoder 166. The LDPC decoder 166 performs the same process as the decoding device illustrated in FIG. 130 except that it does not perform the column replacement represented by Formula (12).

That is, FIG. 131 illustrates a configuration example of the LDPC decoder 166 illustrated in FIG. 124.

In FIG. 131, the LDPC decoder 166 has the same structure as the decoding device illustrated in FIG. 130 except that it does not include the received data sorting unit 310 illustrated in FIG. 130 and performs the same process as the decoding device illustrated in FIG. 130 except that it does not perform the column replacement represented by Formula (12). Therefore, the description thereof will not be repeated.

As described above, since the LDPC decoder 166 can be configured without including the received data sorting unit 310, it is possible to reduce the size of the decoding device, as compared to the decoding device illustrated in FIG. 130.

In FIGS. 127 to 131, for simplicity of explanation, the length N of the LDPC code is 90, the information length K is 60, the unit column number P (the number of rows and the number of column numbers in the component matrix) of the cyclic structure is 5, and the devisor q (=M/P) of the parity length M is 6. However, the code length N, the information length K, the unit column number P of the cyclic structure, and the devisor q (=M/P) are not limited to the above-mentioned values.

That is, in the transmitting device 11 illustrated in FIG. 8, the LDPC encoder 115 outputs, for example, the LDPC code with a code length N of 64800 or 16200, an information length K of N−Pq (=N−M), a unit column number P of 360 in the cyclic structure, and a divisor q of M/P. However, the LDPC decoder 166 illustrated in FIG. 131 may perform check node calculation and variable node calculation for P check nodes and P variable nodes at the same time to perform LDPC decoding for the LDPC code.

FIG. 132 is a diagram illustrating the process of the multiplexer 54 forming the bit deinterleaver 165 illustrated in FIG. 125.

That is, A of FIG. 132 illustrates an example of the functional structure of the multiplexer 54.

The multiplexer 54 includes a reverse exchange unit 1001 and a memory 1002.

The multiplexer 54 performs a reverse exchange process (a process reverse to the exchange process) corresponding to the exchange process performed by the demultiplexer 25 of the transmitting device 11, that is, a reverse exchange process of returning the positions of the code bits (symbol bits) of the LDPC code exchanged by the exchange process to the original positions for the symbol bits of the symbol supplied from the QAM decoder 164 in the previous stage, and supplies the LDPC code obtained by the reverse exchange process to the column twist deinterleaver 55 in the next stage.

That is, in the multiplexer 54, symbol bits $y_0, y_1, \ldots, y_{mb-1}$, which are mb bits of b symbols, are supplied to the reverse exchange unit 1001 in a unit of (consecutive) b symbols.

The reverse exchange unit 1001 performs a reverse exchange process of returning the symbol bits $y_0$ to $y_{mb-1}$, which are mb bits, to the arrangement of code bits $b_o$, $b_1, \ldots, b_{mb-1}$, which are the original mb bits (the arrangement of the code bits $b_0$ to $b_{mb-1}$ before the exchange unit 32 forming the demultiplexer 25 of the transmitting device 11 performs the exchange process) and outputs the code bits $b_0$ to $b_{mb-1}$, which are the mb bits obtained by the reverse exchange process.

The memory 1002 has storage capacity of storing mb bits in the row (lateral) direction and storing N/(mb) bits in the column (longitudinal) direction, similarly to the memory 31 forming the demultiplexer 25 of the transmitting device 11. That is, the memory 1002 is configured with mb columns storing N/(mb) bits.

In the memory 1002, the code bits of the LDPC code output from the reverse exchange unit 1001 are written in the direction in which the code bits are read from the memory 31 of the demultiplexer 25 in the transmitting device 11 and the code bits written to the memory 1002 are read in the direction in which the code bits are written to the memory 31.

That is, in the multiplexer 54 of the receiving device 12, as illustrated in A of FIG. 132, the code bits of the LDPC code output from the reverse exchange unit 1001 are sequentially written in a unit of mb bits in the row direction from the first row of the memory 1002 to the lower side.

Then, when the writing of code bits corresponding to one code length ends, the multiplexer 54 reads the code bits from the memory 1002 in the column direction and supplies the code bits to the column twist deinterleaver 55 in the next stage.

FIG. 132B is a diagram illustrating the reading of the code bits from the memory 1002.

The multiplexer 54 performs a process of reading the code bits of the LDPC code from the columns of the memory 1002 in the downward direction (the column direction) from the upper side for the columns from the left side to the right side.

FIG. 133 is a diagram illustrating the process of the column twist deinterleaver 55 forming the bit deinterleaver 165 illustrated in FIG. 125.

That is, FIG. 133 illustrates a configuration example of the memory 1002 of the multiplexer 54.

The memory 1002 has storage capacity of storing mb bits in the column (longitudinal)) direction and storing N/(mb) bits in the row (lateral) direction and is configured with mb columns.

The column twist deinterleaver 55 controls the reading start position when the code bits of the LDPC code are written to the memory 1002 in the row direction and are read therefrom in the column direction, thereby performing column twist deinterleaving.

That is, the column twist deinterleaver 55 appropriately changes the reading start position where the code bits start to be read for a plurality of columns to perform a reverse sorting process of returning the arrangement of the code bits sorted by the column twist interleaving to the original arrangement.

FIG. 133 illustrates a configuration example of the memory 1002 when the modulation method is 16 QAM and the multiple b is 1 as illustrated in FIG. 24. Therefore, the bit number m of a single symbol is 4 and the memory 1002 includes 4 (=mb) columns.

The column twist deinterleaver 55 sequentially writes the code bits of the LDPC code output from the exchange unit 1001 in the row direction from the first row of the memory 1002 to the lower side, instead of the multiplexer 54.

When the writing of the code bits corresponding to one code length ends, the column twist deinterleaver 55 performs a process of reading the code bits in the downward direction (column direction) from the upper side of the memory 1002 for the columns from the left side to the right side.

The column twist deinterleaver 55 reads the code bits from the memory 1002, using the write start position where the column twist interleaver 24 of the transmitting device 11 writes the code bits as the reading start position of the code bits.

That is, in a case in which the address of a beginning (top) position of each column is represented by 0 and the address of each position in the column direction is represented by an integer in ascending order, when the modulation method is 16 QAM and the multiple b is 1, in the column twist deinterleaver 55, a reading start position of the leftmost column is set to the position having the address of 0, a reading start position of the second column (from the left) is set to the position having the address of 2, a reading start position of the third column is set to the position having the address of 4, and a reading start position of the fourth column is set to the position having the address of 7.

For the columns whose reading start position is a position other than the position having the address of 0, after code bits are read up to the lowest position, it returns to the beginning (the position having the address of 0), and the reading is performed up to the position directly before the reading start position. Then, reading from the next (right) column is performed.

The above-mentioned column twist deinterleaving is performed to return the arrangement of the code bits sorted by the column twist interleaving to the original arrangement.

Similar to the column twist interleaving which is performed in a unit of L code words illustrated in FIG. 123, the column twist deinterleaving may be performed in a unit of L code words.

In this case, the memory 1002 includes L unit storage areas, similarly to the memory 31 illustrated in FIG. 123, and the L code words are sequentially written to the L unit storage areas in the row direction.

When the writing of the L code words ends, the L code words are sequentially read from the L unit storage areas in the column direction.

The code words are read from each unit storage area, using the write start position where the column twist interleaver 24 writes the LDPC code as the reading start position.

FIG. 134 is a block diagram illustrating another configuration example of the bit deinterleaver 165 illustrated in FIG. 124.

In FIG. 134, components corresponding to those illustrated in FIG. 125 are denoted by the same reference numerals and the description thereof will not be repeated.

That is, the bit deinterleaver 165 illustrated in FIG. 134 has the same configuration as that illustrated in FIG. 125 except that a parity deinterleaver 1011 is newly provided.

In FIG. 134, the bit deinterleaver 165 includes a multiplexer (MUX) 54, a column twist deinterleaver 55, and the parity deinterleaver 1011 and performs bit deinterleaving for the code bits of the LDPC code from the QAM decoder 164.

That is, the multiplexer 54 performs a reverse exchange process (a process reverse to the exchange process) corresponding to the exchange process performed by the demultiplexer 25 of the transmitting device 11, that is, a reverse exchange process of returning the positions of the code bits exchanged by the exchange process to the original positions for the LDPC code supplied from the QAM decoder 16, and supplies the LDPC code obtained by the reverse exchange process to the column twist deinterleaver 55.

The column twist deinterleaver 55 performs column twist deinterleaving corresponding to the column twist interleaving, which is the sorting process of the column twist interleaver 24 of the transmitting device 11, for the LDPC code of the multiplexer 54.

The LDPC code obtained by the column twist deinterleaving is supplied from the column twist deinterleaver 55 to the parity deinterleaver 1011.

The parity deinterleaver 1011 performs parity deinterleaving (a process reverse to the parity interleaving) corresponding to the parity interleaving performed by the parity interleaver 23 of the transmitting device 11, that is, parity deinterleaving for returning the code bits of the LDPC code whose arrangement has been changed by the parity interleaving to the original arrangement for the code bits subjected to the column twist deinterleaving by the column twist deinterleaver 55.

The LDPC code obtained by the parity deinterleaving is supplied from the parity deinterleaver 1011 to the LDPC decoder 166.

Therefore, the LDPC code subjected to the reverse exchange process, the column twist deinterleaving, and the parity deinterleaving, that is, the LDPC code obtained by LDPC coding based on the parity check matrix H is supplied from the bit deinterleaver 165 illustrated in FIG. 134 to the LDPC decoder 166.

The LDPC decoder 166 performs LDPC decoding for the LDPC code from the bit deinterleaver 165, using the parity check matrix H which is used for the LDPC coding by the LDPC encoder 115 of the transmitting device 11 or using the conversion parity check matrix obtained by performing at least column replacement corresponding to the parity interleaving for the parity check matrix H, and outputs the decoded data as the decoding result of the LDPC target data.

In FIG. 134, the LDPC code obtained by LDPC coding based on the parity check matrix H is supplied from (the parity deinterleaver 1011 of) the bit deinterleaver 165 to the LDPC decoder 166. Therefore, when LDPC decoding is performed for the LDPC code using the parity check matrix H which is used for LDPC coding by the LDPC encoder 115 of the transmitting device 11, the LDPC decoder 166 may be, for example, a decoding device which performs LDPC decoding using a full serial decoding method in which the calculation of messages (check node messages and variable node messages) is sequentially performed for each node or a decoding device which performs LDPC decoding using a full parallel decoding method in which the calculation of messages is performed for all nodes at the same time (in parallel).

When the LDPC decoder 166 performs LDPC decoding for the LDPC code using the conversion parity check matrix obtained by performing at least column replacement corresponding to the parity interleaving for the parity check matrix H which is used for LDPC coding by the LDPC encoder 115 of the transmitting device 11, the LDPC decoder 166 may be a decoding device (FIG. 130) with an architecture which performs check node calculation and variable node calculation for P (or a devisor of P other than 1) check nodes and P variable nodes at the same time and includes a received data sorting unit 310 that performs the same column replacement as that for obtaining the conversion parity check matrix for the LDPC code to sort the code bits of the LDPC code.

In FIG. 134, for convenience of explanation, the multiplexer 54 which performs the reverse exchange process, the column twist deinterleaver 55 which performs the column twist deinterleaving, and the parity deinterleaver 1011 which performs the parity deinterleaving are separately provided. However, two or more of the multiplexer 54, the column twist deinterleaver 55, and the parity deinterleaver 1011 may be integrally provided, similarly to the parity interleaver 23, the column twist interleaver 24, and the demultiplexer 25 of the transmitting device 11.

[Configuration Example of Reception System]

FIG. 135 is a block diagram illustrating a first configuration example of a reception system to which the receiving device 12 can be applied.

In FIG. 135, the reception system includes an acquisition unit 1101, a transmission path decoding processing unit 1102, and an information source decoding processing unit 1103.

The acquisition unit 1101 acquires a signal including a LDPC code obtained by performing at least LDPC coding for LDPC target data, such as image data and audio data of a program through a transmission path (communication path) which is not illustrated in the figure, such as terrestrial digital broadcasting, satellite digital broadcasting, a CATV network, the Internet, or other networks, and supplies the acquired signal to the transmission path decoding processing unit 1102.

When the signal acquired by the acquisition unit 1101 is broadcasted from a broadcasting station through, for example, ground waves, satellite waves, or a CATV (Cable Television) network, the acquisition unit 1101 is, for example, a tuner or an STB (Set Top Box). When the signal acquired by the acquisition unit 1101 is transmitted by multicast, for example, from a web server as in an IPTV (Internet Protocol Television), the acquisition unit 1101 is, for example, a network I/F (Interface) such as an NIC (Network Interface Card).

The transmission path decoding processing unit 1102 corresponds to the receiving device 12. The transmission path decoding processing unit 1102 performs a transmission path decoding process including at least a process of correcting errors which occur in the transmission path for the signal acquired by the acquisition unit 1101 through the transmission path and supplies the signal obtained by the transmission path decoding process to the information source decoding processing unit 1103.

That is, the signal acquired by the acquisition unit 1101 through the transmission path is obtained by performing at least error correction coding for correcting errors which occur in the transmission path, and the transmission path decoding processing unit 1102 performs the transmission path decoding process, such as an error correction process, for the signal.

Examples of the error correction coding include LDPC coding and BCH coding. In this embodiment, at least LDPC coding is performed as the error correction coding.

In addition, the transmission path decoding process includes, for example, a process of demodulating a modulated signal.

The information source decoding processing unit 1103 performs an information source decoding process including at least a process of decompressing compressed information into the original information for the signal subjected to the transmission path decoding process.

That is, compression coding for compressing information in order to reduce the amount of data of an image or a sound serving as information is performed for the signal acquired by the acquisition unit 1101 through the transmission path. In this case, the information source decoding processing unit 1103 performs the information source decoding process, such as a process (decompression process) of decompressing the compressed information into the original information, for the signal subjected to the transmission path decoding process.

When the compression coding has not been performed for the signal which is acquired by the acquisition unit 1101 through the transmission path, the information source decoding processing unit 1103 does not perform the process of decompressing the compressed information into the original information.

Examples of the decompression process include MPEG decoding. In addition, the transmission path decoding process includes, for example, descrambling in addition to the decompression process.

In the reception system having the above-mentioned configuration, the acquisition unit 1101 acquires the signal obtained by performing compression coding, such as MPEG encoding, and error correction coding, such as LDPC coding, for data, such as an image or a sound, through the transmission path, and the acquired signal is supplied to the transmission path decoding processing unit 1102.

The transmission path decoding processing unit 1102 performs, for example, the same process as that performed by the receiving device 12 as the transmission path decoding process for the signal supplied from the acquisition unit 1101 and supplies the processed signal to the information source decoding processing unit 1103.

The information source decoding processing unit 1103 performs the information source decoding process, such as MPEG decoding, for the signal supplied from the transmission path decoding processing unit 1102 and outputs an image or a sound obtained by the information source decoding process.

The reception system illustrated in FIG. 135 described above can be applied to, for example, a television tuner which receives television broadcasting as digital broadcasting.

The acquisition unit 1101, the transmission path decoding processing unit 1102, and the information source decoding processing unit 1103 each can be configured as an independent device (hardware (for example, an IC (Integrated Circuit)) or a software module).

For the acquisition unit 1101, the transmission path decoding processing unit 1102, and the information source decoding processing unit 1103, a set of the acquisition unit 1101 and the transmission path decoding processing unit 1102, a set of the transmission path decoding processing unit 1102 and the information source decoding processing unit 1103, and a set of the acquisition unit 1101, the transmission path decoding processing unit 1102, and the information source decoding processing unit 1103 each can be configured as an independent device.

FIG. 136 is a block diagram illustrating a second configuration example of the reception system to which the receiving device 12 can be applied.

In FIG. 136, components corresponding to those illustrated in FIG. 135 are denoted by the same reference numerals and the description thereof will not be repeated.

The reception system illustrated in FIG. 136 is similar to that illustrated in FIG. 135 in that it includes the acquisition unit 1101, the transmission path decoding processing unit 1102, and the information source decoding processing unit 1103, but differs from that illustrated in FIG. 135 in that an output unit 1111 is newly provided.

The output unit 1111 is, for example, a display device which displays an image or a speaker which outputs a sound and outputs an image or a sound as the signal output from the information source decoding processing unit 1103. In other words, the output unit 1111 displays an image or outputs a sound.

The reception system illustrated in FIG. 136 described above can be applied to, for example, a TV (television set) which receives television broadcasting as digital broadcasting or a radio receiver which receives radio broadcasting.

When compression coding has not been performed for the signal acquired by the acquisition unit 1101, the signal output from the transmission path decoding processing unit 1102 is supplied to the output unit 1111.

FIG. 137 is a block diagram illustrating a third configuration example of the reception system to which the receiving device 12 can be applied.

In FIG. 137, components corresponding to those illustrated in FIG. 135 are denoted by the same reference numerals and the description thereof will not be repeated.

The reception system illustrated in FIG. 137 is similar to that illustrated in FIG. 135 in that it includes the acquisition unit 1101 and the transmission path decoding processing unit 1102.

However, the reception system illustrated in FIG. 137 differs from that illustrated in FIG. 135 in that the information source decoding processing unit 1103 is not provided and a recording unit 1121 is newly provided.

The recording unit 1121 records (stores) the signal (for example, an MPEG TS packet) output from the transmission path decoding processing unit 1102 on a recording (storage) medium, such as an optical disk, a hard disk (magnetic disk), or a flash memory.

The reception system illustrated in FIG. 137 can be applied to, for example, a recorder which records a television broadcast.

In FIG. 137, the reception system may include the information source decoding processing unit 1103 and the recording unit 1121 may record the signal for which an information source decoding process has been performed by the information source decoding processing unit 1103, that is, the decoded image or sound.

[Embodiment of Computer]

Next, the series of processes may be performed by hardware or software. When the series of processes is performed by software, a program forming the software is installed in, for example, a general-purpose computer.

FIG. 138 illustrates a configuration example of an embodiment of the computer in which the program for executing the series of processes is installed.

The program can be recorded in a hard disk 705 or a ROM 703 serving as recording medium provided in the computer in advance.

Alternatively, the program can be temporarily or permanently stored (recorded) in a removable recording medium 711, such as a flexible disk, a CD-ROM (Compact Disc Read Only Memory), a MO (Magneto Optical) disk, a DVD (Digital Versatile Disc), a magnetic disk, or a semiconductor memory. The removable recording medium 711 can be provided as so-called package software.

The program can be installed by the following method in addition to the method in which the program is installed in the computer from the removable recording medium 711: the program is wirelessly transmitted from a download site to the computer through an artificial satellite for digital satellite broadcasting, or the program is transmitted to the computer by wire through a network, such as a LAN (Local Area Network) or the Internet, and the computer receives the transmitted program using a communication unit 708 and installs the program in a hard disk 705 provided therein.

The computer includes a CPU (Central Processing Unit) 702 provided therein. An input/output interface 710 is connected to the CPU 702 through a bus 701. When the user operates an input unit 707, such as a keyboard, a mouse, or a microphone, to input commands to the CPU 702 through the input/output interface 710, the CPU 702 executes the program stored in the ROM (Read Only Memory) 703 according to the commands. Alternatively, the CPU 702 loads, to a RAM (Random Access Memory) 704, the program stored in the hard disk 705, the program which is transmitted from a satellite or a network, is received by the communication unit 708, and is then installed in the hard disk 705, or the program which is read from the removable recording medium 711 inserted into a drive 709 and is then installed in the hard disk 705, and executes the program. In this way, the CPU 702 performs the processes illustrated in the above-mentioned flowcharts or the processes performed by the configuration of the above-mentioned block diagrams. Then, the CPU 702 outputs the processing result from an output unit 706, such as an LCD (Liquid Crystal Display) or a speaker or transmits the processing result from the communication unit 708 through the input/output interface 710 and records the processing result on the hard disk 705, if necessary.

In the specification, processing steps which describe the program for causing the computer to perform various processes are not necessarily processed in time series in the order described in the flowchart, but include the processes which are executed in parallel or individually (for example, parallel processes or processes by an object).

Further, the program may be processed by one computer, or it may be distributed and processed by a plurality of computers. In addition, the program may be transmitted to a remote computer and then executed by the computer.

The embodiment of the present technology is not limited to the above-described embodiment, but various modifications and changes of the present technology can be made without departing from the scope and spirit of the present technology.

That is, for example, (the parity check matrix initial value table of) the LDPC code which is used in digital broadcasting for a mobile terminal can be used in digital broadcasting for a fixed terminal.

REFERENCE SIGNS LIST

11 Transmitting device, 12 Receiving device, 23 Parity interleaver, 24 Column twist interleaver, 25 Demultiplexer, 31 Memory, 32 Exchange unit, 54 Multiplexer, 55 Column twist interleaver, 111 Mode adaptation/multiplexer, 112 Padder, 113 BB scrambler, 114 BCH encoder, 115 LDPC encoder, 116 Bit interleaver, 117 QAM encoder, 118 Time interleaver, 119 MISO/MIMO encoder, 120 Frequency interleaver, 121 BCH encoder, 122 LDPC encoder, 123 QAM encoder, 124 Frequency interleaver, 131 Frame builder/resource allocation unit, 132 OFDM generation unit, 151 OFDM processing unit, 152 Frame management unit, 153 Frequency deinterleaver, 154 QAM decoder, 155 LDPC decoder, 156 BCH decoder, 161 Frequency deinterleaver, 162 MISO/MIMO decoder, 163 Time deinterleaver, 164 QAM decoder, 165 Bit deinterleaver, 166 LDPC decoder, 167 BCH decoder, 168 BB descrambler, 169 Null deletion unit, 170 Demultiplexer, 300 Memory for branch data storage, 301 Selector, 302 Check node calculation unit, 303 Cyclic shift circuit, 304 Memory for branch data storage, 305 Selector, 306 Memory for received data, 307 Variable node calculation unit, 308 Cyclic shift circuit, 309 Decoded word calculation unit, 310 Received data sorting unit, 311 Decoded data sorting unit, 601 Coding processing unit, 602 Storing unit, 611 Coding rate setting unit, 612 Initial value table reading unit, 613 Parity check matrix generation unit, 614 Information bit reading unit, 615 Coding parity arithmetic unit, 616 Control unit, 701 Bus, 702 CPU, 703 ROM, 704 RAM, 705 Hard disk, 706 Output unit, 707 Input unit, 708 Communication unit, 709 Drive, 710 Input/output interface, 711 Removable recording medium, 1001 Reverse exchange unit, 1002 Memory, 1011 Parity deinterleaver, 1101 Acquisition unit, 1101 Transmission path decoding processing unit, 1103 Information source decoding processing unit, 1111 Output unit, 1121 Recording unit

The invention claimed is:

1. A data processing device comprising:

circuitry configured to perform a sorting process for code bits of an LDPC (Low Density Parity Check) code which is encoded with a code length of 16200, wherein in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480 the parity check matrix initial value table of the LDPC code with a coding rate of 1/3 is as follows:

77 82 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698

3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879
5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352

9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

2. The data processing device according to claim 1,
wherein the circuitry outputs 8 bits acquired from the eight storage units as two symbols, one bit being acquired from each storage unit,
wherein the symbol is data which is mapped to one of 16 signal points.

3. The data processing device according to claim 1,
wherein the storage units are arranged in a row direction and each of the storage units stores the code bits in a column direction, and
the circuitry changes the storage start position in the column direction in the storage unit, writes the code bits in the column direction, and reads the code bits in the row direction, thereby performing the sorting process.

4. The data processing device according to claim 1,
wherein the circuitry changes a reading start position for each storage unit, instead of changing the storage start position for each storage unit, thereby performing the same sorting process as the sorting process.

5. A data processing method comprising:
performing, using circuitry, a sorting process for code bits of an LDPC (Low Density Parity Check) code which is encoded with a code length of 16200, wherein
in a case that the code bits are stored in eight storage units, the sorting process changes a storage start position of the code bits for each storage unit,
in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5,
the LDPC code is:
a LDPC code which has a coding rate of 1/5, 4/15, 1/3, 2/5, 4/9, 7/15, 8/15, 3/5, or 2/3 and includes an information bit and a parity bit,
a LDPC code which is defined by a DVB-T.2 standard, has a code length of 16200 bits and a coding rate of 1/4, 1/2, 3/5, 2/3, or 3/4, and includes an information bit and a parity bit, or
a LDPC code which is defined by a DVB-S.2 standard, has a code length of 16200 bits and a coding rate of 1/3 or 2/5, and includes an information bit and a parity bit,
a parity check matrix of the LDPC code includes an information matrix portion corresponding to the information bit and a parity matrix portion corresponding to the parity bit,
the information matrix portion is represented by a parity check matrix initial value table,
the parity check matrix initial value table represents a position of one element of 1 of the information matrix portion for every 360 columns, and
the parity check matrix initial value table of the LDPC code with a coding rate of 1/5 is as follows:
188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147
the parity check matrix initial value table of the LDPC code with a coding rate of 4/15 is as follows:
1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108
8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480
the parity check matrix initial value table of the LDPC code with a coding rate of 1/3 is as follows:
77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735

29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

4188 1367 1831 1964 3424 3732 4590 4677 5455 5542 5627 6415

904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879
5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

6. A data processing device comprising:

circuitry configured to perform a reverse sorting process for bits included in two received symbols, wherein the two symbols are data obtained by performing a sorting process for code bits of an LDPC (Low Density Parity Check) code which is encoded with a code length of 16200, in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, the reverse sorting process returns the rearranged code bits to original arrangement, the LDPC code is:

- a LDPC code which has a coding rate of 1/5, 4/15, 1/3, 2/5, 4/9, 7/15, 8/15, 3/5, or 2/3 and includes an information bit and a parity bit,
- a LDPC code which is defined by a DVB-T.2 standard, has a code length of 16200 bits and a coding rate of 1/4, 1/2, 3/5, 2/3, or 3/4, and includes an information bit and a parity bit, or
- a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339

5 612 1724 1737 1911 1914 2108 2496 2809 4037 5838 6950 8049 8081 9480 9512 9724 9745 9952 10203 10207 10270 10463 10486 10499 10515 10663 10678 10706 10741

22 345 1938 3636 4016 5293 6424 6589 7426 7547 8102 9038 9095 9127 9174 9239 9279 9810 10347 10403 10408 10591 10610 10632 10660 10721 10754 10765 10773 10791

17 3435 7278 9952

1442 2518 3132 7541

5464 9226 10615 10658

426 2473 8459 10750

1862 2111 6236 10546

1010 9922 10591 10735

29 2663 6553 10749

5652 7265 7789 10708

4534 5497 10784

345 3027 10761

2823 4127 10668

84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710

619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401

499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671

658 4058 7824 8512

3245 4743 8117 9369

465 6559 8112 9461

975 2368 4444 6095

4128 5993 9182 9473

9 3822 5306 5320

4 8311 9571 9669

13 8122 8949 9656

3353 4449 5829 8053

7885 9118 9674

7575 9591 9670

431 8123 9271

4228 7587 9270

8847 9146 9556

11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699

18 24 1578 2569 3538 3714 4879 4922 5825 6417 7090 7285 7291 7451 7545 7758 7857 8180 8511 8687 8834 8877 8896 8923 8956

168 1839 1944 2745 2815 3874 4427 5366 6331 6396 6503 6512 7107 7608 7663 7742 8101 8223 8710 8722 8804 8825 8861 8909 8980

1 12 395 1035 1675 1946 2788 2823 3899 4097 4382 4741 4933 5267 7094 7503 7555 7929 8136 8377 8434 8668 8739 8756 8990

2635 4688 6722 6823

11 527 7081 7698

3930 4520 5817 7864

16 657 2009 8233

2965 5337 6600

521 6304 8963

1218 3326 6124

19 5853 8813

7129 8899 8962

3467 3632 8651

5895 6516 8973

2759 3422 8965

7205 8708 8961

4928 6921 8994

364 7206 8927

3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623

56 1955 3000 8242

1809 4094 7991 8489

2220 6455 7849 8548

1006 2576 3247 6976

2177 6048 7795 8295

1413 2595 7446 8594

2101 3714 7541 8531

10 5961 7484

3144 4636 5282

5708 5875 8390

3322 5223 7975

197 4653 8283

598 5393 8624

906 7249 7542

1223 2148 8195

976 2001 5005 the parity check matrix initial value table of the LDPC code with a coding rate of 8/15 is as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464
the parity check matrix initial value table of the LDPC code with a coding rate of 3/5 is as follows:
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and
the parity check matrix initial value table of the LDPC code with a coding rate of 2/3 is as follows:
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

7. The data processing device according to claim 6,
wherein the two symbols are two data items including 8 bits which are acquired from the eight storage units, one bit being acquired from each storage unit, and
each of the symbols is data which is mapped to one of 16 signal points.

8. The data processing device according to claim 6,
wherein the storage units are arranged in a row direction and each of the storage units stores the code bits in a column direction, and
the sorting process changes the storage start position in the column direction in the storage unit, writes the code bits in the column direction, and reads the code bits in the row direction.

9. The data processing device according to claim 6,
wherein the sorting process changes a reading start position for each storage unit, instead of changing the storage start position for each storage unit.

10. A data processing method comprising:
performing, using circuitry, a reverse sorting process for bits included in two received symbols, wherein
the two symbols are data obtained by performing a sorting process for code bits of an LDPC (Low Density Parity Check) code which is encoded with a code length of 16200,
in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, the reverse sorting process returns the rearranged code bits to original arrangement, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838

7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950

76 4691 7180 7325 11292

6454 8048 12058 12946 3953 4932 10808 12700

4605 9117 9921 10662

2984 8202 10670 12877

4357 6205 7370 10403

5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339

5 612 1724 1737 1911 1914 2108 2496 2809 4037 5838 6950 8049 8081 9480 9512 9724 9745 9952 10203 10207 10270 10463 10486 10499 10515 10663 10678 10706 10741

22 345 1938 3636 4016 5293 6424 6589 7426 7547 8102 9038 9095 9127 9174 9239 9279 9810 10347 10403 10408 10591 10610 10632 10660 10721 10754 10765 10773 10791

17 3435 7278 9952

1442 2518 3132 7541

5464 9226 10615 10658

426 2473 8459 10750

1862 2111 6236 10546

1010 9922 10591 10735

29 2663 6553 10749

5652 7265 7789 10708

4534 5497 10784

345 3027 10761

2823 4127 10668

84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710

619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401

499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671

658 4058 7824 8512

3245 4743 8117 9369

465 6559 8112 9461

975 2368 4444 6095

4128 5993 9182 9473

9 3822 5306 5320

4 8311 9571 9669

13 8122 8949 9656

3353 4449 5829 8053

7885 9118 9674

7575 9591 9670

431 8123 9271

4228 7587 9270

8847 9146 9556

11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699

18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286

211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

11. A data processing device comprising:

circuitry configured to perform a sorting process for code bits of an LDPC (Low Density Parity Check) code which is encoded with a code length of 16200, wherein in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445

3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

12. The data processing device according to claim 11, wherein the circuitry outputs 8 bits acquired from the eight storage units as a single symbol, one bit being acquired from each storage unit, wherein the symbol is data which is mapped to one of 256 signal points.

13. The data processing device according to claim 11, wherein the storage units are arranged in a row direction and each of the storage units stores the code bits in a column direction, and the circuitry changes the storage start position in the column direction in the storage unit, writes the code bits in the column direction, and reads the code bits in the row direction, thereby performing the sorting process.

14. The data processing device according to claim 11, wherein the circuitry changes a reading start position for each storage unit, instead of changing the storage start position for each storage unit, thereby performing the same sorting process as the sorting process.

15. A data processing method comprising:

performing, using circuitry, a sorting process for code bits of an LDPC (Low Density Parity Check) code which is encoded with a code length of 16200, wherein in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124

7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369

465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484

3144 4636 5282
5708 5875 8390
3322 5223 7975
197 4653 8283
598 5393 8624
906 7249 7542
1223 2148 8195
976 2001 5005
the parity check matrix initial value table of the LDPC code with a coding rate of 8/15 is as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464
the parity check matrix initial value table of the LDPC code with a coding rate of 3/5 is as follows:
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and
the parity check matrix initial value table of the LDPC code with a coding rate of 2/3 is as follows:
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

16. A data processing device comprising:

circuitry configured to perform a reverse sorting process for bits included in one received symbol, wherein the single symbol is data obtained by performing a sorting process for code bits of an LDPC (Low Density Parity Check) code which is encoded with a code length of 16200, in a case that the code bits are stored in eight storage units, the sorting process changes a storage start position of the code bits for each storage unit, in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5, the reverse sorting process returns the rearranged code bits to original arrangement, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698

3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241

1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

17. The data processing device according to claim 16,
wherein the single symbol is one data item including 8 bits which are acquired from the eight storage units, one bit being acquired from each storage unit, and
the single symbol is data which is mapped to one of 256 signal points.

18. The data processing device according to claim 16,
wherein the storage units are arranged in a row direction and each of the storage units stores the code bits in a column direction, and
the sorting process changes the storage start position in the column direction in the storage unit, writes the code bits in the column direction, and reads the code bits in the row direction.

19. The data processing device according to claim 16,
wherein the sorting process changes a reading start position for each storage unit, instead of changing the storage start position for each storage unit.

20. A data processing method comprising:
performing, using circuitry, a reverse sorting process for bits included in one received symbol, wherein
the single symbol is data obtained by performing a sorting process for code bits of an LDPC (Low Density Parity Check) code which is encoded with a code length of 16200,
in a case that the code bits are stored in eight storage units, the sorting process changes a storage start position of the code bits for each storage unit,
in the sorting process, a head address of each storage unit is set to address 0, a write start position of a first storage unit among the eight storage units is set to the address 0, the write start position of a second storage unit among the eight storage units is set to address 1, the write start position of a third storage unit among the eight storage units is set to the address 0, the write start position of a fourth storage unit among the eight storage units is set to address 8, the write start position of a fifth storage unit among the eight storage units is set to address 2, the write start position of a sixth storage unit among the eight storage units is set to the address 0, the write start position of a seventh storage unit among the eight storage units is set to the address 1, and the write start position of an eighth storage unit among the eight storage units is set to address 5,
the reverse sorting process returns the rearranged code bits to original arrangement
the LDPC code is:
a LDPC code which has a coding rate of 1/5, 4/15, 1/3, 2/5, 4/9, 7/15, 8/15, 3/5, or 2/3 and includes an information bit and a parity bit,
a LDPC code which is defined by a DVB-T.2 standard, has a code length of 16200 bits and a coding rate of 1/4, 1/2, 3/5, 2/3, or 3/4, and includes an information bit and a parity bit, or
a LDPC code which is defined by a DVB-S.2 standard, has a code length of 16200 bits and a coding rate of 1/3 or 2/5, and includes an information bit and a parity bit,
a parity check matrix of the LDPC code includes an information matrix portion corresponding to the information bit and a parity matrix portion corresponding to the parity bit,
the information matrix portion is represented by a parity check matrix initial value table,
the parity check matrix initial value table represents a position of one element of 1 of the information matrix portion for every 360 columns, and
the parity check matrix initial value table of the LDPC code with a coding rate of 1/5 is as follows:
188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147
the parity check matrix initial value table of the LDPC code with a coding rate of 4/15 is as follows:
1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480
the parity check matrix initial value table of the LDPC code with a coding rate of 1/3 is as follows:
77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541

5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

21. A data processing device comprising:

circuitry configured to perform a sorting process for code bits of an LDPC (Low Density Parity Check) code which is encoded with a code length of 16200, wherein in a case that the code bits are stored in 12 storage units, the sorting process changes a storage start position of the code bits for each storage unit, in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877

4357 6205 7370 10403
5559 9847 10911 11147
the parity check matrix initial value table of the LDPC code with a coding rate of 4/15 is as follows:
1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480
the parity check matrix initial value table of the LDPC code with a coding rate of 1/3 is as follows:
77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068
the parity check matrix initial value table of the LDPC code with a coding rate of 2/5 is as follows:
13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763
the parity check matrix initial value table of the LDPC code with a coding rate of 4/9 is as follows:
567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435
the parity check matrix initial value table of the LDPC code with a coding rate of 7/15 is as follows:
3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542

1223 2148 8195
976 2001 5005
the parity check matrix initial value table of the LDPC code with a coding rate of 8/15 is as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464
the parity check matrix initial value table of the LDPC code with a coding rate of 3/5 is as follows:
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and
the parity check matrix initial value table of the LDPC code with a coding rate of 2/3 is as follows:
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

22. The data processing device according to claim 21,
wherein the circuitry outputs 12 bits acquired from the 12 storage units as two symbols, one bit being acquired from each storage unit,
wherein the symbol is data which is mapped to one of 64 signal points.

23. The data processing device according to claim 21,
wherein the storage units are arranged in a row direction and each of the storage units stores the code bits in a column direction, and
the circuitry changes the storage start position in the column direction in the storage unit, writes the code bits in the column direction, and reads the code bits in the row direction, thereby performing the sorting process.

24. The data processing device according to claim 21,
wherein the circuitry changes a reading start position for each storage unit, instead of changing the storage start position for each storage unit, thereby performing the same sorting process as the sorting process.

25. A data processing method comprising:
performing, using circuitry, a sorting process for code bits of an LDPC (Low Density Parity Check) code which is encoded with a code length of 16200, wherein
in a case that the code bits are stored in 12 storage units, the sorting process changes a storage start position of the code bits for each storage unit, in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838

7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950

76 4691 7180 7325 11292

6454 8048 12058 12946 3953 4932 10808 12700

4605 9117 9921 10662

2984 8202 10670 12877

4357 6205 7370 10403

5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339

5 612 1724 1737 1911 1914 2108 2496 2809 4037 5838 6950 8049 8081 9480 9512 9724 9745 9952 10203 10207 10270 10463 10486 10499 10515 10663 10678 10706 10741

22 345 1938 3636 4016 5293 6424 6589 7426 7547 8102 9038 9095 9127 9174 9239 9279 9810 10347 10403 10408 10591 10610 10632 10660 10721 10754 10765 10773 10791

17 3435 7278 9952

1442 2518 3132 7541

5464 9226 10615 10658

426 2473 8459 10750

1862 2111 6236 10546

1010 9922 10591 10735

29 2663 6553 10749

5652 7265 7789 10708

4534 5497 10784

345 3027 10761

2823 4127 10668

84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710

619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401

499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671

658 4058 7824 8512

3245 4743 8117 9369

465 6559 8112 9461

975 2368 4444 6095

4128 5993 9182 9473

9 3822 5306 5320

4 8311 9571 9669

13 8122 8949 9656

3353 4449 5829 8053

7885 9118 9674

7575 9591 9670

431 8123 9271

4228 7587 9270

8847 9146 9556

11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464 the parity check matrix initial value table of the LDPC code with a coding rate of 3/5 is as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094

14 463 600 1676 2239 2319 2326 2815 2887 4278 4457 4493 4597 4918 4989 5038 5261 5384

451 632 829 1006 1530 1723 2205 2587 2801 3041 3849 4382 4595 4727 5006 5156 5224 5286

211 265 1293 1777 1926 2214 2909 2957 3178 3278 3771 4547 4563 4737 4879 5068 5232 5344

6 2901 3925 5384

2858 4152 5006 5202

9 1232 2063 2768

7 11 2781 3871

12 2161 2820 4078

3 3510 4668 5323

253 411 3215 5241

3919 4789 5040 5302

12 5113 5256 5352

9 1461 4004 5241

1688 3585 4480 5394

8 2127 3469 4360

2827 4049 5084 5379

1770 3331 5315 5386

1885 2817 4900 5088

2568 3854 4660

1604 3565 5373

2317 4636 5156

2480 2816 4094

14 4518 4826

127 1192 3872

93 2282 3663

2962 5085 5314

2078 4277 5089

9 5280 5292

50 2847 4742.

26. A data processing device comprising:

circuitry configured to perform a reverse sorting process for bits included in two received symbols, wherein the two symbols are data obtained by performing a sorting process for code bits of an LDPC (Low Density Parity Check) code which is encoded with a code length of 16200, in a case that the code bits are stored in 12 storage units, the sorting process changes a storage start position of the code bits for each storage unit, in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9, the reverse sorting process returns the rearranged code bits to original arrangement, the LDPC code is:

a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838

7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950

76 4691 7180 7325 11292

6454 8048 12058 12946 3953 4932 10808 12700

4605 9117 9921 10662

2984 8202 10670 12877

4357 6205 7370 10403

5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339

5 612 1724 1737 1911 1914 2108 2496 2809 4037 5838 6950 8049 8081 9480 9512 9724 9745 9952 10203 10207 10270 10463 10486 10499 10515 10663 10678 10706 10741

22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415

2180 7389 7543
2121 6838 7054
1948 3109 5046
272 1015 7464
the parity check matrix initial value table of the LDPC code with a coding rate of 3/5 is as follows:
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514, and
the parity check matrix initial value table of the LDPC code with a coding rate of 2/3 is as follows:
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

27. The data processing device according to claim 26,
wherein the two symbols are two data items including 12 bits which are acquired from the 12 storage units, one bit being acquired from each storage unit, and
each of the symbols is data which is mapped to one of 64 signal points.

28. The data processing device according to claim 26,
wherein the storage units are arranged in a row direction and each of the storage units stores the code bits in a column direction, and
the sorting process changes the storage start position in the column direction in the storage unit, writes the code bits in the column direction, and reads the code bits in the row direction.

29. The data processing device according to claim 26,
wherein the sorting process changes a reading start position for each storage unit, instead of changing the storage start position for each storage unit.

30. A data processing method comprising:
performing, using circuitry, a reverse sorting process for bits included in two received symbols, wherein
the two symbols are data obtained by performing a sorting process for code bits of an LDPC (Low Density Parity Check) code which is encoded with a code length of 16200,
in a case that the code bits are stored in 12 storage units, the sorting process changes a storage start position of the code bits for each storage unit,
in the sorting process, a head address of each storage unit is set to address 0, a write start position of a first storage unit among the 12 storage units is set to the address 0, the write start position of a second storage unit among the 12 storage units is set to address 12, the write start position of a third storage unit among the 12 storage units is set to address 7, the write start position of a fourth storage unit among the 12 storage units is set to address 1, the write start position of a fifth storage unit among the 12 storage units is set to address 3, the write start position of a sixth storage unit among the 12 storage units is set to the address 1, the write start position of a seventh storage unit among the 12 storage units is set to address 8, the write start position of an eighth storage unit among the 12 storage units is set to the address 7, the write start position of a ninth storage unit among the 12 storage units is set to the address 1, the write start position of a tenth storage unit among the 12 storage units is set to the address 0, the write start position of an eleventh storage unit among the 12 storage units is set to the address 3, and the write start position of a twelfth storage unit among the 12 storage units is set to address 9,
the reverse sorting process returns the rearranged code bits to original arrangement,
the LDPC code is:
a LDPC code which has a coding rate of 1/5, 4/15, 1/3, 2/5, 4/9, 7/15, 8/15, 3/5, or 2/3 and includes an information bit and a parity bit, a LDPC code which is defined by a DVB-T.2 standard, has a code length of 16200 bits and a coding rate of 1/4, 1/2, 3/5, 2/3, or 3/4, and includes an information bit and a parity bit, or a LDPC code which is defined by a DVB-S.2 standard, has a code length of 16200 bits and a coding rate of 1/3 or 2/5, and includes an information bit and a parity bit, a parity check matrix of the LDPC code includes an information matrix portion corresponding to the information bit and a parity matrix portion corresponding to the parity bit, the information matrix portion is represented by a parity check matrix initial value table, the parity check matrix initial value table represents a position of one element of 1 of the information matrix portion for every 360 columns, and the parity check matrix initial value table of the LDPC code with a coding rate of 1/5 is as follows:

188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838
7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950
76 4691 7180 7325 11292
6454 8048 12058 12946 3953 4932 10808 12700
4605 9117 9921 10662
2984 8202 10670 12877
4357 6205 7370 10403
5559 9847 10911 11147 the parity check matrix initial value table of the LDPC code with a coding rate of 4/15 is as follows:

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480 the parity check matrix initial value table of the LDPC code with a coding rate of 1/3 is as follows:

77 182 354 816 916 958 1055 1261 1553 1874 2211 2490 2999 3267 3975 5018 5952 6198 6343 7027 7045 7751 7923 8649 9010 9022 9380 9956 10204 10339
5 612 1724 1737 1911 1914 2108 2496 2809 4037 5838 6950 8049 8081 9480 9512 9724 9745 9952 10203 10207 10270 10463 10486 10499 10515 10663 10678 10706 10741
22 345 1938 3636 4016 5293 6424 6589 7426 7547 8102 9038 9095 9127 9174 9239 9279 9810 10347 10403 10408 10591 10610 10632 10660 10721 10754 10765 10773 10791
17 3435 7278 9952
1442 2518 3132 7541
5464 9226 10615 10658
426 2473 8459 10750
1862 2111 6236 10546
1010 9922 10591 10735
29 2663 6553 10749
5652 7265 7789 10708
4534 5497 10784
345 3027 10761
2823 4127 10668
84 4800 9068 the parity check matrix initial value table of the LDPC code with a coding rate of 2/5 is as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401
499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671
658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763 the parity check matrix initial value table of the LDPC code with a coding rate of 4/9 is as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435 the parity check matrix initial value table of the LDPC code with a coding rate of 7/15 is as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623

56 1955 3000 8242

1809 4094 7991 8489

2220 6455 7849 8548

1006 2576 3247 6976

2177 6048 7795 8295

1413 2595 7446 8594

2101 3714 7541 8531

10 5961 7484

3144 4636 5282

5708 5875 8390

3322 5223 7975

197 4653 8283

598 5393 8624

906 7249 7542

1223 2148 8195

976 2001 5005 the parity check matrix initial value table of the LDPC code with a coding rate of 8/15 is as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714

1889 7173 7329

1795 2773 3499

2695 2944 6735

3221 4625 5897

1690 6122 6816

5013 6839 7358

1601 6849 7415

2180 7389 7543

2121 6838 7054

1948 3109 5046

272 1015 7464 the parity check matrix initial value table of the LDPC code with a coding rate of 3/5 is as follows:

41 588 1367 1831 1964 3424 3732 4590 4677 5455 5542 5627 6415

904 1706 2800 3732 3783 4217 4507 4999 6010 6218 6282 6363 6456

356 1871 2216 2629 2994 3719 5194 5585 6012 6273 6393 6457 6474

1676 2419 2604 3939 4186 5080 5400 5552 5971 6023 6324 6442 6445

3 770 2770 3457 3815 4253 4512 4671 5390 5393 5818 5978 6441

491 548 1033 1042 1187 3816 4378 4956 5049 5649 5684 6177 6475

1489 2817 3377 3716 4229 4512 4664 5065 5257 5477 5550 5950 6447

1546 2444 4684

15 3546 6220

1427 6199 6430

103 3629 5526

1330 6150 6255

363 5660 6422

4069 5586 5885

722 820 2823

204 2820 6181

3710 6077 6106

2655 5428 6264

1850 5989 6245

2701 5315 6477

1286 4462 6159

3356 4359 4805

13 4416 4800

3103 4357 4685

1163 5127 6435

164 3202 3934

36 230 3514, and the parity check matrix initial value table of the LDPC code with a coding rate of 2/3 is as follows:

76 545 1005 1029 1390 1970 2525 2971 3448 3845 4088 4114 4163 4373 4640 4705 4970 5094

14 463 600 1676 2239 2319 2326 2815 2887 4278 4457 4493 4597 4918 4989 5038 5261 5384

451 632 829 1006 1530 1723 2205 2587 2801 3041 3849 4382 4595 4727 5006 5156 5224 5286

211 265 1293 1777 1926 2214 2909 2957 3178 3278 3771 4547 4563 4737 4879 5068 5232 5344

6 2901 3925 5384

2858 4152 5006 5202

9 1232 2063 2768

7 11 2781 3871

12 2161 2820 4078

3 3510 4668 5323

253 411 3215 5241

3919 4789 5040 5302

12 5113 5256 5352

9 1461 4004 5241

1688 3585 4480 5394

8 2127 3469 4360

2827 4049 5084 5379

1770 3331 5315 5386

1885 2817 4900 5088

2568 3854 4660

1604 3565 5373

2317 4636 5156

2480 2816 4094

14 4518 4826

127 1192 3872

93 2282 3663

2962 5085 5314

2078 4277 5089
9 5280 5292
50 2847 4742.

* * * * *